United States Patent
Sassa et al.

(10) Patent No.: US 9,159,922 B2
(45) Date of Patent: Oct. 13, 2015

(54) METHOD FOR MANUFACTURING ORGANIC ELECTROLUMINESCENT ELEMENT

(75) Inventors: Shuichi Sassa, Tsukuba (JP); Yoshinobu Ono, Tsukubamirai (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 154 days.

(21) Appl. No.: 13/810,994

(22) PCT Filed: Jul. 15, 2011

(86) PCT No.: PCT/JP2011/066221
§ 371 (c)(1),
(2), (4) Date: Jan. 18, 2013

(87) PCT Pub. No.: WO2012/011441
PCT Pub. Date: Jan. 26, 2012

(65) Prior Publication Data
US 2013/0122625 A1    May 16, 2013

(30) Foreign Application Priority Data

Jul. 21, 2010 (JP) ................................ 2010-164234
Jan. 31, 2011 (JP) ................................ 2011-018106
Mar. 24, 2011 (JP) ................................ 2011-065346

(51) Int. Cl.
*H01L 51/00* (2006.01)
*H01L 51/50* (2006.01)
*H01L 51/56* (2006.01)

(52) U.S. Cl.
CPC ........ *H01L 51/0003* (2013.01); *H01L 51/0024* (2013.01); *H01L 51/5092* (2013.01); *H01L 51/56* (2013.01)

(58) Field of Classification Search
None
See application file for complete search history.

(56) References Cited

U.S. PATENT DOCUMENTS

2011/0006294 A1    1/2011    Tanaka et al.

FOREIGN PATENT DOCUMENTS

| CN | 1731901 A | 2/2006 |
|----|-----------|--------|
| EP | 2249411 A1 | 11/2010 |

(Continued)

OTHER PUBLICATIONS

Extended European Search Report issued Jun. 10, 2014 in corresponding European Patent Application No. 11809611.4.

(Continued)

*Primary Examiner* — Seahvosh Nikmanesh
(74) *Attorney, Agent, or Firm* — Sughrue Mion, PLLC

(57) ABSTRACT

A method for manufacturing an organic electroluminescent element that includes an anode (32), a cathode (34), a layered structure placed between the anode and the cathode and formed by stacking a plurality of organic layers including an electron injection layer (44) provided in contact with the cathode, the method including the steps of: preparing a first component (12) in which either the anode alone is or both the anode and at least a part of the organic layers to make up the layered structure are provided on a first substrate (22); preparing a second component (14) in which either the cathode alone is or both the cathode and the rest part to make up the layered structure excluding the part provided in the first component is provided on a second substrate (24); and laminating the first component and the second component to form the layered structure placed between the anode and the cathode, in which the electron injection layer that contains an ionic polymer is formed in the step of preparing the first component or in the step of preparing the second component.

6 Claims, 3 Drawing Sheets

(56) References Cited

FOREIGN PATENT DOCUMENTS

| | | |
|---|---|---|
| JP | 2008-204890 A | 9/2008 |
| JP | 2009-37751 A | 2/2009 |
| JP | 2009-123690 A | 6/2009 |
| JP | 2009-239279 A | 10/2009 |
| JP | 2010-103040 A | 5/2010 |
| WO | 2008/102867 A1 | 8/2008 |
| WO | 2009/110642 A1 | 9/2009 |

OTHER PUBLICATIONS

First Office Action issued Jan. 23, 2015 in corresponding Chinese Patent Application No. 201180045248.4 with translation.
Office Action issued May 12, 2015 in corresponding Japanese Patent Application No. 2011-159092 with translation.

METHOD FOR MANUFACTURING ORGANIC ELECTROLUMINESCENT ELEMENT

CROSS REFERENCE TO RELATED APPLICATIONS

This application is a National Stage of International Application No. PCT/JP2011/066221 filed Jul. 15, 2011, claiming priority based on Japanese Patent Application Nos. 2010-164234 filed Jul. 21, 2010, 2011-018106 filed Jan. 31, 2011 and 2011-065346 filed Mar. 24, 2011, the contents of all of which are incorporated herein by reference in their entirety.

TECHNICAL FIELD

The present invention relates to a method for manufacturing an organic electroluminescent element (also called an "organic EL element").

BACKGROUND ART

The organic EL element comprises as a basic configuration, an anode, a cathode, and a light-emitting layer placed between these electrodes. For enhancing the characteristics of the organic EL element, there is known a configuration in which in addition to the basic configuration, additional layers such as an electron injection layer and a hole injection layer is provided.

In a conventional organic EL element, for an electron injection layer provided in contact with the cathode, from the viewpoint of electric characteristics, a material having high conductivity and a small work function such as barium (Ba), barium oxide (BaO), sodium fluoride (NaF), and lithium fluoride (LiF) is used (Patent Document 1).

RELATED ART DOCUMENTS

Patent Document

Patent Document 1: JP 2008-204890 A

DISCLOSURE OF INVENTION

Problem to be Solved by the Invention

There are various methods for manufacturing an organic EL element. A laminate method can be mentioned as one example of the methods for manufacturing an organic EL element. In the laminate method, first, a first component in which an anode, a hole injection layer, and a light-emitting layer are formed on a first substrate is prepared, and a second component in which a cathode and an electron injection layer are formed on a second substrate is prepared. Then, these first component and second component are laminated to manufacture an organic EL element.

The above material making up the electron injection layer is easily reacted with a moisture and oxygen at the atmospheric pressure to be rapidly oxidized to be functionally degraded. Therefore, when a step of preparing the first component or the second component having the electron injection layer and a step of laminating the two components are performed at the atmospheric pressure, the electron injection layer might be degraded. When the electron injection layer is degraded, the characteristics of the organic EL element lower and, for example, a dark spot may be generated or the element life may be shortened.

In order to suppress the degradation of the electron injection layer in the manufacturing steps, until the lamination of the two components is performed after the formation of the electron injection layer, the electron injection layer is necessary to be laid in a vacuum atmosphere. However, for this treatment, not only the first component and the second component, but also an apparatus for laminating these two components are necessary to be maintained in a vacuum atmosphere, so that large-scale equipment equipped with a vacuum pump, a vacuum chamber, and the like becomes necessary. Furthermore, a step of carrying the components into a vacuum chamber, a step of carrying the components out of a vacuum chamber, a pressurizing step, a pressure reducing step, and the like become necessary, so that the manufacturing step becomes cumbersome and the manufacturing cost becomes higher.

The present invention has been invented for solving the above problems. It is an object of the present invention to provide a method for manufacturing an organic EL element capable of being manufactured even at around normal atmospheric pressure or even at the atmospheric pressure by the laminate method.

Means for Solving Problem

As a result of assiduous research on a material making up an electron injection layer and an electronic device using the same, the inventors of the present invention have found that an ionic polymer is not only excellent in electric characteristics, but also is difficult to be oxidized even at around normal atmospheric pressure and further even at the atmospheric pressure and is also difficult to be functionally degraded, have found that by using such an ionic polymer, the above problems can be solved, and then, have completed the present invention.

That is, the present invention provides [1] to [7] below:

[1] A method for manufacturing an organic electroluminescent element that comprises an anode, a cathode, a layered structure placed between the anode and the cathode and formed by stacking a plurality of organic layers including an electron injection layer provided in contact with the cathode, the method comprising the steps of:

preparing a first component in which either the anode alone is or both the anode and at least a part of the organic layers to make up the layered structure is provided on a first substrate;

preparing a second component in which either the cathode alone is or both the cathode and the rest part to make up the layered structure excluding the part provided in the first component are provided on a second substrate; and laminating the first component and the second component to form the layered structure placed between the anode and the cathode, wherein the electron injection layer that comprises an ionic polymer is formed in the step of preparing the first component or the second component.

[2] The method for manufacturing an organic electroluminescent element according to above [1], wherein the step of preparing the second component comprises forming the electron injection layer by applying a coating liquid at normal atmospheric pressure.

[3] The method for manufacturing an organic electroluminescent element according to above [1] or [2], wherein the first component and the second component are each an elongated film structure to be rolled up from an unwinding roll to a winding roll, and the step of laminating comprises that the first component and the second component wound off from the each unwinding roll are continuously laminated each other and wound up with the winding roll.

[4] The method for manufacturing an organic electroluminescent element according to any one of above [1] to [3], wherein the laminating is performed at normal atmospheric pressure.

[5] The method for manufacturing an organic electroluminescent element according to any one of above [1] to [4], wherein the first substrate and the second substrate are made of the same material.

[6] The method for manufacturing an organic electroluminescent element according to any one of above [1] to [5], wherein the step of laminating comprises contacting the first layer formed by applying a first coating liquid with the second layer formed by applying a second coating liquid, and the first coating liquid and second coating liquid each comprises a solvent with the same polarity.

[7] The method for manufacturing an organic electroluminescent element according to above [6], wherein the first component comprises a hole transport layer formed by applying a coating liquid, the second component comprises a light-emitting layer formed by applying a coating liquid, and the step of laminating comprises that the hole transport layer and the light-emitting layer are come into contact to be laminated.

EFFECT OF THE INVENTION

Through the method for manufacturing the organic EL element of the present invention, an ionic polymer capable of maintaining advantageous electron injection characteristics even at around normal atmospheric pressure and further even at the atmospheric pressure, is used as a material for the electron injection layer. Therefore, the step of forming the electron injection layer can be performed at the atmospheric pressure, so that the step of forming the electron injection layer can be extremely simplified. As a result thereof, the manufacturing cost can be remarkably reduced.

Moreover, through the method for manufacturing the organic EL element of the present invention, the first component and the second component of different forms in which prescribed layers are formed beforehand are laminated. If a plurality of layers are layered by a coating method, when a prescribed layer to be formed later is formed, the previously formed prescribed layer might be dissolved in a coating liquid. In order to prevent this dissolution, there is also a case where an unnecessary component such as a crosslinker is contained in the coating liquid to insolubilize the prescribed layer to be formed previously relative to the coating liquid. On the other hand, when a first component in which prescribed layers are formed beforehand and a second component in which prescribed layers are formed beforehand are laminated, it is not necessary that in the layers to come into contact with each other, an unnecessary component such as a crosslinker is contained, so that the electric characteristics, the function, and the like of the organic EL element to be manufactured can be enhanced. In addition, a step of effecting a crosslinking reaction can be omitted, so that the manufacturing step can be more simplified. Therefore, the manufacturing cost can be further reduced.

Furthermore, through the manufacturing method of the present invention, upon forming the first component or the second component, when a layer to be formed finally is assumed to be a light-emitting layer, the light-emitting layer is not exposed to a heating treatment during the formation of other layers, so that at least in the manufacturing step, the light-emitting layer is not degraded. Therefore, the electric characteristics, the element life, and the like of the organic EL element to be manufactured can be enhanced.

DESCRIPTION OF EMBODIMENTS

Figure 1:
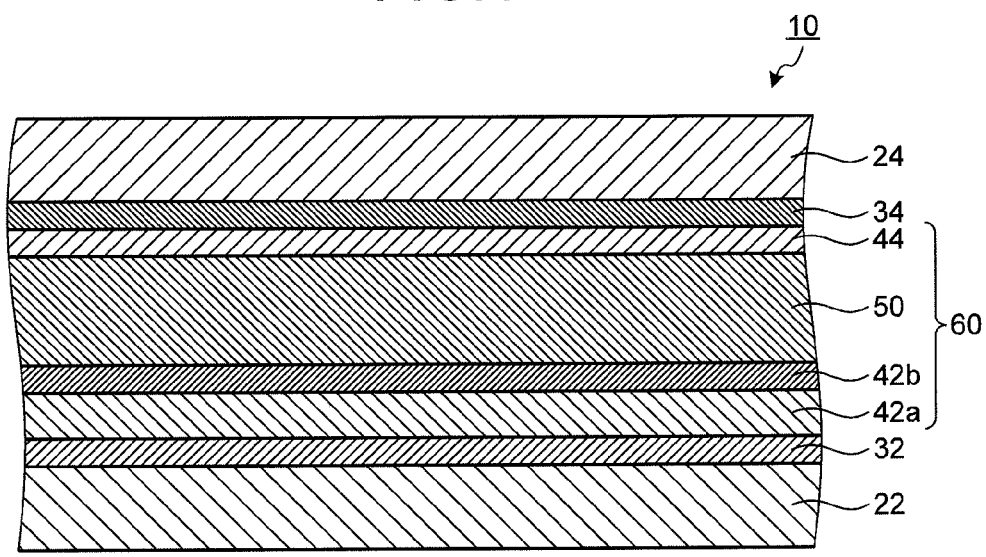
FIG. 1 is a cross-sectional view schematically illustrating one example of the configuration of an organic EL element.

Hereinafter, referring to the drawings, an embodiment of the present invention is described. Here, it is no more than that in each drawing, the shape, the size, and the disposition of each component are schematically illustrated to a degree by which the present invention can be comprehended. The present invention is not limited by the descriptions below and each component can vary accordingly so long as the variation does not depart from the gist of the present invention. Here, in each drawing used for the descriptions below, the same component is indicated with the same symbol and an overlapped description may be omitted. The organic EL element of the present invention is not necessarily manufactured or used in the disposition illustrated in the drawings. In the descriptions below, particularly, one direction of the thickness direction of the substrate may be called "upper" and another direction of the thickness direction may be called "lower".

<Configuration Example of Organic EL Element>

Referring to FIG. 1, the configuration example of an organic EL element of the present invention is described. FIG. 1 is a cross-sectional view schematically illustrating one example of the configuration of the organic EL element.

As illustrated in FIG. 1, an organic EL element 10 of the present invention comprises an anode 32, a cathode 34, and a layered structure 60 placed between these anode 32 and cathode 34 as a basic configuration.

The layered structure 60 is formed by stacking a plurality of organic layers and has an electron injection layer 44 as one organic layer among the plurality of organic layers. This electron injection layer 44 is disposed in a position in contact with the cathode. The layered structure has a light-emitting layer as one organic layer among the plurality of organic layers. Here, the layered structure 60 may be formed with the plurality of organic layers alone and may further comprise an inorganic layer or a layer in which organic substances and inorganic substances are mixed.

In the present embodiment, on one of two main surfaces of a first substrate 22 opposite to each other in the thickness direction of the first substrate 22, the anode 32 is provided. A hole injection layer 42a is provided so as to come into contact with the anode 32. A hole transport layer 42b is provided so as to come into contact with the hole injection layer 42a. A light-emitting layer 50 is provided so as to come into contact with the hole transport layer 42b. The electron injection layer 44 is provided so as to come into contact with the light-emitting layer 50. The cathode 34 is provided so as to come into contact with the electron injection layer 44. A second substrate 24 is provided so as to come into contact with the cathode 34. The layered structure 60 is made up, in this example, with the hole injection layer 42a, the hole transport layer 42b, the light-emitting layer 50, and the electron injection layer 44, and is made up with a plurality of organic layers placed between the anode 32 and the cathode 34.

The organic EL element of the present invention is characterized by the ionic polymer that is a material making up the electron injection layer 44. Therefore, first, the ionic polymer is described and next, the electron injection layer 44 using the ionic polymer is described.

(Ionic Polymer)

Examples of the ionic polymer applicable to the present invention may include polymers having a structural unit containing one or more types of group selected from the group consisting of groups represented by Formula (1) below and groups represented by Formula (2) below. One embodiment of the ionic polymer may be a polymer having a structural unit containing one or more types of group selected from the group consisting of groups represented by Formula (1) or groups represented by Formula (2) in a content of 15% by mole to 100% by mole, based on the number of moles of all structural units.

$$-(Q^1)_{n1}-Y^1(M^1)_{a1}(Z^1)_{b1} \quad (1)$$

(In Formula (1), $Q^1$ is a divalent organic group; $Y^1$ represents $-CO_2^-$, $-SO_3^-$, $-SO_2^-$, $-PO_3^{2-}$, or $-B(R^a)_3^-$; $M^1$ is a metal cation or an ammonium cation optionally having a substituent; $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$; n1 represents an integer of 0 or more; a1 represents an integer of 1 or more and b1 represents an integer of 0 or more, provided that a1 and b1 are selected so that the electric charge of the group represented by Formula (1) becomes 0; $R^a$ represents an alkyl group having 1 to 30 carbon atoms that may have a substituent or an aryl group having 6 to 50 carbon atoms that may have a substituent; and when each of $Q^1$, $M^1$, and $Z^1$ are plurally present, $Q^1$s, $M^1$s, or $Z^1$s may be the same as or different from each other.)

$$-(Q^2)_{n2}-Y^2(M^2)_{a2}(Z^2)_{b2} \quad (2)$$

(In Formula (2), $Q^2$ represents a divalent organic group; $Y^2$ represents a carbo cation, an ammonium cation, a phosphonyl cation or a sulfonyl cation or an iodonium cation; $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$; $Z^2$ represents a metal cation or an ammonium cation optionally having a substituent; n2 represents an integer of 0 or more; a2 represents an integer of 1 or more and b2 represents an integer of 0 or more, provided that a2 and b2 are selected so that the electric charge of the group represented by Formula (2) becomes 0; $R^b$ represents an alkyl group having 1 to 30 carbon atoms that may have a substituent or an aryl group having 6 to 50 carbon atoms that may have a substituent; and when each of $Q^2$, $M^2$, and $Z^2$ is plurally present, $Q^2$s, $M^2$s, or $Z^2$s may be the same as or different from each other.)

One embodiment of the ionic polymer used in the present invention further may be a polymer having a group represented by Formula (3) below. When the ionic polymer has the group represented by Formula (3), the group represented by Formula (3) may be contained in a structural unit of the ionic polymer, may be contained in the same structural unit as the structural unit containing one or more types of group selected from the group consisting of groups represented by Formula (1) and groups represented by Formula (2), or may be contained in other different structural units. Furthermore, one embodiment of the ionic polymer may be a polymer having a structural unit containing at least one type among groups represented by Formula (1), groups represented by Formula (2), or groups represented by Formula (3) in a content of 15% by mole to 100% by mole, based on the number of moles of all structural units.

$$-(Q^3)_{n3}-Y^3 \quad (3)$$

(In Formula (3), $Q^3$ represents a divalent organic group; $Y^3$ represents $-CN$ or a group represented by any one of Formula (4) to Formula (12); and n3 represents an integer of 0 or more.

$$-O-(R'O)_{a3}-R'' \quad (4)$$

[Chemical Formula 1]

$$-S-(R'S)_{a4}-R'' \quad (6)$$

$$-C(=O)-(R'-C(=O))_{a4}-R'' \quad (7)$$

$$-C(=S)-(R'-C(=S))_{a4}-R'' \quad (8)$$

$$-N\{(R')_{a4}R''\}_2 \quad (9)$$

$$-C(=O)O-(R'-C(=O)O)_{a4}-R'' \quad (10)$$

$$-C(=O)O-(R'O)_{a4}-R'' \quad (11)$$

$$-NHC(=O)-(R'NHC(=O))_{a4}-R'' \quad (12)$$

(In Formula (4) to Formula (12), R' represents a divalent hydrocarbon group optionally having a substituent; R" represents a hydrogen atom, a monovalent hydrocarbon group optionally having a substituent, $-COOH$, $-SO_3H$, $-OH$, $-SH$, $-NR^c_2$, $-CN$, or $-C(=O)NR^c_2$; R''' represents a trivalent hydrocarbon group optionally having a substituent; a3 represents an integer of 1 or more; a4 represents an integer of 0 or more; $R^c$ represents an alkyl group having 1 to 30 carbon atoms that may have a substituent or an aryl group having 6 to 50 carbon atoms that may have a substituent; and when each of R', R", and R''' is plurally present, R's, R"s, or R'''s may be the same as or different from each other.)

The ionic polymer contains preferably one or more types of structural unit selected from the group consisting of a structural unit represented by Formula (13), a structural unit represented by Formula (15), a structural unit represented by Formula (17), and a structural unit represented by Formula (20) in a content of 15% by mole to 100% by mole, based on the number of moles of all structural units.

[Chemical Formula 2]

(In Formula (13), $R^1$ is a monovalent group containing a group represented by Formula (14); $Ar^1$ represents a (2+n4) valent aromatic group optionally having a substituent besides $R^1$; n4 represents an integer of 1 or more; and when $R^1$ is plurally present, R's may be the same as or different from each other.

[Chemical Formula 3]

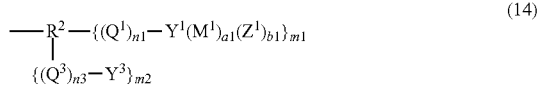
(14)

(In Formula (14), $R^2$ is a (1+m1+m2) valent organic group; $Q^1$, $Q^3$, $Y^1$, $M^1$, $Z^1$, $Y^3$, n1, a1, b1, and n3 represent the same as defined above; m1 and m2 represent independently an integer of 1 or more; and when each of $Q^1$, $Q^3$, $Y^1$, $M^1$, $Z^1$, $Y^3$, n1, a1, b1, and n3 is plurally present, $Q^1$s, $Q^3$s, $Y^1$s, $M^1$s, $Z^1$, $Y^3$s, n1s, a1s, b1s, or n3s may be the same as or different from each other).)

[Chemical Formula 4]

(15)

(In Formula (15), $R^3$ is a monovalent group containing a group represented by Formula (16); $Ar^2$ represents a (2+n5) valent aromatic group optionally having a substituent besides $R^3$; n5 represents an integer of 1 or more; and when $R^3$ is plurally present, $R^3$s may be the same as or different from each other,

[Chemical Formula 5]

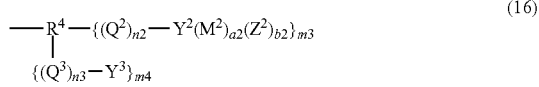
(16)

(In Formula (16), $R^4$ represents a (1+m3+m4) valent organic group; $Q^2$, $Q^3$, $Y^2$, $M^2$, $Z^2$, $Y^3$, n2, a2, b2, and n3 represent the same as defined above; m3 and m4 represent independently an integer of 1 or more; and when each of $Q^2$, $Q^3$, $Y^2$, $M^2$, $Z^2$, $Y^3$, n2, a2, b2, and n3 is plurally present, $Q^2$s, $Q^3$s, $Y^2$s, $M^2$s, $Z^2$s, $Y^3$s, n2s, a2s, b2s, or n3s may be the same as or different from each other).)

[Chemical Formula 6]

(17)

(In Formula (17), $R^5$ is a monovalent group comprising a group represented by Formula (18); $R^6$ is a monovalent group comprising a group represented by Formula (19); $Ar^3$ represents a (2+n6+n7) valent aromatic group optionally having a substituent besides $R^5$ and $R^6$; n6 and n7 represent independently an integer of 1 or more; and when each of $R^5$ and $R^6$ is plurally present, $R^5$s or $R^6$s may be the same as or different from each other,

(18)

(in Formula (18), $R^7$ represents a direct bond or a (1+m5) valent organic group; $Q^1$, $Y^1$, $M^1$, $Z^1$, n1, a1, and b1 represent the same as defined above; m5 represents an integer of 1 or more; when each of $Q^1$, $Y^1$, $M^1$, $Z^1$, n1, a1, and b1 is plurally present, $Q^1$s, $Y^1$s, $M^1$s, $Z^1$s, n1s, a1s, or b1s may be the same as or different from each other),

(19)

(in Formula (19), $R^8$ represents a single bond or a (1+m6) valent organic group; $Y^3$ and n3 represent the same as defined above; m6 represents an integer of 1 or more, provided that when $R^8$ is a single bond, m6 represents 1; and when each of $Q^3$, $Y^3$, and n3 is plurally present, $Q^3$s, $Y^3$s, or n3s may be the same as or different from each other).)

[Chemical Formula 7]

(20)

(In Formula (20), $R^9$ is a monovalent group containing a group represented by Formula (21); $R^{10}$ is a monovalent group containing a group represented by Formula (22); $Ar^4$ represents a (2+n8+n9) valent aromatic group optionally having a substituent besides $R^9$ and $R^{10}$; n8 and n9 represent independently an integer of 1 or more; and when each of $R^9$ and $R^{10}$ is plurally present, $R^9$s or $R^{10}$s may be the same as or different from each other,

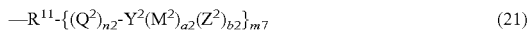
(21)

(in Formula (21), $R^{11}$ represents a single bond or a (1+m7) valent organic group; $Q^2$, $Y^2$, $M^2$, $Z^2$, n2, a2, and b2 represent the same as defined above; m7 represents an integer of 1 or more, provided that when $R^{11}$ is a single bond, m7 represents 1; and when each of $Q^2$, $Y^2$s, $M^2$s, $Z^2$, n2s, a2s, a2, and b2 is plurally present, $Q^2$s, $Y^2$s, $M^2$s, $Z^2$ s, n2s, a2s, or b2s may be the same as or different from each other),

(22)

(in Formula (22), $R^{12}$ represents a single bond or a (1+m8) valent organic group; $Y^3$ and n3 represent the same as defined above; m8 represents an integer of 1 or more, provided that when $R^{12}$ is a single bond, m8 represents 1; and when each of $Q^3$, $Y^3$, and n3 is plurally present, $Q^3$s, $Y^3$s, or n3s may be the same as or different from each other).)

The structural unit in the ionic polymer may comprise two or more types of group represented by Formula (1), may comprise two or more types of group represented by Formula (2), or may comprise two or more types of group represented by Formula (3).

Group Represented by Formula (1)

In Formula (1), examples of the divalent organic group represented by $Q^1$ may include: a divalent saturated hydrocarbon group having 1 to 50 carbon atoms that may have a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; a divalent unsaturated hydrocarbon group having 2 to 50 carbon atoms that may have a substituent that includes an alkenylene group having 2 to 50 carbon atoms that may have a substituent such as an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent, and an ethynylene group; a divalent saturated cyclic hydrocarbon group having 3 to 50 carbon atoms that may have a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an arylene group having 6 to 50 carbon atoms that may have a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; an alkyleneoxy group having 1 to 50 carbon atoms that may have a substituent such as a methyleneoxy group, an ethyleneoxy group, a propyleneoxy group, a butyleneoxy group, a pentyleneoxy group, a hexyleneoxy group, and a group in which at least one hydrogen atom in these groups is substituted with a substituent; an imino group having a substituent containing a carbon atom; and a silylene group having a substituent containing a carbon atom, and from the viewpoint of easy synthesis of a monomer (hereinafter, called a "raw material monomer") becoming a raw material for the ionic polymer, a divalent saturated hydrocarbon group, an arylene group, and an alkyleneoxy group are preferred.

Examples of the above substituent may include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amido group, an acid imido group, a monovalent heterocyclic group, a hydroxy group, a carboxyl group, a substituted carboxyl group, a cyano group, and a nitro group, and when the substituent is plurally present, the substituents may be the same as or different from each other. Among these substituents, substituents besides an amino group, a silyl group, a halogen atom, a hydroxy group, and a nitro group contain a carbon atom.

Hereinafter, the substituent is described. The term "$C_{m-n}$" (m and n are a positive integer satisfying m<n) means that the number of carbon atoms of the organic group expressed together with this term is m to n. For example, a $C_{m-n}$ alkyl group means that the number of carbon atoms of the alkyl group is m to n; a $C_{m-n}$ alkylaryl group means that the number of carbon atoms of the alkyl group in the $C_{m-n}$ alkylaryl group is m to n; and an aryl-$C_{m-n}$ alkyl group means that the number of carbon atoms of the alkyl group in the aryl-$C_{m-n}$ alkyl group is m to n.

The alkyl group as the substituent may be straight chain or branched chain, and may also be a cycloalkyl group. The alkyl group as the substituent has a number of carbon atoms of usually 1 to 20, preferably 1 to 10. Examples of the alkyl group as the substituent may include a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group. The hydrogen atom in the alkyl group may be substituted with a fluorine atom. Examples of the relevant fluorine atom-substituted alkyl group may include a trifluoromethyl group, a pentafluoroethyl group, a perfluorobutyl group, a perfluorohexyl group, and a perfluorooctyl group. Examples of the $C_{1-12}$ alkyl group may include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, and a lauryl group.

The alkoxy group as the substituent may be straight chain or branched chain, may also be a cycloalkyloxy group, and may further have a substituent. The alkoxy group as the substituent has a number of carbon atoms of usually 1 to 20, preferably 1 to 10. Examples of the alkoxy group as the substituent may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a nonyloxy group, a decyloxy group, and a lauryloxy group. The hydrogen atom in the alkoxy group may be substituted with a fluorine atom. Examples of the relevant fluorine atom-substituted alkoxy group may include a trifluoromethoxy group, a pentafluoroethoxy group, a perfluorobutoxy group, a perfluorohexyloxy group, and a perfluorooctyloxy group. The alkoxy group may also include a methoxymethyloxy group and a 2-methoxyethyloxy group. Examples of the $C_{1-12}$ alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group.

The alkylthio group as the substituent may be straight chain or branched chain, may also be a cycloalkylthio group, and may further have a substituent. The alkylthio group as the substituent has a number of carbon atoms of usually 1 to 20, preferably 1 to 10. Examples of the alkylthio group as the substituent may include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, and a laurylthio group. The hydrogen atom in the alkylthio group may be substituted with a fluorine atom. Examples of the relevant fluorine atom-substituted alkylthio group may include a trifluoromethylthio group.

The aryl group as the substituent is an atomic group remaining after eliminating one hydrogen atom bonded to a carbon atom making-up an aromatic ring from an aromatic hydrocarbon, and examples of the aryl group as the substituent may include a group having a benzene ring, a group having a fused ring, and a group in which two or more independent benzene rings or fused rings are bonded through a single bond or a divalent organic group, for example, an alkenylene group such as a vinylene group. The aryl group as the substituent has a number of carbon atoms of usually 6 to 60, preferably 7 to 48. Examples of the aryl group as the substituent may include a phenyl group, a $C_{1-12}$ alkoxyphenyl group, a $C_{1-12}$ alkylphenyl group, a 1-naphthyl group, a 2-naphthyl group, a 1-anthryl group, a 2-anthryl group, and a 9-anthryl group. The hydrogen atom in the aryl group may be substituted with a fluorine atom. Examples of the relevant fluorine atom-substituted aryl group may include a pentafluorophenyl group. Among the aryl groups, a $C_{1-12}$ alkoxyphenyl group and a $C_{1-12}$ alkylphenyl group are preferred.

Among the aryl groups, examples of the $C_{1-12}$ alkoxyphenyl group may include a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, and a lauryloxyphenyl group.

Among the aryl groups, examples of the $C_{1-12}$ alkylphenyl group may include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

The aryloxy group as the substituent has a number of carbon atoms of usually 6 to 60, preferably 7 to 48. Examples of the aryloxy group may include a phenoxy group, a $C_{1-12}$ alkoxyphenoxy group, a $C_{1-12}$ alkylphenoxy group, a 1-naphthyloxy group, a 2-naphthyloxy group, and a pentafluorophenyloxy group. Among the aryloxy groups as the substituent, a $C_{1-12}$ alkoxyphenoxy group and a $C_{1-12}$ alkylphenoxy group are preferred.

Among the aryloxy groups, examples of the $C_{1-12}$ alkoxyphenoxy group may include a methoxyphenoxy group, an ethoxyphenoxy group, a propyloxyphenoxy group, an isopropyloxyphenoxy group, a butoxyphenoxy group, an isobutoxyphenoxy group, a sec-butoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryloxyphenoxy group.

Among the aryloxy groups, examples of the $C_{1-12}$ alkylphenoxy group may include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

The arylthio group as the substituent may be, for example, a group in which a sulfur atom is bonded to the above aryl group. The arylthio group may have a substituent on an aromatic ring of the above aryl group. The arylthio group as the substituent has a number of carbon atoms of usually 6 to 60, preferably 6 to 30. Examples of the arylthio group as the substituent may include a phenylthio group, a $C_{1-12}$ alkoxyphenylthio group, a $C_{1-12}$ alkylphenylthio group, a 1-naphthylthio group, a 2-naphthylthio group, and a pentafluorophenylthio group.

The arylalkyl group as the substituent may be, for example, a group in which the above alkyl group is bonded to the above aryl group. The arylalkyl group as the substituent may have a substituent. The arylalkyl group as the substituent has a number of carbon atoms of usually 7 to 60, preferably 7 to 30. Examples of the arylalkyl group as the substituent may include a phenyl-$C_{1-12}$ alkyl group, a $C_{1-12}$ alkoxyphenyl-$C_{1-12}$ alkyl group, a $C_{1-12}$ alkylphenyl-$C_{1-12}$ alkyl group, a 1-naphthyl-$C_{1-12}$ alkyl group, and a 2-naphthyl-$C_{1-12}$ alkyl group.

The arylalkoxy group as the substituent may be, for example, a group in which the above alkoxy group is bonded to the above aryl group. The arylalkoxy group as the substituent may further have a substituent. The arylalkoxy group as the substituent has a number of carbon atoms of usually 7 to 60, preferably 7 to 30. Examples of the arylalkoxy group as the substituent may include a phenyl-$C_{1-12}$ alkoxy group, a $C_{1-12}$ alkoxyphenyl-$C_{1-12}$ alkoxy group, a $C_{1-12}$ alkylphenyl-$C_{1-12}$ alkoxy group, a 1-naphthyl-$C_{1-12}$ alkoxy group, and a 2-naphthyl-$C_{1-12}$ alkoxy group.

The arylalkylthio group as the substituent may be, for example, a group in which the above alkylthio group is bonded to the above aryl group. The arylalkylthio group as the substituent may further have a substituent. The arylalkylthio group as the substituent has a number of carbon atoms of usually 7 to 60, preferably 7 to 30. Examples of the arylalkylthio group may include a phenyl-$C_{1-12}$ alkylthio group, a $C_{1-12}$ alkoxyphenyl-$C_{1-12}$ alkylthio group, a $C_{1-12}$ alkylphenyl-$C_{1-12}$ alkylthio group, a 1-naphthyl-$C_{1-12}$ alkylthio group, and a 2-naphthyl-$C_{1-12}$ alkylthio group.

The arylalkenyl group as the substituent may be, for example, a group in which an alkenyl group is bonded to the above aryl group. The arylalkenyl group as the substituent has a number of carbon atoms of usually 8 to 60, preferably 8 to 30. Examples of the arylalkenyl group as the substituent may include a phenyl-$C_{2-12}$ alkenyl group, a $C_{1-12}$ alkoxyphenyl-$C_{2-12}$ alkenyl group, a $C_{1-12}$ alkylphenyl-$C_{2-12}$ alkenyl group, a 1-naphthyl-$C_{2-12}$ alkenyl group, and a 2-naphthyl-$C_{2-12}$ alkenyl group. Among them, a $C_{1-12}$ alkoxyphenyl-$C_2$-$C_{12}$ alkenyl group and a $C_{2-12}$ alkylphenyl-$C_{2-12}$ alkenyl group are preferred. Here, examples of the $C_{2-12}$ alkenyl group may include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

The arylalkynyl group as the substituent may be, for example, a group in which an alkynyl group is bonded to the above aryl group. The arylalkynyl group as the substituent has a number of carbon atoms of usually 8 to 60, preferably 8 to 30. Examples of the arylalkynyl group as the substituent may include a phenyl-$C_{2-12}$ alkynyl group, a $C_{1-12}$ alkoxyphenyl-$C_{2-12}$ alkynyl group, a $C_{1-12}$ alkylphenyl-$C_{2-12}$ alkynyl group, a 1-naphthyl-$C_{2-12}$ alkynyl group, and a 2-naphthyl-$C_{2-12}$ alkynyl group, and among them, a $C_{1-12}$ alkoxyphenyl-$C_{2-12}$ alkynyl group and a $C_{1-12}$ alkylphenyl-$C_{2-12}$ alkynyl group are preferred. Examples of the $C_{2-12}$ alkynyl group may include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

The substituted amino group as the substituent is preferably an amino group in which at least one hydrogen atom in the amino group is substituted with one or two groups selected from the group consisting of an alkyl group, an aryl group, an arylalkyl group, and a monovalent heterocyclic group. The alkyl group, the aryl group, the arylalkyl group, and the monovalent heterocyclic group may further have a substituent. The substituted amino group as the substituent has a number of carbon atoms of usually 1 to 60, preferably 2 to 48, without including the number of carbon atoms of the substituent that the alkyl group, the aryl group, the arylalkyl group, or the monovalent heterocyclic group may further have. Examples of the substituted amino group as the substituent may include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_{1-12}$ alkoxyphenyl)amino group, a di($C_{1-12}$ alkoxyphenyl)amino group, a di($C_{1-12}$ alkylphenyl)amino group, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, a (phenyl-$C_{1-12}$ alkyl)amino group, a ($C_{1-12}$ alkoxyphenyl-$C_{1-12}$ alkyl) amino group, a ($C_{1-12}$ alkylphenyl-$C_{1-12}$ alkyl)amino group, a di($C_{1-12}$ alkoxyphenyl-$C_{1-12}$ alkyl) amino group, a di($C_{1-12}$ alkylphenyl-$C_{1-12}$ alkyl)amino group, a 1-naphthyl-$C_{1-12}$ alkylamino group, and a 2-naphthyl-$C_{1-12}$ alkylamino group.

Examples of the substituted silyl group as the substituent may include a silyl group in which at least one hydrogen atom in the silyl group is substituted with one to three groups selected from the group consisting of an alkyl group, an aryl group, an arylalkyl group, and a monovalent heterocyclic group. The alkyl group, the aryl group, the arylalkyl group, and the monovalent heterocyclic group may further have a substituent. The substituted silyl group as the substituent has a number of carbon atoms of usually 1 to 60, preferably 3 to 48, without including the number of carbon atoms of the substituent that the alkyl group, the aryl group, the arylalkyl group, or the monovalent heterocyclic group may further have. Examples of the substituted silyl group as the substituent may include a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_{1-12}$ alkyl) silyl group, a ($C_{1-12}$ alkoxyphenyl-$C_{1-12}$ alkyl) silyl group, a ($C_{1-12}$ alkylphenyl-$C_{1-12}$ alkyl) silyl group, a (1-naphthyl-$C_{1-12}$ alkyl) silyl group, a (2-naphthyl-$C_{1-12}$ alkyl) silyl group, a (phenyl-$C_{1-12}$ alkyl)dimethylsilyl group, a triphenylsilyl group, a tri(p-xylyl)silyl group, a tribenzylsilyl group, a diphenylmethylsilyl group, a tert-butyldiphenylsilyl group, and a dimethylphenylsilyl group.

The halogen atom as the substituent may be a fluorine atom, a chlorine atom, a bromine atom, and an iodine atom.

The acyl group as the substituent has a number of carbon atoms of usually 2 to 20, preferably 2 to 18. Examples of the acyl group as the substituent may include an acetyl group, a propionyl group, a butyryl group, an isobutyryl group, a pivaloyl group, a benzoyl group, a trifluoroacetyl group, and a pentafluorobenzoyl group.

The acyloxy group as the substituent has a number of carbon atoms of usually 2 to 20, preferably 2 to 18. Examples of the acyloxy group as the substituent may include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

The imine residue as the substituent means a residue remaining after eliminating one hydrogen atom from an imine compound having a structure represented by at least any one of a formula: H—N=C< and a formula: —N=CH—. Examples of such an imine compound may include a compound in which a hydrogen atom bonded to a nitrogen atom in aldimine, ketimine and aldimine is substituted with an alkyl group, an aryl group, an arylalkyl group, an arylalkenyl group, an arylalkynyl group, or the like. The imine residue as the substituent has a number of carbon atoms of usually 2 to 20, preferably 2 to 18. Examples of the imine residue as the substituent may include a group represented by a general formula: —CR$^\beta$=N—R$^\gamma$ or a general formula: —N=C(R$^\gamma$)$_2$ (R$^\beta$ represents a hydrogen atom, an alkyl group, an aryl group, an arylalkyl group, an arylalkenyl group, or an arylalkynyl group; and R$^\gamma$s represent independently an alkyl group, an aryl group, an arylalkyl group, an arylalkenyl group, or an arylalkynyl group, provided that when two R$^\gamma$s exist, the two R$^\gamma$s may be bonded with each other to be integrated to form a ring as a divalent group, for example, a $C_{2-18}$ alkylene group such as an ethylene group, a trimethylene group, a tetramethylene group, a pentamethylene group, and a hexamethylene group). Examples of the imine residue as the substituent may include the groups below.

[Chemical Formula 8]

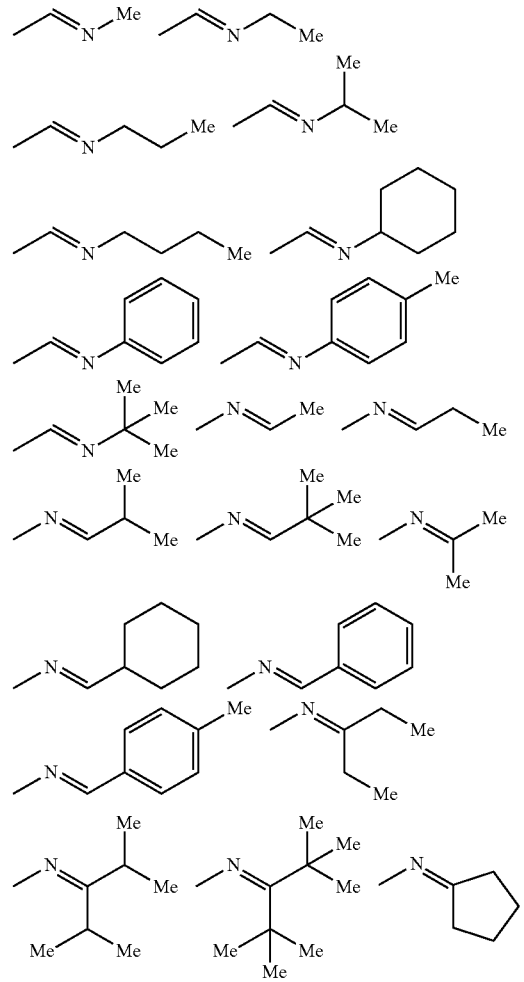

-continued

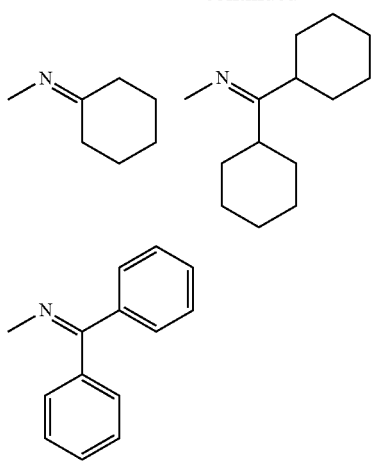

(In formulae, Me represents a methyl group, which is the same hereinafter.)

The amido group as the substituent has a number of carbon atoms of usually 1 to 20, preferably 2 to 18. Examples of the amido group as the substituent may include a formamido group, an acetamido group, a propioamido group, a butyroamido group, a benzamido group, a trifluoroacetamido group, a pentafluorobenzamido group, a diformamido group, a diacetamido group, a dipropioamido group, a dibutyroamido group, a dibenzamido group, a ditrifluoroacetamido group, and a dipentafluorobenzamido group.

The acid imido group as the substituent is a residue obtained by eliminating hydrogen atom bonded to a nitrogen atom from an acid imide, and has a number of carbon atoms of usually 4 to 20, preferably 4 to 18. Examples of the acid imido group as the substituent may include the groups below.

[Chemical Formula 9]

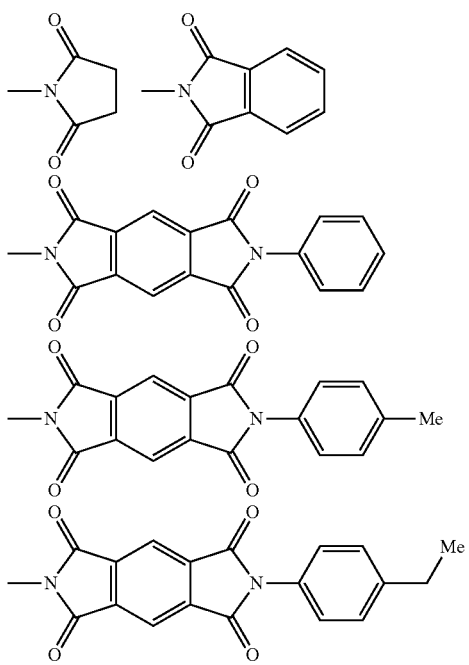

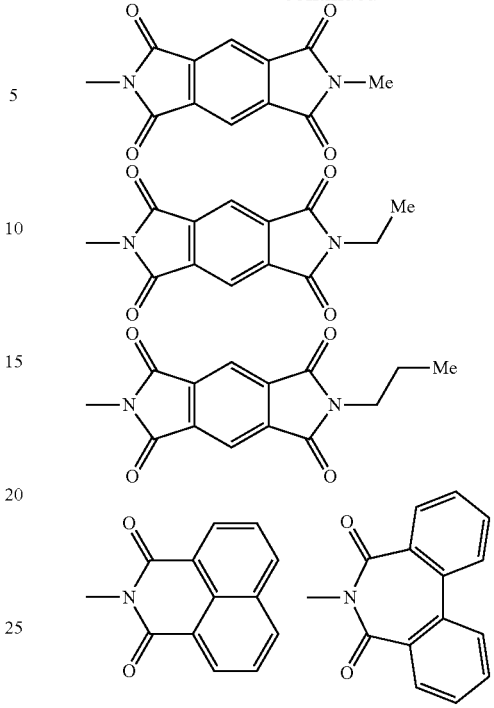

The monovalent heterocyclic group as the substituent refers to an atomic group remaining after eliminating one hydrogen atom from a heterocyclic compound. Here, the heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element making-up the ring, among organic compounds having a cyclic structure. The monovalent heterocyclic group as the substituent may further have a substituent. The monovalent heterocyclic group as the substituent has a number of carbon atoms of usually 3 to 60, preferably 3 to 20. Here, the number of carbon atoms of the monovalent heterocyclic group as the substituent does not include the number of carbon atoms of the substituent that the monovalent heterocyclic group may further have. Examples of such a monovalent heterocyclic group may include a thienyl group, a $C_{1-12}$ alkylthienyl group, a pyrrolyl group, a furyl group, a pyridyl group, a $C_{1-12}$ alkylpyridyl group, a pyridazinyl group, a pyrimidyl group, a pyrazinyl group, a triazinyl group, a pyrrolidyl group, a piperidyl group, a quinolyl group, and an isoquinolyl group, and among them, a thienyl group, a $C_{1-12}$ alkylthienyl group, a pyridyl group, and a $C_{1-12}$ alkylpyridyl group are preferred. Here, the monovalent heterocyclic group as the substituent is preferably a monovalent aromatic heterocyclic group.

The substituted carboxyl group as the substituent refers to a group in which a hydrogen atom in a carboxyl group is substituted with an alkyl group, an aryl group, an arylalkyl group, or a monovalent heterocyclic group, that is, a group represented by a formula: $-C(=O)OR^*$, where $R^*$ is an alkyl group, an aryl group, an arylalkyl group, or a monovalent heterocyclic group. The substituted carboxyl group has a number of carbon atoms of usually 2 to 60, preferably 2 to 48. The alkyl group, the aryl group, the arylalkyl group, and the monovalent heterocyclic group may have a substituent. Here, the above number of carbon atoms does not include the number of carbon atoms of the substituent that the alkyl group, the aryl group, the arylalkyl group, or the monovalent heterocyclic group may have. Examples of the substituted carboxyl group may include a methoxycarbonyl group, an ethoxycarbonyl group, a propoxycarbonyl group, an isopropoxycarbonyl group, a butoxycarbonyl group, an isobutoxycarbonyl group, a sec-butoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

In Formula (1), $Y^1$ represents a monovalent group such as $-CO_2^-$, $-SO_3^-$, $-SO_2^-$, $-PO_3^-$, or $-B(R^a)_3^-$, and $Y^1$ may be, from the viewpoint of the acidity of the ionic polymer, preferably $-CO_2^-$, $-SO_2^-$, or $-PO_3^-$, more preferably $-CO_2^-$, and from the viewpoint of the stability of the ionic polymer, preferably $-CO_2^-$, $-SO_3^-$, $-SO_2^-$, or $-PO_3^-$.

In Formula (1), $M^1$ represents a metal cation or an ammonium cation optionally having a substituent. The metal cation is preferably a monovalent, divalent, or trivalent ion and examples thereof may include an ion of Li, Na, K, Cs, Be, Mg, Ca, Ba, Ag, Al, Bi, Cu, Fe, Ga, Mn, Pb, Sn, Ti, V, W, Y, Yb, Zn, or Zr, and the like. Among them, $Li^+$, $Na^+$, $K^+$, $Cs^+$, $Ag^+$, $Mg^{2+}$, and $Ca^{2+}$ are preferred. Examples of the substituent that the ammonium cation may have may include an alkyl group having 1 to 10 carbon atoms such as a methyl group, an ethyl group, a propyl group, an isopropyl group, a butyl group, an isobutyl group, and a tert-butyl group.

In Formula (1), $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$.

In Formula (1), n1 represents an integer of 0 or more and from the viewpoint of the synthesis of the raw material monomer, n1 is preferably an integer of from 0 to 8, more preferably an integer of from 0 to 2.

In Formula (1), a1 represents an integer of 1 or more and b1 represents an integer of 0 or more.

a1 and b1 are selected so that the electric charge of the group represented by Formula (1) becomes 0. For example, when $Y^1$ is $-CO_2^-$, $-SO_3^-$, $-SO_2^-$, $-PO_3^-$, or $-B(R^a)_3^-$, $M^1$ is a monovalent metal cation or an ammonium cation optionally having a substituent, and $Z^1$ is $F^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, a1 and b1 are selected so that they satisfy a1=b1+1. When $Y^1$ is $-CO_2^-$, $-SO_3^-$, $-SO_2^-$, $-PO_3^-$, or $-B(R^a)_3^-$, $M^1$ is a divalent metal cation, and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, a1 and b1 are selected so that they satisfy b1=2×a1-1. When $Y^1$ is $-CO_2^-$, $-SO_3^-$, $-SO_2^-$, $-PO_3^-$, or $-B(R^a)_3^-$, $M^1$ is a trivalent metal cation, and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$ $ClO_4^-$, $SCN^-$, $CN^-$, $NO_3^-$, $HSO_4^-$, $H_2PO_4^-$, $BF_4^-$, or $PF_6^-$, a1 and b1 are selected so that they satisfy b1=3×a1-1. When $Y^1$ is $-CO_2^-$, $-SO_3^-$, $-SO_2^-$, $-PO_2^-$, or $-B(R^a)_3^-$, $M^1$ is a monovalent metal cation or an ammonium cation optionally having a substituent, and $Z^1$ is $SO_4^{2-}$ or $HPO_4^{2-}$, a1 and b1 are selected so that they satisfy a1=2×b1+1. In any one of the above numerical formulae expressing the relationship between a1 and b1, a1 is preferably an integer of from 1 to 5, more preferably 1 or 2.

$R^a$ represents an alkyl group having 1 to 30 carbon atoms that may have a substituent or an aryl group having 6 to 50 carbon atoms that may have a substituent. Examples of the substituent that these groups may have may include the same substituent as the substituent included in the description with respect to $Q^1$. When the substituent is plurally present, the substituents may be the same as or different from each other. Examples of $R^a$ may include an alkyl group having 1 to 20 carbon atoms such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group, and an aryl group having 6 to 30 carbon atoms such as a phenyl group, a 1-naphthyl group, a 2-naphthyl group, a 1-anthryl group, a 2-anthryl group, and a 9-anthryl group.

Examples of the group represented by Formula (1) may include the groups below.

[Chemical Formula 10]

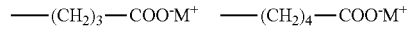
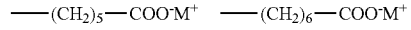
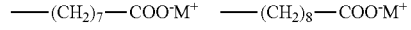
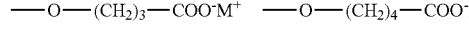
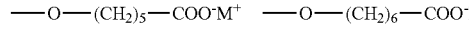
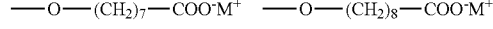
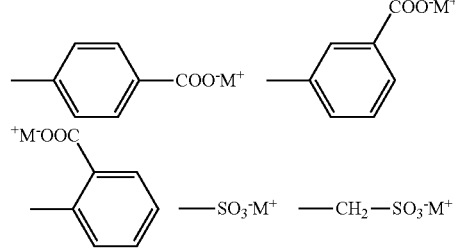
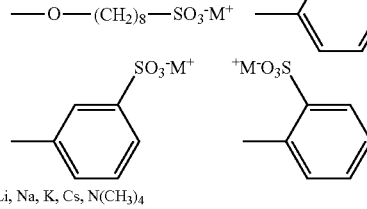

M = Li, Na, K, Cs, N(CH₃)₄

Group Represented by Formula (2)

In Formula (2), examples of as the divalent organic group represented by $Q^2$, may include the same group as the group included with respect to the divalent organic group represented by $Q^1$ and from the viewpoint of easy synthesis of the raw material monomer, the divalent organic group represented by $Q^2$ is preferably a saturated divalent hydrocarbon group, a divalent arylene group, and a divalent alkyleneoxy group.

The group included as examples for the divalent organic group represented by $Q^2$ may have a substituent, and examples of the substituent may include the same substituent as the substituent included in the description with respect to $Q^1$. When the substituent is plurally present, the substituents may be the same as or different from each other.

In Formula (2), $Y^2$ represents a carbo cation, an ammonium cation, a phosphonyl cation, a sulfonyl cation, or an iodonium cation.

Examples of the carbo cation may include a group represented by

—$C^+R_2$ where each R independently represents an alkyl group or an aryl group.

Examples of the ammonium cation may include a group represented by

—$N^+R_3$ where each R independently represents an alkyl group or an aryl group.

Examples of the phosphonyl cation may include a group represented by

—$P^+R_3$ where each R independently represents an alkyl group or an aryl group.

Examples of the sulfonyl cation may include a group represented by

—$S^+R_2$ where each R independently represents an alkyl group or an aryl group.

Examples of the iodonium cation may include a group represented by

—$I^+R_2$ where each R independently represents an alkyl group or an aryl group).

In Formula (2), $Y^2$ is, from the viewpoints of easy synthesis of the raw material monomer and the stability of the raw material monomer and the ionic polymer relative to air, moisture, and heat, preferably a carbo cation, an ammonium cation, a phosphonyl cation, a sulfonyl cation, more preferably an ammonium cation.

In Formula (2), $Z^2$ represents a metal cation or an ammonium cation optionally having a substituent. The metal cation is preferably a monovalent, divalent, or trivalent ion and examples thereof may include an ion of Li, Na, K, Cs, Be, Mg, Ca, Ba, Ag, Al, Bi, Cu, Fe, Ga, Mn, Pb, Sn, Ti, V, W, Y, Yb, Zn, or Zr, and the like. Examples of the substituent that the ammonium cation may have may include an alkyl group having 1 to 10 carbon atoms such as a methyl group, an ethyl group, a propyl group, an isopropyl group, a butyl group, an isobutyl group, and a tert-butyl group.

In Formula (2), $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In Formula (2), n2 represents an integer of 0 or more, preferably an integer of from 0 to 6, more preferably an integer of from 0 to 2.

In Formula (2), a2 represents an integer of 1 or more and b2 represents an integer of 0 or more.

a2 and b2 are selected so that the electric charge of the group represented by Formula (2) becomes 0. For example, in the case where $M^2$ is $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$: when $Z^2$ is a monovalent metal ion or an ammonium ion optionally having a substituent, a1 and b1 are selected so that they satisfy $a2=b2+1$; when $Z^2$ is a divalent metal ion, a1 and b1 are selected so that they satisfy $a2=2\times b2+1$; and when $Z^2$ is a trivalent metal ion, a1 and b1 are selected so that they satisfy $a2=3\times b2+1$. In the case where M is $SO_4^{2-}$ or $HPO_4^{2-}$: when $Z^2$ is a monovalent metal ion or an ammonium ion optionally having a substituent, a1 and b1 are selected so that they satisfy $b2=2\times a2-1$; and when $Z^2$ is a trivalent metal ion, a2 and b2 are selected so that they satisfy the relationship of $2\times a2=3\times b2+1$. In any one of the above numerical formulae expressing the relationship between a2 and b2, a2 is preferably an integer of from 1 to 3, more preferably 1 or 2.

$R^b$ represents an alkyl group having 1 to 30 carbon atoms that may have a substituent or an aryl group having 6 to 50 carbon atoms that may have a substituent, and examples of the substituent that these groups may have may include the same substituent as the substituent included in the description with respect to $Q^1$. When the substituent is plurally present, the substituents may be the same as or different from each other. Examples of $R^b$ may include an alkyl group having 1 to 20 carbon atoms such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group, and an aryl group having 6 to 30 carbon atoms such as a phenyl group, a 1-naphthyl group, a 2-naphthyl group, a 1-anthryl group, a 2-anthryl group, and a 9-anthryl group.

Examples of the group represented by Formula (2) may include the groups below.

[Chemical Formula 11]

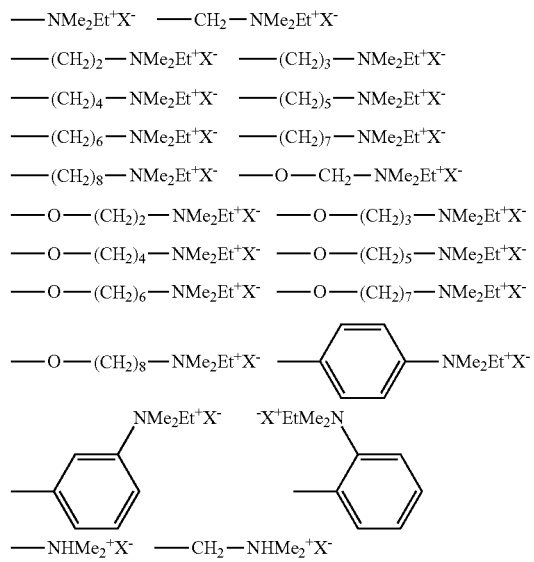

-continued

—(CH$_2$)$_2$—NHMe$_2$$^+$X$^-$  —(CH$_2$)$_3$—NHMe$_2$$^+$X$^-$

—(CH$_2$)$_4$—NHMe$_2$$^+$X$^-$  —(CH$_2$)$_5$—NHMe$_2$$^+$X$^-$

—(CH$_2$)$_6$—NHMe$_2$$^+$X$^-$  —(CH$_2$)$_7$—NHMe$_2$$^+$X$^-$

—(CH$_2$)$_8$—NHMe$_2$$^+$X$^-$  —O—CH$_2$—NHMe$_2$$^+$X$^-$

—O—(CH$_2$)$_2$—NHMe$_2$$^+$X$^-$  —O—(CH$_2$)$_3$—NHMe$_2$$^+$X$^-$

—O—(CH$_2$)$_4$—NHMe$_2$$^+$X$^-$  —O—(CH$_2$)$_5$—NEt$_3$$^+$X$^-$

—O—(CH$_2$)$_6$—NEt$_3$$^+$X$^-$  —O—(CH$_2$)$_7$—NHMe$_2$$^+$X$^-$

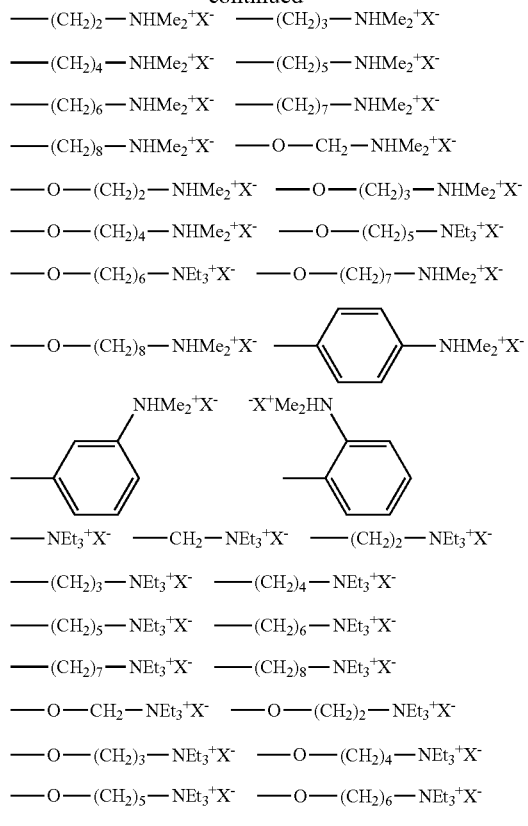

—NEt$_3$$^+$X$^-$  —CH$_2$—NEt$_3$$^+$X$^-$  —(CH$_2$)$_2$—NEt$_3$$^+$X$^-$

—(CH$_2$)$_3$—NEt$_3$$^+$X$^-$  —(CH$_2$)$_4$—NEt$_3$$^+$X$^-$

—(CH$_2$)$_5$—NEt$_3$$^+$X$^-$  —(CH$_2$)$_6$—NEt$_3$$^+$X$^-$

—(CH$_2$)$_7$—NEt$_3$$^+$X$^-$  —(CH$_2$)$_8$—NEt$_3$$^+$X$^-$

—O—CH$_2$—NEt$_3$$^+$X$^-$  —O—(CH$_2$)$_2$—NEt$_3$$^+$X$^-$

—O—(CH$_2$)$_3$—NEt$_3$$^+$X$^-$  —O—(CH$_2$)$_4$—NEt$_3$$^+$X$^-$

—O—(CH$_2$)$_5$—NEt$_3$$^+$X$^-$  —O—(CH$_2$)$_6$—NEt$_3$$^+$X$^-$

—O—(CH$_2$)$_7$—NEt$_3$$^+$X$^-$  —O—(CH$_2$)$_8$—NEt$_3$$^+$X$^-$

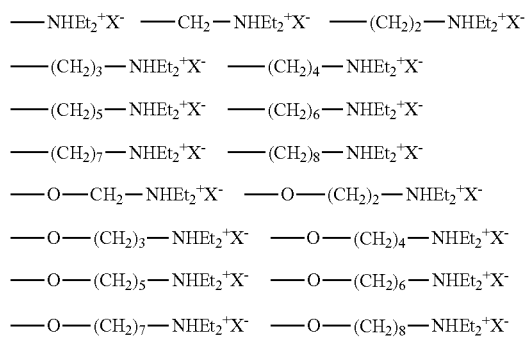

Me = CH$_3$
Et = CH$_2$CH$_3$
X = F, Cl, Br, I, BPh$_4$, CH$_3$COO, CF$_3$SO$_3$,

[Chemical Formula 12]

—NHEt$_2$$^+$X$^-$  —CH$_2$—NHEt$_2$$^+$X$^-$  —(CH$_2$)$_2$—NHEt$_2$$^+$X$^-$

—(CH$_2$)$_3$—NHEt$_2$$^+$X$^-$  —(CH$_2$)$_4$—NHEt$_2$$^+$X$^-$

—(CH$_2$)$_5$—NHEt$_2$$^+$X$^-$  —(CH$_2$)$_6$—NHEt$_2$$^+$X$^-$

—(CH$_2$)$_7$—NHEt$_2$$^+$X$^-$  —(CH$_2$)$_8$—NHEt$_2$$^+$X$^-$

—O—CH$_2$—NHEt$_2$$^+$X$^-$  —O—(CH$_2$)$_2$—NHEt$_2$$^+$X$^-$

—O—(CH$_2$)$_3$—NHEt$_2$$^+$X$^-$  —O—(CH$_2$)$_4$—NHEt$_2$$^+$X$^-$

—O—(CH$_2$)$_5$—NHEt$_2$$^+$X$^-$  —O—(CH$_2$)$_6$—NHEt$_2$$^+$X$^-$

—O—(CH$_2$)$_7$—NHEt$_2$$^+$X$^-$  —O—(CH$_2$)$_8$—NHEt$_2$$^+$X$^-$

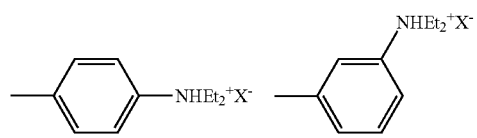

-continued

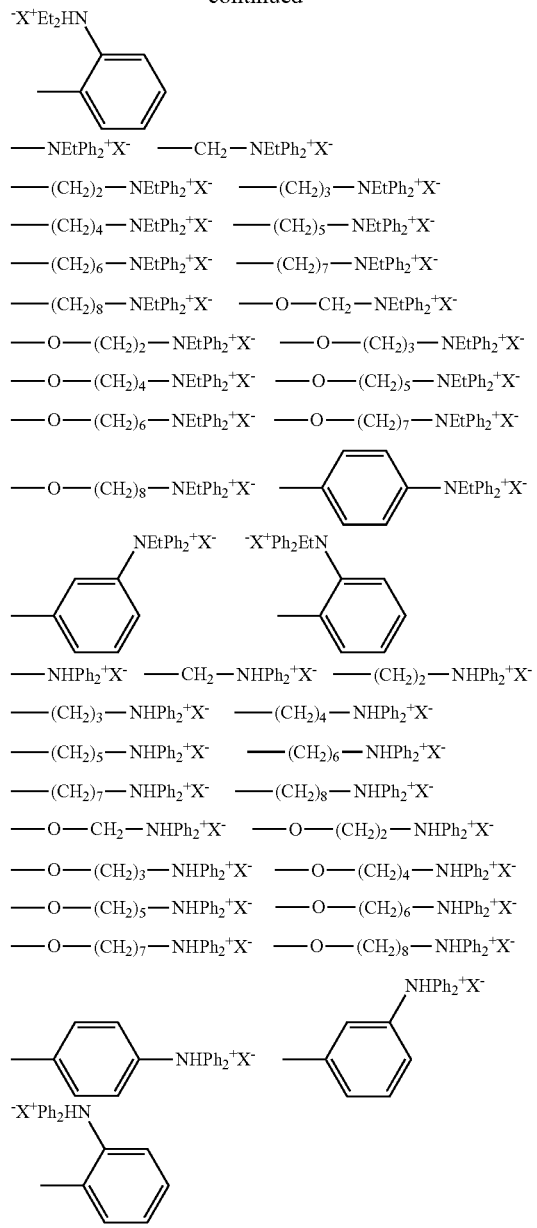

—NEtPh$_2$$^+$X$^-$  —CH$_2$—NEtPh$_2$$^+$X$^-$

—(CH$_2$)$_2$—NEtPh$_2$$^+$X$^-$  —(CH$_2$)$_3$—NEtPh$_2$$^+$X$^-$

—(CH$_2$)$_4$—NEtPh$_2$$^+$X$^-$  —(CH$_2$)$_5$—NEtPh$_2$$^+$X$^-$

—(CH$_2$)$_6$—NEtPh$_2$$^+$X$^-$  —(CH$_2$)$_7$—NEtPh$_2$$^+$X$^-$

—(CH$_2$)$_8$—NEtPh$_2$$^+$X$^-$  —O—CH$_2$—NEtPh$_2$$^+$X$^-$

—O—(CH$_2$)$_2$—NEtPh$_2$$^+$X$^-$  —O—(CH$_2$)$_3$—NEtPh$_2$$^+$X$^-$

—O—(CH$_2$)$_4$—NEtPh$_2$$^+$X$^-$  —O—(CH$_2$)$_5$—NEtPh$_2$$^+$X$^-$

—O—(CH$_2$)$_6$—NEtPh$_2$$^+$X$^-$  —O—(CH$_2$)$_7$—NEtPh$_2$$^+$X$^-$

—O—(CH$_2$)$_8$—NEtPh$_2$$^+$X$^-$

—NHPh$_2$$^+$X$^-$  —CH$_2$—NHPh$_2$$^+$X$^-$  —(CH$_2$)$_2$—NHPh$_2$$^+$X$^-$

—(CH$_2$)$_3$—NHPh$_2$$^+$X$^-$  —(CH$_2$)$_4$—NHPh$_2$$^+$X$^-$

—(CH$_2$)$_5$—NHPh$_2$$^+$X$^-$  —(CH$_2$)$_6$—NHPh$_2$$^+$X$^-$

—(CH$_2$)$_7$—NHPh$_2$$^+$X$^-$  —(CH$_2$)$_8$—NHPh$_2$$^+$X$^-$

—O—CH$_2$—NHPh$_2$$^+$X$^-$  —O—(CH$_2$)$_2$—NHPh$_2$$^+$X$^-$

—O—(CH$_2$)$_3$—NHPh$_2$$^+$X$^-$  —O—(CH$_2$)$_4$—NHPh$_2$$^+$X$^-$

—O—(CH$_2$)$_5$—NHPh$_2$$^+$X$^-$  —O—(CH$_2$)$_6$—NHPh$_2$$^+$X$^-$

—O—(CH$_2$)$_7$—NHPh$_2$$^+$X$^-$  —O—(CH$_2$)$_8$—NHPh$_2$$^+$X$^-$

Et = CH$_2$CH$_3$
Ph = C$_6$H$_5$
X = F, Cl, Br, I, BPh$_4$, CH$_3$COO, CF$_3$SO$_3$,

Group Represented by Formula (3)

In Formula (3), examples of the divalent organic group represented by Q$^3$, may include the same group as the group included with respect to the divalent organic group represented by Q$^1$ and from the viewpoint of easy synthesis of the raw material monomer, the divalent organic group of Q$^3$ is preferably a saturated divalent hydrocarbon group, a divalent arylene group, and a divalent alkyleneoxy group.

The group included as examples for the divalent organic group represented by Q$^3$ may have a substituent, and examples of the substituent may include the same substituent as the substituent included in the description with respect to Q$^1$. When the substituent is plurally present, the substituents may be the same as or different from each other.

The divalent organic group represented by Q$^3$ is preferably a group represented by —(CH$_2$)—.

n3 represents an integer of 0 or more, preferably an integer of from 0 to 20, more preferably an integer of from 0 to 8.

In Formula (3), $Y^3$ represents —CN or a group represented by any one of Formulae (4) to (12).

In Formulae (4) to (12), examples of the divalent hydrocarbon group represented by R' may include: a saturated divalent hydrocarbon group having 1 to 50 carbon atoms that may have a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; an unsaturated divalent hydrocarbon group having 2 to 50 carbon atoms that may have a substituent that includes an alkenylene group having 2 to 50 carbon atoms that may have a substituent such as an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent, and an ethynylene group; a saturated divalent cyclic hydrocarbon group having 3 to 50 carbon atoms that may have a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an arylene group having 6 to 50 carbon atoms that may have a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; and an alkyleneoxy group having 1 to 50 carbon atoms that may have a substituent such as a methyleneoxy group, an ethyleneoxy group, a propyleneoxy group, a butyleneoxy group, a pentyleneoxy group, a hexyleneoxy group, and a group in which at least one hydrogen atom in these groups is substituted with a substituent.

The substituent may be the same substituent as the substituent included in the description with respect to $Q^1$. When the substituent is plurally present, the substituents may be the same as or different from each other.

In Formulae (4) to (12), the monovalent hydrocarbon group represented by R" may be an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; and an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent. From the viewpoint of the solubility of the ionic polymer, a methyl group, an ethyl group, a phenyl group, a 1-naphthyl group, and a 2-naphthyl group are preferred. The substituent may be the same substituent as the substituent included in the description with respect to $Q^1$. When the substituent is plurally present, the substituents may be the same as or different from each other.

In Formula (5), examples of the trivalent hydrocarbon group represented by R'" may include: an alkyltriyl group having 1 to 20 carbon atoms that may have a substituent such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group, and a group in which at least one hydrogen atom in these groups is substituted with a substituent; and an aryl group having 6 to 30 carbon atoms that may have a substituent such as a 1,2,3-benzenetriyl group, a 1,2,4-benzenetriyl group, a 1,3,5-benzenetriyl group, and a group in which at least one hydrogen atom in these groups is substituted with a substituent. From the viewpoint of the solubility of the ionic polymer, a methanetriyl group, an ethanetriyl group, a 1,2,4-benzenetriyl group, and a 1,3,5-benzenetriyl group are preferred. The substituent may be the same substituent as the substituent included in the description with respect to $Q^1$. When the substituent is plurally present, the substituents may be the same as or different from each other.

In Formulae (4) to (12), $R^c$ is, from the viewpoint of the solubility of the ionic polymer, preferably a methyl group, an ethyl group, a phenyl group, a 1-naphthyl group, or a 2-naphthyl group.

In Formula (4) and Formula (5), a3 represents an integer of 1 or more, preferably an integer of from 3 to 10. In Formula (6) to Formula (12), a4 represents an integer of 0 or more. In Formula (6), a4 is preferably an integer of from 0 to 30, more preferably an integer of from 3 to 20. In Formula (7) to Formula (10), a4 is preferably an integer of from 0 to 10, more preferably an integer of from 0 to 5. In Formula (11), a4 is preferably an integer of from 0 to 20, more preferably an integer of from 3 to 20. In Formula (12), a4 is preferably an integer of from 0 to 20, more preferably an integer of from 0 to 10.

$Y^3$ is, from the viewpoint of easy synthesis of the raw material monomer, preferably —CN, a group represented by Formula (4), a group represented by Formula (6), a group represented by Formula (10), or a group represented by Formula (11), more preferably a group represented by Formula (4), a group represented by Formula (6), or a group represented by Formula (11), particularly preferably the groups below.

[Chemical Formula 13]

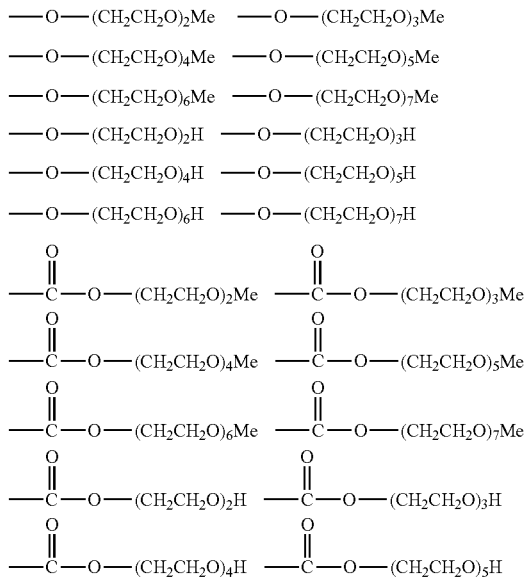

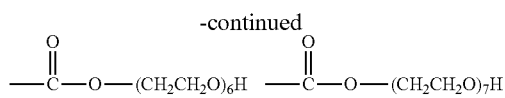

Structural Unit in Ionic Polymer

The ionic polymer used in the present invention preferably has a structural unit represented by Formula (13), a structural unit represented by Formula (15), a structural unit represented by Formula (17), or a structural unit represented by Formula (20) and more preferably is an ionic polymer having these structural units in a content of 15% by mole to 100% by mole, based on the number of moles of all structural units.

Structural Unit Represented by Formula (13)

In Formula (13), $R^1$ is a monovalent group containing a group represented by Formula (14); $Ar^1$ represents a (2+n4) valent aromatic group optionally having a substituent besides $R^1$; and n4 represents an integer of 1 or more.

The group represented by Formula (14) may be bonded to $Ar^1$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^1$ may have a substituent besides $R^1$. The substituent may be the same substituent as the substituent included in the description with respect to $Q^1$. When the substituent is plurally present, the substituents may be the same as or different from each other.

The substituent besides $R^1$ that $Ar^1$ has is, from the viewpoint of easy synthesis of the raw material monomer, preferably an alkyl group, an alkoxy group, an aryl group, an aryloxy group, a carboxyl group, or a substituted carboxyl group.

In Formula (13), n4 represents an integer of 1 or more, preferably an integer of from 1 to 4, more preferably an integer of from 1 to 3.

Examples of the (2+n4) valent aromatic group represented by $Ar^1$ in Formula (13) may include a (2+n4) valent aromatic hydrocarbon group and a (2+n4) valent aromatic heterocyclic group and among them, preferred is a (2+n4) valent aromatic group containing a carbon atom alone or a carbon atom and one or more atoms selected from the group consisting of a hydrogen atom, a nitrogen atom, and an oxygen atom. Examples of the (2+n4) valent aromatic group may include: a (2+n4) valent group remaining after eliminating (2+n4) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n4) valent group remaining after eliminating (2+n4) hydrogen atoms from a fused polycyclic aromatic ring system formed by fusing two or more rings selected from the group consisting of the above monocyclic aromatic rings; a (2+n4) valent group remaining after eliminating (2+n4) hydrogen atoms from an aromatic ring assembly formed by linking two or more aromatic rings selected from the group consisting of the above monocyclic aromatic rings and the above fused polycyclic aromatic ring systems through a single bond, an ethenylene group, or an ethynylene group; and a (2+n4) valent group remaining after eliminating (2+n4) hydrogen atoms from a crosslinkage-having polycyclic aromatic ring formed by crosslinking two aromatic rings adjacent to each other of the above fused polycyclic aromatic ring system or the above aromatic ring assembly through a divalent group such as a methylene group, an ethylene group, and a carbonyl group.

Examples of the monocyclic aromatic ring may include the rings below.

[Chemical Formula 14]

1

2

3

4

5

6

7

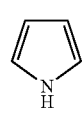

8

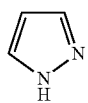
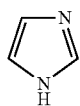
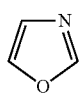
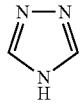
Examples of the fused polycyclic aromatic ring system may include the rings below.
[Chemical Formula 15]
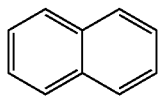
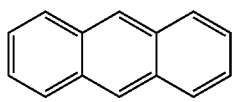
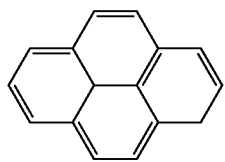
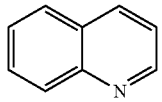
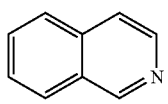
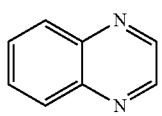
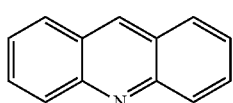
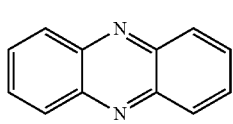
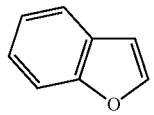
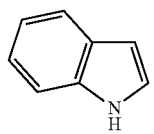
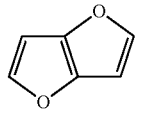
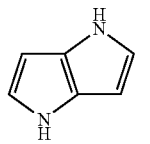
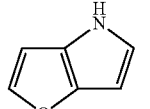
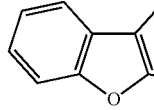
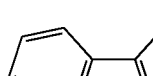
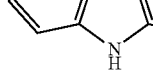
Examples of the aromatic ring assembly may include the rings below.
[Chemical Formula 16]
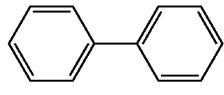
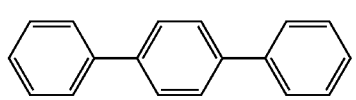
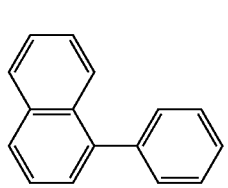

-continued

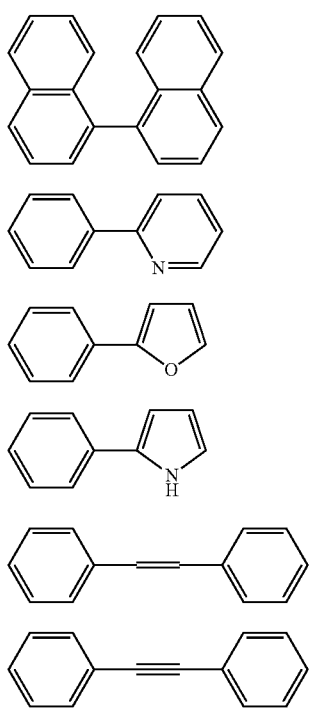

Examples of the crosslinkage-having polycyclic aromatic ring may include the rings below.

[Chemical Formula 17]

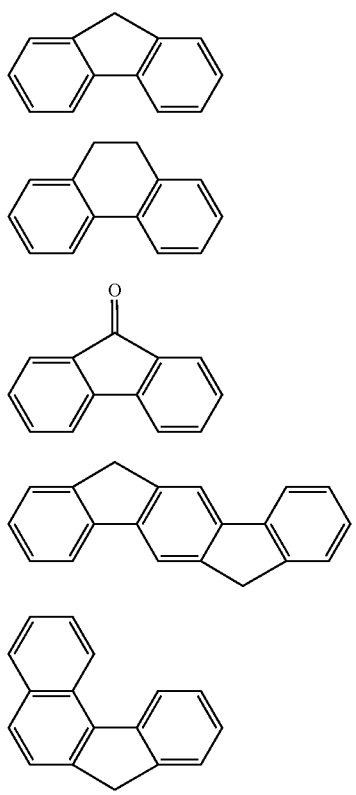

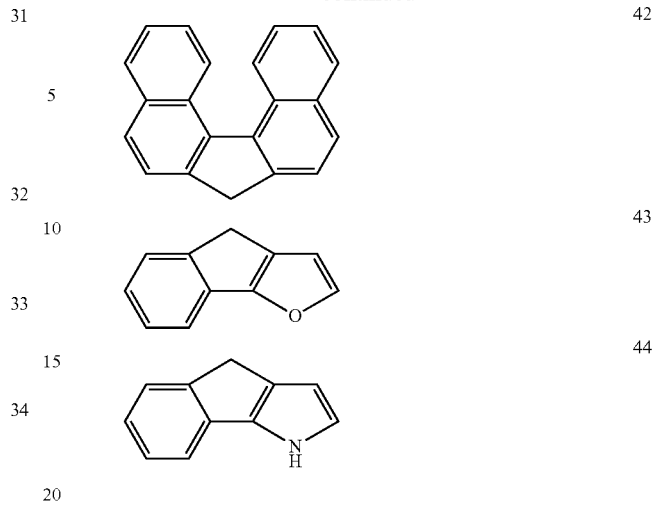

The (2+n4) valent aromatic group is, from the viewpoint of easy synthesis of the raw material monomer, preferably a group remaining after eliminating (2+n4) hydrogen atoms from a ring represented by any of Formulae 1 to 14, 26 to 29, 37 to 39, and 41, more preferably a group remaining after eliminating (2+n4) hydrogen atoms from a ring represented by any of Formulae 1 to 6, 8, 13, 26, 27, 37 and 41, further preferably a group remaining after eliminating (2+n4) hydrogen atoms from a ring represented by Formula I, Formula 37, or Formula 41.

In Formula (14), examples of the (1+m1+m2) valent organic group represented by $R^2$ may include: a group remaining after eliminating (m1+m2) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m1+m2) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m1+m2) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m1+m2) hydrogen atoms from an amino group having a substituent containing a carbon atom; and a group remaining after eliminating (m1+m2) hydrogen atoms from a silyl group having a substituent containing a carbon atom. Among them, from the viewpoint of easy synthesis of the raw material monomer, preferred are a group remaining after eliminating (m1+m2) hydrogen atoms from an alkyl group, a group remaining after eliminating (m1+m2) hydrogen atoms from an aryl group, and a group remaining after eliminating (m1+m2) hydrogen atoms from an alkoxy group.

The substituent may be the same substituent as the substituent included in the description with respect to $Q^1$. When the substituent is plurally present, the substituents may be the same as or different from each other.

Structural Unit Represented by Formula (15)

In Formula (15), $R^3$ is a monovalent group containing a group represented by Formula (16); $Ar^2$ represents a (2+n5) valent aromatic group optionally having a substituent besides $R^3$; and n5 represents an integer of 1 or more.

The group represented by Formula (16) may be bonded to $Ar^2$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^2$ may have a substituent besides $R^3$. The substituent may be the same substituent as the substituent included in the description with respect to $Q^1$. When the substituent is plurally present, the substituents may be the same as or different from each other.

The substituent besides $R^3$ that $Ar^2$ has is, from the viewpoint of easy synthesis of the raw material monomer, preferably an alkyl group, an alkoxy group, an aryl group, an aryloxy group, a carboxyl group, or a substituted carboxyl group.

In Formula (15), n5 represents an integer of 1 or more, preferably an integer of from 1 to 4, more preferably an integer of from 1 to 3.

The (2+n5) valent aromatic group represented by $Ar^2$ in Formula (15) may be a (2+n5) valent aromatic hydrocarbon group and a (2+n5) valent aromatic heterocyclic group and among them, preferred is a (2+n5) valent aromatic group containing a carbon atom alone or a carbon atom and one or more atoms selected from the group consisting of a hydrogen atom, a nitrogen atom, and an oxygen atom. Examples of the (2+n5) valent aromatic group may include: a (2+n5) valent group remaining after eliminating (2+n5) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n5) valent group remaining after eliminating (2+n5) hydrogen atoms from a fused polycyclic aromatic ring system formed by fusing two or more rings selected from the group consisting of the above monocyclic aromatic rings; a (2+n5) valent group remaining after eliminating (2+n5) hydrogen atoms from an aromatic ring assembly formed by linking two or more aromatic rings selected from the group consisting of the above monocyclic aromatic rings and the above fused polycyclic aromatic ring systems through a single bond, an ethenylene group, or an ethynylene group; and a (2+n5) valent aromatic group remaining after eliminating (2+n5) hydrogen atoms from a crosslinkage-having polycyclic aromatic ring formed by crosslinking two aromatic rings adjacent to each other of the above fused polycyclic aromatic ring system or the above aromatic ring assembly through a divalent group such as a methylene group, an ethylene group, and a carbonyl group.

Examples of the monocyclic aromatic ring may include rings represented by Formula 1 to Formula 12 included in the description with respect to the structural unit represented by Formula (13).

Examples of the fused polycyclic aromatic ring system may include rings represented by Formula 13 to Formula 27 included in the description with respect to the structural unit represented by Formula (13).

Examples of the aromatic ring assembly may include rings represented by Formula 28 to Formula 36 included in the description with respect to the structural unit represented by Formula (13).

Examples of the crosslinkage-having polycyclic aromatic ring may include rings represented by Formula 37 to Formula 44 included in the description with respect to the structural unit represented by Formula (13).

The (2+n5) valent aromatic group is, from the viewpoint of easy synthesis of the raw material monomer, preferably a group remaining after eliminating (2+n5) hydrogen atoms from a ring represented by any of Formulae 1 to 14, 26 to 29, 37 to 39, and 41, more preferably a group remaining after eliminating (2+n5) hydrogen atoms from a ring represented by any of Formula 1 to Formula 6, Formula 8, Formula 13, Formula 26, Formula 27, Formula 37, and Formula 41, further preferably a group remaining after eliminating (2+n5) hydrogen atoms from a ring represented by Formula 1, Formula 37, or Formula 41.

In Formula (16), m3 and m4 each independently represent an integer of 1 or more.

In Formula (16), examples of the (1+m3+m4) valent organic group represented by $R^4$ may include: a group remaining after eliminating (m3+m4) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m3+m4) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m3+m4) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m3+m4)

hydrogen atoms from an amino group having a substituent containing a carbon atom; and a group remaining after eliminating (m3+m4) hydrogen atoms from a silyl group having a substituent containing a carbon atom. Among them, from the viewpoint of easy synthesis of the raw material monomer, preferred are a group remaining after eliminating (m3+m4) hydrogen atoms from an alkyl group, a group remaining after eliminating (m3+m4) hydrogen atoms from an aryl group, and a group remaining after eliminating (m3+m4) hydrogen atoms from an alkoxy group.

The substituent may be the same substituent as the substituent included in the description with respect to $Q^1$. When the substituent is plurally present, the substituents may be the same as or different from each other.

Structural Unit Represented by Formula (17)

In Formula (17), $R^5$ is a monovalent group containing a group represented by Formula (18); $R^6$ is a monovalent group containing a group represented by Formula (19); $Ar^3$ represents a (2+n6+n7) valent aromatic group optionally having a substituent besides $R^5$ and $R^6$; and n6 and n7 represent independently an integer of 1 or more.

The group represented by Formula (18) and the group represented by Formula (19) may be bonded to $Ar^3$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^3$ may have a substituent besides $R^5$ and $R^6$. The substituent may be the same substituent as the substituent included in the description with respect to $Q^1$. When the substituent is plurally present, the substituents may be the same as or different from each other.

The substituent besides $R^5$ and $R^6$ that $Ar^3$ has is, from the viewpoint of easy synthesis of the raw material monomer, preferably an alkyl group, an alkoxy group, an aryl group, an aryloxy group, a carboxyl group, or a substituted carboxyl group.

In Formula (17), n6 represents an integer of 1 or more, preferably an integer of from 1 to 4, more preferably an integer of from 1 to 3.

In Formula (17), n7 represents an integer of 1 or more, preferably an integer of from 1 to 4, more preferably an integer of from 1 to 3.

Examples of the (2+n6+n7) valent aromatic group represented by $Ar^3$ in Formula (17) may include a (2+n6+n7) valent aromatic hydrocarbon group and a (2+n6+n7) valent aromatic heterocyclic group and among them, preferred is a (2+n6+n7) valent aromatic group containing a carbon atom alone or a carbon atom and one or more atoms selected from the group consisting of a hydrogen atom, a nitrogen atom, and an oxygen atom. Examples of the (2+n6+n7) valent aromatic group may include: a (2+n6+n7) valent group remaining after eliminating (2+n6+n7) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, an imidazole ring, and an oxazole ring; a (2+n6+n7) valent group remaining after eliminating (2+n6+n7) hydrogen atoms from a fused polycyclic aromatic ring system formed by fusing two or more rings selected from the group consisting of the above monocyclic aromatic rings; a (2+n6+n7) valent group remaining after eliminating (2+n6+n7) hydrogen atoms from an aromatic ring assembly formed by linking two or more aromatic rings selected from the group consisting of the above monocyclic aromatic rings and the above fused polycyclic aromatic ring systems through a single bond, an ethenylene group, or an ethynylene group; and a (2+n6+n7) valent group remaining after eliminating (2+n6+n7) hydrogen atoms from a crosslinkage-having polycyclic aromatic ring formed by crosslinking two aromatic rings adjacent to each other of the above fused polycyclic aromatic ring system or the above aromatic ring assembly through a divalent group such as a methylene group, an ethylene group, and a carbonyl group.

Examples of the monocyclic aromatic ring may include rings represented by Formula 1 to Formula 5 and Formula 7 to Formula 10 included in the description with respect to the structural unit represented by Formula (13).

Examples of the fused polycyclic aromatic ring systems may include rings represented by Formula 13 to Formula 27 included in the description with respect to the structural unit represented by Formula (13).

Examples of the aromatic ring assembly may include rings represented by Formula 28 to Formula 36 included in the description with respect to the structural unit represented by Formula (13).

Examples of the crosslinkage-having polycyclic aromatic ring may include rings represented by Formula 37 to Formula 44 included in the description with respect to the structural unit represented by Formula (13).

The (2+n6+n7) valent aromatic group is, from the viewpoint of easy synthesis of the raw material monomer, preferably a group remaining after eliminating (2+n6+n7) hydrogen atoms from a ring represented by any of Formula I to Formula 5, Formula 7 to Formula 10, Formula 13, Formula 14, Formula 26 to Formula 29, Formula 37 to Formula 39, and Formula 41, more preferably a group remaining after eliminating (2+n6+n7) hydrogen atoms from a ring represented by Formula I, Formula 37, or Formula 41, further preferably a group remaining after eliminating (2+n6+n7) hydrogen atoms from a ring represented by Formula I, Formula 38, or Formula 42.

In Formula (18), $R^7$ represents a single bond or a (1+m5) valent organic group, preferably a (1+m5) valent organic group.

In Formula (18), examples of the (1+m5) valent organic group represented by $R^7$ may include: a group remaining after eliminating m5 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m5 hydrogen atoms from an aryl group having 6 to 30 carbon atoms that may have a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after eliminating m5 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m5 hydrogen atoms from an amino group having a substituent containing a carbon atom; and a group remaining after eliminating m5 hydrogen atoms from a silyl group having a substituent containing a carbon atom. Among them, from the viewpoint of easy synthesis of the raw material monomer, preferred are a group remaining after eliminating m5 hydrogen atoms from an alkyl group, a group remaining after eliminating m5 hydrogen atoms from an aryl group, and a group remaining after eliminating m5 hydrogen atoms from an alkoxy group.

The substituent may be the same substituent as the substituent included in the description with respect to $Q^1$. When the substituent is plurally present, the substituents may be the same as or different from each other.

In Formula (18), m5 represents an integer of 1 or more, provided that when $R^7$ is a single bond, m5 represents 1.

In Formula (19), $R^8$ represents a single bond or a (1+m6) valent organic group, preferably a (1+m6) organic group.

In Formula (19), examples of the (1+m6) valent organic group represented by $R^8$ may include: a group remaining after eliminating m6 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m6 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after removing m6 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m6 hydrogen atoms from an amino group having a substituent containing a carbon atom; and a group remaining after eliminating m6 hydrogen atoms from a silyl group having a substituent containing a carbon atom. Among them, from the viewpoint of easy synthesis of the raw material monomer, preferred are a group remaining after eliminating m6 hydrogen atoms from an alkyl group, a group remaining after eliminating m6 hydrogen atoms from an aryl group, and a group remaining after eliminating m6 hydrogen atoms from an alkoxy group.

The substituent may be the same substituent as the substituent included in the description with respect to $Q^1$. When the substituent is plurally present, the substituents may be the same as or different from each other.

In Formula (19), m6 represents an integer of 1 or more, provided that when $R^8$ is a single bond, m6 represents 1.

Structural Unit Represented by Formula (20)

In Formula (20), $R^9$ is a monovalent group containing a group represented by Formula (21); $R^{10}$ is a monovalent group containing a group represented by Formula (22); $Ar^4$ represents a (2+n8+n9) valent aromatic group optionally having a substituent besides $R^9$ and $R^{10}$; and n8 and n9 each independently represent an integer of 1 or more.

The group represented by Formula (21) and the group represented by Formula (22) may be bonded to $Ar^4$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^4$ may have a substituent besides $R^9$ and $R^{10}$. The substituent may be the same substituent as the substituent included in the description with respect to $Q^1$. When the substituent is plurally present, the substituents may be the same as or different from each other.

The substituent besides $R^9$ and $R^{10}$ that $Ar^4$ has is, from the viewpoint of easy synthesis of the raw material monomer, preferably an alkyl group, an alkoxy group, an aryl group, an aryloxy group, a carboxyl group, or a substituted carboxyl group.

In Formula (20), n8 represents an integer of 1 or more, preferably an integer of from 1 to 4, more preferably an integer of from 1 to 3.

In Formula (20), n9 represents an integer of 1 or more, preferably an integer of from 1 to 4, more preferably an integer of from 1 to 3.

Examples of the (2+n8+n9) valent aromatic group represented by $Ar^4$ in Formula (20) may include a (2+n8+n9) valent aromatic hydrocarbon group and a (2+n8+n9) valent aromatic heterocyclic group and among them, preferred is a (2+n8+n9) valent aromatic group containing a carbon atom alone or a carbon atom and one or more atoms selected from the group consisting of a hydrogen atom, a nitrogen atom, and an oxygen atom. Examples of the (2+n8+n9) valent aromatic group may include: a (2+n8+n9) valent group remaining after eliminating (2+n8+n9) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, and an imidazole ring; a (2+n8+n9) valent group remaining after eliminating (2+n8+n9) hydrogen atoms from a fused polycyclic aromatic ring system formed by fusing two or more rings selected from the group consisting of the above monocyclic aromatic rings; a (2+n8+n9) valent group remaining after eliminating (2+n8+n9) hydrogen atoms from an aromatic ring assembly formed by linking two or more aromatic rings selected from the group consisting of the above monocyclic aromatic rings and the above fused polycyclic aromatic ring systems through a single bond, an ethenylene group, or an ethynylene group; and a (2+n8+n9) valent group remaining after eliminating (2+n8+n9) hydrogen atoms from a crosslinkage-having polycyclic aromatic ring formed by crosslinking two aromatic rings adjacent to each other of the above fused polycyclic aromatic ring system or the above aromatic ring assembly through a divalent group such as a methylene group, an ethylene group, and a carbonyl group.

Examples of the monocyclic aromatic ring may include rings represented by Formula 1 to Formula 5 and Formula 7 to Formula 10 shown as examples in the description with respect to the structural unit represented by Formula (13).

Examples of the fused polycyclic aromatic ring system may include rings represented by Formula 13 to Formula 27 shown as examples in the description with respect to the structural unit represented by Formula (13).

Examples of the aromatic ring assembly may include rings represented by Formula 28 to Formula 36 shown as examples in the description with respect to the structural unit represented by Formula (13).

Examples of the crosslinkage-having polycyclic aromatic ring may include rings represented by Formula 37 to Formula 44 shown as examples in the description with respect to the structural unit represented by Formula (13).

The (2+n8+n9) valent aromatic group is, from the viewpoint of easy synthesis of the raw material monomer, preferably a group remaining after eliminating (2+n8+n9) hydrogen atoms from a ring represented by any of Formula 1 to Formula 5, Formula 7 to Formula 10, Formula 13, Formula 14, Formula 26 to Formula 29, Formula 37 to Formula 39, and Formula 41, more preferably a group remaining after eliminating (2+n8+n9) hydrogen atoms from a ring represented by any of Formula I to Formula 6, Formula 8, Formula 14, Formula 27, Formula 28, Formula 38, and Formula 42, further preferably a group remaining after eliminating (2+n8+n9) hydrogen atoms from a ring represented by Formula I, Formula 37, or Formula 41.

In Formula (21), $R^{11}$ represents a single bond or a (1+m7) valent organic group, preferably a (1+m7) valent organic group.

In Formula (21), examples of the (1+m7) valent organic group represented by $R^{11}$ may include: a group remaining after eliminating m7 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m7 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating m7 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m7 hydrogen atoms from an amino group having a substituent containing a carbon atom; and a group remaining after eliminating m7 hydrogen atoms from a silyl group having a substituent containing a carbon atom. Among them, from the viewpoint of easy synthesis of the raw material monomer, preferred are a group remaining after eliminating m7 hydrogen atoms from an alkyl group, a group remaining after eliminating m7 hydrogen atoms from an aryl group, and a group remaining after eliminating m7 hydrogen atoms from an alkoxy group.

Examples of the substituent may include the same substituent as the substituent included in the description with respect to $Q^1$. When the substituent is plurally present, the substituents may be the same as or different from each other.

In Formula (21), m7 represents an integer of 1 or more, provided that when $R^{11}$ is a single bond, m7 represents 1.

In Formula (22), $R^{12}$ represents a single bond or a (1+m8) valent organic group, preferably a (1+m8) valent organic group.

In Formula (22), examples of the (1+m8) valent organic group represented by $R^{12}$ may include: a group remaining after eliminating m8 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m8 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating m8 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m8 hydrogen atoms from an amino group having a substituent containing a carbon atom; and a group remaining after eliminating m8 hydrogen atoms from a silyl group having a substituent containing a carbon atom. Among them, from the viewpoint of easy synthesis of the raw material monomer, preferred are a group remaining after eliminating m8 hydrogen atoms from an alkyl group, a group remaining after eliminating m8 hydrogen atoms from an aryl group, and a group remaining after eliminating m8 hydrogen atoms from an alkoxy group.

The substituent may be the same substituent as the substituent included in the description with respect to $Q^1$. When the substituent is plurally present, the substituents may be the same as or different from each other.

In Formula (22), m8 represents an integer of 1 or more, provided that when $R^{12}$ is a single bond, m8 represents 1.

Example of structural unit represented by Formula (13)

The structural unit represented by Formula (13) is, from the viewpoint of the electron transport characteristic of the obtained ionic polymer, preferably a structural unit represented by Formula (23) and a structural unit represented by Formula (24), more preferably a structural unit represented by Formula (24).

[Chemical Formula 18]

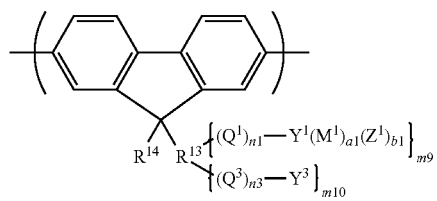

(23)

(In Formula (23), $R^{13}$ represents a (1+m9+m10) valent organic group; $R^{14}$ represents a monovalent organic group; $Q^1$, $Q^3$, $Y^1$, $M^1$, $Z^1$, $Y^3$, n1, a1, b1, and n3 represent the same meanings as described above; m9 and m10 each independently represent an integer of 1 or more; and when each of $Q^1$, $Q^3$, $Y^1$, $M^1$, $Z^1$, $Y^3$, each of n1, a1, b1, and n3 is plurally present, $Q^1$s, $Q^3$s, $Y^1$s, $M^1$s, $Z^1$s, $Y^3$s, n1s, a1s, b1s, or n3s may be the same as or different from each other.)

In Formula (23), the (1+m9+m10) valent organic group represented by $R^{13}$ include: a group remaining after eliminating (m9+m10) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m9+m10) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m9+m10) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m9+m10) hydrogen atoms from an amino group having a substituent containing a carbon atom; and a group remaining after eliminating (m9+m10) hydrogen atoms from a silyl group having a substituent containing a carbon atom. Among them, from the viewpoint of easy synthesis of the raw material monomer, preferred are a group remaining after eliminating (m9+m10) hydrogen atoms from an alkyl group, a group remaining after eliminating (m9+m10) hydrogen atoms from an aryl group, and a group remaining after eliminating (m9+m10) hydrogen atoms from an alkoxy group.

In Formula (23), examples of the monovalent organic group represented by $R^{14}$ may include: a group remaining after eliminating one hydrogen atom from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating one hydrogen atom from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating one hydrogen atom from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating one hydrogen atom from an amino group having a substituent containing a carbon atom; and a group remaining after eliminating one hydrogen atom from a silyl group having a substituent containing a carbon atom. Among them, from the viewpoint of easy synthesis of the raw material monomer, preferred are a group remaining after eliminating one hydrogen atom from an alkyl group, a group remaining after eliminating one hydrogen atom from an aryl group, and a group remaining after eliminating one hydrogen atom from an alkoxy group.

Examples of the structural unit represented by Formula (23) may include the structural units below.

[Chemical Formula 19]

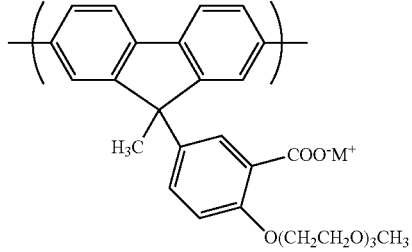

M = Li, Na, K, Cs, N(CH$_3$)$_4$

41
-continued
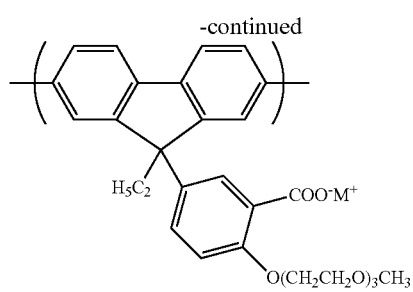
M = Li, Na, K, Cs, N(CH$_3$)$_4$
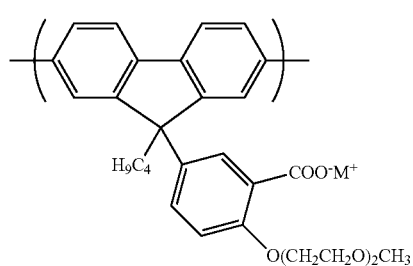
M = Li, Na, K, Cs, N(CH$_3$)$_4$
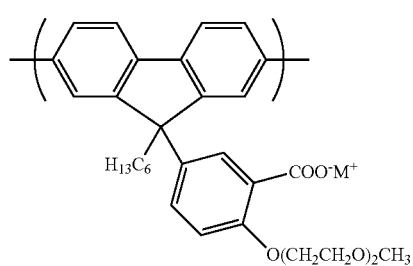
M = Li, Na, K, Cs, N(CH$_3$)$_4$
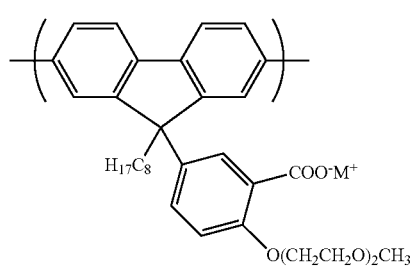
M = Li, Na, K, Cs, N(CH$_3$)$_4$
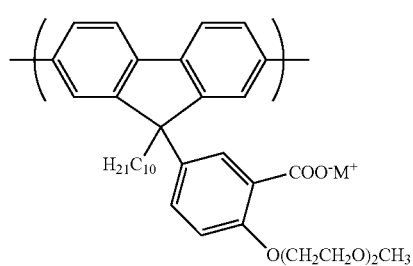
M = Li, Na, K, Cs, N(CH$_3$)$_4$
42
-continued
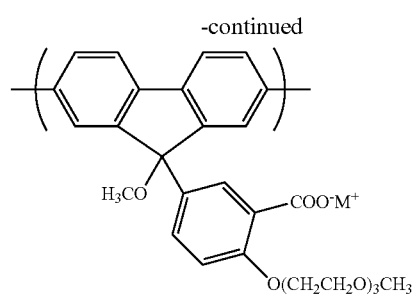
M = Li, Na, K, Cs, N(CH$_3$)$_4$
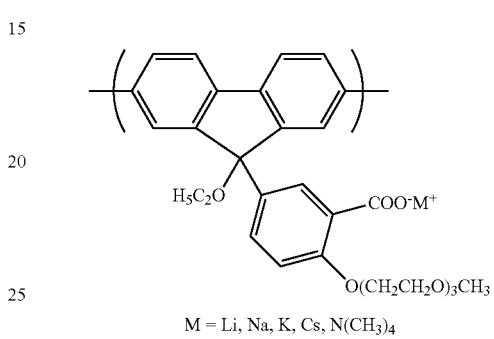
M = Li, Na, K, Cs, N(CH$_3$)$_4$
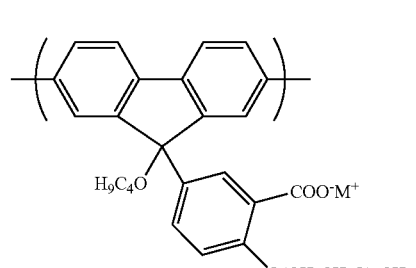
M = Li, Na, K, Cs, N(CH$_3$)$_4$
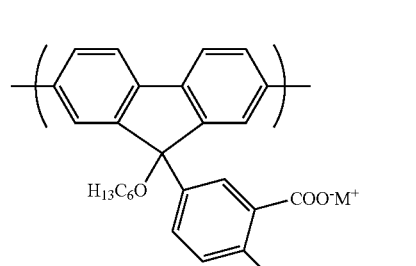
M = Li, Na, K, Cs, N(CH$_3$)$_4$
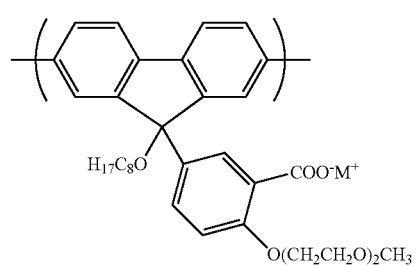
M = Li, Na, K, Cs, N(CH$_3$)$_4$

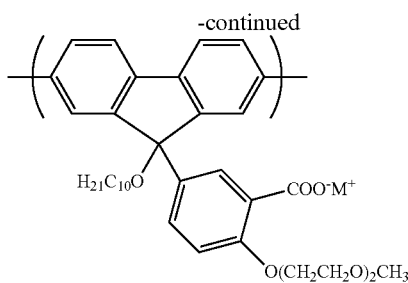

M = Li, Na, K, Cs, N(CH₃)₄

[Chemical Formula 20]

(24)

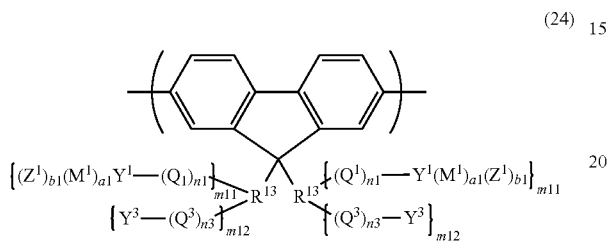

(In Formula (24), $R^{13}$ represents a (1+m11+m12) valent organic group; $Q^1$, $Q^3$, $Y^1$, $M^1$, $Z^1$, $Y^3$, n1, a1, b1, and n3 represent the same meanings as described above; m11 and m12 represent independently an integer of 1 or more; and when each of $R^{13}$, m11, m12, $Q^1$, $Q^3$, $Y^1$, $M^1$, $Z^1$, n1, a1, b1, and n3 is plurally present, $R^{13}$s, m1s, m12s, $Q^1$s, $Q^3$s, $Y^1$s, $M^1$s, $Z^1$s, $Y^3$s, n1s, a1s, b1s, or n3s may be the same as or different from each other.)

In Formula (24), examples of the (1+m11+m12) valent organic group represented by $R^{13}$ may include: a group remaining after eliminating (m11+m12) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m11+m12) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m11+m12) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m11+m12) hydrogen atoms from an amino group having a substituent containing a carbon atom; and a group remaining after eliminating (m11+m12) hydrogen atoms from a silyl group having a substituent containing a carbon atom. Among them, from the viewpoint of easy synthesis of the raw material monomer, preferred are a group remaining after eliminating (m11+m12) hydrogen atoms from an alkyl group, a group remaining after eliminating (m11+m12) hydrogen atoms from an aryl group, and a group remaining after eliminating (m11+m12) hydrogen atoms from an alkoxy group.

Examples of the structural unit represented by Formula (24) may include the structural units below.

[Chemical Formula 21]

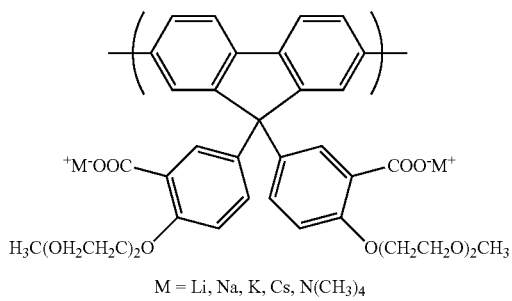

M = Li, Na, K, Cs, N(CH₃)₄

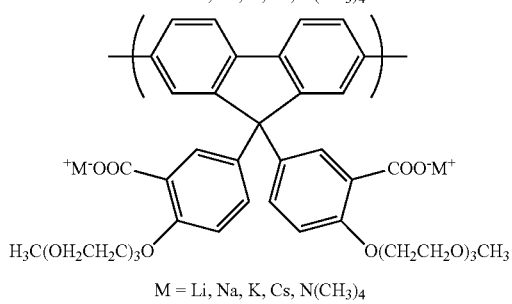

M = Li, Na, K, Cs, N(CH₃)₄

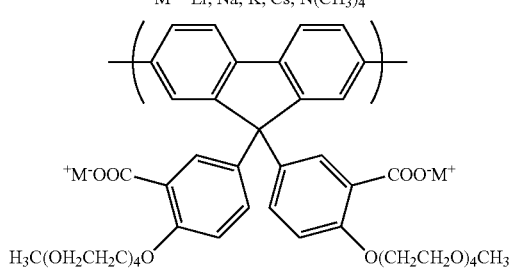

M = Li, Na, K, Cs, N(CH₃)₄

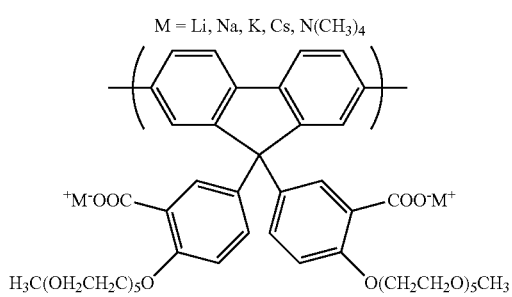

M = Li, Na, K, Cs, N(CH₃)₄

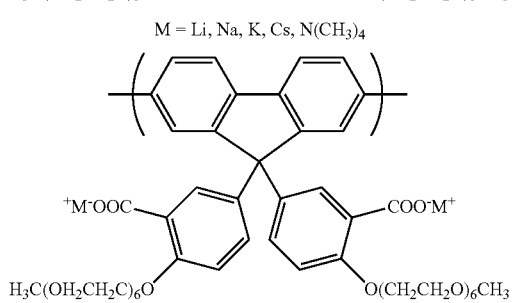

M = Li, Na, K, Cs, N(CH₃)₄

-continued
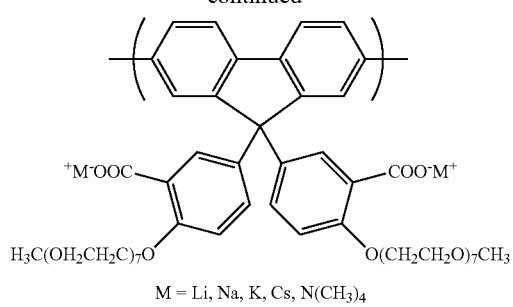
M = Li, Na, K, Cs, N(CH₃)₄
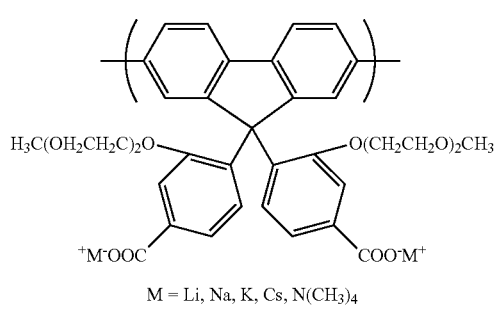
M = Li, Na, K, Cs, N(CH₃)₄
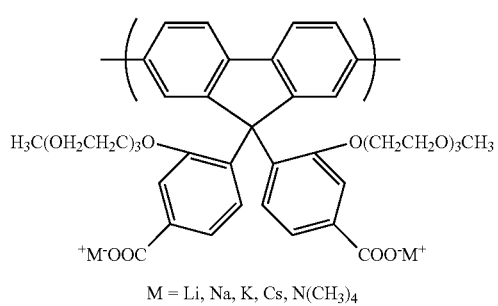
M = Li, Na, K, Cs, N(CH₃)₄
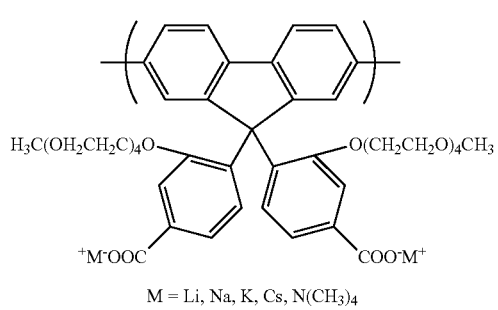
M = Li, Na, K, Cs, N(CH₃)₄
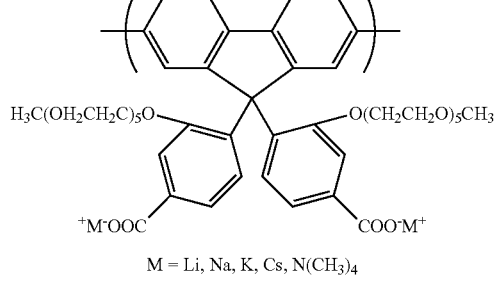
M = Li, Na, K, Cs, N(CH₃)₄
-continued
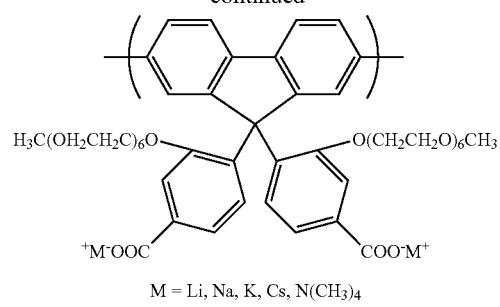
M = Li, Na, K, Cs, N(CH₃)₄
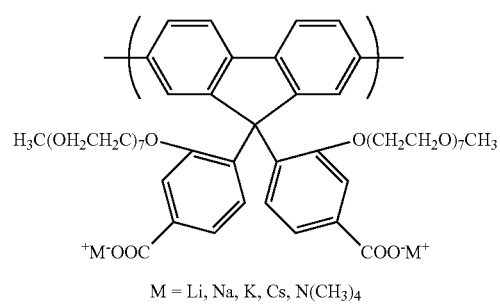
M = Li, Na, K, Cs, N(CH₃)₄
[Chemical Formula 22]
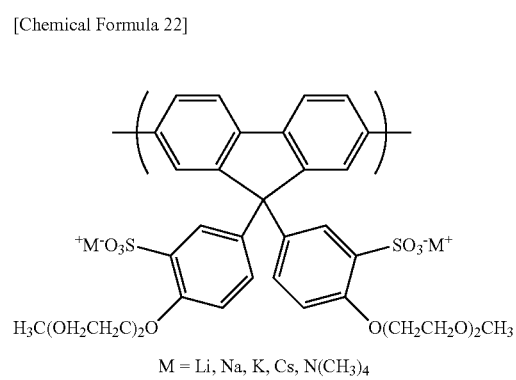
M = Li, Na, K, Cs, N(CH₃)₄
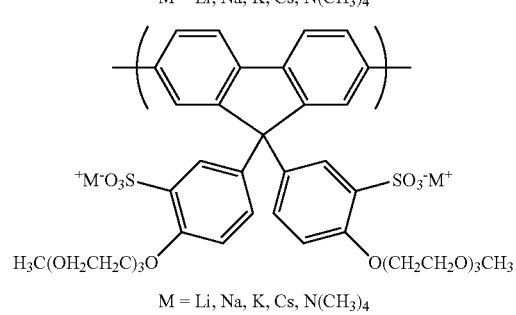
M = Li, Na, K, Cs, N(CH₃)₄
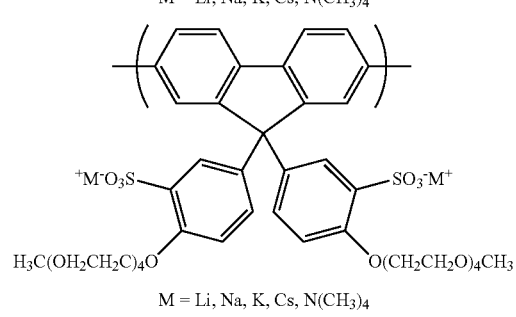
M = Li, Na, K, Cs, N(CH₃)₄

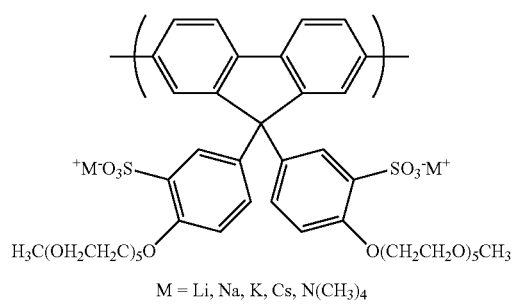
M = Li, Na, K, Cs, N(CH$_3$)$_4$
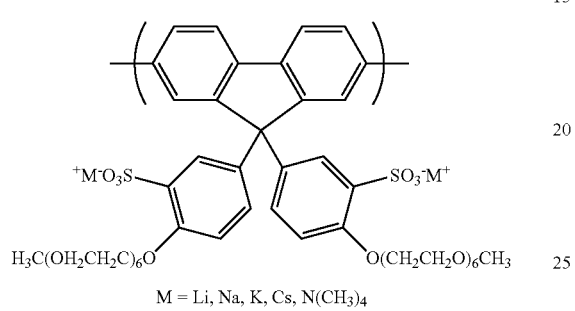
M = Li, Na, K, Cs, N(CH$_3$)$_4$
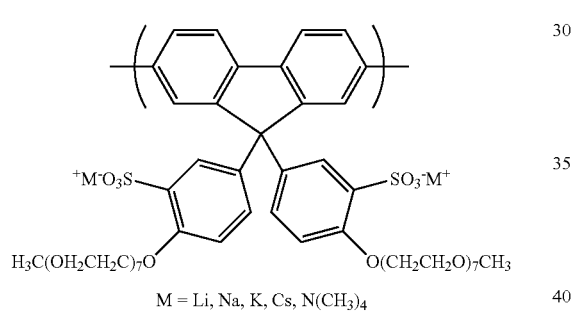
M = Li, Na, K, Cs, N(CH$_3$)$_4$
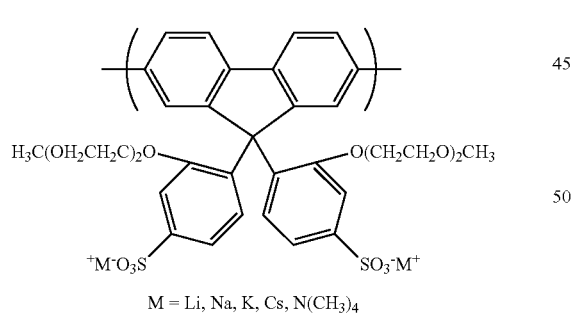
M = Li, Na, K, Cs, N(CH$_3$)$_4$
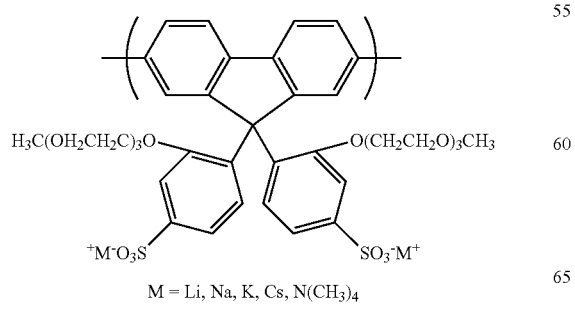
M = Li, Na, K, Cs, N(CH$_3$)$_4$
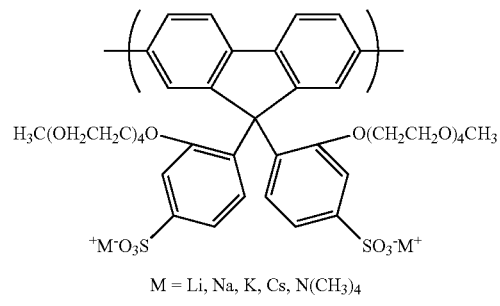
M = Li, Na, K, Cs, N(CH$_3$)$_4$
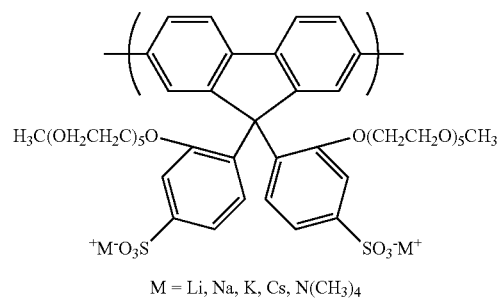
M = Li, Na, K, Cs, N(CH$_3$)$_4$
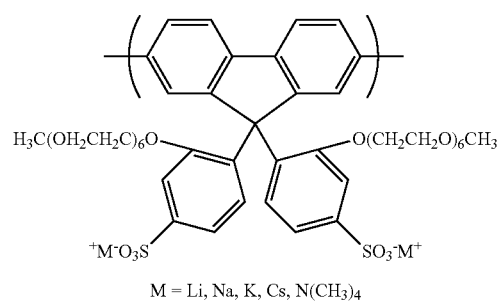
M = Li, Na, K, Cs, N(CH$_3$)$_4$
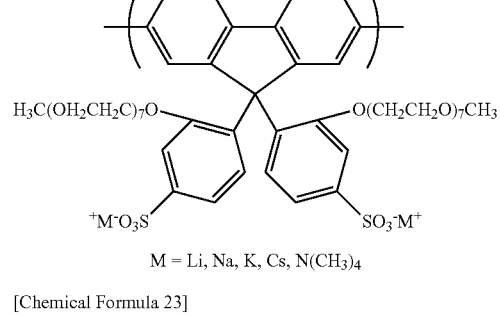
M = Li, Na, K, Cs, N(CH$_3$)$_4$
[Chemical Formula 23]
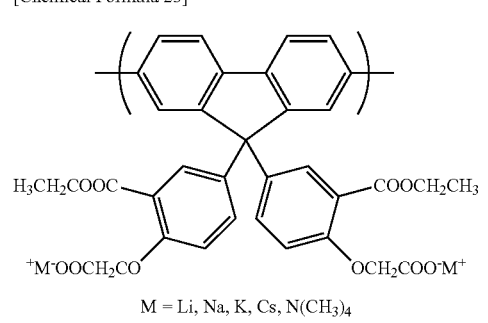
M = Li, Na, K, Cs, N(CH$_3$)$_4$ 49
-continued
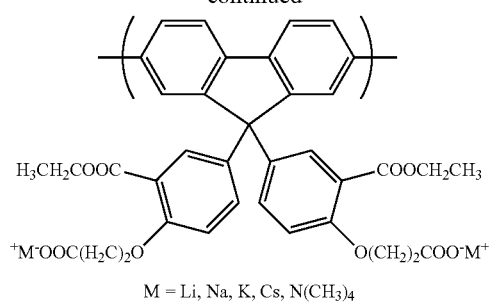
M = Li, Na, K, Cs, N(CH$_3$)$_4$
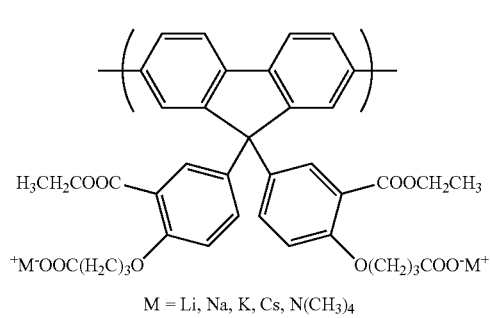
M = Li, Na, K, Cs, N(CH$_3$)$_4$
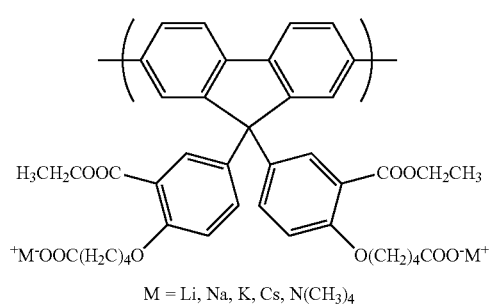
M = Li, Na, K, Cs, N(CH$_3$)$_4$
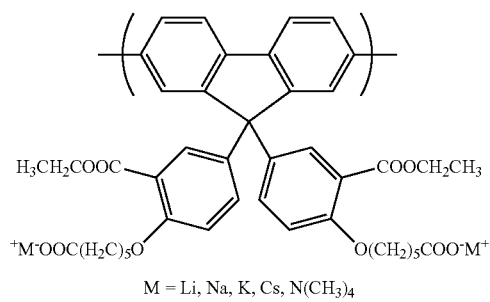
M = Li, Na, K, Cs, N(CH$_3$)$_4$
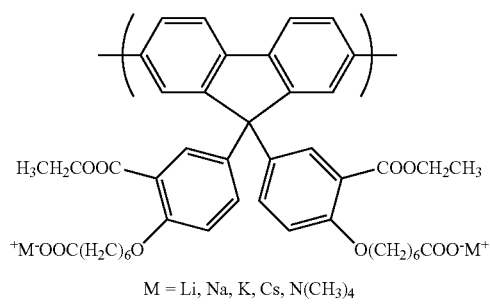
M = Li, Na, K, Cs, N(CH$_3$)$_4$
50
-continued
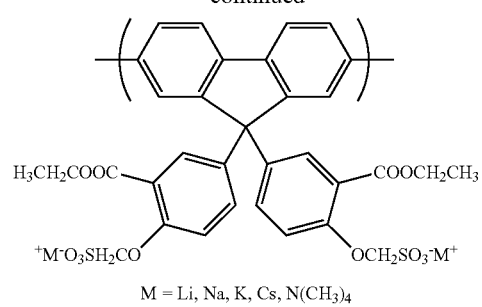
M = Li, Na, K, Cs, N(CH$_3$)$_4$
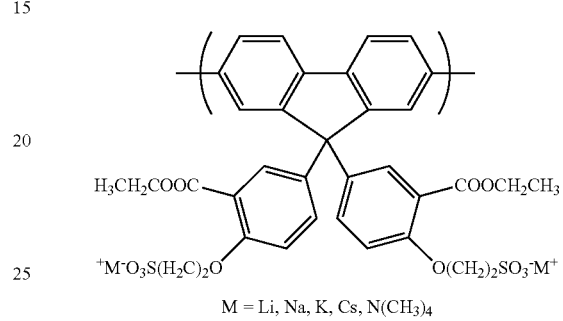
M = Li, Na, K, Cs, N(CH$_3$)$_4$
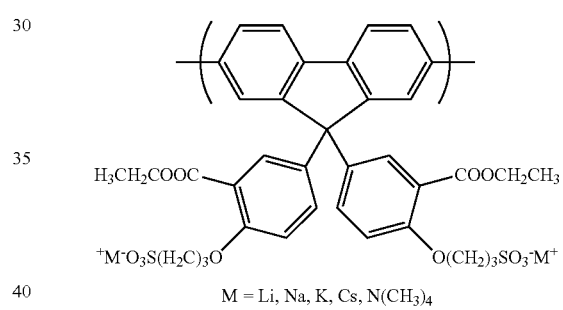
M = Li, Na, K, Cs, N(CH$_3$)$_4$
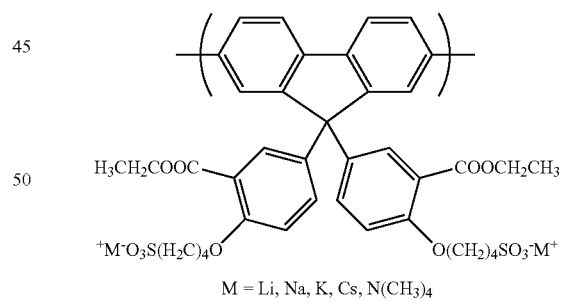
M = Li, Na, K, Cs, N(CH$_3$)$_4$
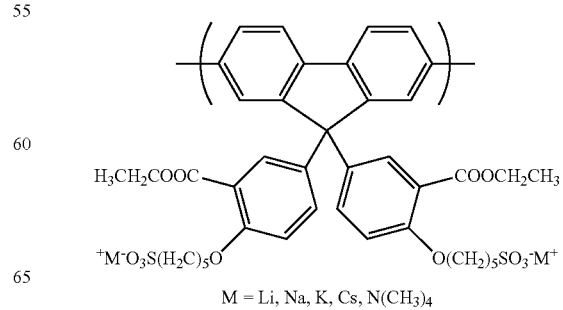
M = Li, Na, K, Cs, N(CH$_3$)$_4$

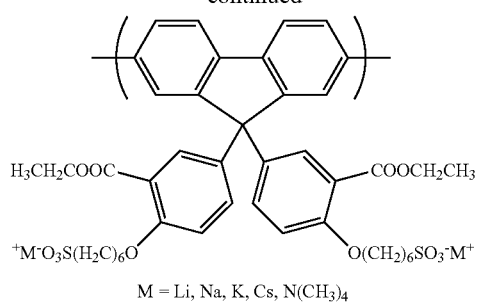
M = Li, Na, K, Cs, N(CH₃)₄
[Chemical Formula 24]
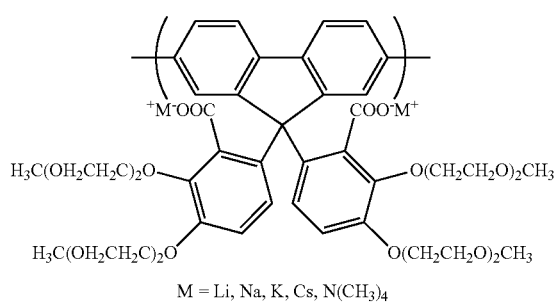
M = Li, Na, K, Cs, N(CH₃)₄
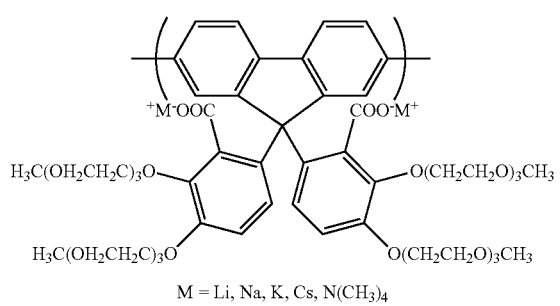
M = Li, Na, K, Cs, N(CH₃)₄
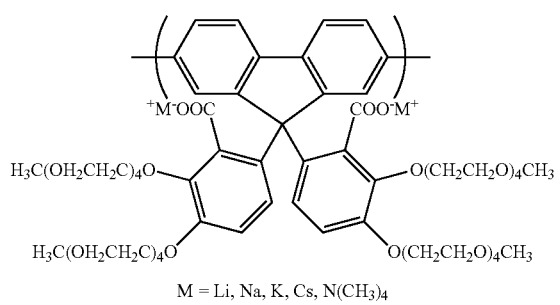
M = Li, Na, K, Cs, N(CH₃)₄
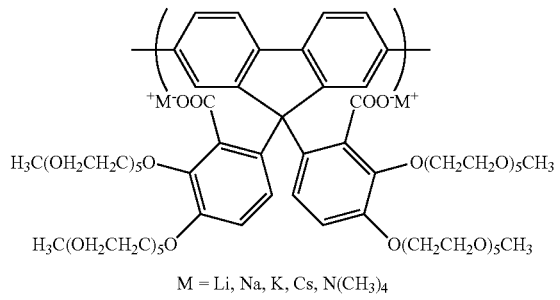
M = Li, Na, K, Cs, N(CH₃)₄
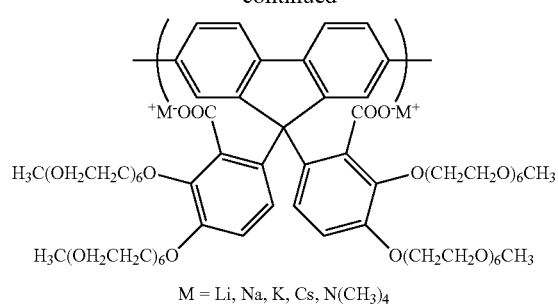
M = Li, Na, K, Cs, N(CH₃)₄
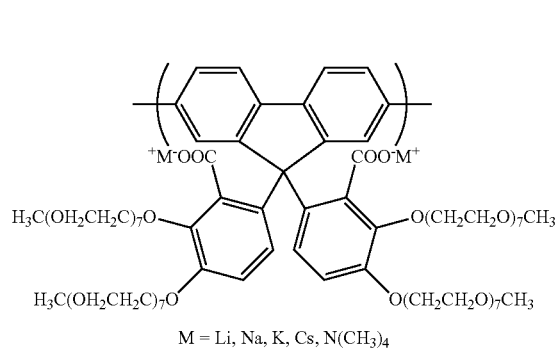
M = Li, Na, K, Cs, N(CH₃)₄
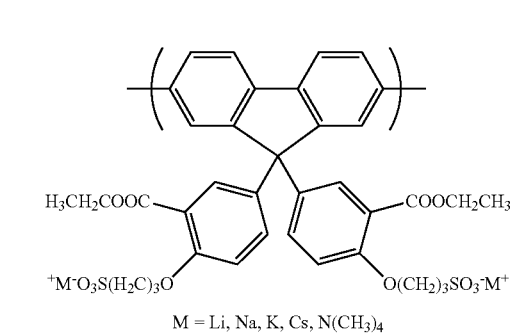
M = Li, Na, K, Cs, N(CH₃)₄
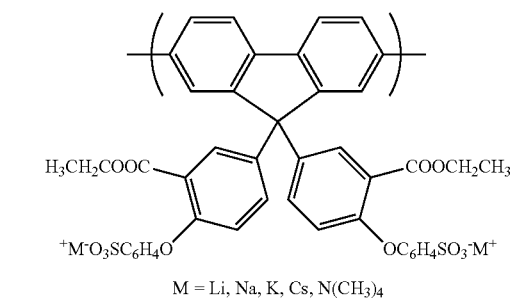
M = Li, Na, K, Cs, N(CH₃)₄
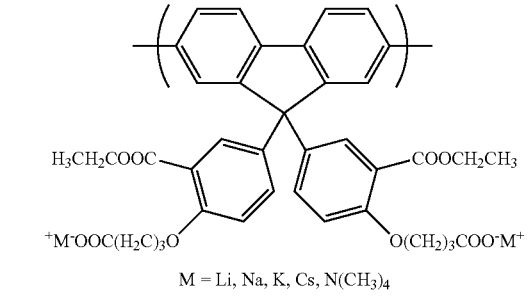
M = Li, Na, K, Cs, N(CH₃)₄

-continued

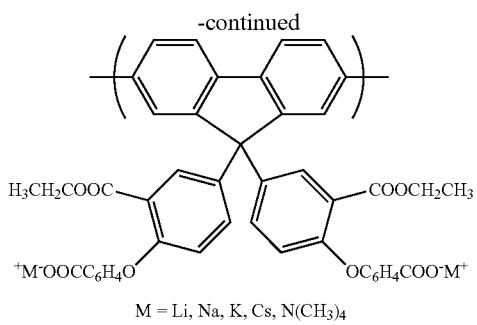

M = Li, Na, K, Cs, N(CH$_3$)$_4$

The structural unit represented by Formula (13) is, from the viewpoint of the durability of the obtained ionic polymer, preferably a structural unit represented by Formula (25).

[Chemical Formula 25]

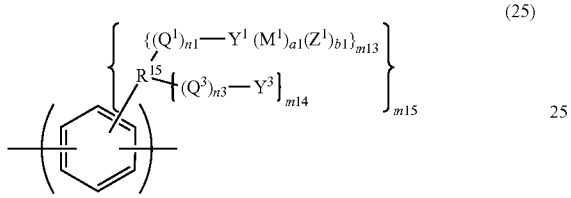

(In Formula (25), R$^{15}$ represents a (1+m13+m14) valent organic group; Q$^1$, Q$^3$, Y$^1$, M$^1$, Z$^1$, Y$^3$, n1, a1, b1, and n3 represent the same meanings as described above; m13, m14, and m15 each independently represent an integer of 1 or more; and when each of R$^{15}$, m13, m14, Q$^1$, Q$^3$, Y$^1$, M$^1$, Z$^1$, Y$^3$, n1, a1, b1, and n3 is plurally present, R$^{15}$s, m13s, m14s, Q$^1$s, Q$^3$s, Y$^1$s, M$^1$s, Z$^1$s, Y$^3$s, n1s, a1s, b1s, or n3s may be the same as or different from each other.)

In Formula (25), examples of the (1+m13+m14) valent organic group represented by R$^{15}$ may include: a group remaining after eliminating (m13+m14) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m13+m14) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m13+m14) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m13+m14) hydrogen atoms from an amino group having a substituent containing a carbon atom; and a group remaining after eliminating (m13+m14) hydrogen atoms from a silyl group having a substituent containing a carbon atom. Among them, from the viewpoint of easy synthesis of the raw material monomer, preferred are a group remaining after eliminating (m13+m14) hydrogen atoms from an alkyl group, a group remaining after eliminating (m13+m14) hydrogen atoms from an aryl group, and a group remaining after eliminating (m13+m14) hydrogen atoms from an alkoxy group.

The structural unit represented by Formula (25) may be the structural units below.

[Chemical Formula 26]

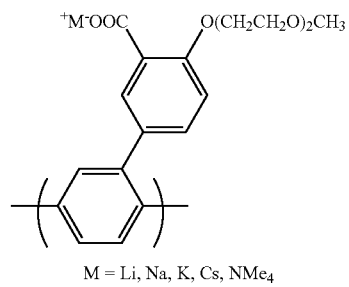

M = Li, Na, K, Cs, NMe$_4$

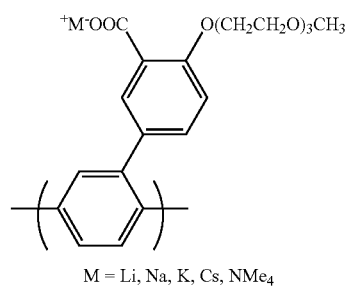

M = Li, Na, K, Cs, NMe$_4$

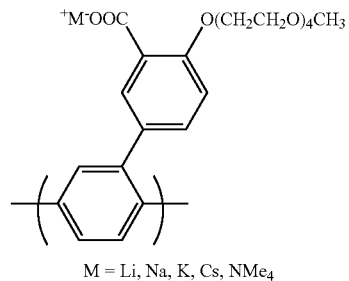

M = Li, Na, K, Cs, NMe$_4$

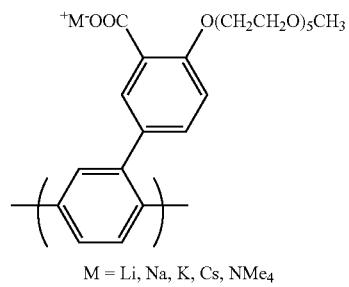

M = Li, Na, K, Cs, NMe$_4$

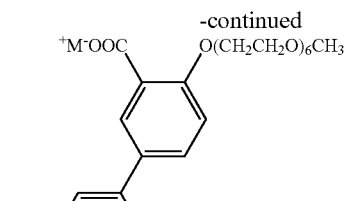

M = Li, Na, K, Cs, NMe₄

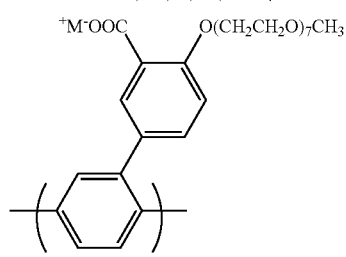

M = Li, Na, K, Cs, NMe₄

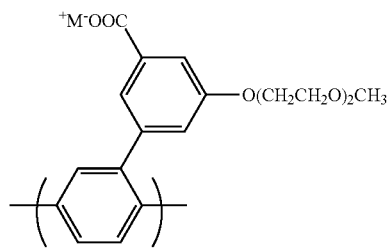

M = Li, Na, K, Cs, NMe₄

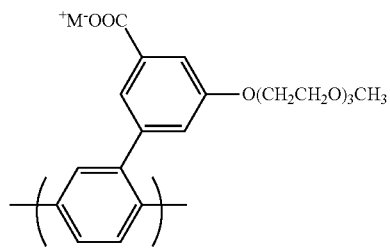

M = Li, Na, K, Cs, NMe₄

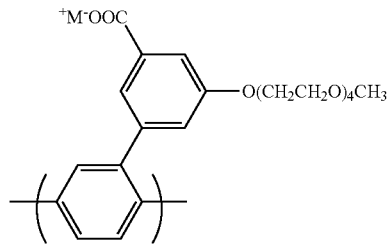

M = Li, Na, K, Cs, NMe₄

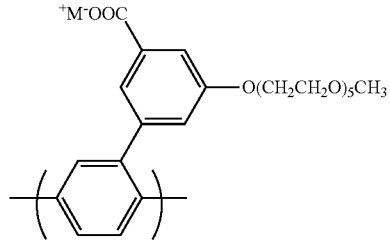

M = Li, Na, K, Cs, NMe₄

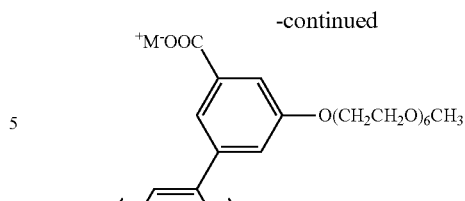

M = Li, Na, K, Cs, NMe₄

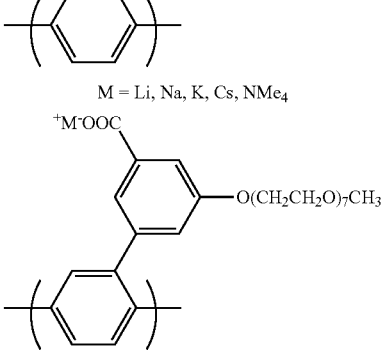

M = Li, Na, K, Cs, NMe₄

Example of structural unit represented by Formula (15)

The structural unit represented by Formula (15) is, from the viewpoint of the electron transport characteristics of the obtained ionic polymer, preferably a structural unit represented by Formula (26) and a structural unit represented by Formula (27), more preferably a structural unit represented by Formula (27).

[Chemical Formula 27]

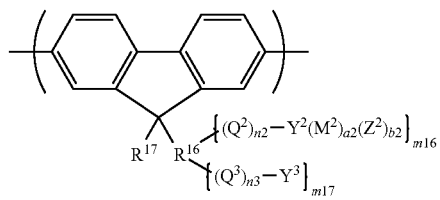

(26)

(In Formula (26), $R^{16}$ represents a (1+m16+m17) valent organic group; $R^{17}$ represents a monovalent organic group; $Q^2$, $Q^3$, $Y^2$, $M^2$, $Z^2$, $Y^3$, n2, a2, b2, and n3 represent the same meanings as described above; m16 and m17 represent each independently an integer of 1 or more; and when each of $Q^2$, $Q^3$, $Y^2$, $M^2$, $Z^2$, $Y^3$, n2, a2, b2, and n3 is plurally present, $Q^2$s, $Q^3$s, $Y^2$s, $M^2$s, $Z^2$s, $Y^3$s, n2s, a2s, b2s, or n3s may be the same as or different from each other.)

In Formula (26), examples of the (1+m16+m17) valent organic group represented by $R^{16}$ may include: a group remaining after eliminating (m16+m17) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m16+m17) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m16+m17) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m16+m17) hydrogen atoms from an amino group having a substituent containing a carbon atom; and a group remaining after eliminating (m16+m17) hydrogen atoms from a silyl group having a substituent containing a carbon atom. Among them, from the viewpoint of easy synthesis of the raw material monomer, preferred are a group remaining after eliminating (m16+m17) hydrogen atoms from an alkyl group, a group remaining after eliminating (m16+m17) hydrogen atoms from an aryl group, and a group remaining after eliminating (m16+m17) hydrogen atoms from an alkoxy group.

In Formula (26), examples of the monovalent organic group represented by $R^{17}$ may include: a group remaining after eliminating one hydrogen atom from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating one hydrogen atom from a aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating one hydrogen atom from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating one hydrogen atom from an amino group having a substituent containing a carbon atom; and a group remaining after eliminating one hydrogen atom from a silyl group having a substituent containing a carbon atom. Among them, from the viewpoint of easy synthesis of the raw material monomer, preferred are a group remaining after eliminating one hydrogen atom from an alkyl group, a group remaining after eliminating one hydrogen atom from an aryl group, and a group remaining after eliminating one hydrogen atom from an alkoxy group.

The structural unit represented by Formula (26) may be the structural units below.

[Chemical Formula 28]

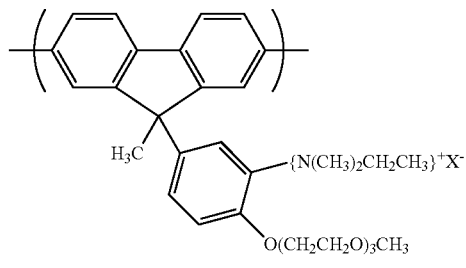

X = F, Cl, Br, I, $BPh_4$, $CF_3SO_3$, $CH_3COO$

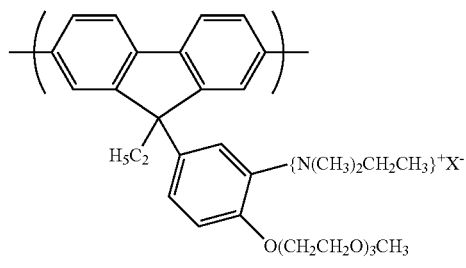

X = F, Cl, Br, I, $BPh_4$, $CF_3SO_3$, $CH_3COO$

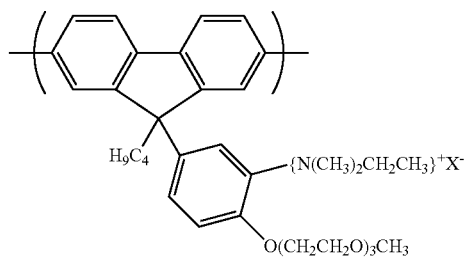

X = F, Cl, Br, I, $BPh_4$, $CF_3SO_3$, $CH_3COO$

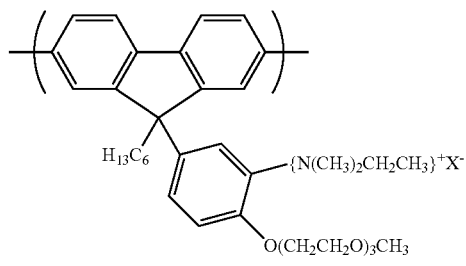

X = F, Cl, Br, I, $BPh_4$, $CF_3SO_3$, $CH_3COO$

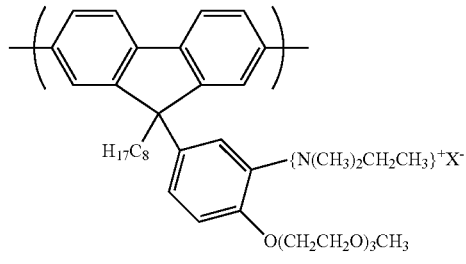

X = F, Cl, Br, I, $BPh_4$, $CF_3SO_3$, $CH_3COO$

-continued

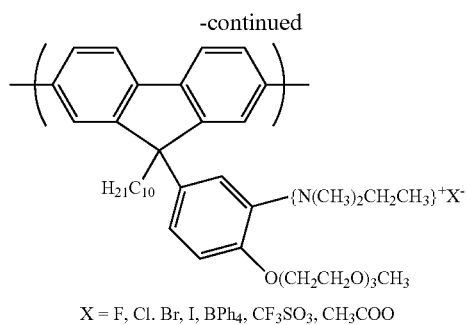

X = F, Cl, Br, I, BPh4, CF3SO3, CH3COO

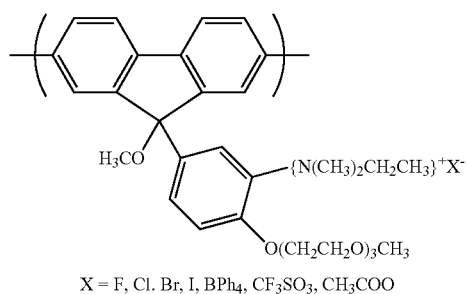

X = F, Cl, Br, I, BPh4, CF3SO3, CH3COO

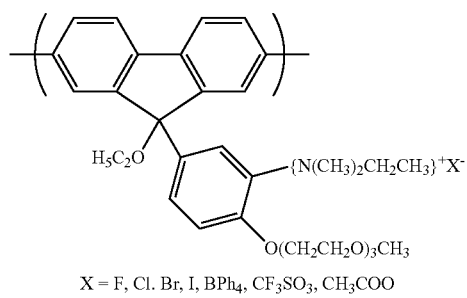

X = F, Cl, Br, I, BPh4, CF3SO3, CH3COO

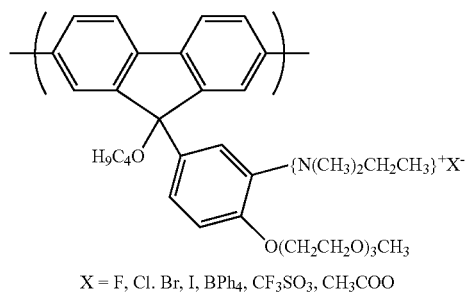

X = F, Cl, Br, I, BPh4, CF3SO3, CH3COO

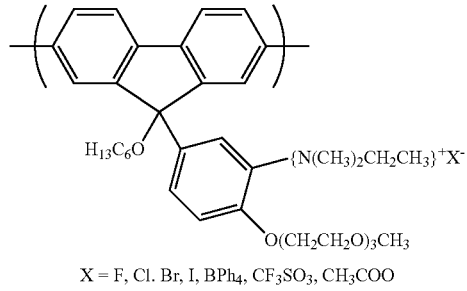

X = F, Cl, Br, I, BPh4, CF3SO3, CH3COO

-continued

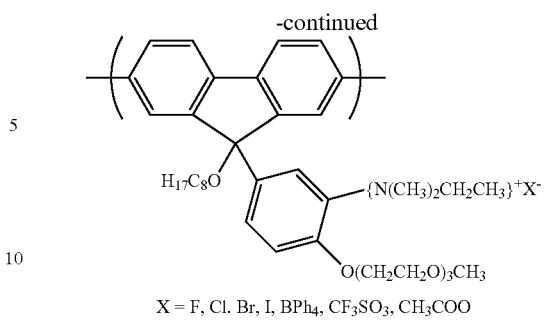

X = F, Cl, Br, I, BPh4, CF3SO3, CH3COO

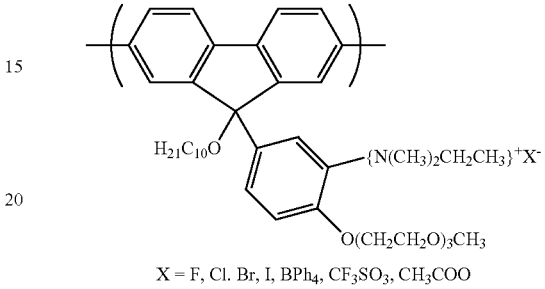

X = F, Cl, Br, I, BPh4, CF3SO3, CH3COO

[Chemical Formula 29]

(27)

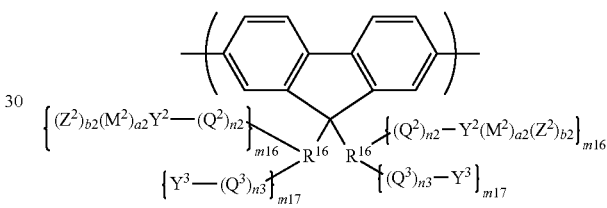

(In Formula (27), $R^{16}$ represents a (1+m16+m17) valent organic group; $Q^2$, $Q^3$, $Y^2$, $M^2$, $Z^2$, $Y^3$, n2, a2, b2, and n3 represent the same meanings as described above; m16 and m17 each independently represent an integer of 1 or more; and when each of $R^{16}$, m16, m17, $Q^2$, $Q^3$, $Y^2$, $M^2$, $Z^2$, $Y^3$, n2, a2, b2, and n3 is plurally present, $R^{16}$s, m16s, m17s, $Q^2$s, $Q^3$s, $Y^2$s, $M^2$s, $Z^2$s, $Y^3$s, n2s, a2s, b2s, or n3s may be the same as or different from each other.)

In Formula (27), examples of the (1+m16+m17) valent organic group represented by $R^{16}$ may include: a group remaining after eliminating (m16+m17) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m16+m17) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m16+m17) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, norbornyloxy group, an adamantyloxy group, and a group in which at least one hydrogen atom in these groups is substituted with a substituent; a group remaining after eliminating (m16+m17) hydrogen atoms from an amino group having a substituent containing a carbon atom; and a group remaining after eliminating (m16+m17) hydrogen atoms from a silyl group having a substituent containing a carbon atom. Among them, from the viewpoint of easy synthesis of the raw material monomer, preferred are a group remaining after eliminating (m16+m17) hydrogen atoms from an alkyl group, a group remaining after eliminating (m16+m17) hydrogen atoms from an aryl group, and a group remaining after eliminating (m16+m17) hydrogen atoms from an alkoxy group.

The structural unit represented by Formula (27) may be the structural units below.

[Chemical Formula 30]

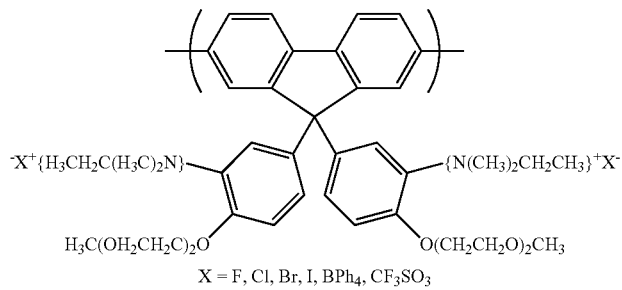

X = F, Cl, Br, I, BPh$_4$, CF$_3$SO$_3$

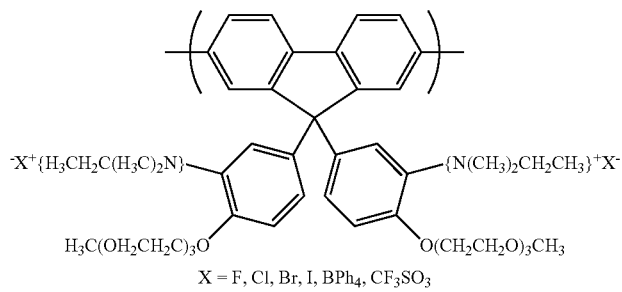

X = F, Cl, Br, I, BPh$_4$, CF$_3$SO$_3$

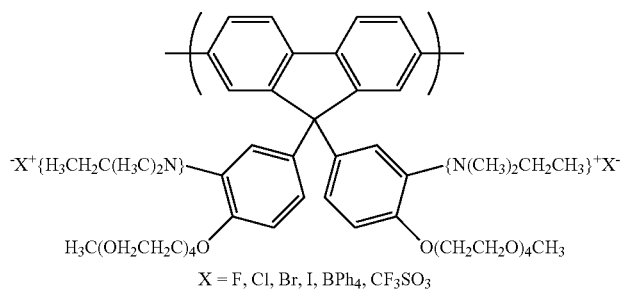

X = F, Cl, Br, I, BPh$_4$, CF$_3$SO$_3$

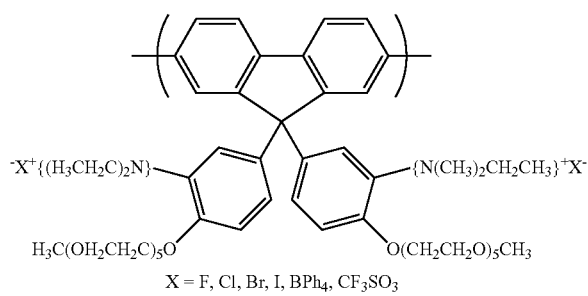

X = F, Cl, Br, I, BPh$_4$, CF$_3$SO$_3$

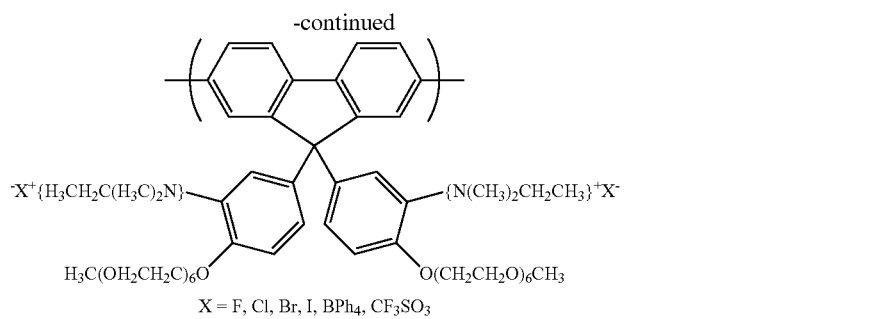
X = F, Cl, Br, I, BPh₄, CF₃SO₃
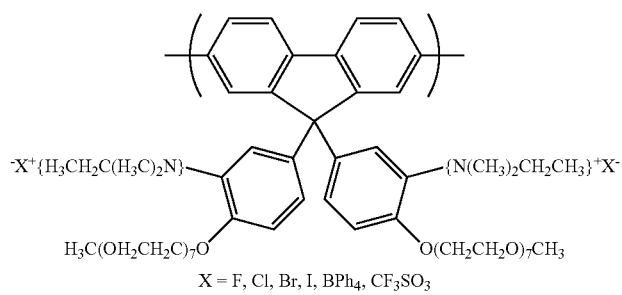
X = F, Cl, Br, I, BPh₄, CF₃SO₃
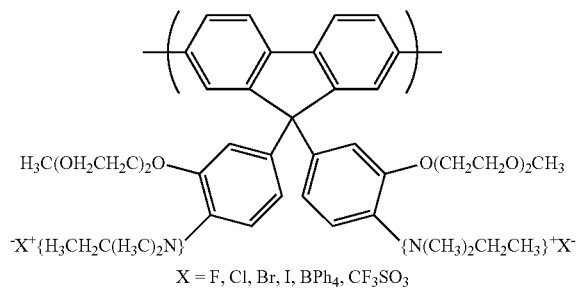
X = F, Cl, Br, I, BPh₄, CF₃SO₃
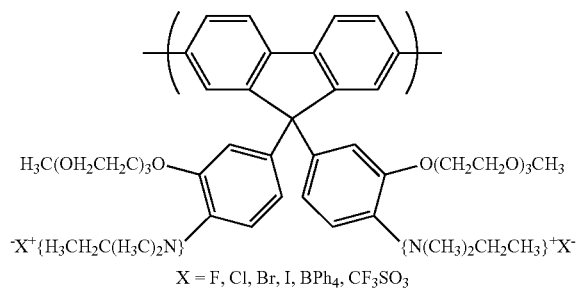
X = F, Cl, Br, I, BPh₄, CF₃SO₃
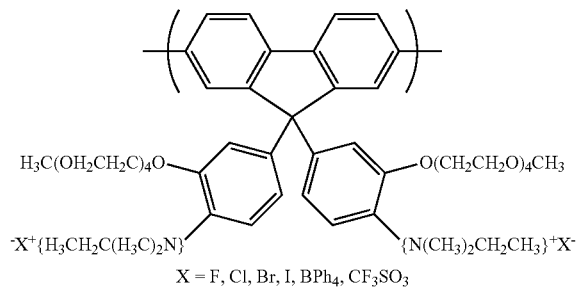
X = F, Cl, Br, I, BPh₄, CF₃SO₃

-continued
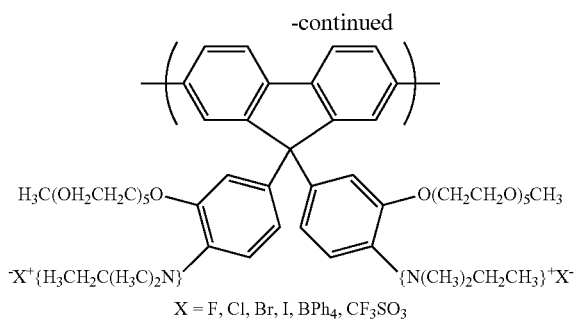
X = F, Cl, Br, I, BPh4, CF3SO3
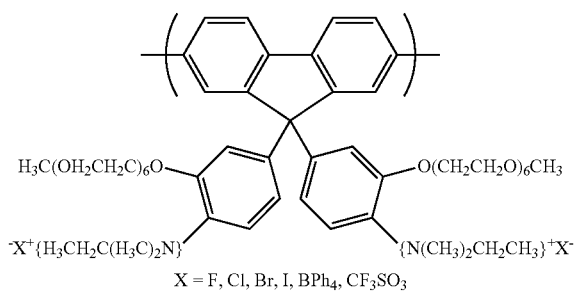
X = F, Cl, Br, I, BPh4, CF3SO3
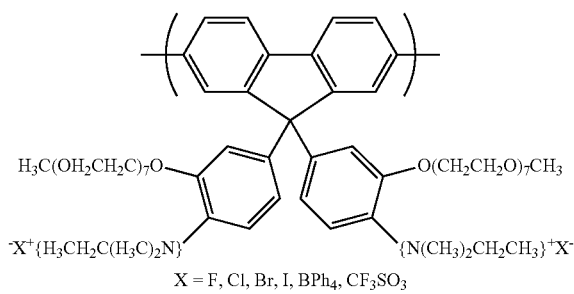
X = F, Cl, Br, I, BPh4, CF3SO3
[Chemical Formula 31]
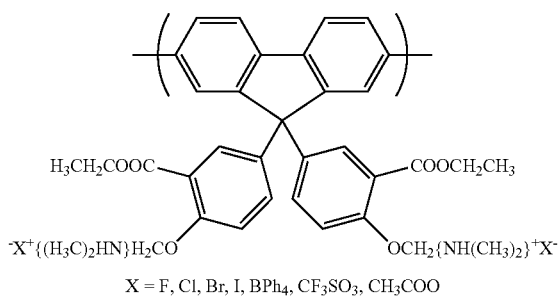
X = F, Cl, Br, I, BPh4, CF3SO3, CH3COO
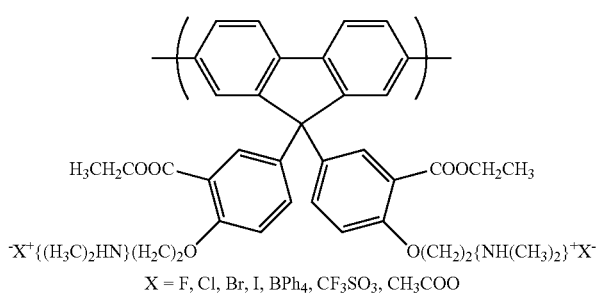
X = F, Cl, Br, I, BPh4, CF3SO3, CH3COO -continued
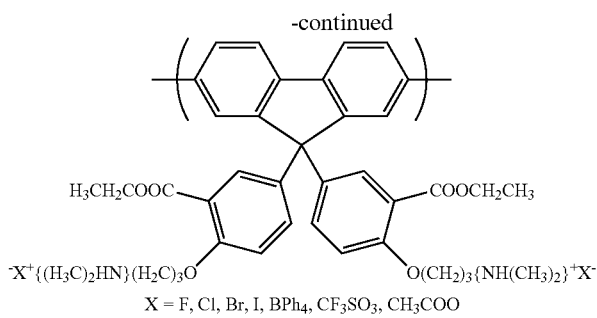
X = F, Cl, Br, I, BPh4, CF3SO3, CH3COO
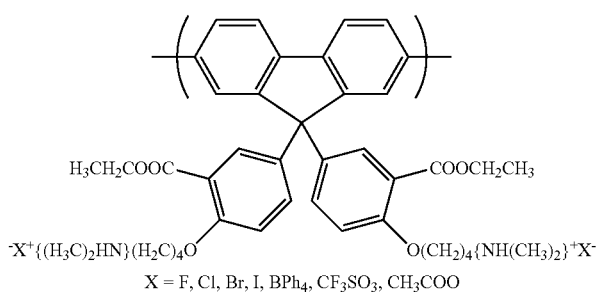
X = F, Cl, Br, I, BPh4, CF3SO3, CH3COO
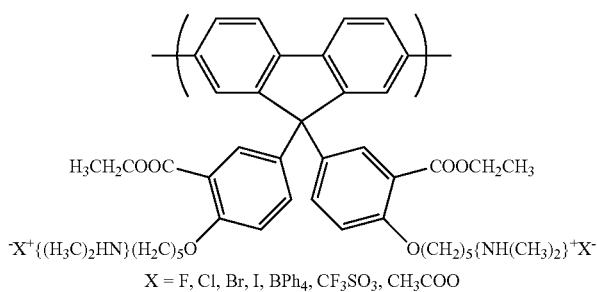
X = F, Cl, Br, I, BPh4, CF3SO3, CH3COO
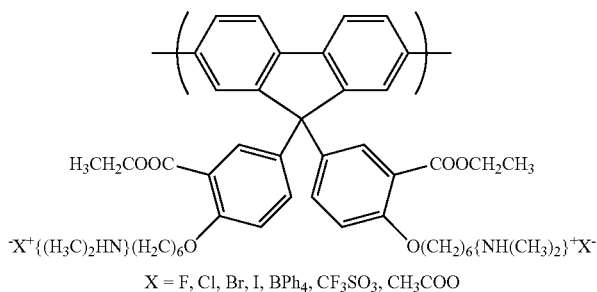
X = F, Cl, Br, I, BPh4, CF3SO3, CH3COO
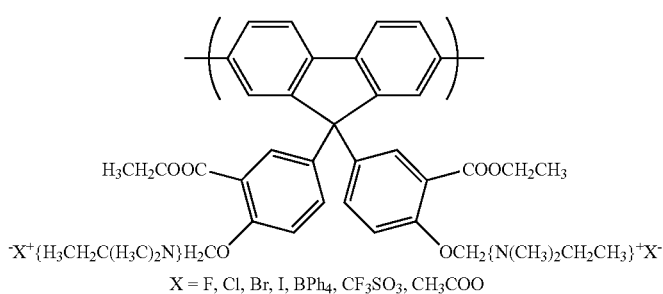
X = F, Cl, Br, I, BPh4, CF3SO3, CH3COO -continued
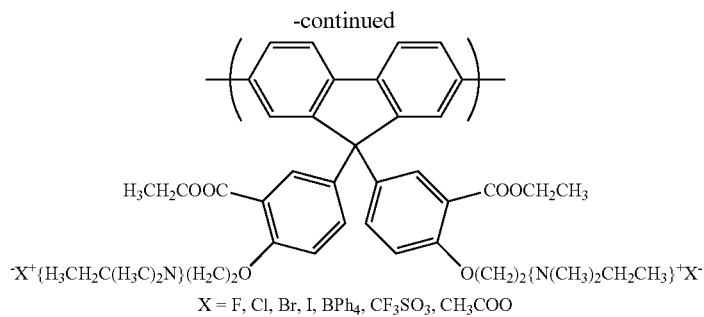
X = F, Cl, Br, I, BPh₄, CF₃SO₃, CH₃COO
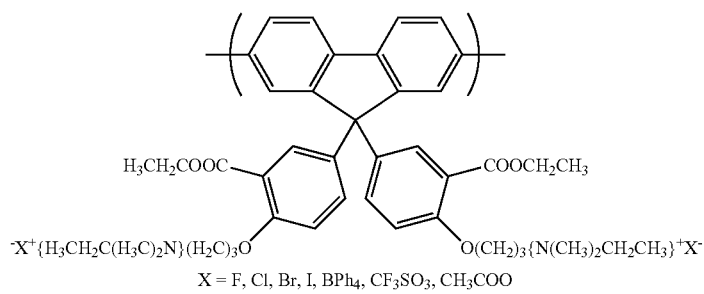
X = F, Cl, Br, I, BPh₄, CF₃SO₃, CH₃COO
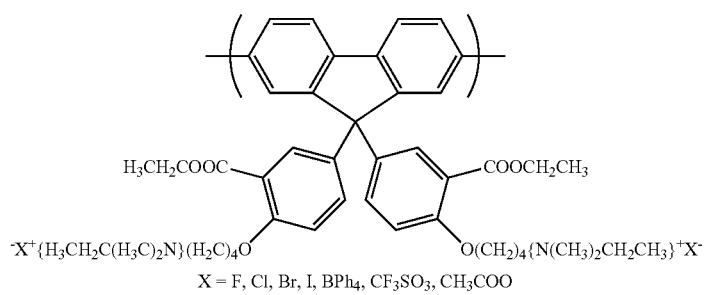
X = F, Cl, Br, I, BPh₄, CF₃SO₃, CH₃COO
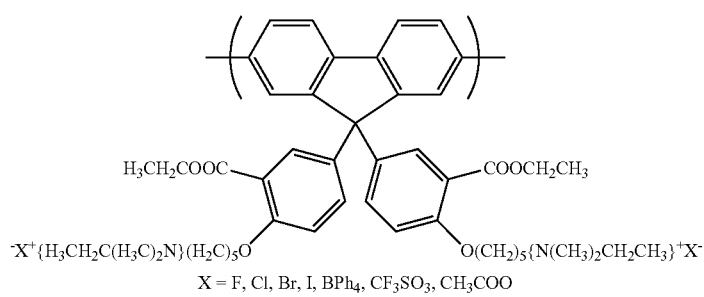
X = F, Cl, Br, I, BPh₄, CF₃SO₃, CH₃COO
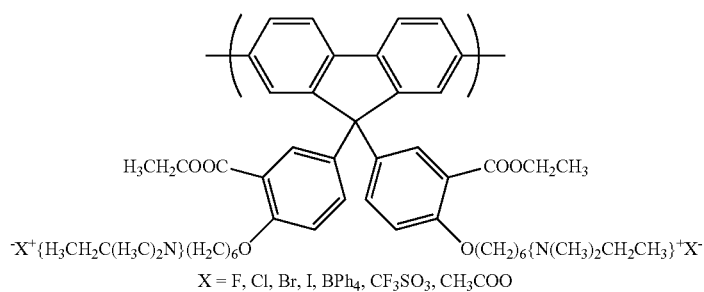
X = F, Cl, Br, I, BPh₄, CF₃SO₃, CH₃COO -continued
[Chemical Formula 32]
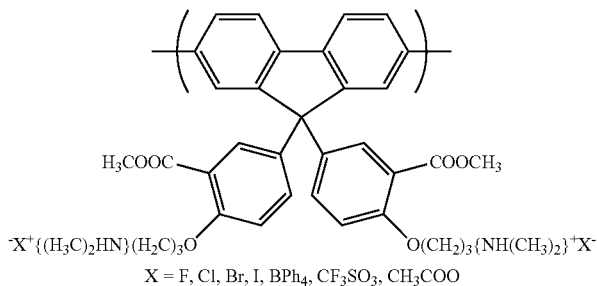
X = F, Cl, Br, I, BPh₄, CF₃SO₃, CH₃COO
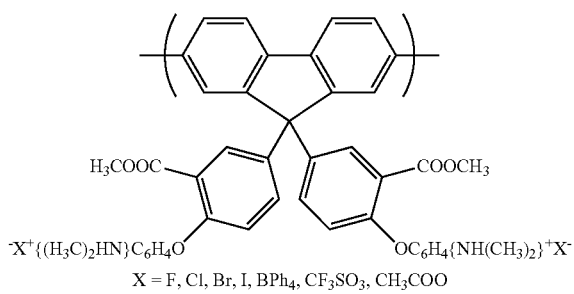
X = F, Cl, Br, I, BPh₄, CF₃SO₃, CH₃COO
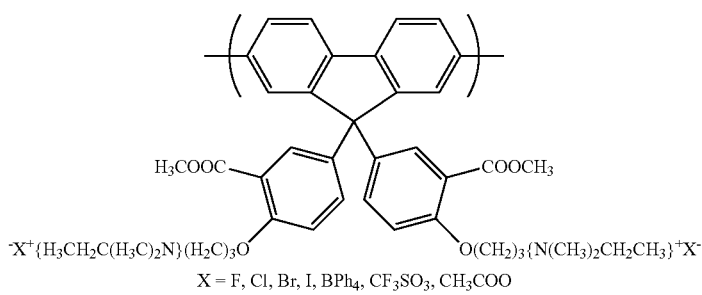
X = F, Cl, Br, I, BPh₄, CF₃SO₃, CH₃COO
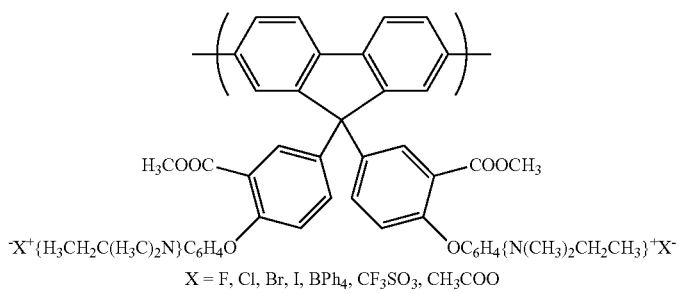
X = F, Cl, Br, I, BPh₄, CF₃SO₃, CH₃COO
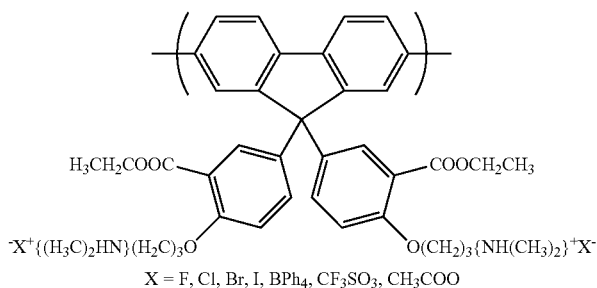
X = F, Cl, Br, I, BPh₄, CF₃SO₃, CH₃COO

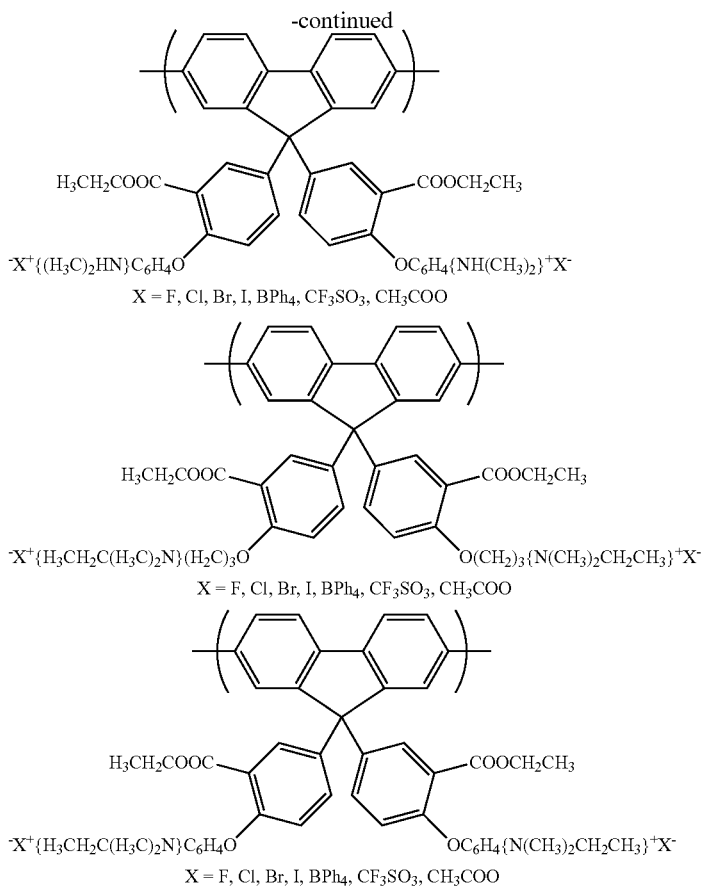

The structural unit represented by Formula (15) is, from the viewpoint of the durability of the obtained ionic polymer, preferably a structural unit represented by Formula (28).

[Chemical Formula 33]

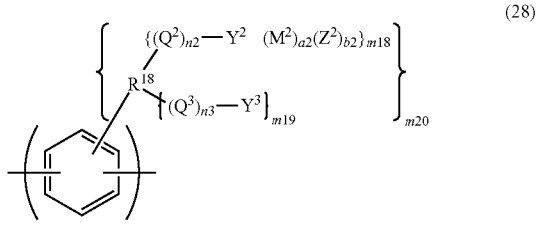

(In Formula (28), $R^{18}$ represents a (1+m18+m19) valent organic group; $Q^2$, $Q^3$, $Y^2$, $M^2$, $Z^2$, $Y^3$, n2, a2, b2, and n3 represent the same meanings as described above; m18, m19, and m20 each independently represent an integer of 1 or more; and when each of $R^{18}$, m18, m19, $Q^2$, $Q^3$, $Y^2$, $M^2$, $Z^2$, $Y^3$, n2, a2, b2, and n3 exists is plurally present, $R^{18}$s, m18s, m19s, $Q^2$s, $Q^3$s, $Y^2$s, $M^2$s, $Z^2$s, $Y^3$s, n2s, a2s, b2s, or n3s may be the same as or different from each other.)

In Formula (28), examples of the (1+m18+m19) valent organic group represented by $R^{18}$ may include: a group remaining after eliminating (m18+m19) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, lauryl group, and a group in which at least one hydrogen atom in these groups is substituted with a substituent; a group remaining after eliminating (m18+m19) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m18+m19) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m18+m19) hydrogen atoms from an amino group having a substituent containing a carbon atom; and a group remaining after eliminating (m18+m19) hydrogen atoms from a silyl group having a substituent containing a carbon atom. Among them, from the viewpoint of easy synthesis of the raw material monomer, preferred are a group remaining after eliminating (m18+m19) hydrogen atoms from an alkyl group, a group remaining after eliminating (m18+m19) hydrogen atoms from an aryl group, and a group remaining after eliminating (m18+m19) hydrogen atoms from an alkoxy group.

The structural unit represented by Formula (28) may be the structural units below.

[Chemical Formula 34]

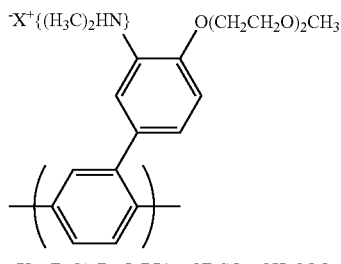

X = F, Cl, Br, I, BPh$_4$, CF$_3$SO$_3$, CH$_3$COO

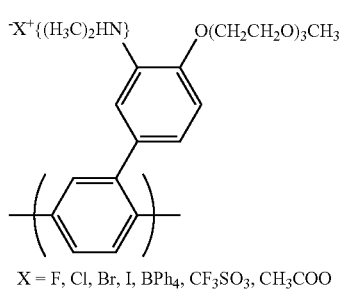

X = F, Cl, Br, I, BPh$_4$, CF$_3$SO$_3$, CH$_3$COO

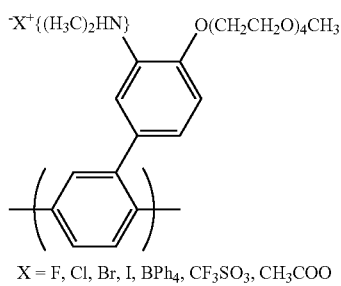

X = F, Cl, Br, I, BPh$_4$, CF$_3$SO$_3$, CH$_3$COO

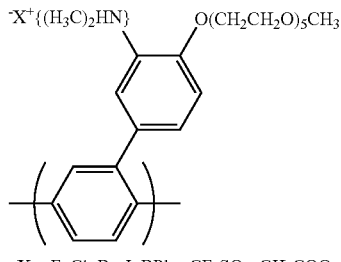

X = F, Cl, Br, I, BPh$_4$, CF$_3$SO$_3$, CH$_3$COO

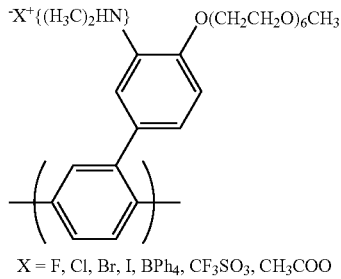

X = F, Cl, Br, I, BPh$_4$, CF$_3$SO$_3$, CH$_3$COO

-continued

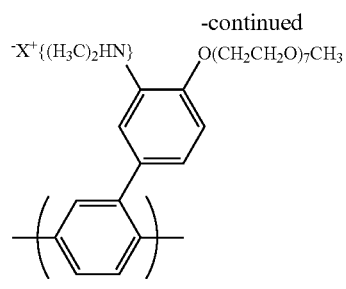

X = F, Cl, Br, I, BPh$_4$, CF$_3$SO$_3$, CH$_3$COO

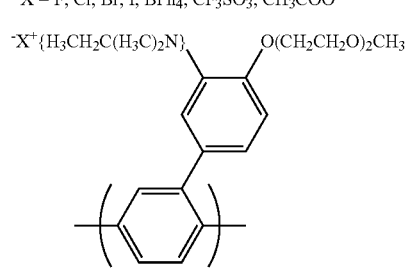

X = F, Cl, Br, I, BPh$_4$, CF$_3$SO$_3$, CH$_3$COO

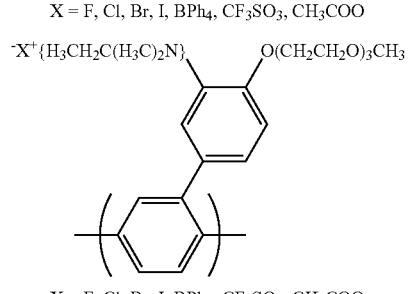

X = F, Cl, Br, I, BPh$_4$, CF$_3$SO$_3$, CH$_3$COO

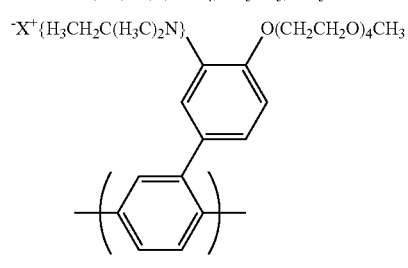

X = F, Cl, Br, I, BPh$_4$, CF$_3$SO$_3$, CH$_3$COO

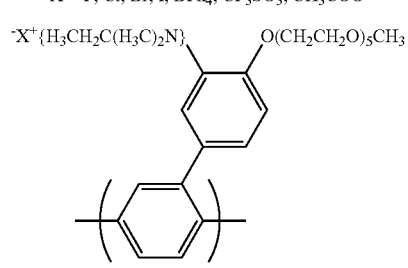

X = F, Cl, Br, I, BPh$_4$, CF$_3$SO$_3$, CH$_3$COO

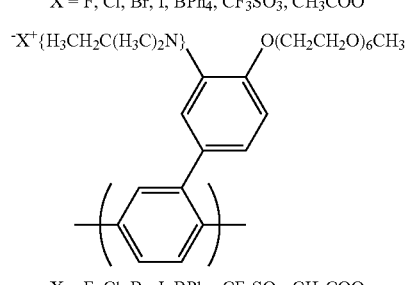

X = F, Cl, Br, I, BPh$_4$, CF$_3$SO$_3$, CH$_3$COO

77
-continued

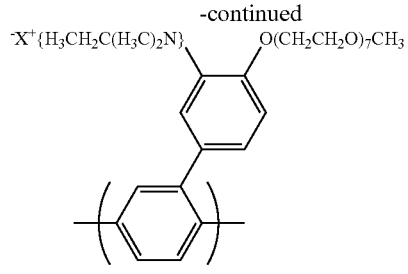
X = F, Cl, Br, I, BPh₄, CF₃SO₃, CH₃COO

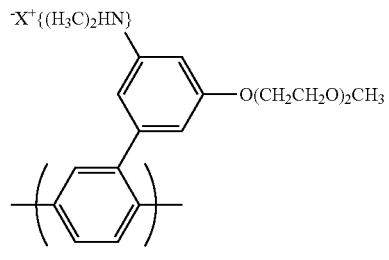
X = F, Cl, Br, I, BPh₄, CF₃SO₃, CH₃COO

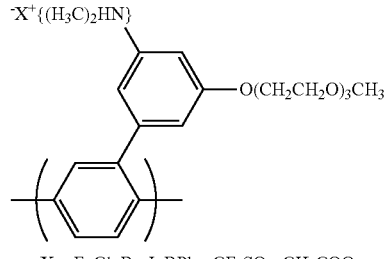
X = F, Cl, Br, I, BPh₄, CF₃SO₃, CH₃COO

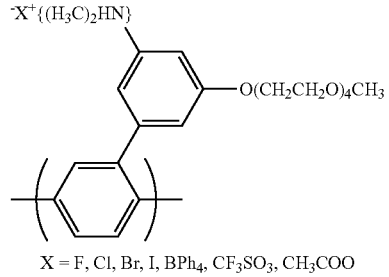
X = F, Cl, Br, I, BPh₄, CF₃SO₃, CH₃COO

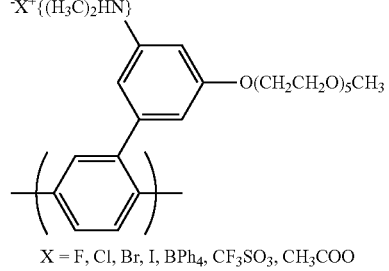
X = F, Cl, Br, I, BPh₄, CF₃SO₃, CH₃COO

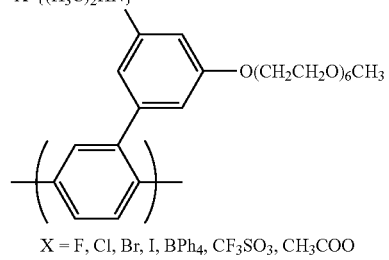
X = F, Cl, Br, I, BPh₄, CF₃SO₃, CH₃COO

78
-continued

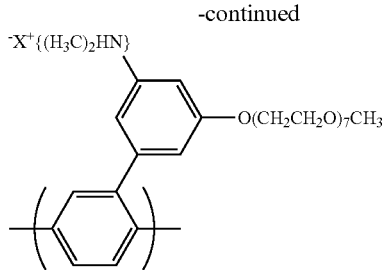
X = F, Cl, Br, I, BPh₄, CF₃SO₃, CH₃COO

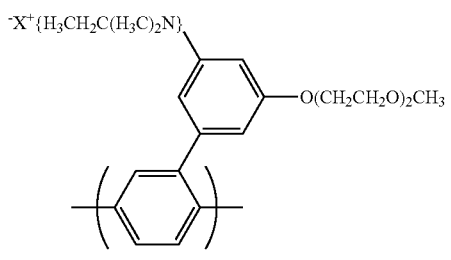
X = F, Cl, Br, I, BPh₄, CF₃SO₃, CH₃COO

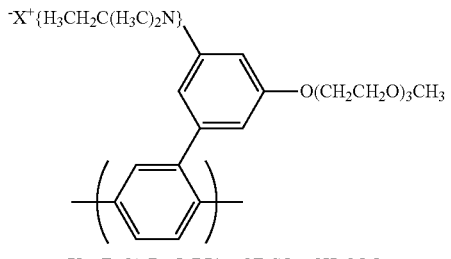
X = F, Cl, Br, I, BPh₄, CF₃SO₃, CH₃COO

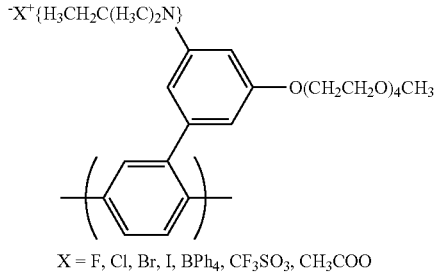
X = F, Cl, Br, I, BPh₄, CF₃SO₃, CH₃COO

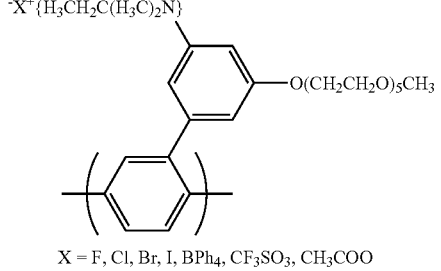
X = F, Cl, Br, I, BPh₄, CF₃SO₃, CH₃COO

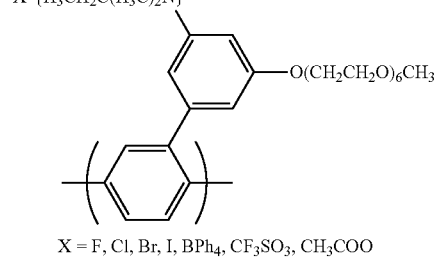
X = F, Cl, Br, I, BPh₄, CF₃SO₃, CH₃COO

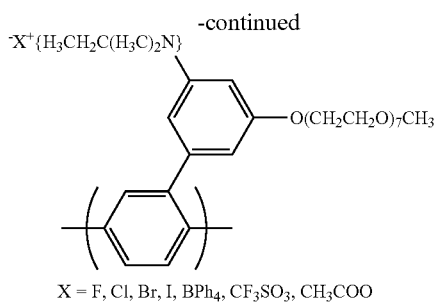

X = F, Cl, Br, I, BPh$_4$, CF$_3$SO$_3$, CH$_3$COO

Example of structural unit represented by Formula (17)

The structural unit represented by Formula (17) is, from the viewpoint of the electron transport characteristic of the obtained ionic polymer, preferably a structural unit represented by Formula (29).

[Chemical Formula 35]

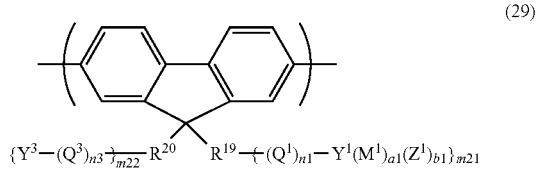

(29)

(In Formula (29), $R^{19}$ represents a single bond or a (1+m21) valent organic group; $R^{20}$ represents a single bond or a (1+m22) valent organic group; $Q^1$, $Q^3$, $Y^1$, $M^1$, $Z^1$, $Y^3$, n1, a1, b1, and n3 represent the same meanings as described above; m21 and m22 each independently represent an integer of 1 or more, provided that when $R^{19}$ is a single bond, m21 represents 1 and when $R^{20}$ is a single bond, m22 represents 1; and when each of $Q^1$, $Q^3$, $Y^1$, $M^1$, $Z^1$, $Y^3$, n1, a1, b1, and n3 is plurally present, $Q^1$s, $Q^3$s, $Y^1$s, $M^1$s, $Z^1$s, $Y^3$s, n1s, a1s, b1s, or n3s may be the same as or different from each other.)

In Formula (29), examples of the (1+m21) valent organic group represented by R″ may include: a group remaining after eliminating (m21) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m21) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m21) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m21) hydrogen atoms from an amino group having a substituent containing a carbon atom; and a group remaining after eliminating (m21) hydrogen atoms from a silyl group having a substituent containing a carbon atom. Among them, from the viewpoint of easy synthesis of the raw material monomer, preferred are a group remaining after eliminating (m21) hydrogen atoms from an alkyl group, a group remaining after eliminating (m21) hydrogen atoms from an aryl group, and a group remaining after eliminating (m21) hydrogen atoms from an alkoxy group.

In Formula (29), examples of the (1+m22) valent organic group represented by $R^{20}$ may include: a group remaining after eliminating (m22) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m22) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m22) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m22) hydrogen atoms from an amino group having a substituent containing a carbon atom; and a group remaining after eliminating (m22) hydrogen atoms from a silyl group having a substituent containing a carbon atom. Among them, from the viewpoint of easy synthesis of the raw material monomer, preferred are a group remaining after eliminating (m22) hydrogen atoms from an alkyl group, a group remaining after eliminating (m22) hydrogen atoms from an aryl group, and a group remaining after eliminating (m22) hydrogen atoms from an alkoxy group.

The structural unit represented by Formula (29) may be the structural units below.

[Chemical Formula 36]

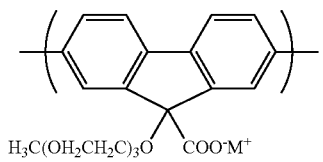

M = Li, Na, K, Cs, N(CH$_3$)$_4$

-continued

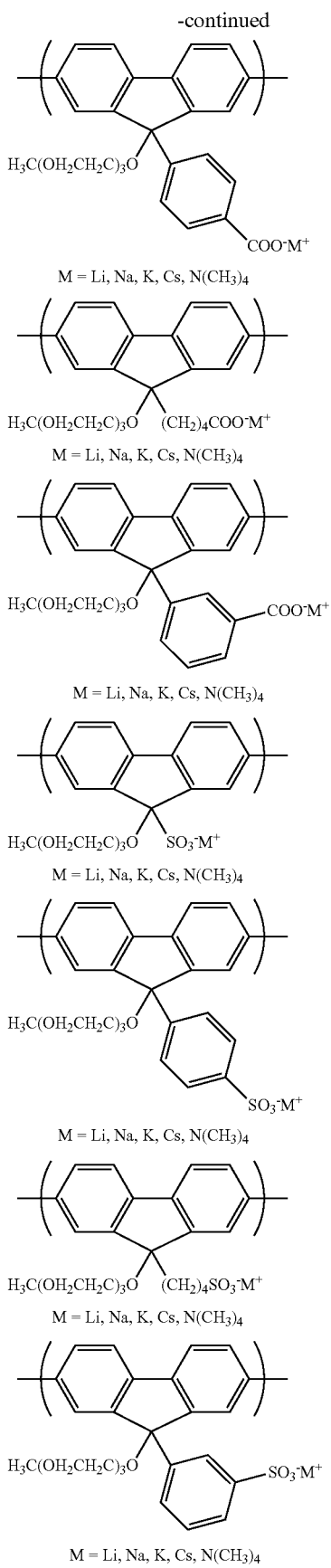

The structural unit represented by Formula (17) is, from the viewpoint of the durability of the obtained ionic polymer, preferably a structural unit represented by Formula (30).

[Chemical Formula 37]

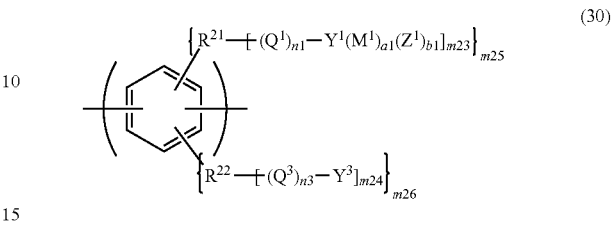

(30)

(In Formula (30), $R^{21}$ represents a single bond or a (1+m23) valent organic group; $R^{22}$ represents a single bond or a (1+m24) valent organic group; $Q^1$, $Q^3$, $Y^1$, $M^1$, $Z^1$, n1, a1, b1, and n3 represent the same meanings as described above; m23 and m24 each independently represent an integer of 1 or more, provided that when $R^{21}$ is a single bond, m23 represents 1 and when $R^{22}$ is a single bond, m24 represents 1; m25 and m26 each independently represent an integer of 1 or more; and when each of m23, m24, $R^{21}$, $R^{22}$, $Q^1$, $Q^3$, $Y^1$, $M^1$, $Z^1$, $Y^3$, n1, a1, b1, and n3 is plurally present, m23s, m24s, $R^{21}$s, $R^{22}$s, $Q^1$s, $Q^3$s, $Y^1$s, $M^1$s, $Y^3$s, n1s, a1s, b1s, or n3s may be the same as or different from each other.)

In Formula (30), examples of the (1+m23) valent organic group represented by $R^{21}$ may include: a group remaining after eliminating (m23) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m23) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m23) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m23) hydrogen atoms from an amino group having a substituent containing a carbon atom; and a group remaining after eliminating (m23) hydrogen atoms from a silyl group having a substituent containing a carbon atom. Among them, from the viewpoint of easy synthesis of the raw material monomer, preferred are a group remaining after eliminating (m23) hydrogen atoms from an alkyl group, a group remaining after eliminating (m23) hydrogen atoms from an aryl group, and a group remaining after eliminating (m23) hydrogen atoms from an alkoxy group.

In Formula (30), examples of the (1+m24) valent organic group represented by $R^{22}$ may include: a group remaining after eliminating (m24) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m24) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m24) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, norbornyloxy group, an adamantyloxy group, and a group in which at least one hydrogen atom in these groups is substituted with a substituent; a group remaining after eliminating (m24) hydrogen atoms from an amino group having a substituent containing a carbon atom; and a group remaining after eliminating (m24) hydrogen atoms from a silyl group having a substituent containing a carbon atom. Among them, from the viewpoint of easy synthesis of the raw material monomer, preferred are a group remaining after eliminating (m24) hydrogen atoms from an alkyl group, a group remaining after eliminating (m24) hydrogen atoms from an aryl group, and a group remaining after eliminating (m24) hydrogen atoms from an alkoxy group.

The structural unit represented by Formula (30) may be the structural units below.

[Chemical Formula 38]

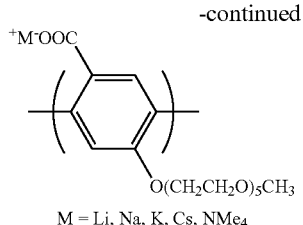

M = Li, Na, K, Cs, NMe$_4$

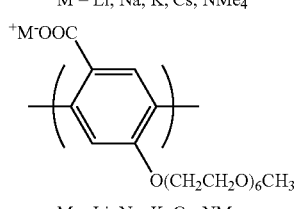

M = Li, Na, K, Cs, NMe$_4$

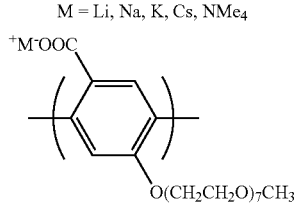

M = Li, Na, K, Cs, NMe$_4$

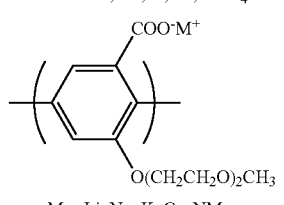

M = Li, Na, K, Cs, NMe$_4$

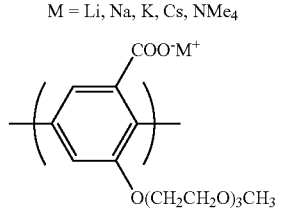

M = Li, Na, K, Cs, NMe$_4$

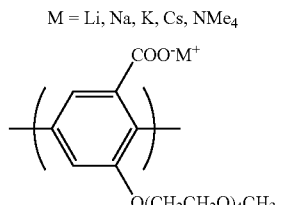

M = Li, Na, K, Cs, NMe$_4$

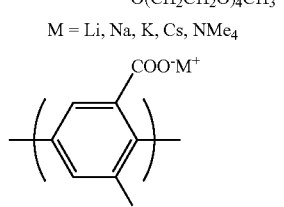

M = Li, Na, K, Cs, NMe$_4$

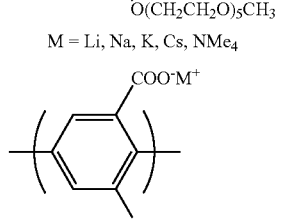

M = Li, Na, K, Cs, NMe$_4$

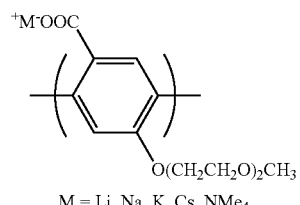

M = Li, Na, K, Cs, NMe$_4$

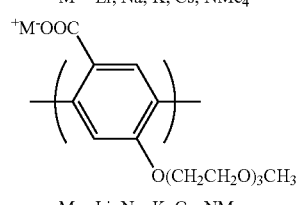

M = Li, Na, K, Cs, NMe$_4$

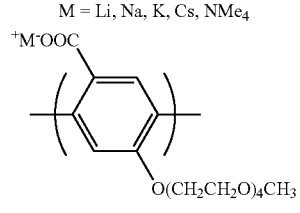

M = Li, Na, K, Cs, NMe$_4$

-continued

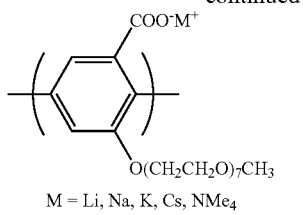
M = Li, Na, K, Cs, NMe$_4$

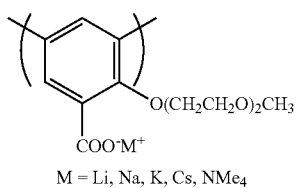
M = Li, Na, K, Cs, NMe$_4$

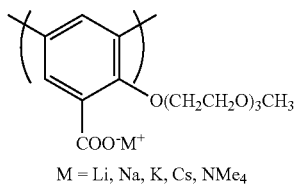
M = Li, Na, K, Cs, NMe$_4$

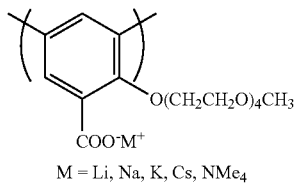
M = Li, Na, K, Cs, NMe$_4$

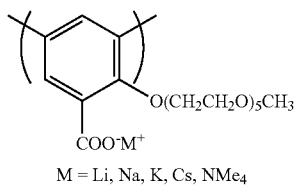
M = Li, Na, K, Cs, NMe$_4$

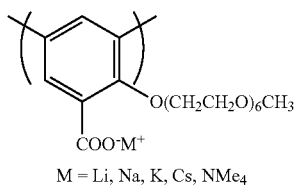
M = Li, Na, K, Cs, NMe$_4$

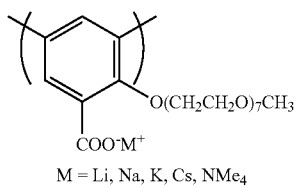
M = Li, Na, K, Cs, NMe$_4$

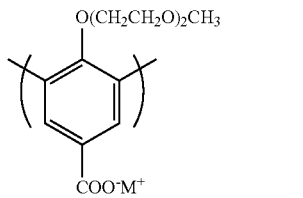
M = Li, Na, K, Cs, NMe$_4$

-continued

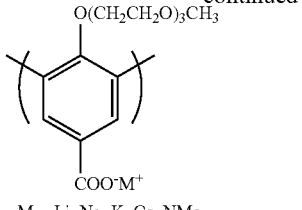
M = Li, Na, K, Cs, NMe$_4$

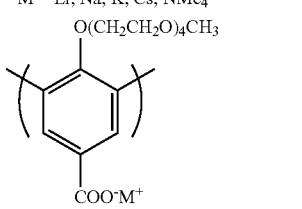
M = Li, Na, K, Cs, NMe$_4$

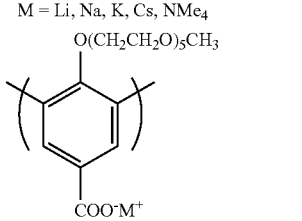
M = Li, Na, K, Cs, NMe$_4$

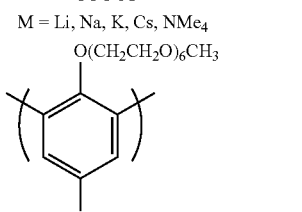
M = Li, Na, K, Cs, NMe$_4$

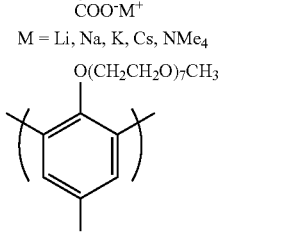
M = Li, Na, K, Cs, NMe$_4$

Example of structural unit represented by Formula (20)

The structural unit represented by Formula (20) is, from the viewpoint of the obtained electron transport characteristic, preferably a structural unit represented by Formula (31).

[Chemical Formula 39]

(31)

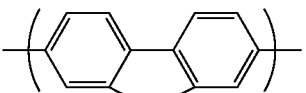

(In Formula (31), $R^{23}$ represents a single bond or a (1+m27) valent organic group; $R^{24}$ represents a single bond or a (1+m28) valent organic group; $Q^2$, $Q^3$, $Y^2$, $M^2$, $Z^2$, $Y^3$, n2, a2, b2, and n3 represent the same meanings as described above; m27 and m28 each independently represent an integer of 1 or more, provided that when $R^{23}$ is a single bond, m27 represents 1 and when $R^{24}$ is a single bond, m28 represents 1; and when each of $Q^2$, $Q^3$, $Y^2$, $M^2$, $Z^2$, $Y^3$, n2, a2, b2, and n3 is plurally present, $Q^2$s, $Q^3$s, $Y^2$s, $M^2$s, $Z^2$s, $Y^2$s, n2s, a2s, b2s, or n3s may be the same as or different from each other.)

In Formula (31), examples of the (1+m27) valent organic group represented by $R^{23}$ may include: a group remaining after eliminating (m27) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m27) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m27) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m27) hydrogen atoms from an amino group having a substituent containing a carbon atom; and a group remaining after eliminating (m27) hydrogen atoms from a silyl group having a substituent containing a carbon atom. Among them, from the viewpoint of easy synthesis of the raw material monomer, preferred are a group remaining after eliminating (m27) hydrogen atoms from an alkyl group, a group remaining after eliminating (m27) hydrogen atoms from an aryl group, and a group remaining after eliminating (m27) hydrogen atoms from an alkoxy group.

In Formula (31), examples of the (1+m28) valent organic group represented by $R^{24}$ may include: a group remaining after eliminating (m28) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m28) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m28) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m28) hydrogen atoms from an amino group having a substituent containing a carbon atom; and a group remaining after eliminating (m28) hydrogen atoms from a silyl group having a substituent containing a carbon atom. Among them, from the viewpoint of easy synthesis of the raw material monomer, preferred are a group remaining after eliminating (m28) hydrogen atoms from an alkyl group, a group remaining after eliminating (m28) hydrogen atoms from an aryl group, and a group remaining after eliminating (m28) hydrogen atoms from an alkoxy group.

The structural unit represented by Formula (31) may be the structural units below.

[Chemical Formula 40]

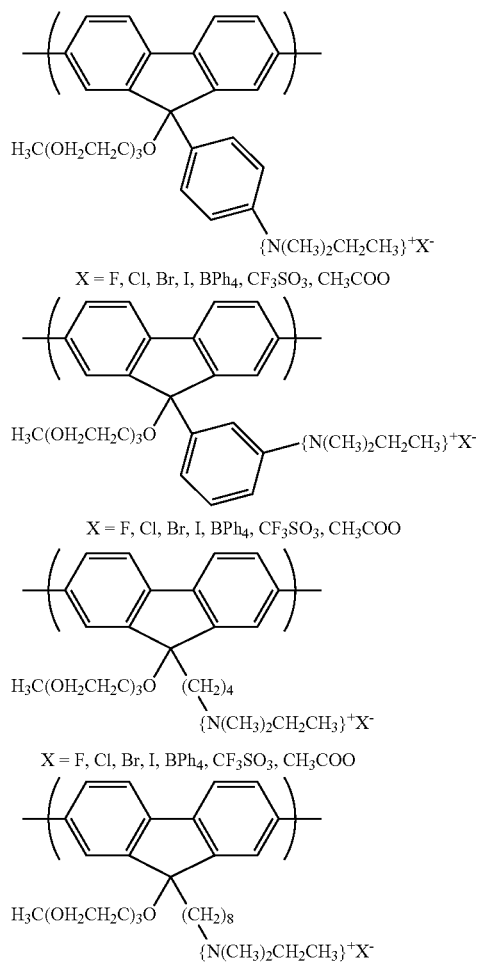

The structural unit represented by Formula (20) is, from the viewpoint of the durability of the obtained ionic polymer, preferably a structural unit represented by Formula (32).

[Chemical Formula 41]

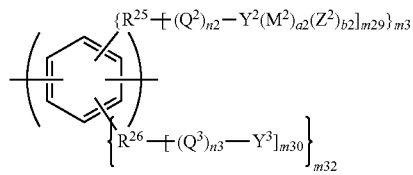

(32)

(In Formula (32), $R^{25}$ represents a single bond or a (1+m29) valent organic group; $R^{26}$ represents a single bond or a (1+m30) valent organic group; $Q^2$, $Q^3$, $Y^2$, $M^2$, $M^2$, $Z^2$, $Y^3$, n2, a2, b2, and n3 represent the same meanings as described above; m29 and m30 each independently represent an integer of 1 or more, provided that when $R^{25}$ is a single bond, m29 represents 1 and when $R^{26}$ is a single bond, m30 represents 1; m31 and m32 each independently represent an integer of 1 or more; and when each of m29, m30, $R^{25}$, $R^{26}$, $Q^2$, $Q^3$, $Y^2$, $M^2$, $Z^2$, $Y^3$, n2, a2, b2, and n3 is plurally present, m29s, m30s, $R^{25}$, $R^{26}$, $Q^2$, $Q^3$, $Y^2$, $M^2$, $Z^2$, $Y^3$, n2, a2, b2, or n3 may be the same as or different from each other.)

In Formula (32), examples of the (1+m29) valent organic group represented by $R^{25}$ may include: a group remaining after eliminating (m29) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m29) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m29) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m29) hydrogen atoms from an amino group having a substituent containing a carbon atom; and a group remaining after eliminating (m29) hydrogen atoms from a silyl group having a substituent containing a carbon atom. Among them, from the viewpoint of easy synthesis of the raw material monomer, preferred are a group remaining after eliminating (m29) hydrogen atoms from an alkyl group, a group remaining after eliminating (m29) hydrogen atoms from an aryl group, and a group remaining after eliminating (m29) hydrogen atoms from an alkoxy group.

In Formula (32), examples of the (1+m30) valent organic group represented by $R^{26}$ may include: a group remaining after eliminating (m30) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m30) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m30) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m30) hydrogen atoms from an amino group having a substituent containing a carbon atom; and a group remaining after eliminating (m30) hydrogen atoms from a silyl group having a substituent containing a carbon atom. Among them, from the viewpoint of easy synthesis of the raw material monomer, preferred are a group remaining after eliminating (m30) hydrogen atoms from an alkyl group, a group remaining after eliminating (m30) hydrogen atoms from an aryl group, and a group remaining after eliminating (m30) hydrogen atoms from an alkoxy group.

The structural unit represented by Formula (32) may be the structural units below.

[Chemical Formula 42]

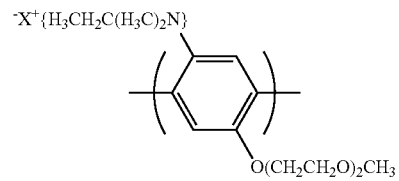

X = F, Cl, Br, I, BPh$_4$, CF$_3$SO$_3$, CH$_3$COO

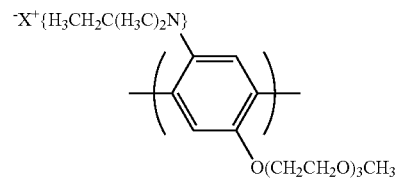

X = F, Cl, Br, I, BPh$_4$, CF$_3$SO$_3$, CH$_3$COO

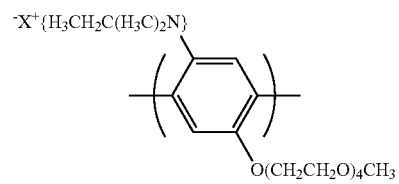

X = F, Cl, Br, I, BPh$_4$, CF$_3$SO$_3$, CH$_3$COO

-continued

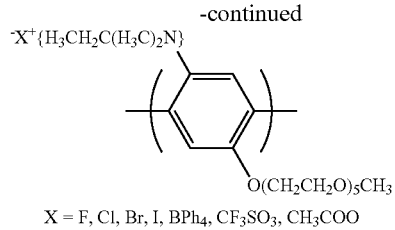
X = F, Cl, Br, I, BPh4, CF3SO3, CH3COO

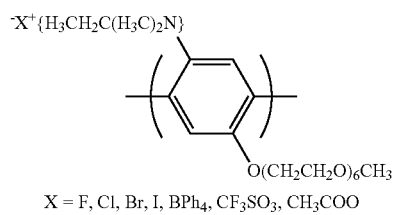
X = F, Cl, Br, I, BPh4, CF3SO3, CH3COO

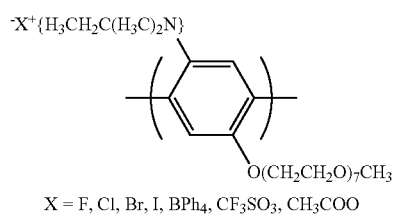
X = F, Cl, Br, I, BPh4, CF3SO3, CH3COO

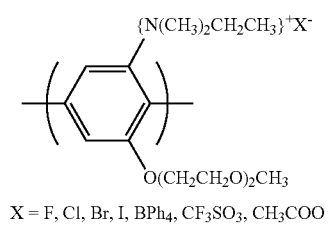
X = F, Cl, Br, I, BPh4, CF3SO3, CH3COO

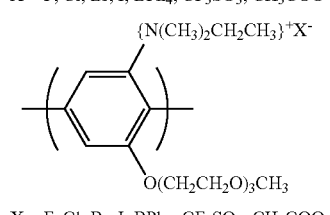
X = F, Cl, Br, I, BPh4, CF3SO3, CH3COO

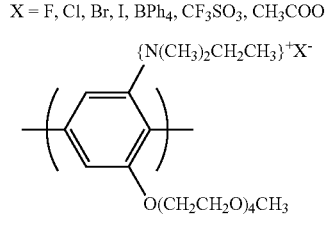
X = F, Cl, Br, I, BPh4, CF3SO3, CH3COO

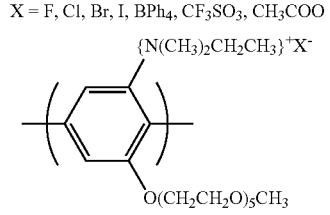
X = F, Cl, Br, I, BPh4, CF3SO3, CH3COO

-continued

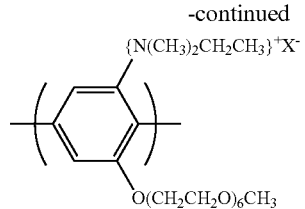
X = F, Cl, Br, I, BPh4, CF3SO3, CH3COO

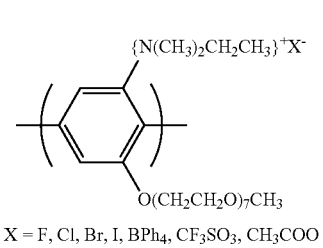
X = F, Cl, Br, I, BPh4, CF3SO3, CH3COO

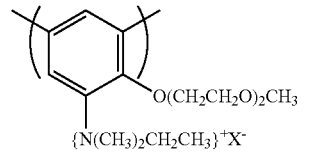
X = F, Cl, Br, I, BPh4, CF3SO3, CH3COO

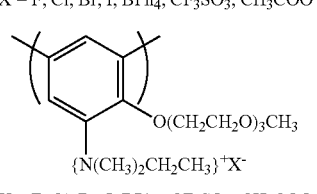
X = F, Cl, Br, I, BPh4, CF3SO3, CH3COO

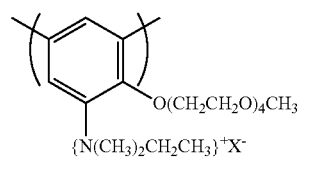
X = F, Cl, Br, I, BPh4, CF3SO3, CH3COO

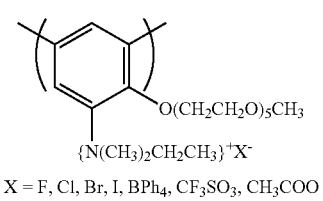
X = F, Cl, Br, I, BPh4, CF3SO3, CH3COO

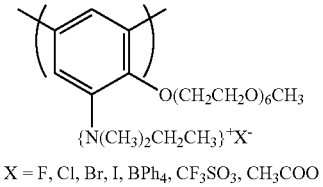
X = F, Cl, Br, I, BPh4, CF3SO3, CH3COO

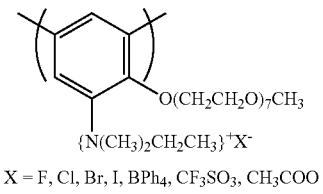
X = F, Cl, Br, I, BPh4, CF3SO3, CH3COO

-continued

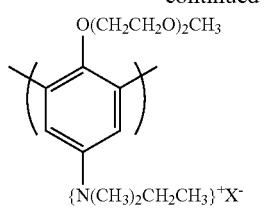

X = F, Cl, Br, I, BPh4, CF3SO3, CH3COO

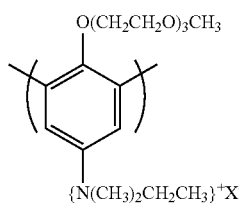

X = F, Cl, Br, I, BPh4, CF3SO3, CH3COO

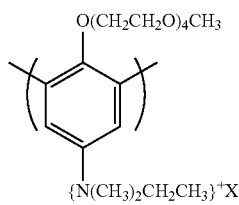

X = F, Cl, Br, I, BPh4, CF3SO3, CH3COO

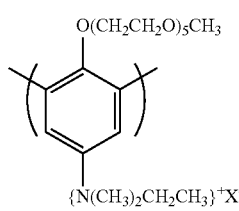

X = F, Cl, Br, I, BPh4, CF3SO3, CH3COO

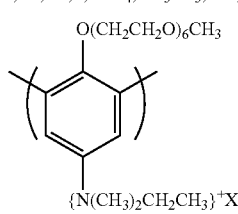

X = F, Cl, Br, I, BPh4, CF3SO3, CH3COO

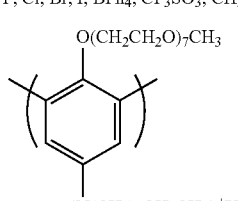

X = F, Cl, Br, I, BPh4, CF3SO3, CH3COO

Other Structural Units

The ionic polymer used in the present invention may further have one or more types of structural unit represented by Formula (33).

[Chemical Formula 43]

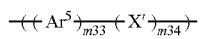

(33)

(In Formula (33), $Ar^5$ represents a divalent aromatic group optionally having a substituent or a divalent aromatic amine residue optionally having a substituent; X' represents an imino group optionally having a substituent, a silylene group optionally having a substituent, an ethenylene group optionally having a substituent, or an ethynylene group; and m33 and m34 each independently represent 0 or 1 and at least one of m33 and m34 is 1.)

Examples of the divalent aromatic group represented by $Ar^5$ in Formula (33) may include a divalent aromatic hydrocarbon group and a divalent aromatic heterocyclic group. The divalent aromatic group may be: a divalent group remaining after eliminating two hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring, or an azadiazole ring; a divalent group remaining after eliminating two hydrogen atoms from a fused polycyclic aromatic ring system formed by fusing two or more rings selected from the group consisting of the above monocyclic aromatic rings; a divalent group remaining after eliminating two hydrogen atoms from an aromatic ring assembly formed by linking two or more aromatic rings selected from the group consisting of the above monocyclic aromatic rings and the above fused polycyclic aromatic ring systems through a single bond, an ethenylene group, or an ethynylene group; or a divalent group remaining after eliminating two hydrogen atoms from a crosslinkage-having polycyclic aromatic ring formed by crosslinking two aromatic rings adjacent to each other of the above fused polycyclic aromatic ring system or the above aromatic ring assembly through a divalent group such as a methylene group, an ethylene group, a carbonyl group, and an imino group.

In the fused polycyclic aromatic ring system, the number of monocyclic aromatic rings to be fused is, from the viewpoint of the solubility of the ionic polymer, preferably 2 to 4, more preferably 2 to 3, further preferably 2. In the aromatic ring assembly, the number of aromatic rings to be linked is, from the viewpoint of the solubility of the ionic polymer, preferably 2 to 4, more preferably 2 to 3, further preferably 2. In the crosslinkage-having polycyclic aromatic ring, the number of aromatic rings to be crosslinked is, from the viewpoint of the solubility of the ionic polymer, preferably 2 to 4, more preferably 2 to 3, further preferably 2.

Examples of the monocyclic aromatic ring may include the rings below.

[Chemical Formula 44]

45

46

-continued
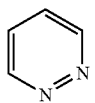 47
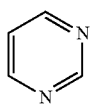 48
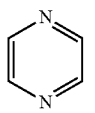 49
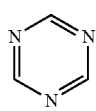 50
 51
 52
 53
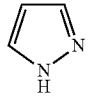 54
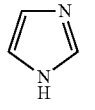 55
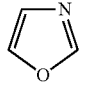 56
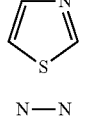 57
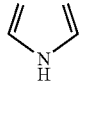 58
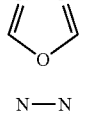 59
 60
Examples of the fused polycyclic aromatic ring system may include the rings below.
[Chemical Formula 45]
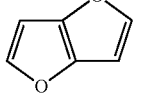
61
62
63
64
65
66
67
68
69
70
71
72

-continued
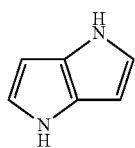
73
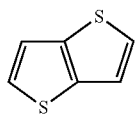
74
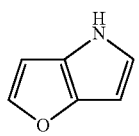
75
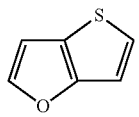
76
77
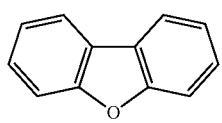
78
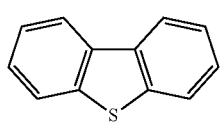
79
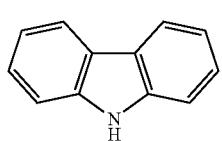
80
Examples of the aromatic ring assembly may include the rings below.
[Chemical Formula 46]
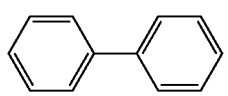
81
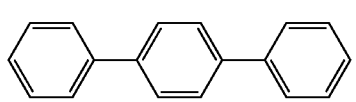
82
-continued
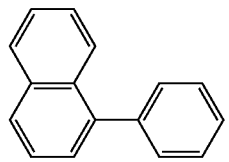
83
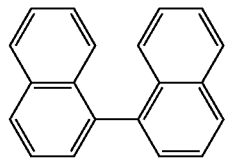
84
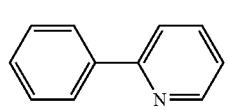
85
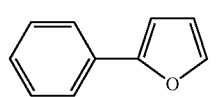
86
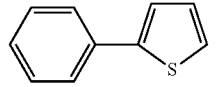
87
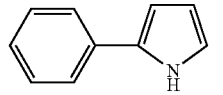
88
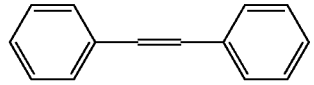
89
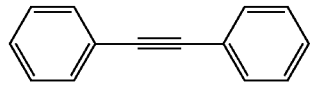
90
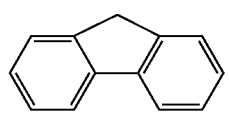
91
Examples of the crosslinkage-having polycyclic aromatic ring may include the rings below.
[Chemical Formula 47]
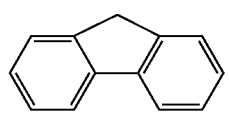
92
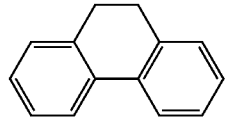
93

94

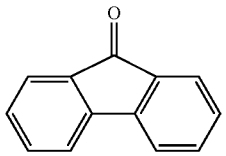

95

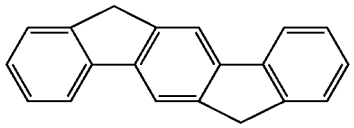

96

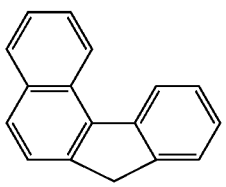

97

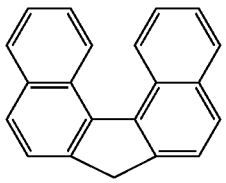

98

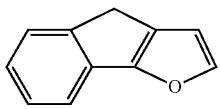

99

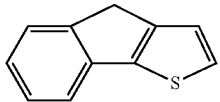

100

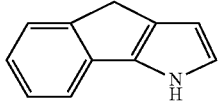

From the viewpoint of any one of or both of the electron acceptability and the hole acceptability of the ionic polymer, the divalent aromatic group represented by $Ar^5$ is preferably a divalent group remaining after eliminating two hydrogen atoms from a ring represented by Formula 45 to Formula 60, Formula 61 to Formula 71, Formula 77 to Formula 80, Formula 91, Formula 92, Formula 93, or Formula 96, more preferably a divalent group remaining after eliminating two hydrogen atoms from a ring represented by Formula 45 to Formula 50, Formula 59, Formula 60, Formula 77, Formula 80, Formula 91, Formula 92, or Formula 96.

The divalent aromatic group may have a substituent. The substituent may be the same substituent as the substituent included in the description with respect to $Q^1$.

The divalent aromatic amine residue represented by $Ar^5$ in Formula (33) may be groups of Formula (34).

[Chemical Formula 48]

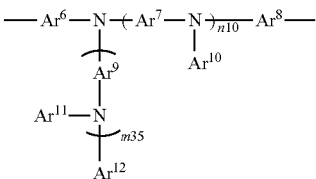

(34)

(In Formula (34), $Ar^6$, $Ar^7$, $Ar^8$, and $Ar^9$ each independently represent an arylene group optionally having a substituent or a divalent heterocyclic group optionally having a substituent; $Ar^{10}$, $Ar^{11}$, and $Ar^{12}$ each independently represent an aryl group optionally having a substituent or a monovalent heterocyclic group optionally having a substituent; and n10 and m35 each independently represent 0 or 1.)

The substituent that the arylene group, the aryl group, the divalent heterocyclic group, or the monovalent heterocyclic group may have may be a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amido group, an acid imido group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, and a carboxyl group. The substituent may be also a crosslinkable group such as a vinyl group, an acetylene group, a butenyl group, an acryl group, an arcylate group, an arcylamido group, a methacryl group, a metharcylate group, a metharcylamido group, a vinyl ether group, a vinylamino group, a silanol group, a group having a small ring (such as a cyclopropyl group, a cyclobutyl group, an epoxy group, an oxetane group, a diketene group, and an episulfide group), a lactone group, a lactam group, or a group containing a structure of a siloxane derivative.

When n10 is 0, a carbon atom in $Ar^6$ and a carbon atom in $Ar^8$ may be bonded with each other either directly or through a divalent group such as —O—, —S— and the like.

The aryl group and the monovalent heterocyclic group represented by $Ar^{10}$, $Ar^{11}$, and $Ar^{12}$ are the same as the aryl group and the monovalent heterocyclic group described and included above as the substituent.

The arylene group represented by $Ar^6$, $Ar^7$, $Ar^8$, and $Ar^9$ may be an atomic group remaining after eliminating two hydrogen atoms bonded to a carbon atom making-up an aromatic ring from an aromatic hydrocarbon and the arylene group may be a group having a benzene ring, a group having a fused ring, or a group in which two or more independent benzene rings or fused rings are bonded with each other through a single bond or a divalent organic group, for example, an alkenylene group such as a vinylene group. The arylene group has a number of carbon atoms of usually 6 to 60, preferably 7 to 48. Specific examples of the arylene group may be a phenylene group, a biphenylene group, a $C_{1-17}$ alkoxyphenylene group, a $C_{1-17}$ alkylphenylene group, a 1-naphthylene group, a 2-naphthylene group, a 1-anthrylene group, a 2-anthrylene group, or a 9-anthrylene group. The hydrogen atom in the arylene group may be substituted with a fluorine atom. The relevant fluorine atom-substituted arylene group may be a tetrafluorophenylene group. Among the arylene groups, a phenylene group, a biphenylene group, a $C_{1-12}$ alkoxyphenylene group, and a $C_{1-12}$ alkylphenylene group are preferred.

The divalent heterocyclic group represented by $Ar^6$, $Ar^7$, $Ar^8$, and $Ar^9$ may be an atomic group remaining after eliminating two hydrogen atoms from a heterocyclic compound. Here, the heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element making-up the ring, among organic compounds having a cyclic structure. The divalent heterocyclic group may have a substituent. The divalent heterocyclic group has a number of carbon atoms of usually 4 to 60, preferably 4 to 20. Here, the number of carbon atoms of the divalent heterocyclic group does not include the number of carbon atoms of the substituent. Examples of such a divalent heterocyclic group may include a thiophenediyl group, a $C_{1-12}$ alkylthiophenediyl group, a pyrrolediyl group, a furandiyl group, a pyridinediyl group, a $C_{1-12}$ alkylpyridinediyl group, a pyridazinediyl group, a pyrimidinediyl group, a pyrazinediyl group, a triazinediyl group, a pyrrolidinediyl group, a piperidinediyl group, a quinolinediyl group, and an isoquinolinediyl group, and among them, a thiophenediyl group, a $C_{1-12}$ alkylthiophenediyl group, a pyridinediyl group, and a $C_{1-12}$ alkylpyridinediyl group are more preferred.

The ionic polymer containing a divalent aromatic amine residue as a structural unit may further have other structural units. The other structural unit may be an arylene group such as a phenylene group and a fluorenediyl group. Among these ionic polymers, those containing a crosslinkable group are preferred.

The divalent aromatic amine residue represented by Formula (34) may be a group remaining after eliminating two hydrogen atoms from an aromatic amine represented by Formula 101 to Formula 110 below.

[Chemical Formula 49]

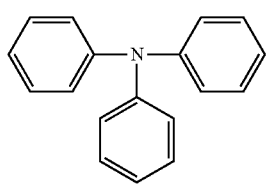
101

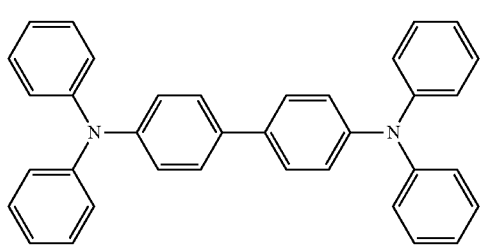
102

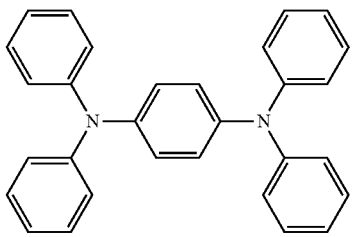
103

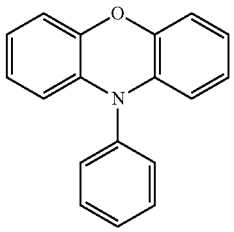
104

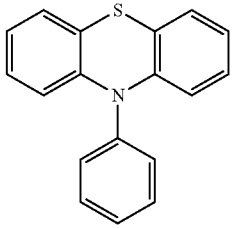
105

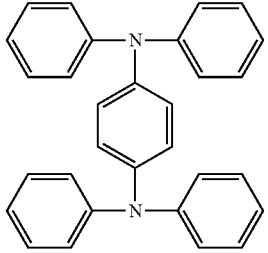
106

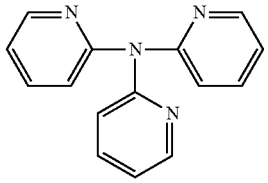
107

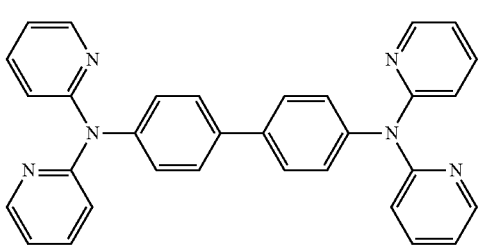
108

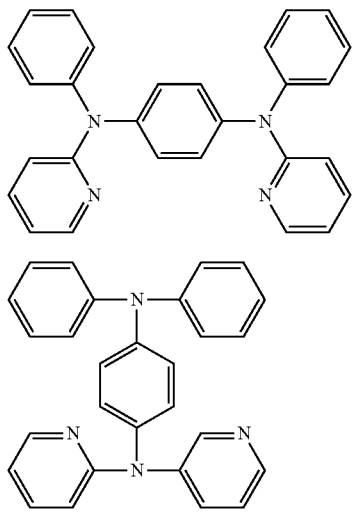

109

110

The aromatic amine represented by Formula 101 to Formula 110 may have a substituent so long as the aromatic amine can generate a divalent aromatic amine residue and the substituent may be the same substituent as the substituent included in the above description with respect to $Q^1$. When the substituent exists is plurally present, the substituents may be the same as or different from each other.

In Formula (33), X' represents an imino group optionally having a substituent, a silylene group optionally having a substituent, an ethenylene group optionally having a substituent, or an ethynylene group. The substituent that the imino group, the silyl group, or the ethenylene group may have may be: an alkyl group having 1 to 20 carbon atoms such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a 2-ethylhexyl group, a nonyl group, a decyl group, a 3,7-dimethyloctyl group, and a lauryl group; or an aryl group having 6 to 30 carbon atoms such as a phenyl group, a 1-naphthyl group, a 2-naphthyl group, a 1-anthryl group, a 2-anthryl group, and a 9-anthryl group, and when the substituent is plurally present, the substituents may be the same as or different from each other.

From the viewpoint of the stability of the ionic polymer relative to air, moisture, or heat, X' is preferably an imino group, an ethenylene group, or an ethynylene group.

From the viewpoint of the electron acceptability and the hole acceptability of the ionic polymer, it is preferred that m33 is 1 and m34 is 0.

The structural unit represented by Formula (33) is, from the viewpoint of the electron acceptability of the ionic polymer, preferably a structural unit represented by Formula (35).
[Chemical Formula 50]

$$\pm Ar^{13}\pm \qquad (35)$$

(In Formula (35), $Ar^{13}$ represents a pyridinediyl group optionally having a substituent, a pyrazinediyl group optionally having a substituent, a pyrimidinediyl group optionally having a substituent, a pyridazinediyl group optionally having a substituent, or a triazinediyl group optionally having a substituent.)

The substituent that a pyridinediyl group may have may be the same substituent as the substituent included in the above description with respect to $Q^1$. When the substituent is plurally present, the substituents may be the same as or different from each other.

The substituent that a pyrazinediyl group may have may be the same substituent as the substituent included in the above description with respect to $Q^1$. When the substituent is plurally present, the substituents may be the same as or different from each other.

The substituent that a pyrimidinediyl group may have may be the same substituent as the substituent included in the above description with respect to $Q^1$. When the substituent is plurally present, the substituents may be the same as or different from each other.

The substituent that a pyridazinediyl group may have may be the same substituent as the substituent included in the above description with respect to $Q^1$. When the substituent is plurally present, the substituents may be the same as or different from each other.

The substituent that a triazinediyl group may have may be the same substituent as the substituent included in the above description with respect to $Q^1$. When the substituent is plurally present, the substituents may be the same as or different from each other.

Ratio of Structural Unit

The ratio of the total of the structural unit represented by Formula (13), the structural unit represented by Formula (15), the structural unit represented by Formula (17), and the structural unit represented by Formula (20) that are contained in the ionic polymer used in the present invention is, from the viewpoint of the light-emitting efficacy of the organic EL element, more preferably 30 to 100% by mole, based on the number of moles of all structural units contained in the ionic polymer excluding the terminal structural units.

Terminal Structural Unit

Examples of the terminal structural unit (terminal group) of the ionic polymer used in the present invention may include a hydrogen atom, a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, a lauryl group, a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, a laurylthio group, a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_{1-12}$ alkoxyphenyl)amino group, a di($C_{1-12}$ alkoxyphenyl)amino group, a di($C_{1-12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_{1-12}$ alkyl)amino group, a ($C_{1-12}$ alkoxyphenyl-$C_{1-12}$ alkyl)amino group, a ($C_{1-12}$ alkylphenyl-$C_{1-12}$ alkyl)amino group, a di($C_{1-12}$ alkoxyphenyl-$C_{1-12}$ alkyl)amino group, a di($C_{1-12}$ alkylphenyl-$C_{1-12}$ alkyl)amino group, a 1-naphthyl-$C_{1-12}$ alkylamino group, a 2-naphthyl-$C_{1-12}$ alkylamino group, a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_{1-12}$ alkyl)silyl group, a ($C_{1-12}$ alkoxyphenyl-$C_{1-12}$ alkyl)silyl group, a ($C_{1-12}$ alkylphenyl-$C_{1-12}$ alkyl)silyl group, a (1-naphthyl-$C_{1-12}$ alkyl)silyl group, a (2-naphthyl-$C_{1-12}$ alkyl)silyl group, a (phenyl-$C_{1-12}$ alkyl)dimethylsilyl group, a triphenylsilyl group, a tri(p-xylyl)silyl group, a tribenzylsilyl group, a diphenylmethylsilyl group, a tert-butyldiphenylsilyl group, a dimethylphenylsilyl group, a thienyl group, a $C_{1-12}$ alkylthienyl group, a pyrrolyl group, a furyl group, a pyridyl group, a $C_{1-12}$ alkylpyridyl group, a pyridazinyl group, a pyrimidyl group, a pyrazinyl group, a triazinyl group, a pyrrolidyl group, a piperidyl group, a quinolyl group, an isoquinolyl group, a hydroxy group, a mercapto group, a fluorine atom, a chlorine atom, a bromine atom, and an iodine atom. When the terminal structural unit is plurally present, the terminal structural units may be the same as or different from each other.

Characteristics of Ionic Polymer

The ionic polymer used in the present invention is preferably a conjugated compound. That the ionic polymer used in the present invention is a conjugated compound means that the ionic polymer contains in the main chain thereof, a region in which multiple bonds (such as double bond, triple bond) or non-covalent electron pairs that a nitrogen atom, an oxygen atom, or the like has are linked through one single bond. When the ionic polymer is a conjugated compound, from the viewpoint of the electron transport characteristic of the conjugated compound, the ionic polymer has a ratio calculated by a formula of (the number of atoms on the main chain contained in the region in which multiple bonds or non-covalent electron pairs that a nitrogen atom, an oxygen atom, or the like has are linked through one single bond)/(the number of all atoms on the backbone)}×100% of preferably 50% or more, more preferably 60% or more, more preferably 70% or more, more preferably 80% or more, further preferably 90% or more.

The ionic polymer used in the present invention is preferably a macromolecular compound, more preferably a conjugated macromolecular compound. Here, the macromolecular compound refers to a compound having a number average molecular weight in terms of polystyrene of $1\times10^3$ or more. That the ionic polymer used in the present invention is a conjugated macromolecular compound means that the ionic polymer is a conjugated compound and also a macromolecular compound.

From the viewpoint of the film formation characteristic by coating of the ionic polymer used in the present invention, the ionic polymer has a number average molecular weight in terms of polystyrene of preferably $1\times10^3$ to $1\times10^8$, more preferably $2\times10^3$ to $1\times10^7$, more preferably $3\times10^3$ to $1\times10^7$, further preferably $5\times10^3$ to $1\times10^7$. From the viewpoint of the purity of the ionic polymer, the ionic polymer has a weight average molecular weight in terms of polystyrene of preferably $1\times10^3$ to $5\times10^7$, more preferably $1\times10^3$ to $1\times10^7$, further preferably $1\times10^3$ to $5\times10^6$. From the viewpoint of the solubility of the ionic polymer, the ionic polymer has a number average molecular weight in terms of polystyrene of preferably $1\times10^3$ to $5\times10^5$, more preferably $1\times10^3$ to $5\times10^4$, further preferably $1\times10^3$ to $3\times10^3$. The number average molecular weight and the weight average molecular weight in terms of polystyrene of the ionic polymer used in the present invention can be measured, for example, using gel permeation chromatography (GPC).

From the viewpoint of the purity of the ionic polymer used in the present invention, the number (that is a polymerization degree) of all structural units contained in the ionic polymer excluding the terminal structural unit is preferably 1 or more and 20 or less, more preferably 1 or more and 10 or less, further preferably 1 or more and 5 or less.

From the viewpoint of the electron acceptability and the hole acceptability of the ionic polymer used in the present invention, the ionic polymer has an orbital energy of the lowest unoccupied molecular orbital (LUMO) of preferably −5.0 eV or more and −2.0 eV or less, more preferably −4.5 eV or more and −2.0 eV or less. From the same viewpoint, the ionic polymer has an orbital energy of the highest occupied molecular orbital (HOMO) of preferably −6.0 eV or more and −3.0 eV or less, more preferably −5.5 eV or more and −3.0 eV or less, provided that the orbital energy of HOMO is lower than the orbital energy of LUMO. The orbital energy of the highest occupied molecular orbital (HOMO) of the ionic polymer is obtained by measuring the ionization potential of the ionic polymer as the orbital energy of HOMO. On the other hand, the orbital energy of the lowest unoccupied molecular orbital (LUMO) of the ionic polymer is obtained by measuring the energy difference between HOMO and LUMO and by calculating the sum of the energy difference and the above measured ionization potential as the orbital energy of LUMO. For measuring the ionization potential, a photoelectronic spectrophotometer is used. The energy difference between HOMO and LUMO is obtained from an absorption terminal of an absorption spectrum of the ionic polymer measured using an ultraviolet-visible-near infrared spectrophotometer.

When the polymer used in the present invention is used for an electric field light-emitting element, the polymer is preferably substantially non-luminescent. Here, that a polymer is substantially non-luminescent means as follows. First, an electric field light-emitting element A having a polymer-containing layer is prepared. An electric field light-emitting element 2 having no polymer-containing layer is also prepared. The electric field light-emitting element A and the electric field light-emitting element 2 are different from each other only in terms that although the electric field light-emitting element A has a polymer-containing layer, the electric field light-emitting element 2 has no polymer-containing layer. Next, to the electric field light-emitting element A and the electric field light-emitting element 2, a forward direction voltage is applied to measure a light-emitting spectrum. A wavelength λ giving a maximum peak in the light-emitting spectrum obtained with respect to the electric field light-emitting element 2, is measured. While assuming the light-emitting strength at the wavelength λ, as 1, the light-emitting spectrum obtained with respect to the electric field light-emitting element 2 is normalized and is integrated relative to the wavelength to calculate a normalized light-emitting amount $S_0$. While assuming the light-emitting strength at the wavelength λ as 1, also the light-emitting spectrum obtained with respect to the electric field light-emitting element A is normalized and is integrated relative to the wavelength to calculate a normalized light-emitting amount S. When the value calculated by a formula of $(S-S_0)/S_0 \times 100\%$ is 30% or less, that is, when an increment of the normalized light-emitting amount of the electric field light-emitting element A having a polymer-containing layer from the normalized light-emitting amount of the electric field light-emitting element 2 having no polymer-containing layer is 30% or less, the used polymer is regarded as substantially non-luminescent. The value calculated by a formula of $(S-S_0)/S_0 \times 100$ is preferably 15% or less, more preferably 10% or less.

Examples of the ionic polymer containing the group represented by Formula (1) and the group represented by Formula (3) may include: an ionic polymer consisting of a group represented by Formula (23) alone; an ionic polymer consisting of a group represented by Formula (23) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (24) alone; an ionic polymer consisting of a group represented by Formula (24) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (25) alone; an ionic polymer consisting of a group represented by Formula (25) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (29) alone; an ionic polymer consisting of a group represented by Formula (29) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (30) alone; and an ionic polymer consisting of a group represented by Formula (30) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110.

The ionic polymer containing a group represented by Formula (1) and a group represented by Formula (3) may be the macromolecular compounds below. Among these macromolecular compounds, in macromolecular compounds represented by a formula in which two types of structural unit are delimited by the slash "/", the ratio of the left structural unit is p % by mole and the ratio of the right structural unit is (100–p) % by mole, and these structural units are arranged at random. In the formulae below, n represents the degree of polymerization.

[Chemical Formula 51]

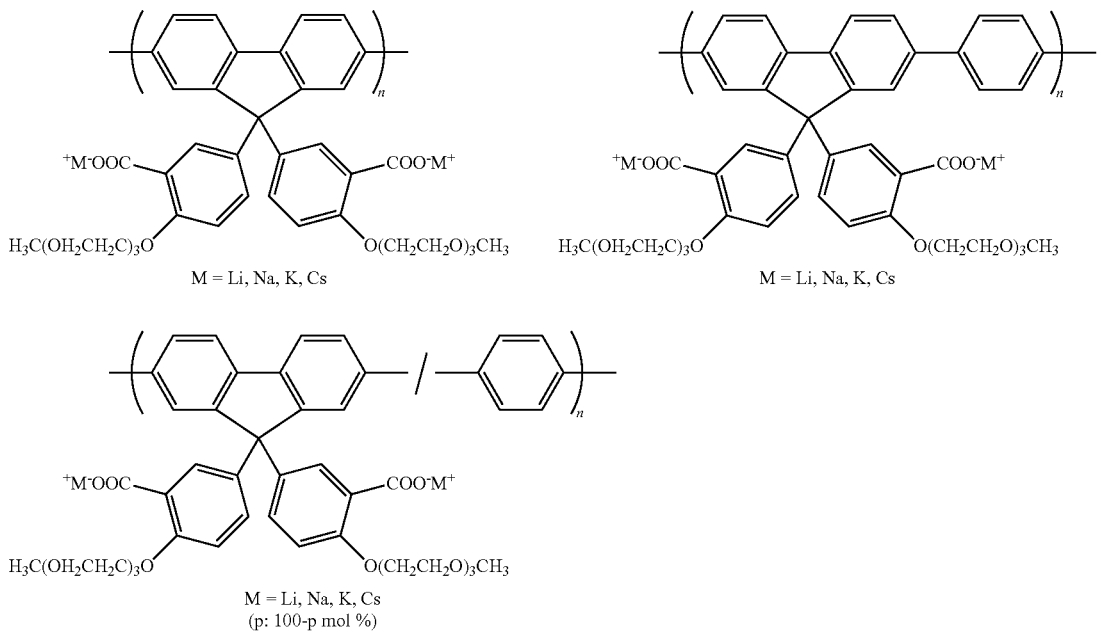

-continued
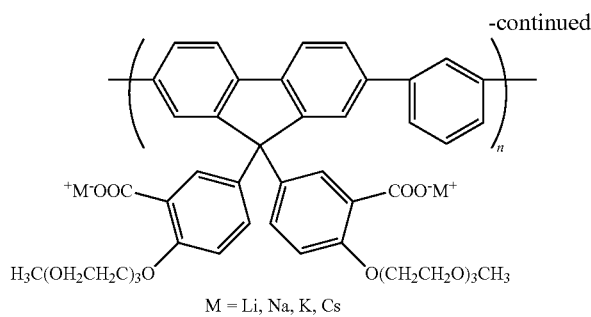
M = Li, Na, K, Cs
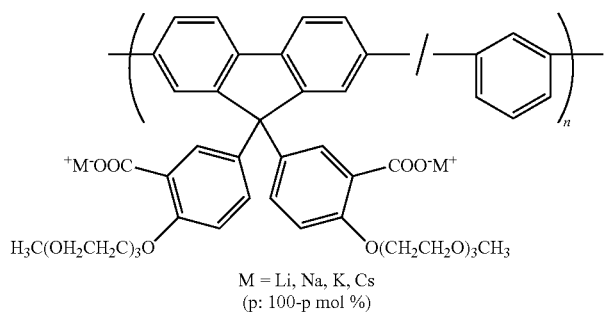
M = Li, Na, K, Cs
(p: 100-p mol %)
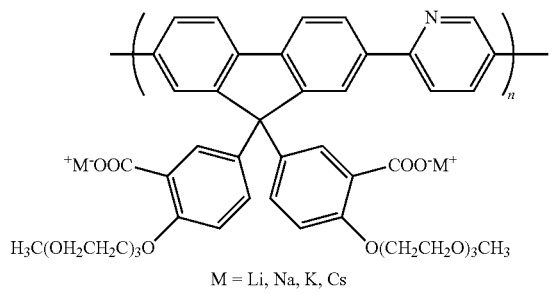
M = Li, Na, K, Cs
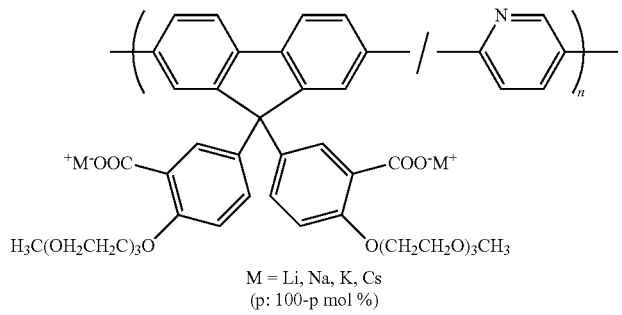
M = Li, Na, K, Cs
(p: 100-p mol %)
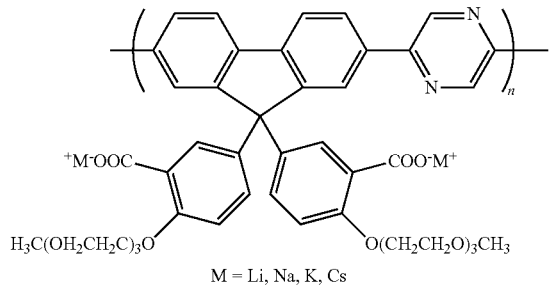
M = Li, Na, K, Cs -continued
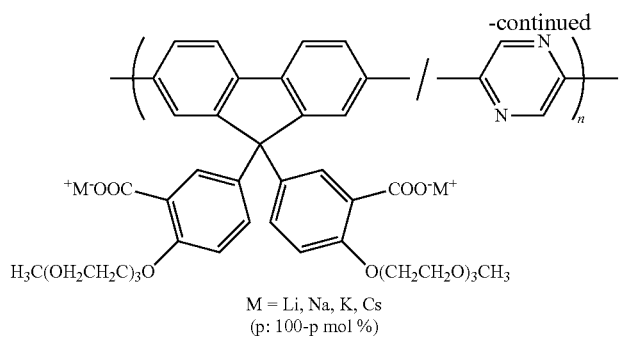
M = Li, Na, K, Cs
(p: 100-p mol %)
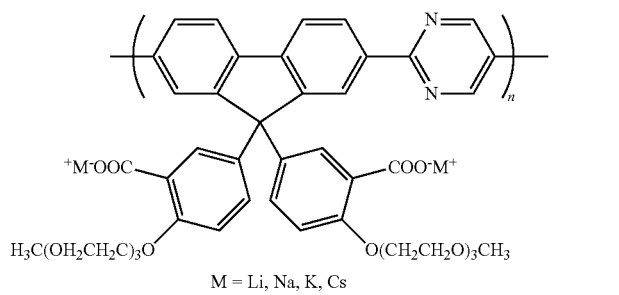
M = Li, Na, K, Cs
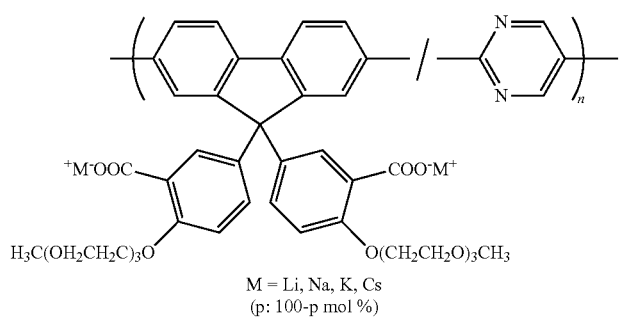
M = Li, Na, K, Cs
(p: 100-p mol %)
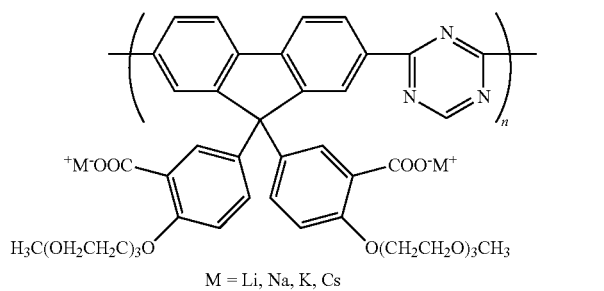
M = Li, Na, K, Cs
[Chemical Formula 52]
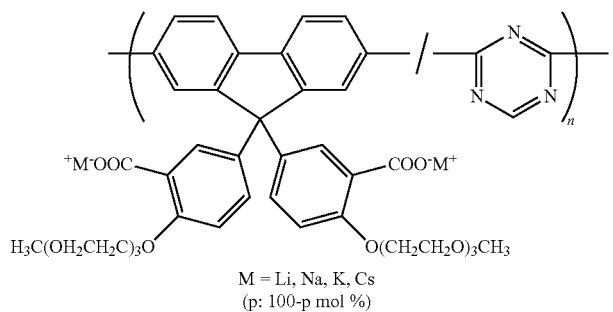
M = Li, Na, K, Cs
(p: 100-p mol %)

-continued
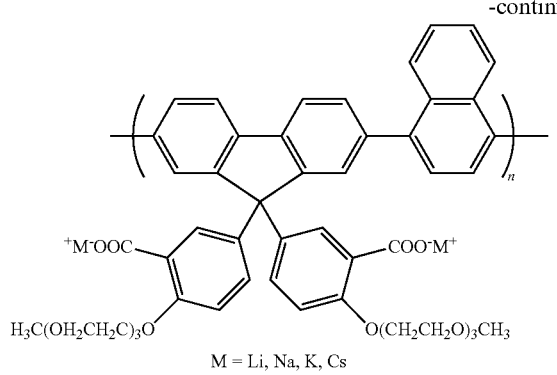
M = Li, Na, K, Cs
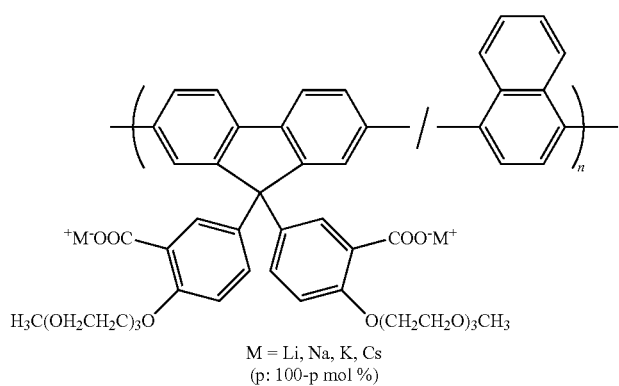
M = Li, Na, K, Cs
(p: 100-p mol %)
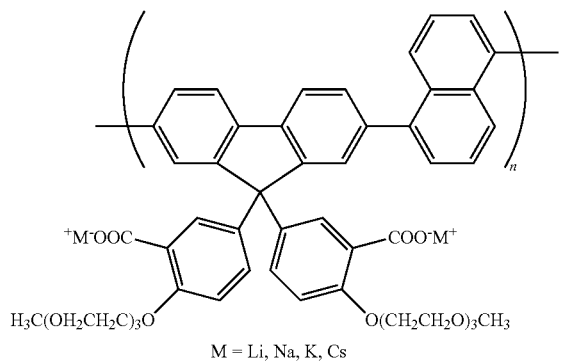
M = Li, Na, K, Cs
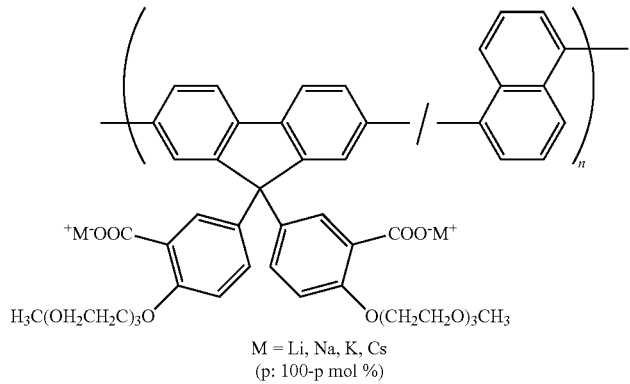
M = Li, Na, K, Cs
(p: 100-p mol %)

-continued
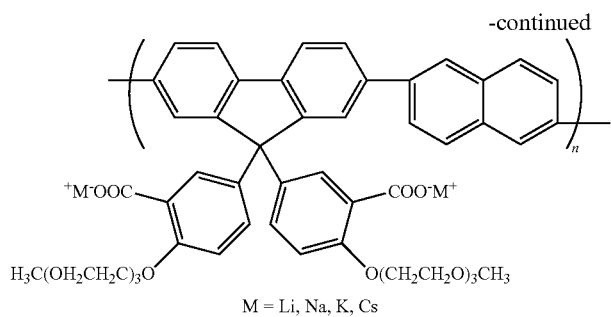
M = Li, Na, K, Cs
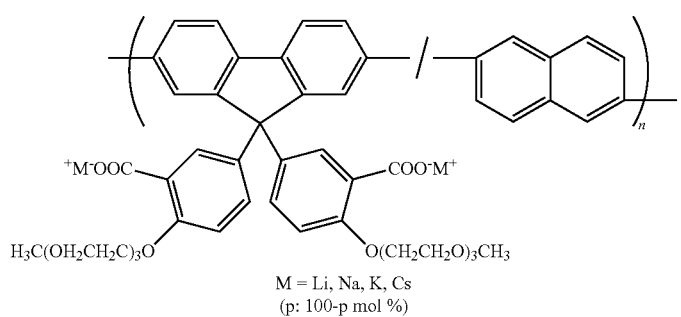
M = Li, Na, K, Cs
(p: 100-p mol %)
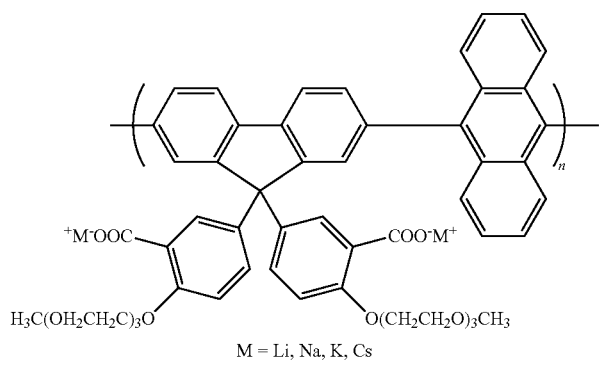
M = Li, Na, K, Cs
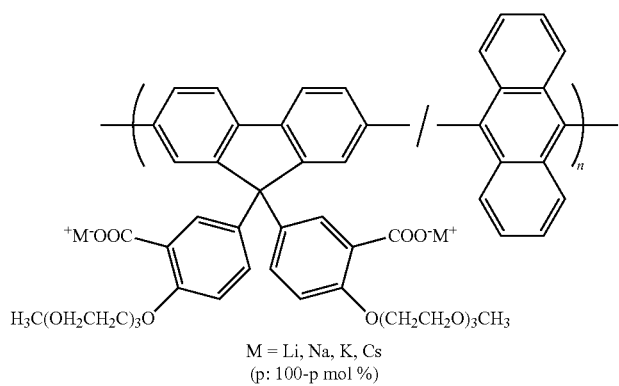
M = Li, Na, K, Cs
(p: 100-p mol %)

-continued
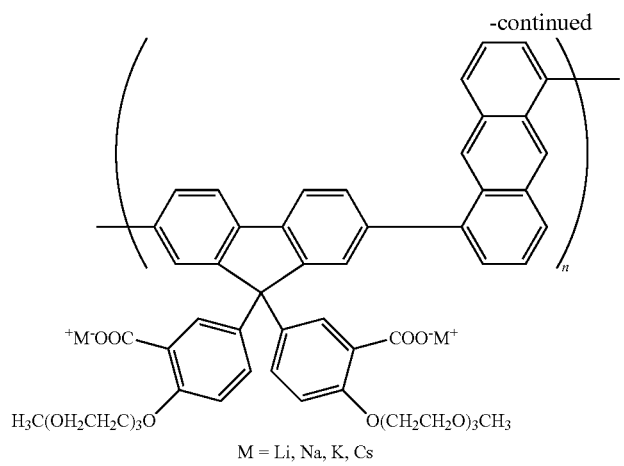
M = Li, Na, K, Cs
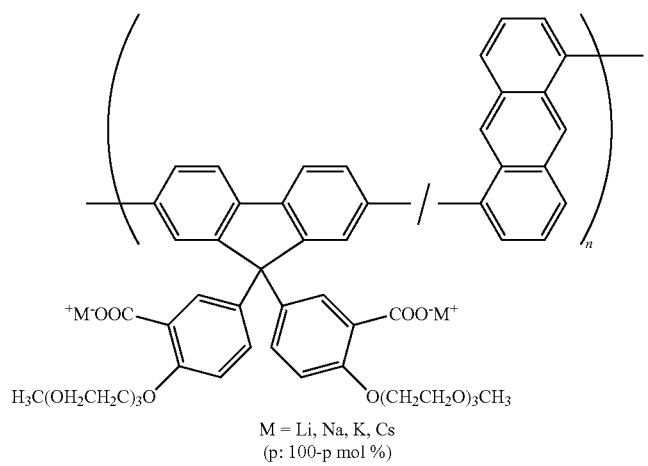
M = Li, Na, K, Cs
(p: 100-p mol %)
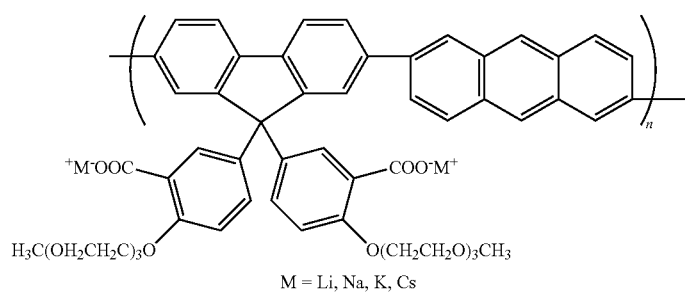
M = Li, Na, K, Cs
[Chemical Formula 53]
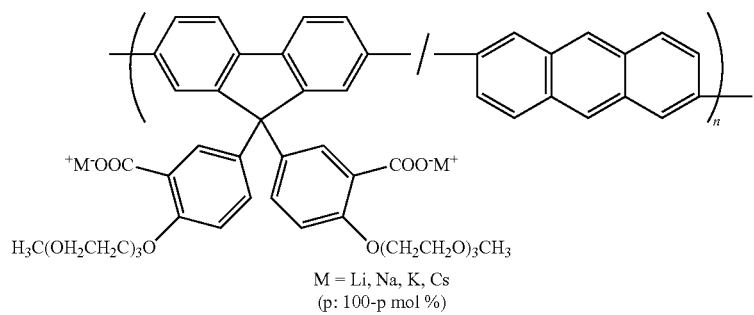
M = Li, Na, K, Cs
(p: 100-p mol %)

-continued
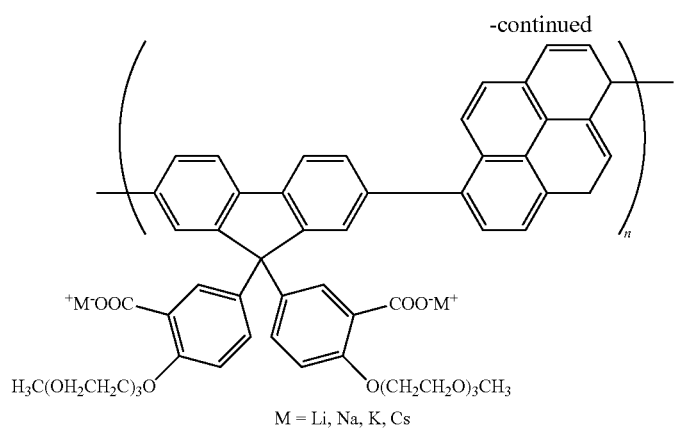
M = Li, Na, K, Cs
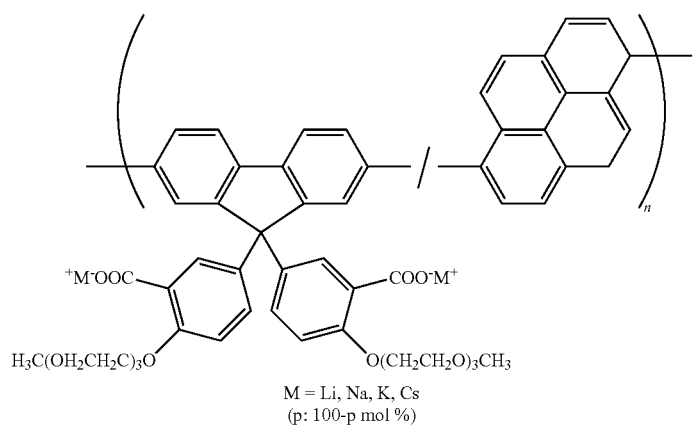
M = Li, Na, K, Cs
(p: 100-p mol %)
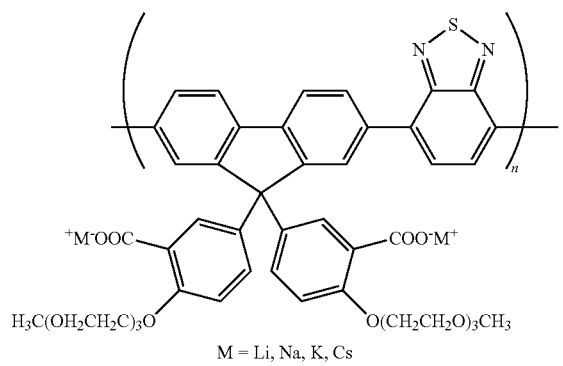
M = Li, Na, K, Cs
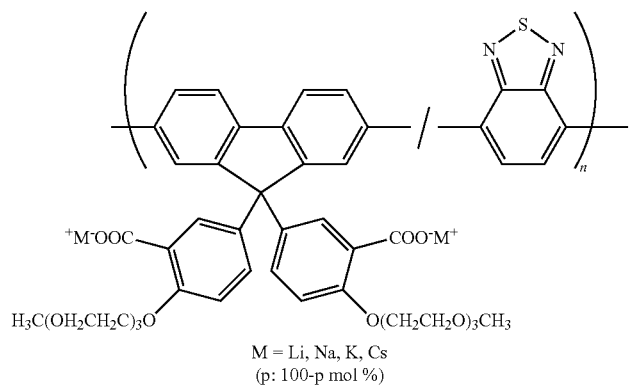
M = Li, Na, K, Cs
(p: 100-p mol %)

-continued
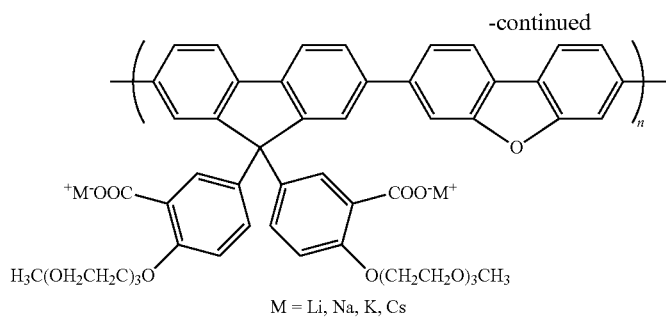
M = Li, Na, K, Cs
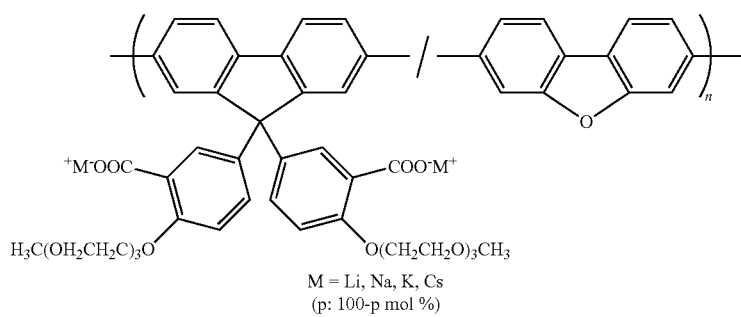
M = Li, Na, K, Cs
(p: 100-p mol %)
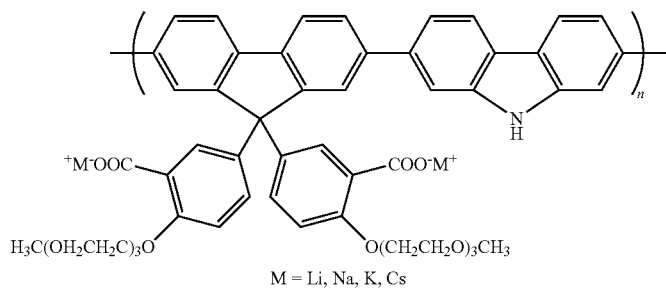
M = Li, Na, K, Cs
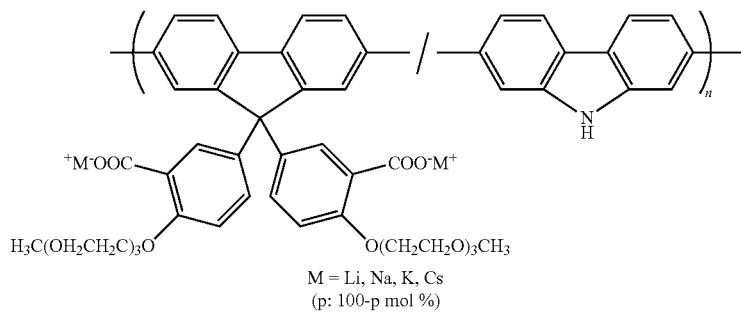
M = Li, Na, K, Cs
(p: 100-p mol %)
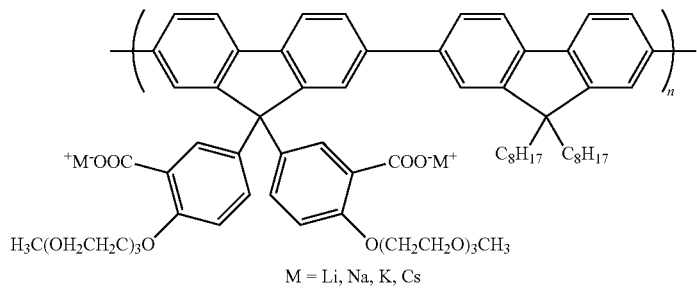
M = Li, Na, K, Cs -continued
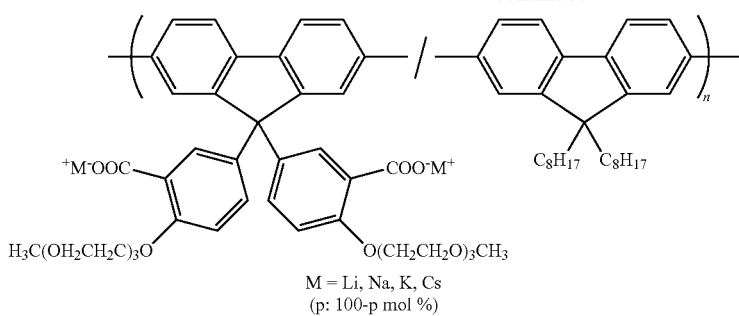
M = Li, Na, K, Cs
(p: 100-p mol %)
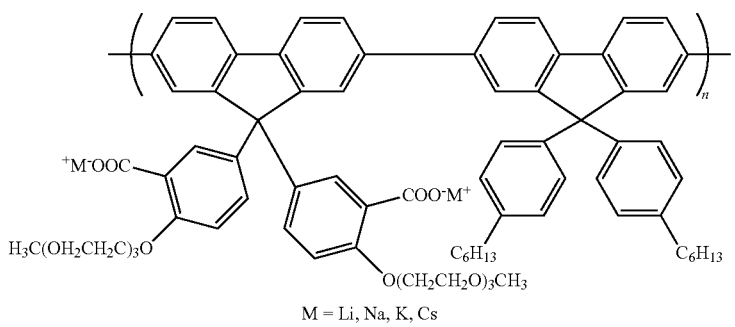
M = Li, Na, K, Cs
[Chemical Formula 54]
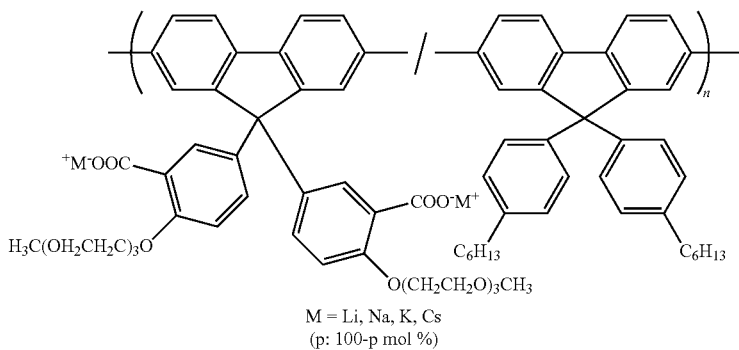
M = Li, Na, K, Cs
(p: 100-p mol %)
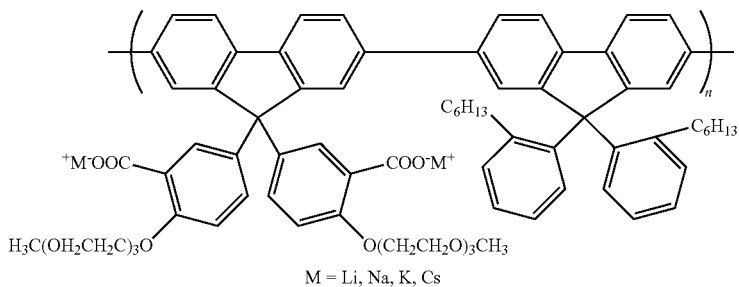
M = Li, Na, K, Cs
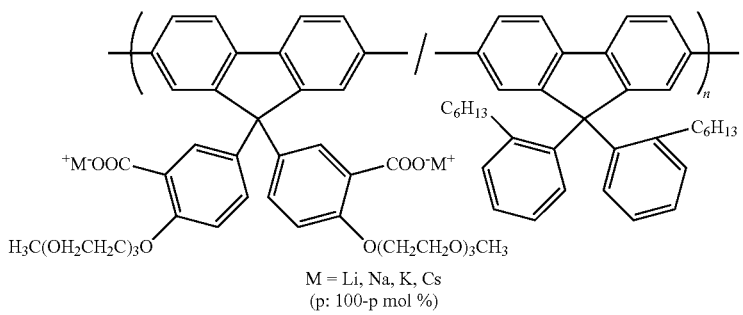
M = Li, Na, K, Cs
(p: 100-p mol %)

-continued
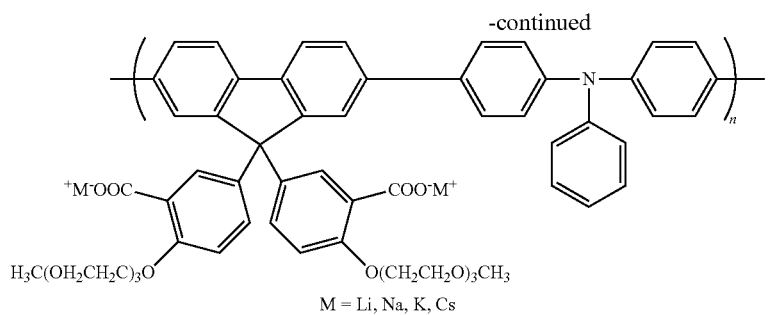
M = Li, Na, K, Cs
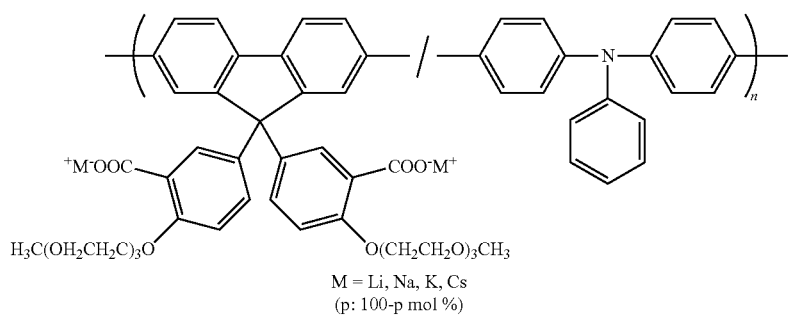
M = Li, Na, K, Cs
(p: 100-p mol %)
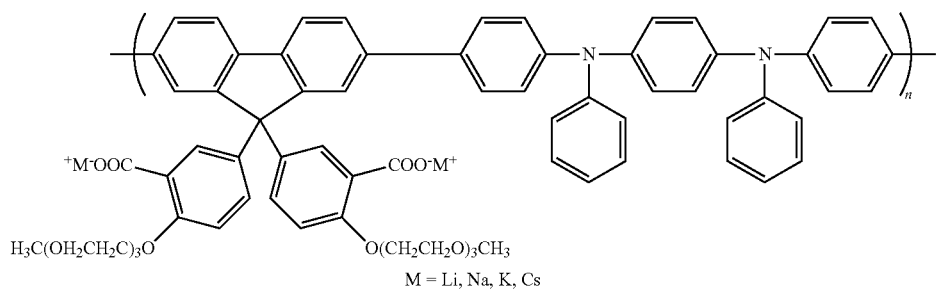
M = Li, Na, K, Cs
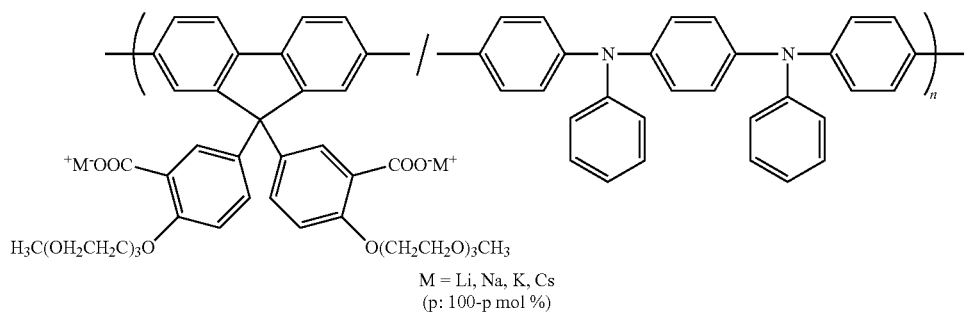
M = Li, Na, K, Cs
(p: 100-p mol %)
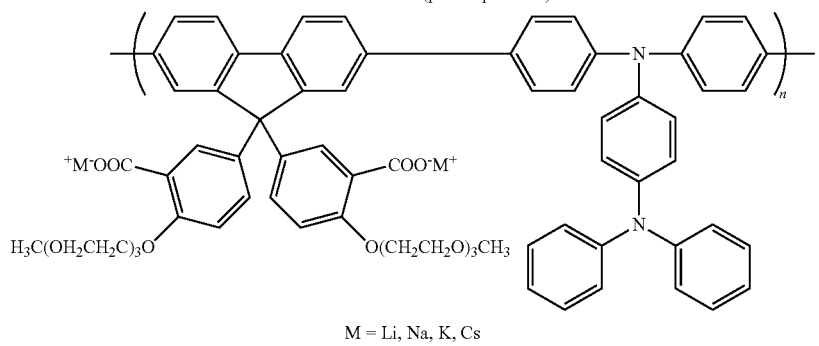
M = Li, Na, K, Cs

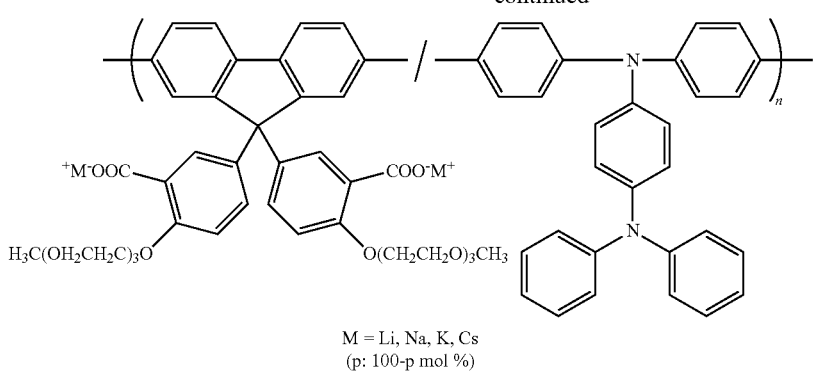
M = Li, Na, K, Cs
(p: 100-p mol %)
[Chemical Formula 55]
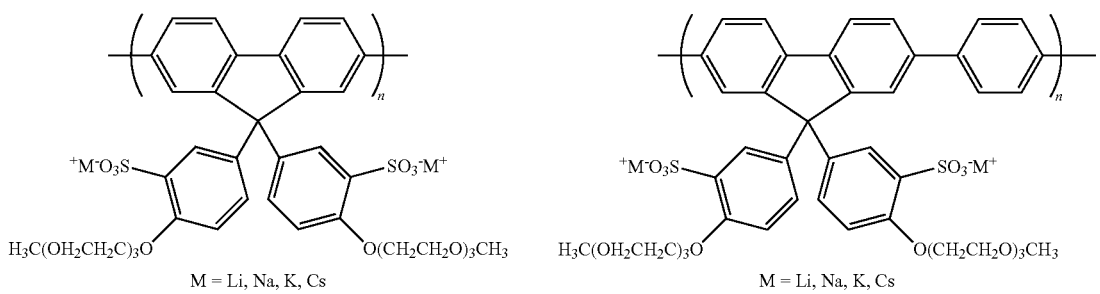
M = Li, Na, K, Cs          M = Li, Na, K, Cs
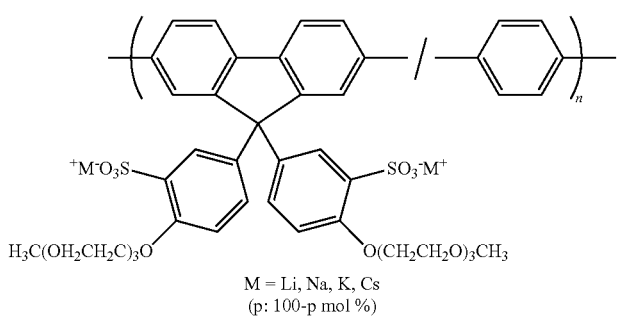
M = Li, Na, K, Cs
(p: 100-p mol %)
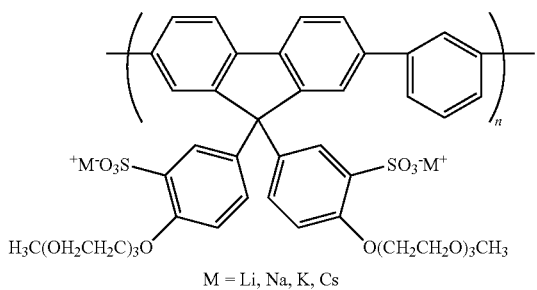
M = Li, Na, K, Cs
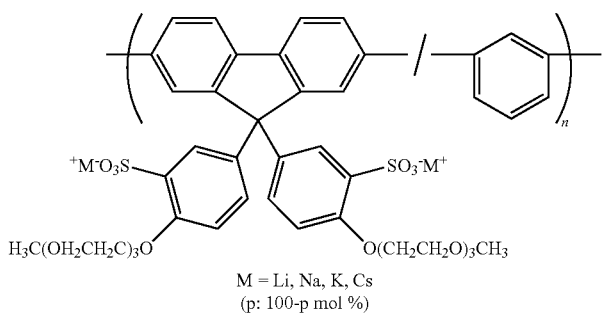
M = Li, Na, K, Cs
(p: 100-p mol %)

-continued
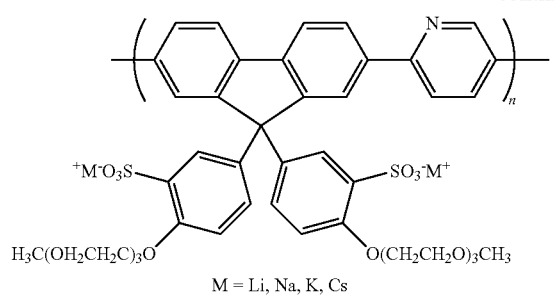
M = Li, Na, K, Cs
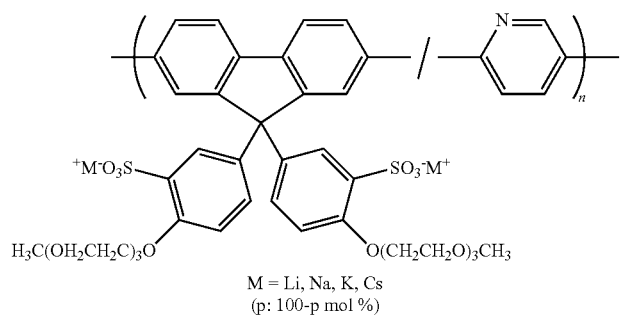
M = Li, Na, K, Cs
(p: 100-p mol %)
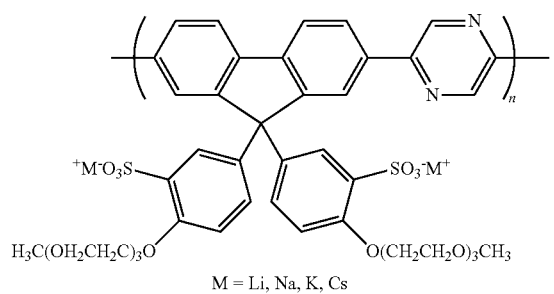
M = Li, Na, K, Cs
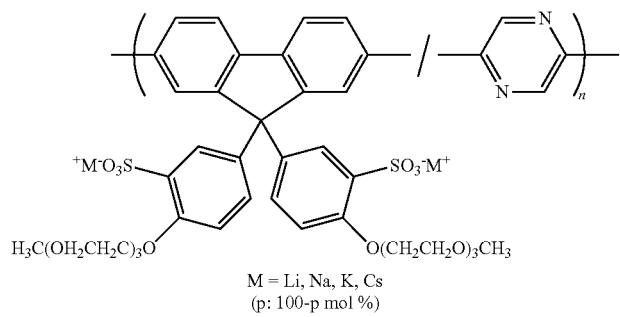
M = Li, Na, K, Cs
(p: 100-p mol %)
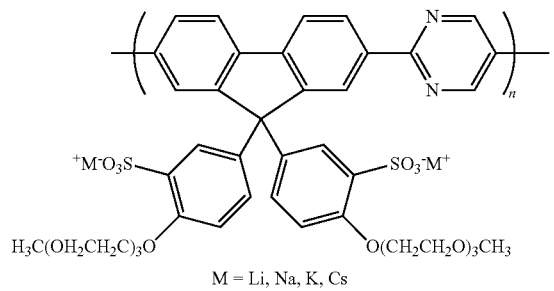
M = Li, Na, K, Cs -continued
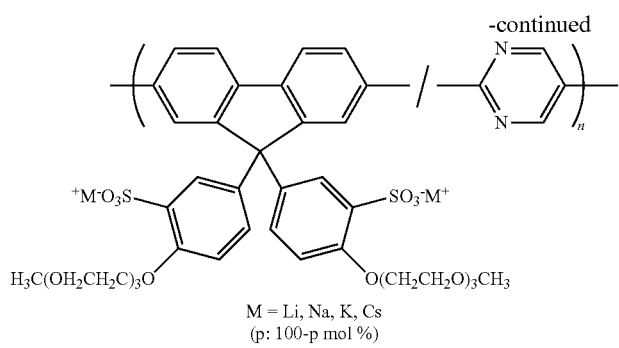
M = Li, Na, K, Cs
(p: 100-p mol %)
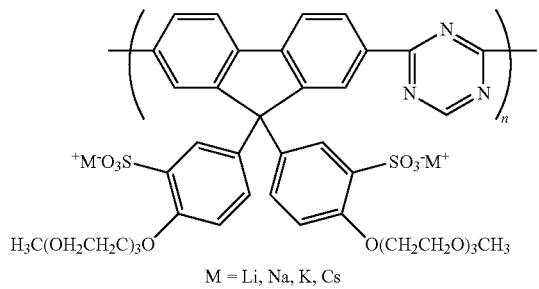
M = Li, Na, K, Cs
[Chemical Formula 56]
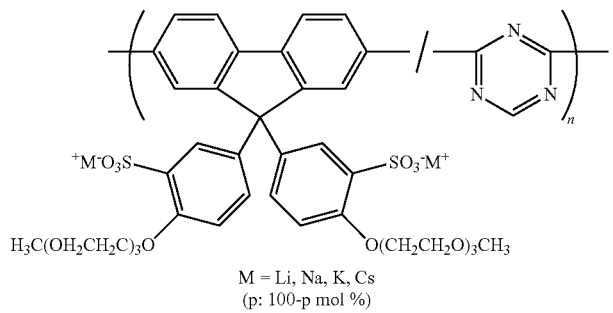
M = Li, Na, K, Cs
(p: 100-p mol %)
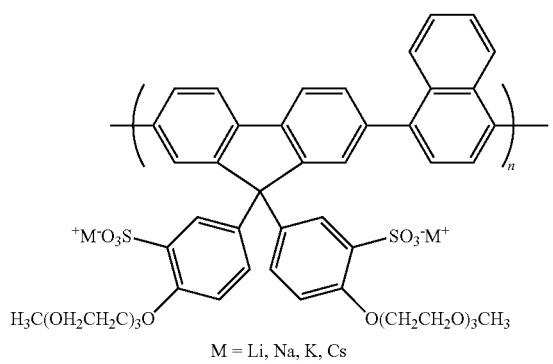
M = Li, Na, K, Cs
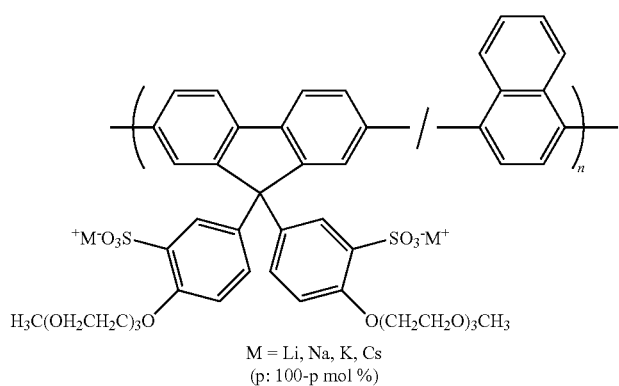
M = Li, Na, K, Cs
(p: 100-p mol %)

-continued
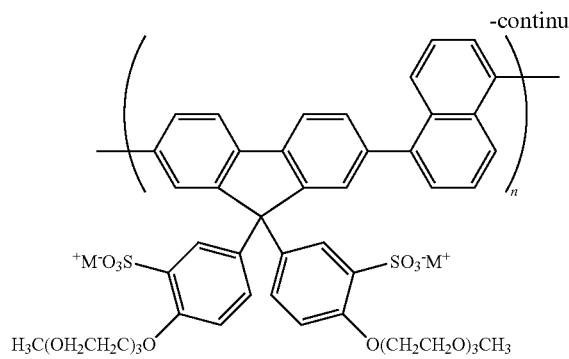
M = Li, Na, K, Cs
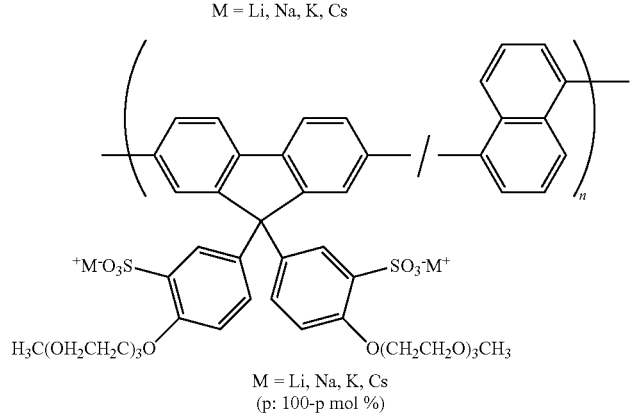
M = Li, Na, K, Cs
(p: 100-p mol %)
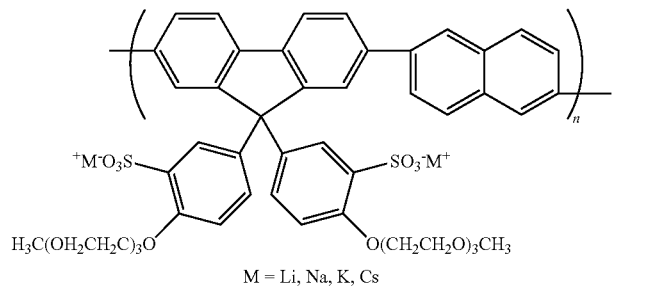
M = Li, Na, K, Cs
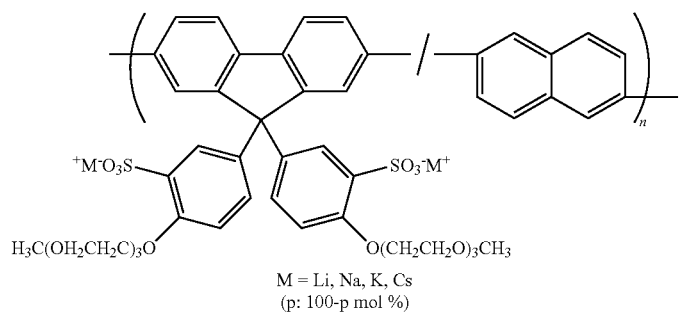
M = Li, Na, K, Cs
(p: 100-p mol %)
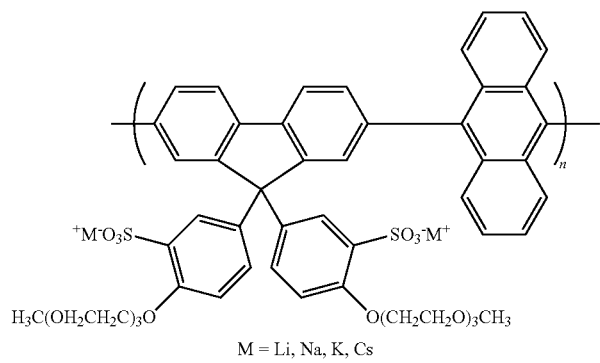
M = Li, Na, K, Cs -continued
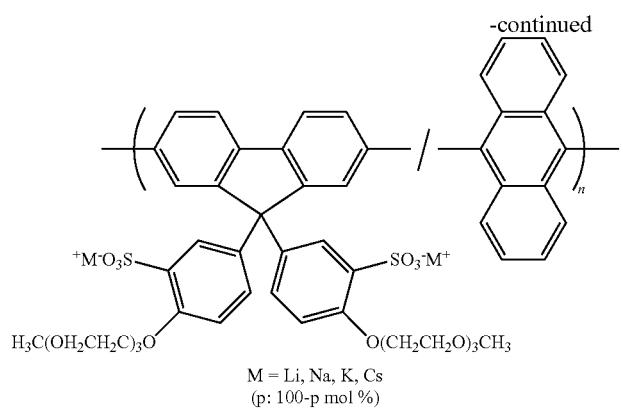
M = Li, Na, K, Cs
(p: 100-p mol %)
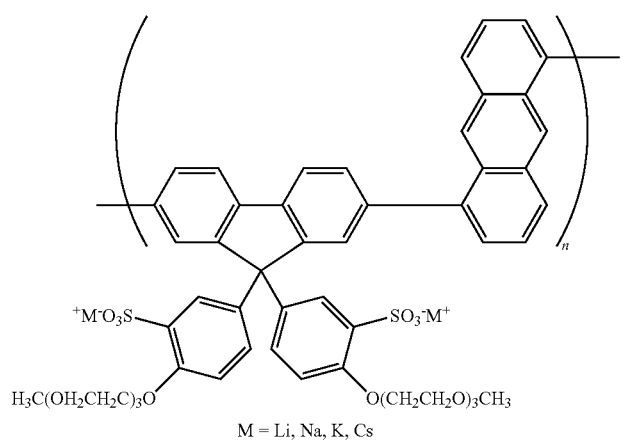
M = Li, Na, K, Cs
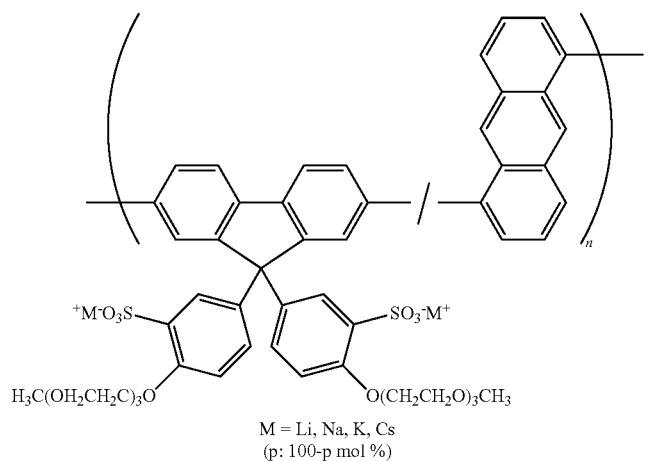
M = Li, Na, K, Cs
(p: 100-p mol %)
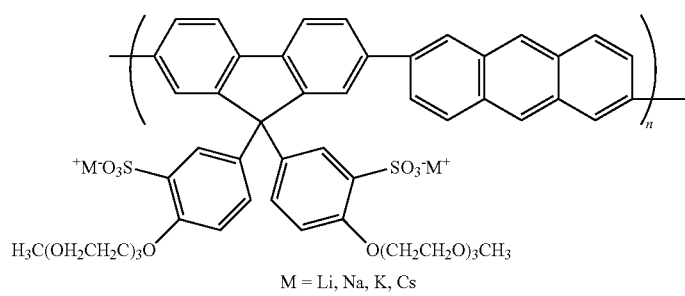
M = Li, Na, K, Cs -continued
[Chemical Formula 57]
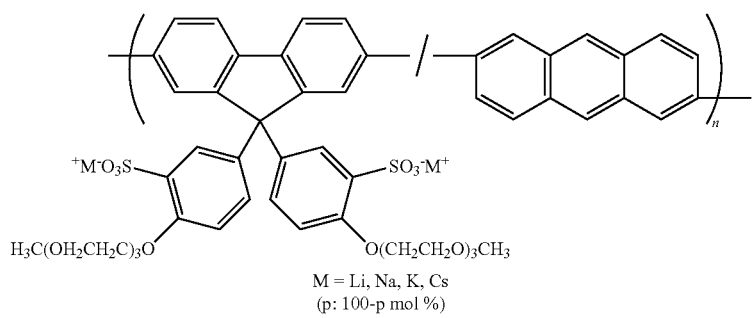
M = Li, Na, K, Cs
(p: 100-p mol %)
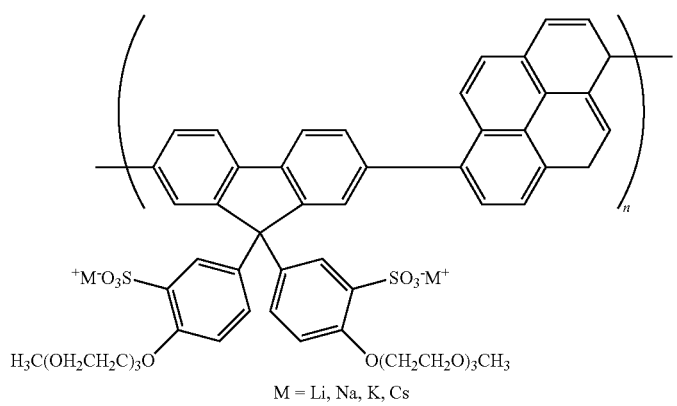
M = Li, Na, K, Cs
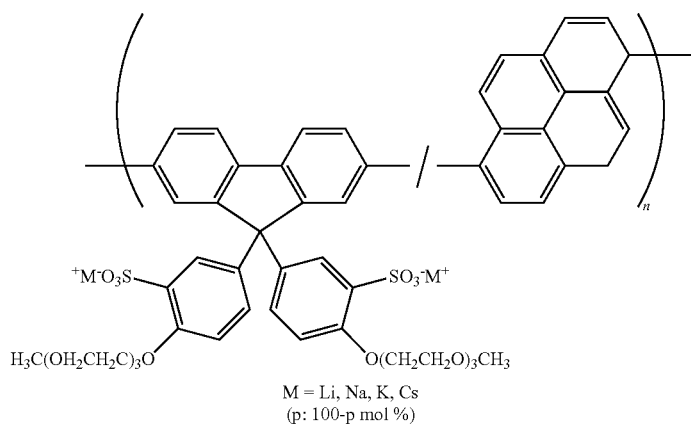
M = Li, Na, K, Cs
(p: 100-p mol %)
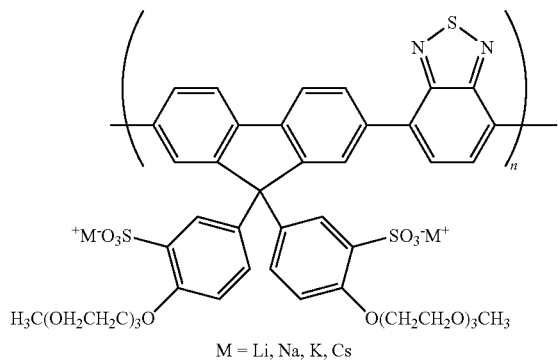
M = Li, Na, K, Cs -continued
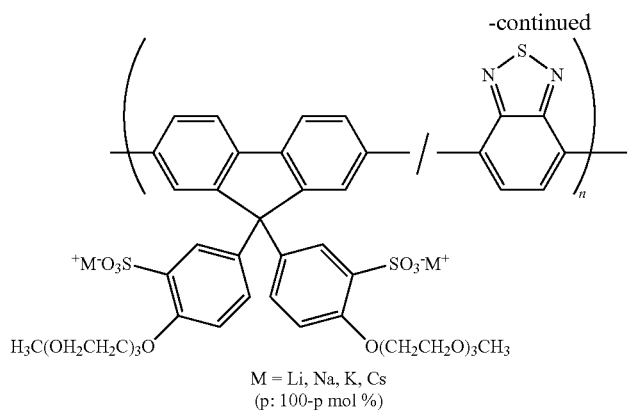
M = Li, Na, K, Cs
(p: 100-p mol %)
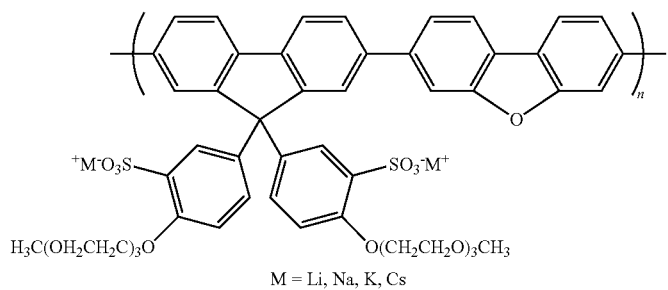
M = Li, Na, K, Cs
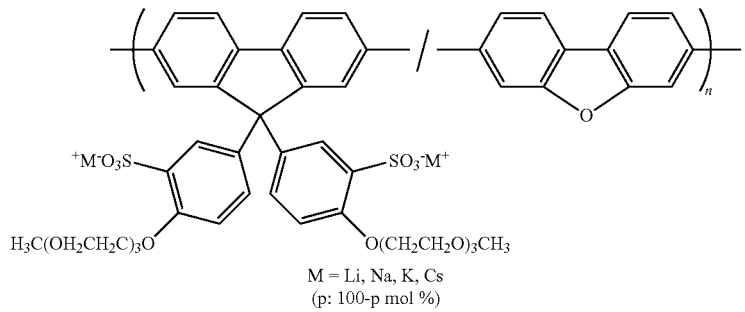
M = Li, Na, K, Cs
(p: 100-p mol %)
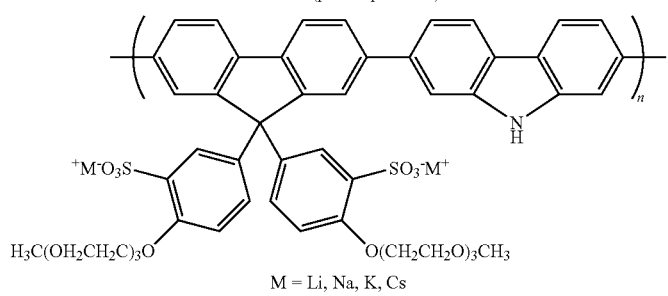
M = Li, Na, K, Cs
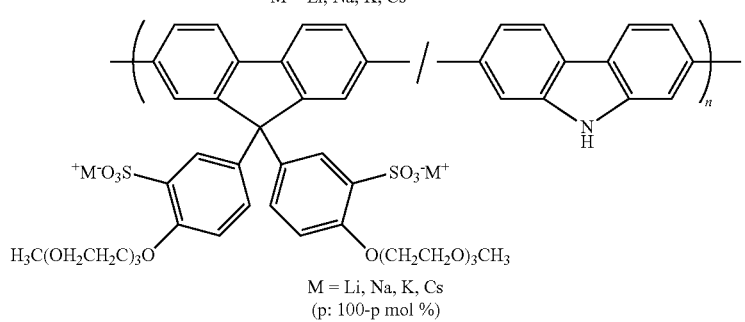
M = Li, Na, K, Cs
(p: 100-p mol %)

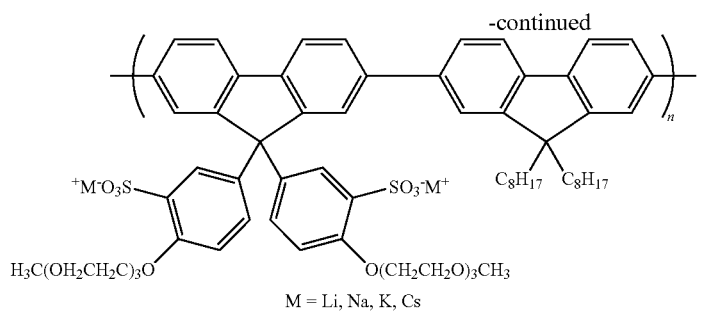
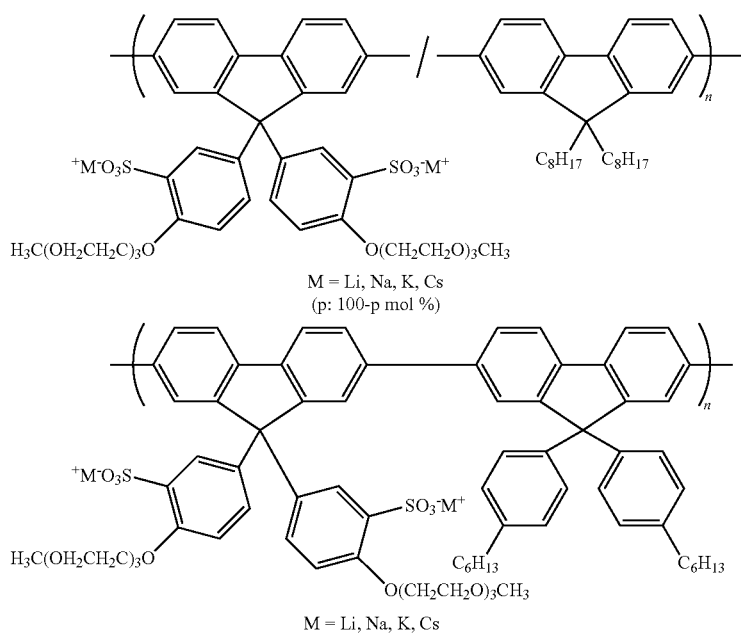
[Chemical Formula 58]
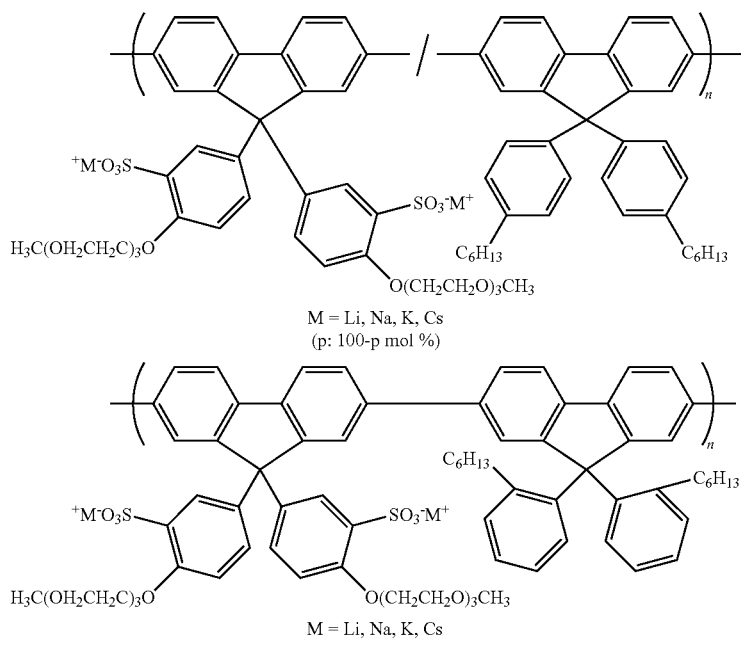

-continued
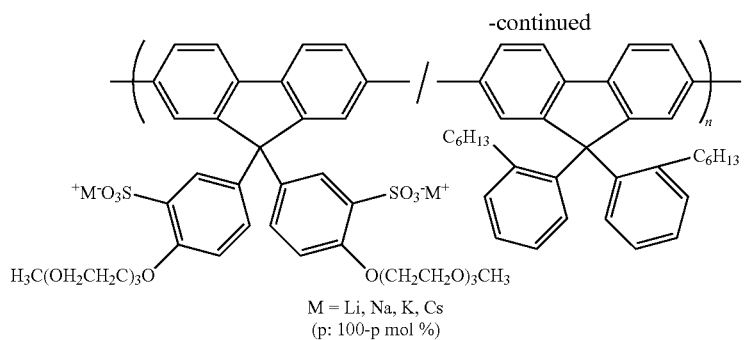
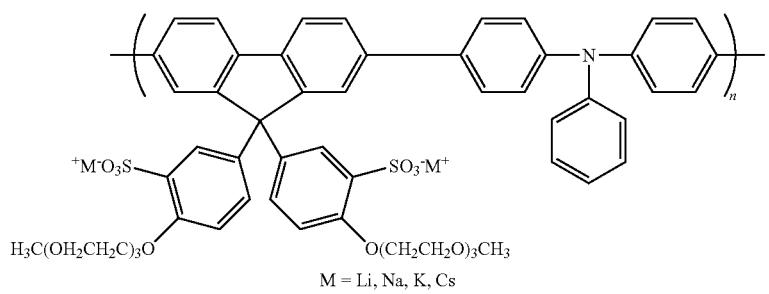
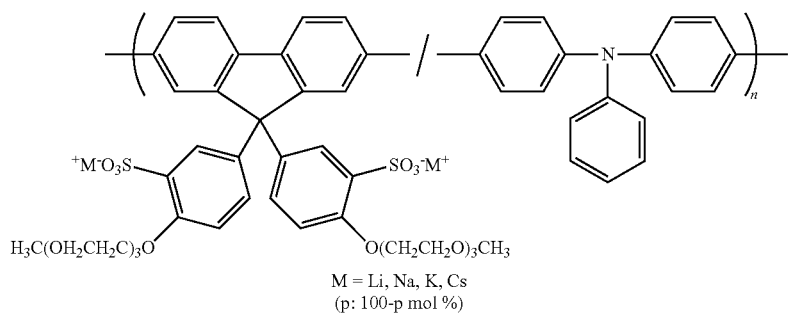
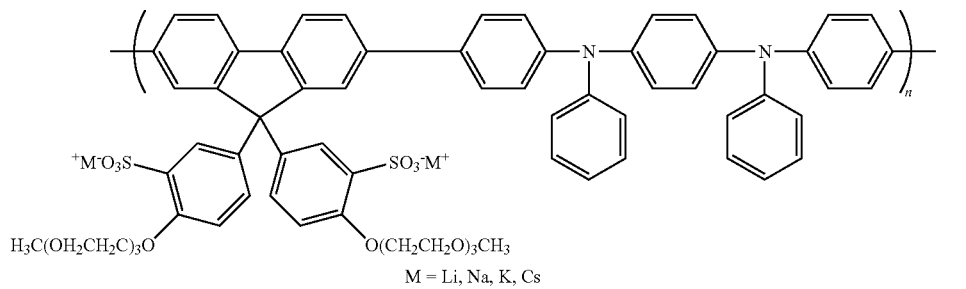
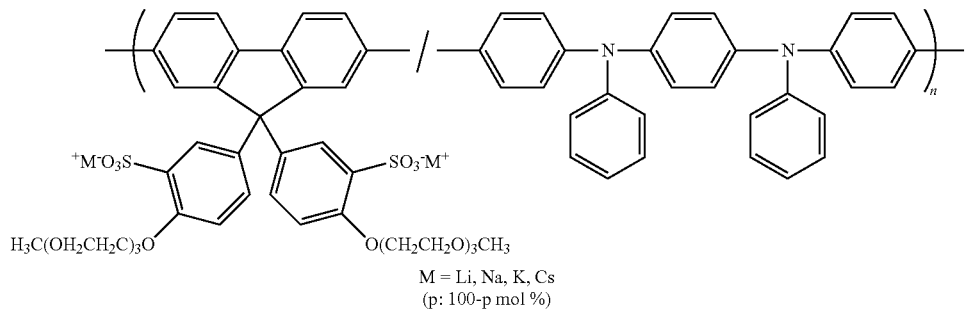

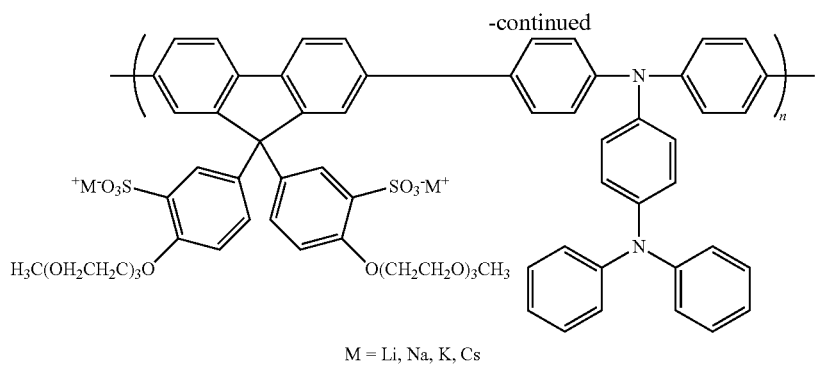

M = Li, Na, K, Cs

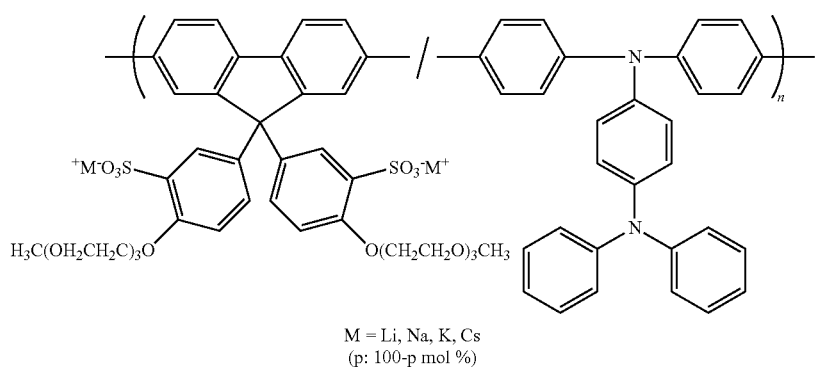

M = Li, Na, K, Cs
(p: 100-p mol %)

(In formulae, p represents a number of 15 to 100.)

Examples of the ionic polymer containing a group represented by Formula (2) and a group represented by Formula (3) may include: an ionic polymer consisting of a group represented by Formula (26) alone; an ionic polymer consisting of a group represented by Formula (26) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (27) alone; an ionic polymer consisting of a group represented by Formula (27) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (28) alone; an ionic polymer consisting of a group represented by Formula (28) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (31) alone; an ionic polymer consisting of a group represented by Formula (31) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (32) alone; and an ionic polymer consisting of a group represented by Formula (32) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110.

The ionic polymer containing a group represented by Formula (2) and a group represented by Formula (3) may be the macromolecular compounds below. Among these macromolecular compounds, in macromolecular compounds represented by a formula in which two types of structural unit are delimited by the slash "/", the ratio of the left structural unit is p % by mole and the ratio of the right structural unit is (100–p) % by mole, and these structural units are arranged at random. In the formulae below, n represents the degree of polymerization.

[Chemical Formula 59]
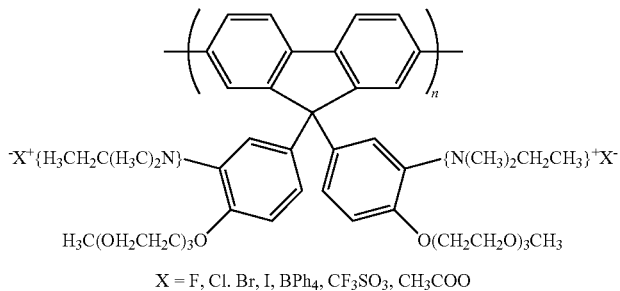
X = F, Cl. Br, I, BPh4, CF3SO3, CH3COO
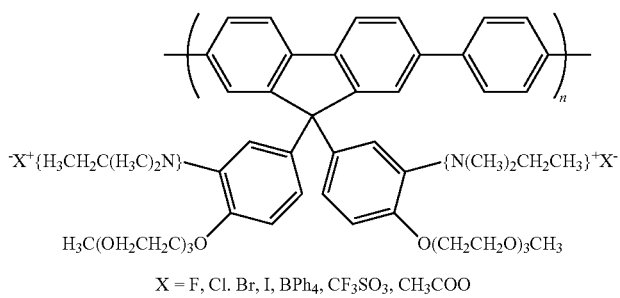
X = F, Cl. Br, I, BPh4, CF3SO3, CH3COO
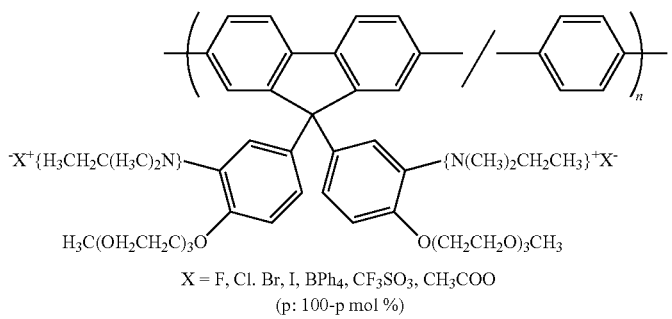
X = F, Cl. Br, I, BPh4, CF3SO3, CH3COO
(p: 100-p mol %)
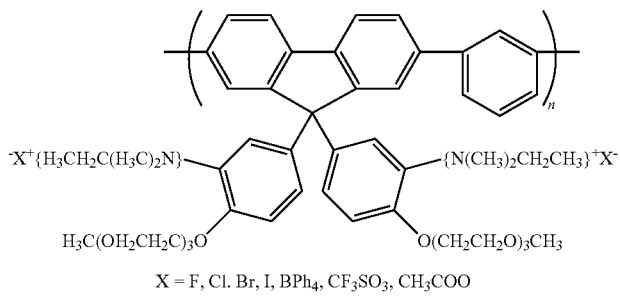
X = F, Cl. Br, I, BPh4, CF3SO3, CH3COO
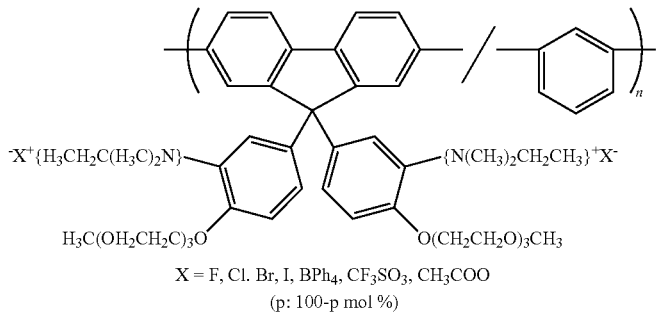
X = F, Cl. Br, I, BPh4, CF3SO3, CH3COO
(p: 100-p mol %)

-continued
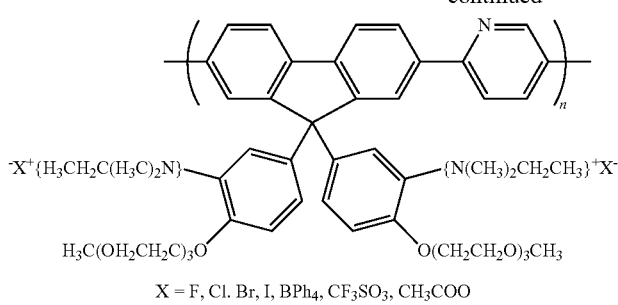
X = F, Cl. Br, I, BPh$_4$, CF$_3$SO$_3$, CH$_3$COO
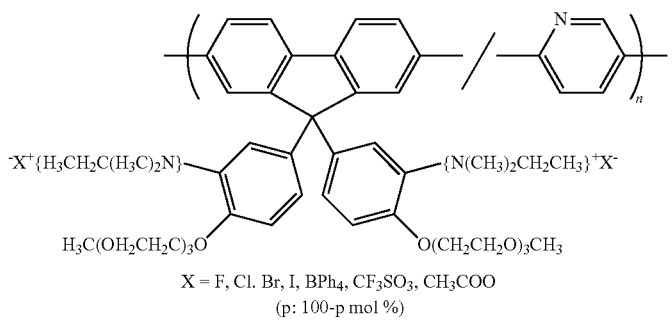
X = F, Cl. Br, I, BPh$_4$, CF$_3$SO$_3$, CH$_3$COO
(p: 100-p mol %)
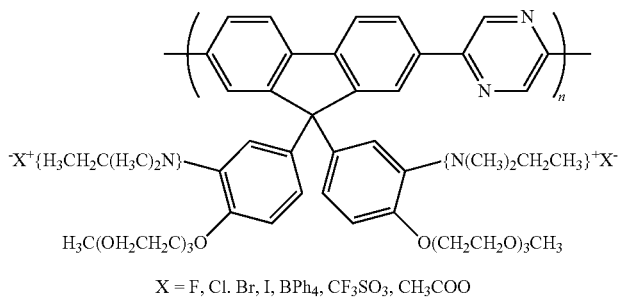
X = F, Cl. Br, I, BPh$_4$, CF$_3$SO$_3$, CH$_3$COO
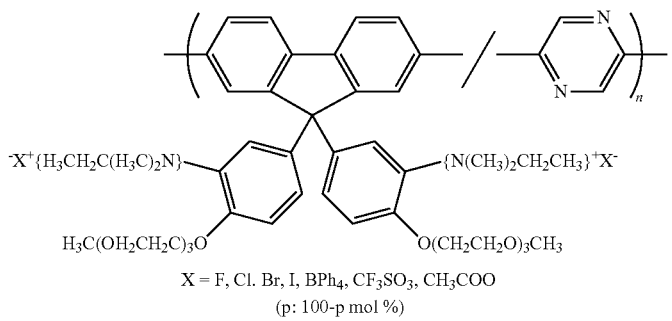
X = F, Cl. Br, I, BPh$_4$, CF$_3$SO$_3$, CH$_3$COO
(p: 100-p mol %)
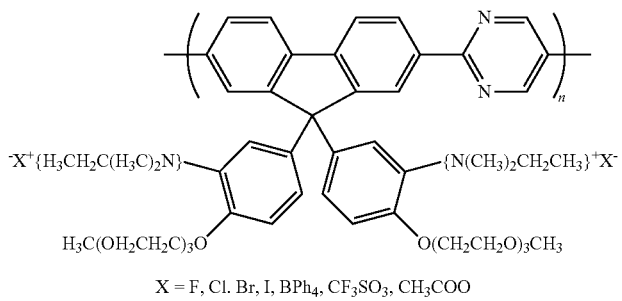
X = F, Cl. Br, I, BPh$_4$, CF$_3$SO$_3$, CH$_3$COO -continued
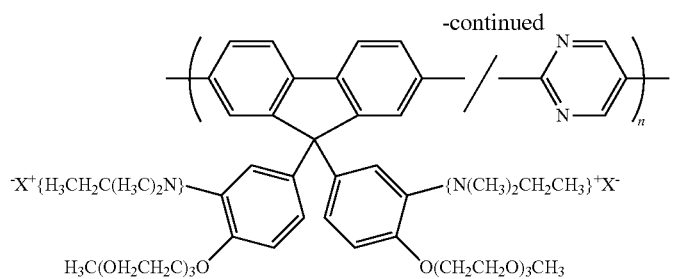
X = F, Cl, Br, I, BPh$_4$, CF$_3$SO$_3$, CH$_3$COO
(p: 100-p mol %)
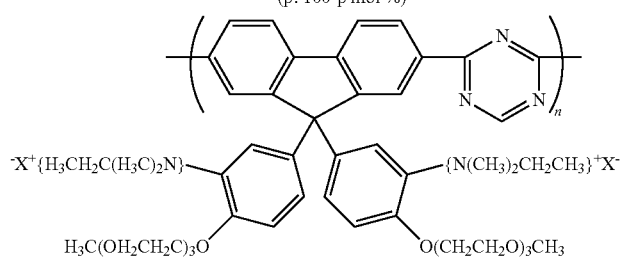
X = F, Cl, Br, I, BPh$_4$, CF$_3$SO$_3$, CH$_3$COO
[Chemical Formula 60]
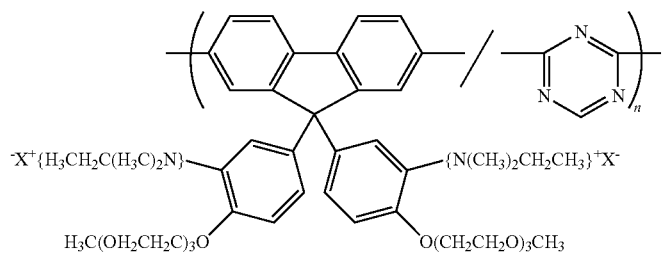
X = F, Cl, Br, I, BPh$_4$, CF$_3$SO$_3$, CH$_3$COO
(p: 100-p mol %)
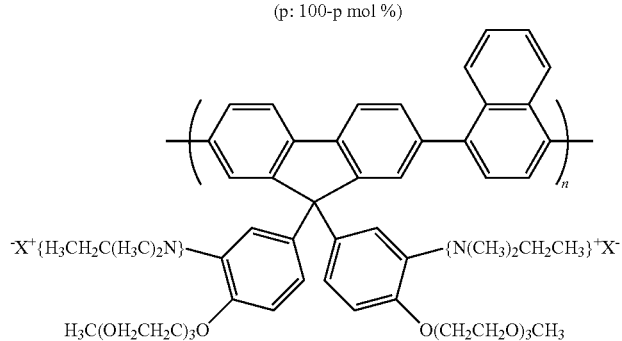
X = F, Cl, Br, I, BPh$_4$, CF$_3$SO$_3$, CH$_3$COO
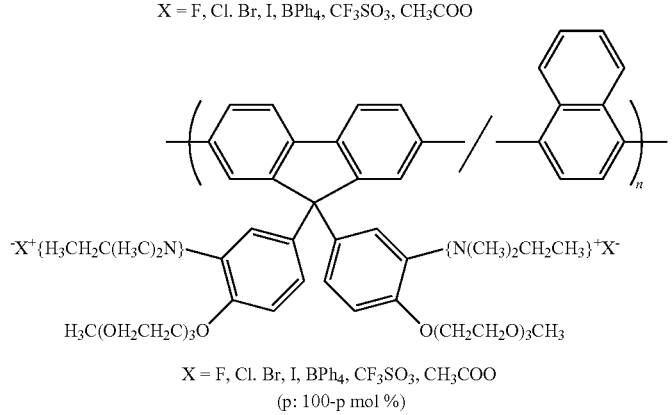
X = F, Cl, Br, I, BPh$_4$, CF$_3$SO$_3$, CH$_3$COO
(p: 100-p mol %)

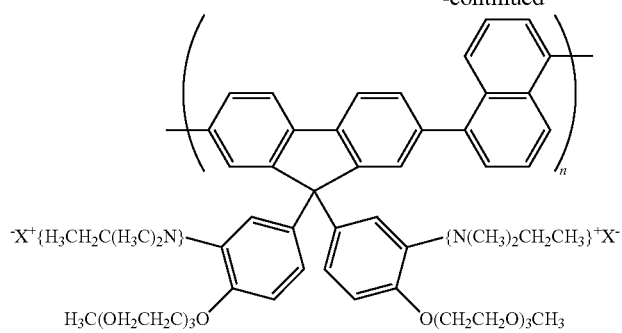
X = F, Cl, Br, I, BPh$_4$, CF$_3$SO$_3$, CH$_3$COO
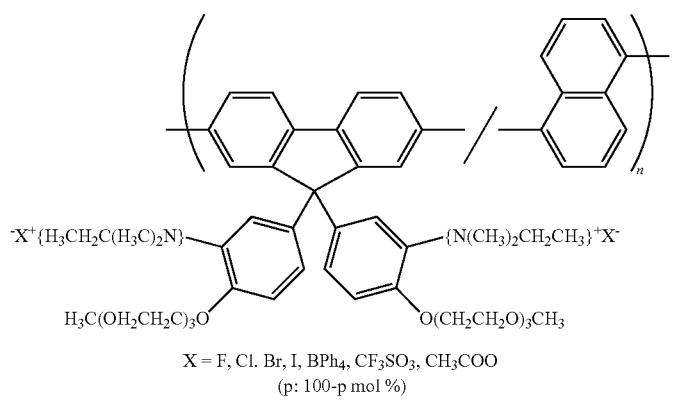
X = F, Cl, Br, I, BPh$_4$, CF$_3$SO$_3$, CH$_3$COO
(p: 100-p mol %)
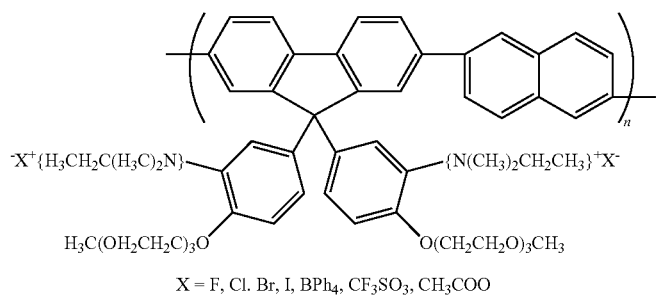
X = F, Cl, Br, I, BPh$_4$, CF$_3$SO$_3$, CH$_3$COO
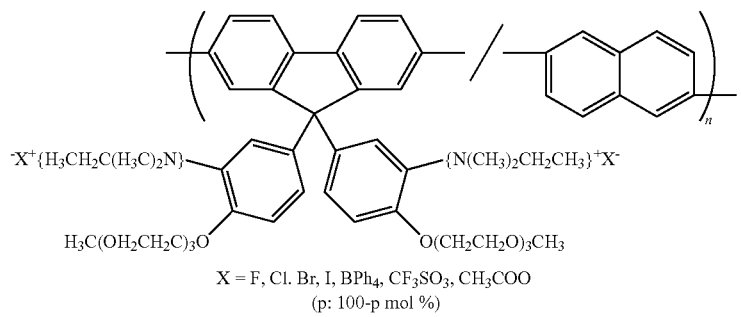
X = F, Cl, Br, I, BPh$_4$, CF$_3$SO$_3$, CH$_3$COO
(p: 100-p mol %)

-continued
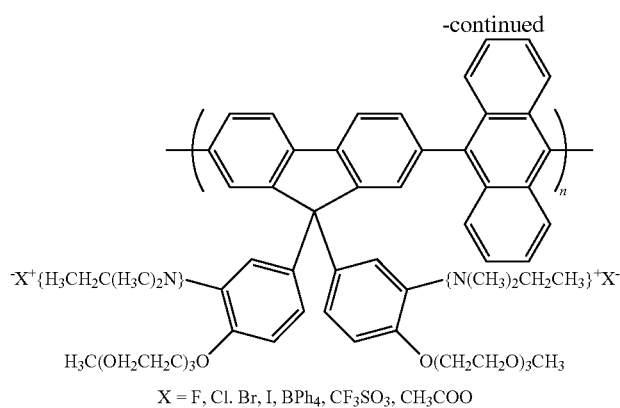
X = F, Cl, Br, I, BPh4, CF3SO3, CH3COO
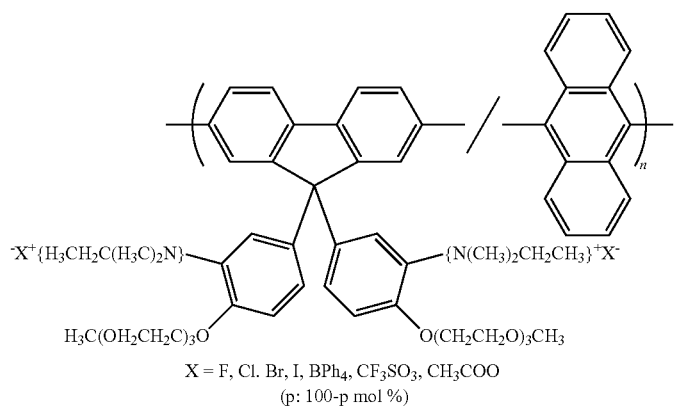
X = F, Cl, Br, I, BPh4, CF3SO3, CH3COO
(p: 100-p mol %)
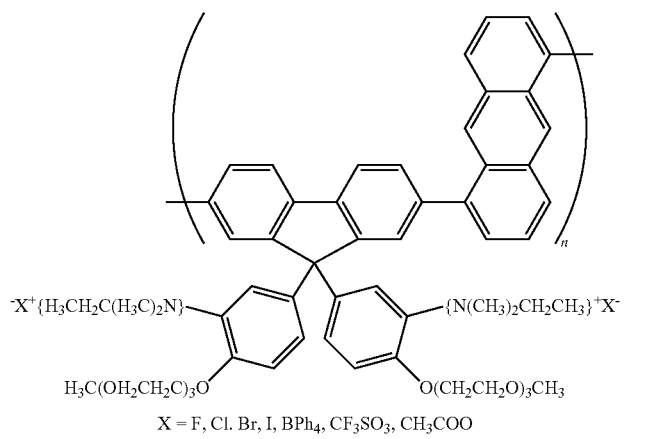
X = F, Cl, Br, I, BPh4, CF3SO3, CH3COO
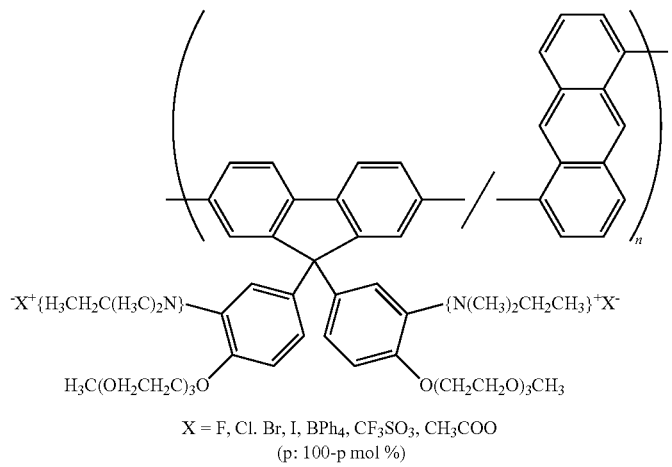
X = F, Cl, Br, I, BPh4, CF3SO3, CH3COO
(p: 100-p mol %)

-continued
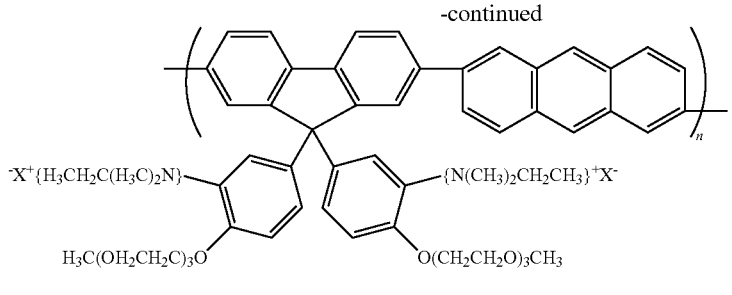
X = F, Cl. Br, I, BPh$_4$, CF$_3$SO$_3$, CH$_3$COO
[Chemical Formula 61]
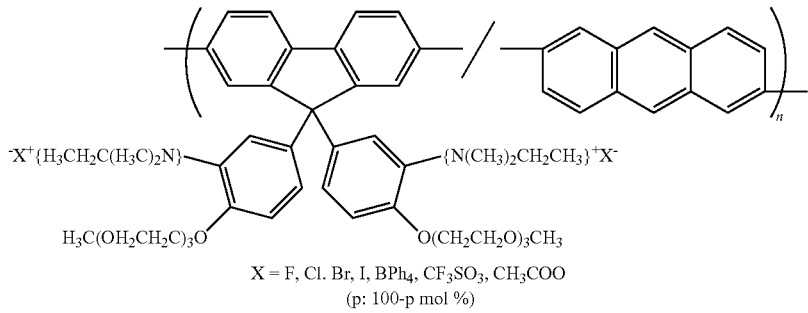
X = F, Cl. Br, I, BPh$_4$, CF$_3$SO$_3$, CH$_3$COO
(p: 100-p mol %)
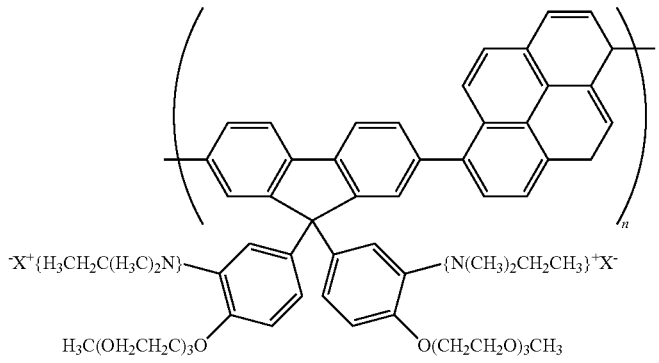
X = F, Cl. Br, I, BPh$_4$, CF$_3$SO$_3$, CH$_3$COO
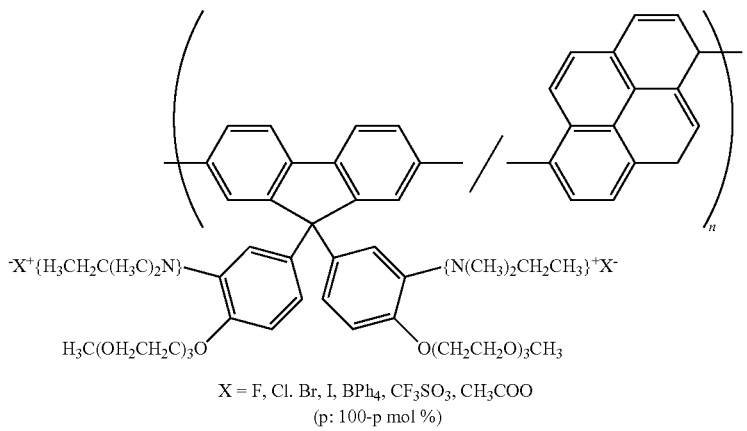
X = F, Cl. Br, I, BPh$_4$, CF$_3$SO$_3$, CH$_3$COO
(p: 100-p mol %)

-continued
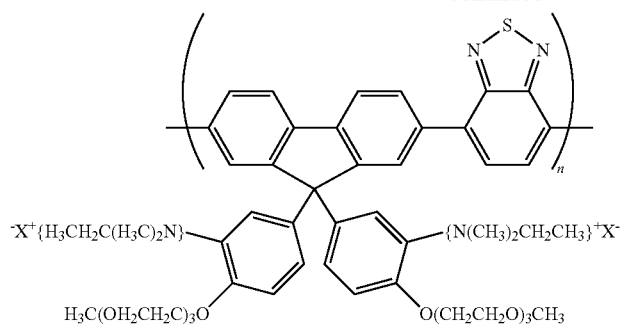
X = F, Cl. Br, I, BPh$_4$, CF$_3$SO$_3$, CH$_3$COO
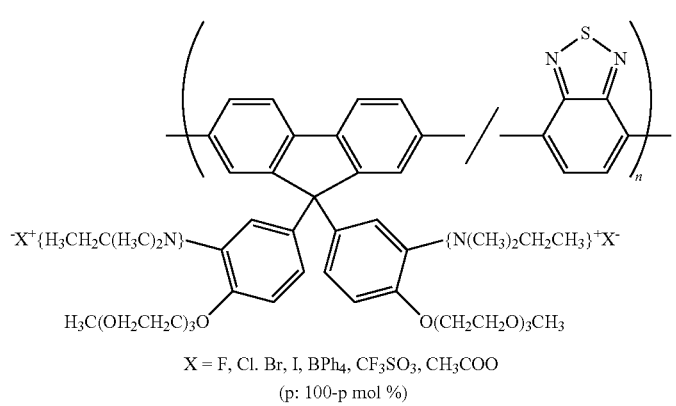
X = F, Cl. Br, I, BPh$_4$, CF$_3$SO$_3$, CH$_3$COO
(p: 100-p mol %)
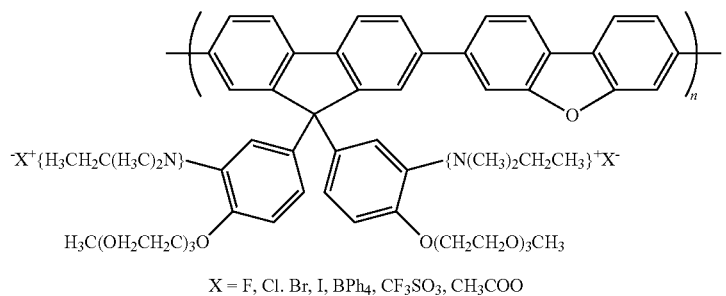
X = F, Cl. Br, I, BPh$_4$, CF$_3$SO$_3$, CH$_3$COO
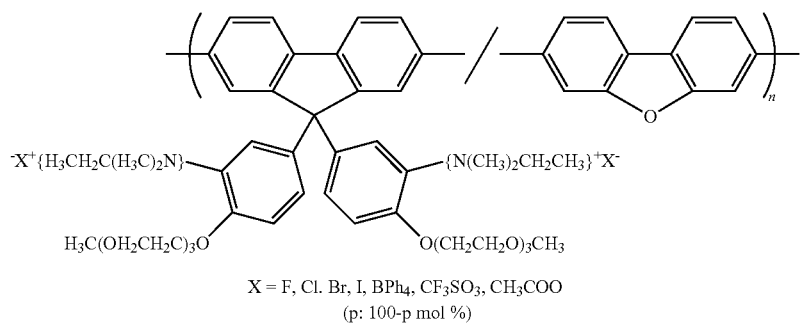
X = F, Cl. Br, I, BPh$_4$, CF$_3$SO$_3$, CH$_3$COO
(p: 100-p mol %)
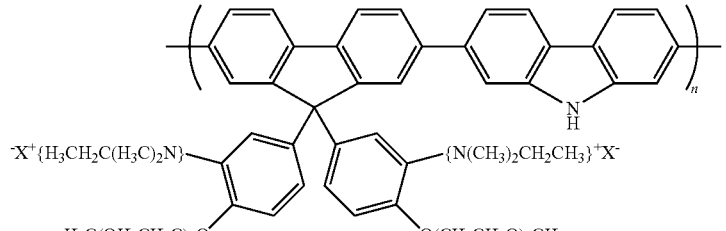
X = F, Cl. Br, I, BPh$_4$, CF$_3$SO$_3$, CH$_3$COO -continued
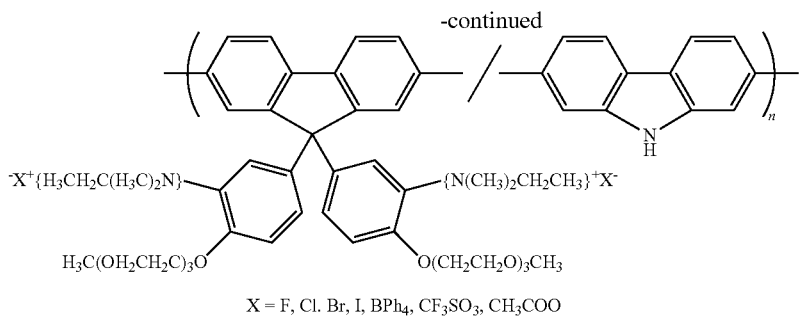
X = F, Cl, Br, I, BPh$_4$, CF$_3$SO$_3$, CH$_3$COO
(p: 100-p mol %)
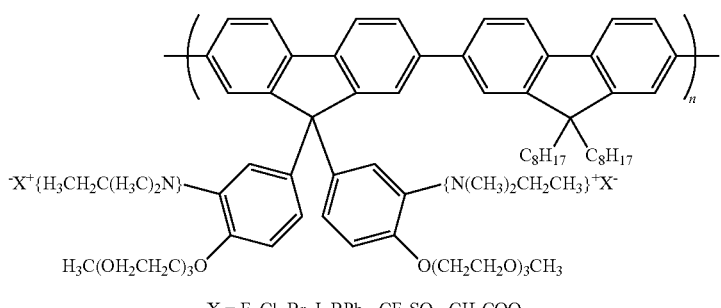
X = F, Cl, Br, I, BPh$_4$, CF$_3$SO$_3$, CH$_3$COO
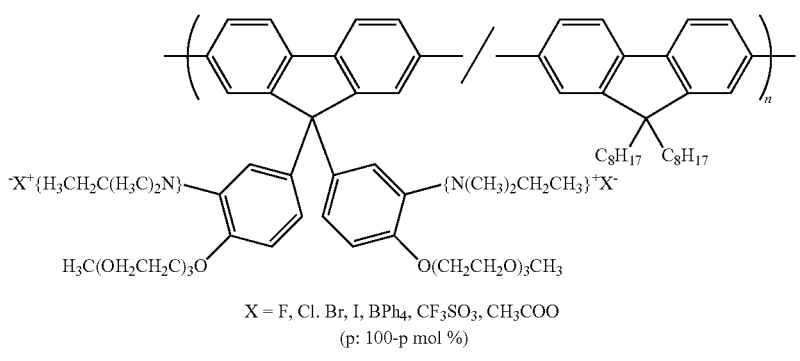
X = F, Cl, Br, I, BPh$_4$, CF$_3$SO$_3$, CH$_3$COO
(p: 100-p mol %)
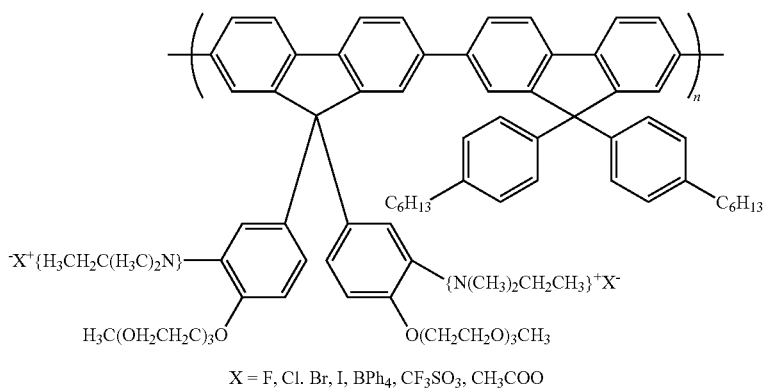
X = F, Cl, Br, I, BPh$_4$, CF$_3$SO$_3$, CH$_3$COO

[Chemical Formula 62]
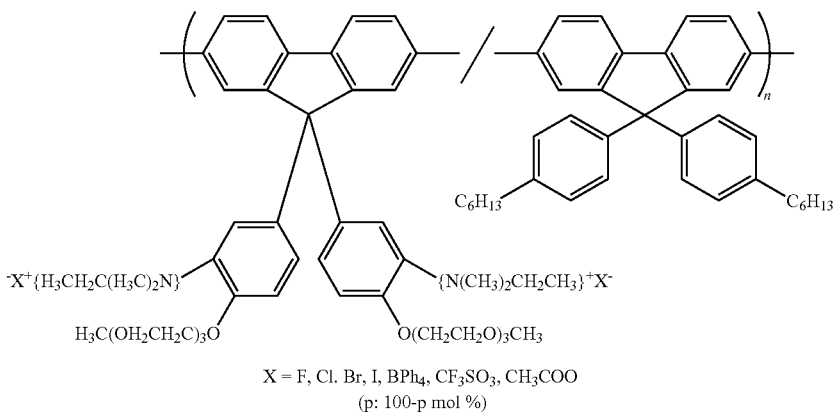
X = F, Cl. Br, I, BPh$_4$, CF$_3$SO$_3$, CH$_3$COO
(p: 100-p mol %)
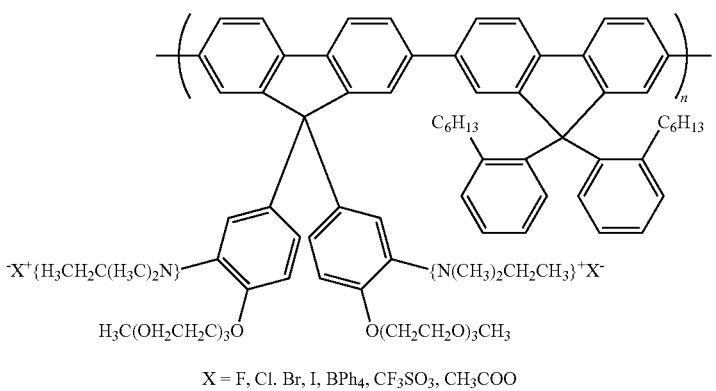
X = F, Cl. Br, I, BPh$_4$, CF$_3$SO$_3$, CH$_3$COO
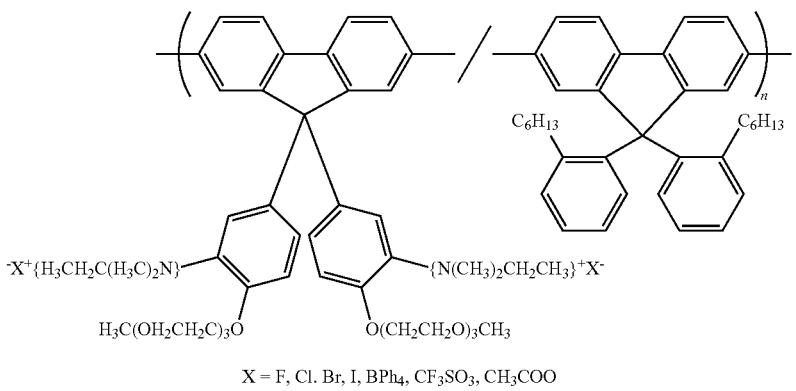
X = F, Cl. Br, I, BPh$_4$, CF$_3$SO$_3$, CH$_3$COO
(p: 100-p mol %)
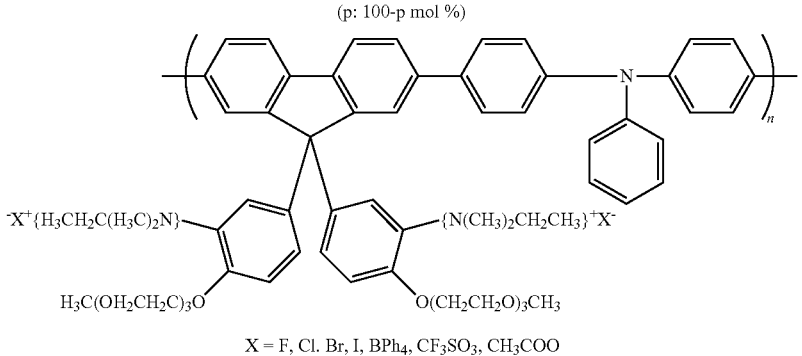
X = F, Cl. Br, I, BPh$_4$, CF$_3$SO$_3$, CH$_3$COO -continued
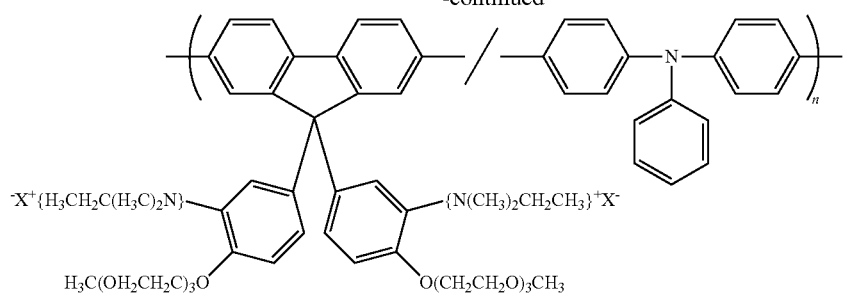
X = F, Cl. Br, I, BPh₄, CF₃SO₃, CH₃COO
(p: 100-p mol %)
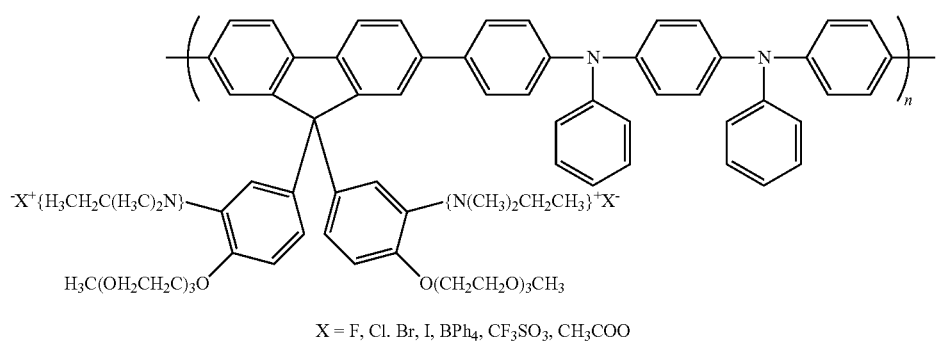
X = F, Cl. Br, I, BPh₄, CF₃SO₃, CH₃COO
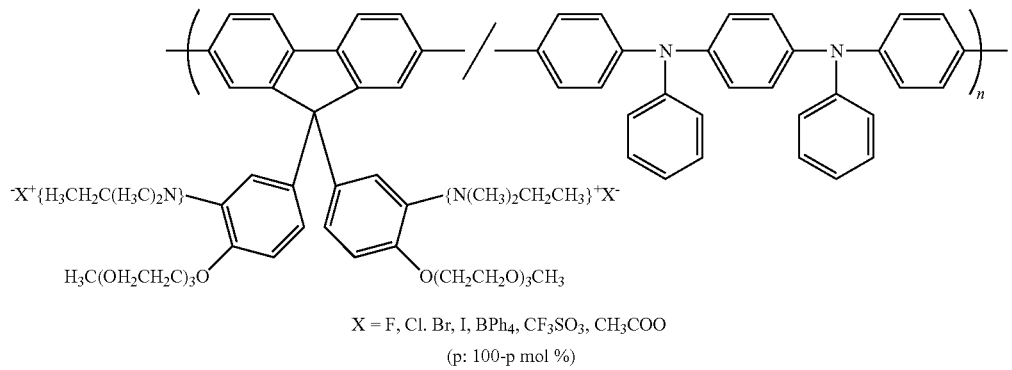
X = F, Cl. Br, I, BPh₄, CF₃SO₃, CH₃COO
(p: 100-p mol %)
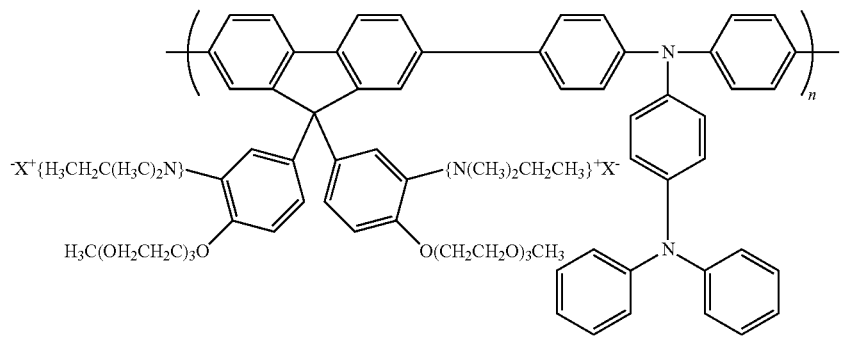
X = F, Cl. Br, I, BPh₄, CF₃SO₃, CH₃COO -continued

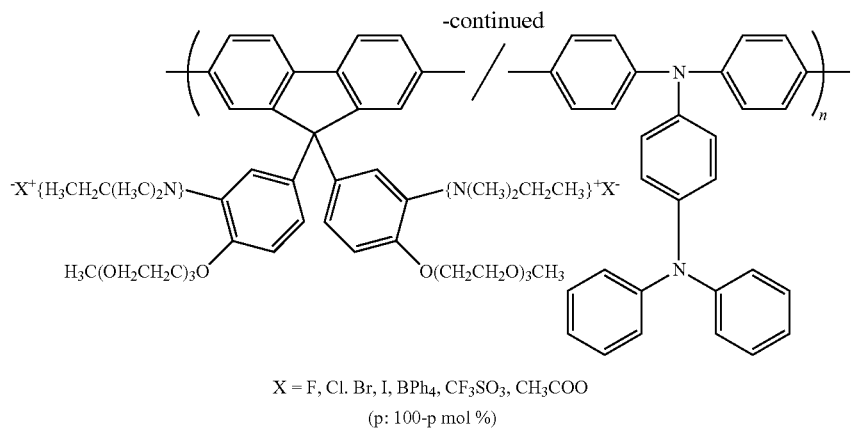

X = F, Cl. Br, I, BPh4, CF3SO3, CH3COO (p: 100-p mol %)

(In formulae, p represents a number of 15 to 100.)

Method for Preparing Ionic Polymer

Next, a method for preparing the ionic polymer used in the present invention is described. Examples of a preferred method for preparing the ionic polymer used in the present invention may include a method comprising: selecting as one of the raw materials, for example, a compound represented by Formula (36) below to be used, containing in the reaction mixture as an essential raw material, at least one type of a compound in which -$A_a$- in General Formula (36) is a structural unit represented by Formula (13), a compound in which -$A_a$- is a structural unit represented by Formula (15), a compound in which -$A_a$- is a structural unit represented by Formula (17), and a compound in which -$A_a$- is a structural unit represented by Formula (20), particularly; and subjecting the reaction mixture to the condensation-polymerization.

$Y^4$-$A_a$-$Y^5$         Formula (36)

(In Formula (36), $A_a$ represents a repeating unit containing one or more types of group selected from the group consisting of a group represented by Formula (1) and a group represented by Formula (2) and one or more types of group represented by Formula (3); and $Y^4$ and $Y^5$ each independently represent a group involved in the condensation-polymerization.)

When in the ionic polymer used in the present invention, a structural unit besides -$A_a$- is contained together with a structural unit represented by -$A_a$- in Formula (36), a compound having two substituents to be involved in the condensation-polymerization that becomes another structural unit besides -$A_a$- is used and may be allowed to coexist with a compound represented by Formula (36) to be subjected to the condensation-polymerization.

The compound having two condensation-polymerizable substituents used for containing such another structural unit may be compounds represented by Formula (37). Thus, by subjecting to the condensation-polymerization, a compound represented by Formula (37) in addition to a compound represented by $Y^4$-$A_a$-$Y^5$, an ionic polymer further having a structural unit represented by -$A_b$-used in the present invention can be prepared.

$Y^6$-$A_b$-$Y^7$         Formula (37)

(In Formula (37), $A_b$ is a structural unit represented by General Formula (33) or a structural unit represented by General Formula (35); and $Y^6$ and $Y^7$ each independently represent a group involved in the condensation-polymerization.)

Such a group ($Y^4$, $Y^5$, $Y^6$, and $Y^7$) involved in the condensation-polymerization may be a hydrogen atom, a halogen atom, an alkyl sulfonate group, an aryl sulfonate group, an arylalkyl sulfonate group, a boric acid ester residue, a sulfonium methyl group, a phosphonium methyl group, a phosphonate methyl group, a monohalogenated methyl group, —B(OH)$_2$, a formyl group, a cyano group, or a vinyl group.

The halogen atom capable of being selected as such a group involved in the condensation-polymerization may be a fluorine atom, a chlorine atom, a bromine atom, or an iodine atom.

The alkyl sulfonate group capable of being selected as the group involved in the condensation-polymerization may be a methane sulfonate group, an ethane sulfonate group, or a trifluoromethane sulfonate group, and The aryl sulfonate group capable of being selected as the group involved in the condensation-polymerization may be a benzene sulfonate group or a p-toluene sulfonate group.

The arylalkyl sulfonate group capable of being selected as the group involved in the condensation-polymerization may be a benzyl sulfonate group.

The boric acid ester residue capable of being selected as the group involved in the condensation-polymerization may be the groups represented by formulae below.

[Chemical Formula 63]

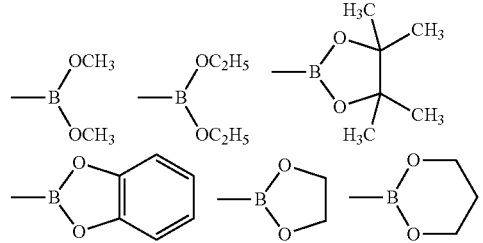

Moreover, the sulfoniummethyl group capable of being selected as the group involved in the condensation-polymerization may be a group represented by a formula:

—CH$_2$S$^+$Me$_2$E$^-$ or

—CH$_2$S$^+$Ph$_2$E$^-$ wherein E represents a halogen atom and Ph represents a phenyl group, which are the same also hereinafter.

The phosphonium methyl group capable of being selected as the group involved in the condensation-polymerization may be a group represented by a formula:

—CH$_2$P$^+$Ph$_3$E$^-$ wherein E represents a halogen atom.

The phosphonate methyl group capable of being selected as the group involved in the condensation-polymerization may be a group represented by a formula:

—CH$_2$PO(OR$^d$)$_2$ wherein R$^d$ represents an alkyl group, an aryl group, or an arylalkyl group.

The monohalogenated methyl group capable of being selected as the group involved in the condensation-polymerization may be a methyl fluoride group, a methyl chloride group, a methyl bromide group, and a methyl iodide group.

Moreover, the group preferred as the group involved in the condensation-polymerization varies depending on the type of the polymerization reaction. Examples of the group preferred as the group involved in the condensation-polymerization may include, for example, when a 0 valent nickel complex is used such as for the Yamamoto coupling reaction, a halogen atom, an alkyl sulfonate group, an aryl sulfonate group, and an arylalkyl sulfonate group. When a nickel catalyst or a palladium catalyst is used such as for the Suzuki coupling reaction, examples of the group preferred as the group involved in the condensation-polymerization may include an alkyl sulfonate group, a halogen atom, a boric acid ester residue, —B(OH)$_2$, and the like. When an oxidation polymerization is performed either with an oxidant or electrochemically, examples of the group preferred as the group involved in the condensation-polymerization may include a hydrogen atom.

When the ionic polymer used in the present invention is prepared, adopted may be, for example, a polymerization method comprising: dissolving, if necessary, a compound (monomer) represented by General Formula (36) or (37) having the groups involved in the condensation-polymerization in a plurality in an organic solvent; and subjecting the resultant solution to the reaction at a temperature that is a melting point of the organic solvent or higher and a boiling point of the organic solvent or lower using an alkali or an appropriate catalyst. As such a polymerization method, adopted can be publicly known methods described in, for example, "Organic Reactions, vol. 14, pp. 270-490 (1965), published by John Wiley & Sons, Inc.", "Organic Syntheses, Collective Volume VI, pp. 407-411 (1988), published by John Wiley & Sons, Inc.", "Chemical Review (Chem. Rev.), vol. 95, p. 2457 (1995)", "Journal of Organometallic Chemistry (J. Organomet. Chem.), vol. 576, p. 147 (1999)", and "Macromolecular Chemistry, Macromolecular Symposium (Macromol. Chem., Macromol. Symp.) vol. 12, p. 229 (1987)".

When the ionic polymer used in the present invention is prepared, according to the group involved in the condensation-polymerization, a known condensation-polymerization reaction may be adopted. Examples of such a polymerization method may include: a method for polymerizing the relevant monomer by the Suzuki coupling reaction; a method for polymerizing the relevant monomer by the Grignar reaction; a method for polymerizing the relevant monomer by a Ni(0) complex; a method for polymerizing the relevant monomer by an oxidant such as FeCl$_3$; a method for polymerizing the relevant monomer by an electrochemical oxidation polymerization; and a method for polymerizing the relevant monomer by a decomposition of an intermediate polymer having an appropriate leaving group. Among such polymerization reactions, the method for polymerizing by the Suzuki coupling reaction, the method for polymerizing by the Grignard reaction, and the method for polymerizing by a nickel 0 valent complex are preferred in terms that the structure of the obtained ionic polymer can be easily controlled.

One embodiment of the preferred method for preparing the ionic polymer used in the present invention is a method for preparing the ionic polymer comprising: using a raw material monomer having as the group involved in the condensation-polymerization, a group selected from the group consisting of a halogen atom, an alkyl sulfonate group, an aryl sulfonate group, and an arylalkyl sulfonate group; and subjecting the raw material monomer to the condensation-polymerization in the presence of a nickel 0 valent complex. Examples of the raw material monomer used for such a method may include a dihalogenated compound, a bis(alkyl sulfonate) compound, a bis(aryl sulfonate) compound, a bis(arylalkyl sulfonate) compound, a halogen-alkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound, and an aryl sulfonate-arylalkyl sulfonate compound.

Another embodiment of the preferred method for preparing the ionic polymer is a method for preparing the ionic polymer comprising: using a raw material monomer having as the group involved in the condensation-polymerization, a group selected from the group consisting of a halogen atom, an alkyl sulfonate group, an aryl sulfonate group, an arylalkyl sulfonate group, —B(OH)$_2$, and a boric acid ester residue, the raw material monomer in which the ratio (K/J) of the total (J) of the number of moles of a halogen atom, an alkyl sulfonate group, an aryl sulfonate group, and an arylalkyl sulfonate group that all raw material monomers have and the total (K) of the number of moles of —B(OH)$_2$ and a boric acid ester residue that all raw material monomers have, is substantially 1 (usually, K/J is in a range of 0.7 to 1.2); and subjecting the raw material monomer to the condensation-polymerization in the presence of a nickel catalyst or a palladium catalyst.

The organic solvent varies depending on the used compounds and the reaction. As the organic solvent, generally in order to suppress a side reaction, an organic solvent subjected thoroughly to deoxygenation treatment is preferably used. When the ionic polymer is prepared, the reaction is preferably progressed using such an organic solvent in an inert gas atmosphere. The organic solvent is preferably subjected also to a dehydration treatment like to the deoxygenation treatment, provided that this may not be the case for the reaction in a two-phase system with water such as the Suzuki coupling reaction.

Examples of such an organic solvent may include: a saturated hydrocarbon such as pentane, hexane, heptane, octane, and cyclohexane; an unsaturated hydrocarbon such as benzene, toluene, ethylbenzene, and xylene; a halogenated saturated hydrocarbon such as carbon tetrachloride, chloroform, dichloromethane, chlorobutane, bromobutane, chloropentane, bromopentane, chlorohexane, bromohexane, chlorocyclohexane, and bromocyclohexane; a halogenated unsaturated hydrocarbon such as chlorobenzene, dichlorobenzene, and trichlorobenzene; alcohols such as methanol, ethanol, propanol, isopropanol, butanol, and tert-butyl alcohol; carboxylic acids such as formic acid, acetic acid, and propionic acid; ethers such as dimethyl ether, diethyl ether, methyl tert-butyl ether, tetrahydrofuran, tetrahydropyran, and dioxane; amines such as trimethylamine, triethylamine, N,N,N',N'-tetramethylethylenediamine, and pyridine; and amides such as N,N-dimethylformamide, N,N-dimethylacetamide, N,N-diethylacetamide, and N-methylmorpholine oxide.

These organic solvents may be used individually or in combination of two or more types thereof. Among such organic solvents, from the viewpoint of the reactivity, ethers are more preferred, tetrahydrofuran and diethyl ether are further preferred, and from the viewpoint of the reaction rate, toluene and xylene are preferred.

Upon preparing the ionic polymer, in order to react the raw material monomer, an alkali or an appropriate catalyst is preferably added. Such an alkali or a catalyst may be selected according to the adopted polymerization method. Such an alkali and a catalyst are preferably those capable of being thoroughly dissolved in the solvent used for the reaction. The method for mixing the alkali or the catalyst may be a method in which while stirring the reaction mixture in an inert gas atmosphere such as argon and nitrogen, a solution of the alkali or the catalyst is slowly added thereto and a method in which the reaction mixture is slowly added to a solution of the alkali or the catalyst.

In the ionic polymer used in the present invention, when a polymerization-active group as it is remains at the position of a terminal group, there is such a probability that the light-emitting characteristics and the life characteristics of the obtained light-emitting element might lower, so that the terminal group may also be protected with a stable group. Thus, in the case where the terminal group is protected with a stable group, when the ionic polymer used in the present invention is a conjugated compound, the ionic polymer has preferably a conjugated bond in continuity from a conjugated structure of the mainchain of the ionic polymer. Examples of such a structure may include a structure in which the terminal group is bonded with an aryl group or a heterocyclic group through a carbon-carbon bond. Such a stable group for protecting the terminal group may be a substituent such as a monovalent aromatic compound group represented by a structural formula of [Chemical Formula 10] in JP 9-45478 A.

Another preferred method for preparing an ionic polymer containing a structural unit represented by Formula (1) may be a method in which in a first step, an ionic polymer having no cation is polymerized and in a second step, an ionic polymer containing a cation is prepared from the ionic polymer. The method for polymerizing the ionic polymer having no cation in the first step may be the above described condensation-polymerization reaction. The reaction in the second step may be a hydrolysis reaction with a metal hydroxide, an alkylammonium hydroxide, or the like.

Another preferred method for preparing an ionic polymer containing a group represented by Formula (2) may be a method in which in a first step, an ionic polymer having no ion is polymerized and in a second step, an ionic polymer containing an ion is prepared from the ionic polymer. The method for polymerizing the ionic polymer having no ion in the first step may be the above described condensation-polymerization reaction. The reaction in the second step may be a reaction for converting an amine into a quaternary ammonium salt using a halogenated alkyl and a halogen abstraction reaction by $SbF_5$.

The ionic polymer used in the present invention is excellent in injection characteristic and transport characteristic of the electric charge, so that the ionic polymer can obtain an element emitting light with a high brightness.

Examples of the method for forming a layer containing the ionic polymer may include a method for film-forming using a solution containing the ionic polymer.

As examples of the solvent used for such film-forming from a solution, among the solvents such as alcohols, ethers, esters, nitrile compounds, nitro compounds, halogenated alkyls, halogenated aryls, thiols, sulfides, sulfoxides, thioketones, amides, and carboxylic acids except water, preferred are solvents having a solubility parameter of 9.3 or more. Examples of the solvent (a value in each parenthesis represents the value of solubility parameter of each solvent) may include methanol (12.9), ethanol (11.2), 2-propanol (11.5), 1-butanol (9.9), tert-butyl alcohol (10.5), acetonitrile (11.8), 1,2-ethandiol (14.7), N,N-dimethylformamide (11.5), dimethylsulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and a solvent mixture of these solvents. Here, the solvent mixture prepared by mixing two types of solvents (solvent 1 and solvent 2) is described as follows. The solubility parameter ($\delta_m$) of the solvent mixture is to be obtained according to an equation: $\delta_m = \delta_1 \times \phi_1 + \delta_2 \times \phi_2$ ($\delta_1$ is the solubility parameter of the solvent 1; $\phi_1$ is the volume fraction of the solvent 1; $\delta_2$ is the solubility parameter of the solvent 2; and $\phi_2$ is the volume fraction of the solvent 2).

The optimal value of the thickness of the layer containing the ionic polymer varies depending on the used ionic polymer. The thickness may be selected so that the driving voltage and the light-emitting efficacy will be moderate values. The layer needs to be thick enough to cause no pin hole. From the viewpoint of reducing the driving voltage of the element, the layer containing the ionic polymer has a thickness of preferably 1 nm to 1 μm, more preferably 2 nm to 500 nm, further preferably 2 nm to 200 nm. From the viewpoint of protecting the light-emitting layer, the thickness of the layer is preferably 5 nm to 1 μm.

(Electron Injection Layer)

The electron injection layer 44 is a layer having a function of improving the electron injection efficiency from the cathode 34. The electron injection layer 44 is formed with containing the ionic polymer for improving the electron injection efficiency. The electron injection layer 44 is provided between the cathode 34 and the light-emitting layer 50 and is provided so as to come into contact with the cathode 34.

The electron injection layer 44 can be formed by a coating method using a coating liquid in which the ionic polymer is dissolved in any suitable solvent. As such a solvent, preferred are the above described solvents having a solubility parameter of 9.3 or more excluding water.

Examples of the coating method may include a spin coating method, a casting method, a microgravure coating method, a gravure coating method, a bar coating method, a roll coating method, a wire bar coating method, a dip coating method, a spray coating method, a screen printing method, a flexo printing method, an offset printing method, and an inkjet printing method.

(First Substrate and Second Substrate)

The first substrate 22 and the second substrate 24 may be a rigid substrate or a flexible substrate and moreover, may be a film. When these substrates are a film, a roll structure prepared by winding an elongated film onto a roll (unwinding roll) can be used as the material for the substrates.

By using a flexible substrate or a film, a flexible device as a whole can be achieved.

As at least any one of the first substrate 22 and the second substrate 24, a substrate exhibiting optical transparency is used. When light is taken out through at least one of the first substrate 22 and the second substrate 24, as a substrate in a side opposite to the side through which light emitted from the light-emitting layer 50 is taken out in the thickness direction, an opaque substrate that does not transmit light can be used. In the present specification, "light" means an electromagnetic wave in a wavelength range of 1 nm to around 1 mm. "Exhibiting optical transparency" means "at least a part of light having a prescribed wavelength and entering into the member is emitted from the member. The first substrate 20 exhibits preferably optical transparency relative to visible light. "Visible light" refers to an electromagnetic wave sensitive to the naked eyes of the human. Visible light has generally a wavelength of around 360 nm to 830 nm. The higher the optical transparency of the first substrate 20 is, the more preferred it is and the optical transparency is, for example 10% or more, preferably 25% or more, more preferably 50% or more.

As the first substrate 22 and the second substrate 24, an insulating substrate exhibiting optical transparency can be used and for example, a glass substrate can be used. A quartz substrate and a plastic substrate may also be used.

When as the first substrate 22 and the second substrate 24, elongated substrates are used, preferably used is a substrate made of an insulating material capable of being rolled up in a roll shape such as a film made of a colorless and transparent resin material. The material for such a substrate is not particularly limited. Examples of the resin material used for such an elongated substrate may include: polyether sulfon (PES); a polyester resin such as polyethylene terephthalate (PET) and polyethylene naphthalate (PEN); a polyolefin resin such as polyethylene (PE), polypropylene (PP), and cyclic polyolefin; a polyamide resin; a polycarbonate resin; a polystyrene resin; a polyvinyl alcohol resin; a saponified product of an ethylene-vinyl acetate copolymer; a polyacrylonitrile resin; an acetal resin; a polyimide resin; and an epoxy resin.

Among these resin materials, a polyester resin and a polyolefin resin are preferred and polyethylene terephthalate and polyethylene naphthalate are particularly preferred, because these resins have high heat resistance and a small linear expansion coefficient and the cost for preparing these resins is low. These resin materials may be used individually or in combination of two or more types thereof.

The thickness of each of the first substrate 22 and the second substrate 24 is not particularly limited and can be accordingly set with taking into consideration the stability during the manufacturing step. The thickness of each of the first substrate 22 and the second substrate 24 is preferably in a range of 5 μm to 500 μm, more preferably in a range of 50 μm to 200 μm, particularly preferably in a range of 50 μm to 100 μm.

As the first substrate 22 and the second substrate 24, substrates made of the same material are preferably selected. By preparing the first substrate 22 and the second substrate 24 as substrates made of the same material, these substrates have the same physical characteristics such as linear expansion coefficient, so that in the below-described manufacturing step, the first substrate 22 and the second substrate 24 negate each stress with each other. The occurrence of a warp can be prevented or reduced. Therefore, the stress applied to the anode 32, the cathode 34, and the layered structure 60 can be effectively reduced.

(Anode and Cathode)

The electrode (at least one of the anode 32 and the cathode 34) in a side of taking out light emitted from the light-emitting layer 50 is prepared as an electrode exhibiting optical transparency.

When the anode 32 is formed from a transparent electrode or a translucent electrode, a thin film of a metal oxide, a metal sulfide, or a metal having a high electric conductivity can be used, a material having a high transparency can be preferably utilized, and the material therefor is accordingly selected according to the used organic layer to be used. Specifically, used are conductive films of indium oxide, zinc oxide, tin oxide, and indium-tin-oxide (ITO), which is a complex of these oxides; NESA and the like; and gold, platinum, silver, and copper. Among them, preferred are ITO, indium-zinc-oxide, and tin oxide. The forming method thereof may be a vacuum deposition method, a sputtering method, an ion plating method, and a plating method. In addition, as the anode, an organic transparent conductive film such as polyaniline or derivatives thereof and polythiophene or derivatives thereof may be used.

The thickness of the anode can be accordingly selected by taking into consideration the optical transparency and the electric conductivity. The thickness of the anode is, for example 10 nm to 10 μm, preferably 20 nm to 1 μm, further preferably 50 nm to 500 nm.

As the material for the cathode 34, in addition to a material having a small work function that has been conventionally utilized, also a material having a large work function can be utilized. Examples of the material for the cathode 34 may include: a metal such as magnesium, aluminum, scandium, vanadium, zinc, yttrium, indium, cerium, samarium, europium, terbium, ytterbium, titanium, chromium, manganese, iron, cobalt, nickel, copper, zirconium, niobium, molybdenum, palladium, silver, tin, tantalum, tungsten, iridium, platinum, gold, lead, and bismuth; an alloy of two or more these metals; and graphite and a graphite intercalation compound. Among these metals, preferred is a material that is difficult to be oxidized such as titanium, chromium, manganese, iron, cobalt, nickel, copper, zirconium, niobium, molybdenum, palladium, silver, tin, tantalum, tungsten, iridium, platinum, gold, lead, and bismuth. In addition, ITO, ZnO, ZTO, IZTO, and the like, which are conductive oxides, are applicable. The cathode may be formed as a layered structure having two or more layers.

Examples of the alloy may include a magnesium-silver alloy, a magnesium-indium alloy, a magnesium-aluminum alloy, and a indium-silver alloy.

For the formation of the cathode 34, any suitable forming method such as a deposition method can be selected according to the selected material. The cathode 34 can also be formed by a coating method using a coating liquid.

A conductive material capable of being suitably utilized when the cathode 34 is formed by a coating method may be a conductive macromolecular material. As the conductive macromolecular material, a macromolecular material containing ethylenedioxythiophene is preferred. As the conductive macromolecular material, specifically a mixed material of 3,4-polyethylenedioxythiophene (PEDOT) used also as a forming material of a hole injection layer and polystyrenesulfonic acid (PSS) (mixing ratio: PEDOT:PSS=1:20)[manufactured by Bayer AG; trade name: Baytron-p] is preferably used. A liquid in which such a conductive macromolecular material is dispersed in a solvent can be used. As the liquid, preferred is a liquid in which 3,4-polyethylenedioxythiophene is dispersed in polystyrenesulfonic acid as a dispersion medium.

In this case, a solution in which a dispersion in which 3,4-polyethylenedioxythiophene is dispersed in polystyrenesulfonic acid as a dispersion medium is dissolved in a polar solvent such as water and isopropyl alcohol, is preferably used.

As the conductive material making up the cathode 34, instead of the above conductive macromolecular material or together with the above conductive macromolecular material, a metal fine particle having conductivity may also be used. When the cathode 34 is made of a mixed material of a conductive macromolecular compound with a metal fine particle, by subjecting the cathode 34 to heating treatment at a relatively low temperature, the conductivity of the cathode 34 becomes possible to be secured. As the metal fine particle, gold, silver, aluminum, and the like are preferably used. Besides the metal fine particle such as gold, silver, and aluminum, a carbon paste and a mixture of a carbon paste and a metal fine particle are preferably used.

When the metal fine particle is adopted as the conductive material, a polar solvent such as water, methanol, ethanol, propanol, isopropyl alcohol (IPA), and dimethyl ketone can be preferably used.

The thickness of the cathode 34 can be accordingly selected with considering the electric conductivity and the durability. The thickness of the cathode 34 is, for example 10 nm to 10 μm, preferably 20 nm to 1 μm, further preferably 50 nm to 500 nm.

(Light-Emitting Layer)

As the light-emitting material making up the light-emitting layer 50, known are a fluorescence emission type (singlet transition) and a phosphorescence emission type (triplet transition). As the light-emitting material making up the light-emitting layer 50, both of them may be used. The light-emitting layer 50 can be formed, for example, by a deposition method or a coating method. As the light-emitting material, both of a low molecular material and a macromolecular material can be utilized. Particularly, the macromolecular material is easily dissolved in a solvent, so that the macromolecular material can be suitably applied to a coating method using a coating liquid in which a light-emitting material is dissolved in a solvent. Accordingly, as the light-emitting material, the macromolecular material capable of being applied to a simple coating method is preferred. "Macromolecule" in the present specification means having a number average molecular weight in terms of polystyrene of $10^3$ or more, usually having a number average molecular weight in terms of polystyrene of $10^8$ or less.

The light-emitting layer 50 is formed with containing an organic substance emitting at least one light among a fluorescence and a phosphorescence or containing the organic substance and a dopant. Examples of the light-emitting material making up mainly the light-emitting layer 50 may include the materials below.

(Coloring Material)

Examples of the coloring material may include polymerized products of a cyclopentamine derivative, a tetraphenylbutadiene derivative compound, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a quinacridone derivative, a coumarin derivative, and a pyrazoline dimer.

(Metal Complex Material)

The metal complex material may be polymerized products of a metal complex having as a central metal, aluminum, zinc, beryllium, or a rare earth metal such as terbium, europium, and dysprosium and having as a ligand, oxadiazole, thiazole, phenylpyridine, phenylbenzimidazole, a quinoline structure, or the like.

The metal complex material may be polymerized products of a metal complex having light emission from a triplet excitation state such as an iridium complex and a platinum complex, an aluminum-quinolinole complex, a benzoquinolinole-beryllium complex, a benzoxazolyl-zinc complex, a benzothiazole-zinc complex, an azomethyl-zinc complex, a porphyrin-zinc complex, or an europium complex.

The macromolecular material may be a poly-p-phenylenevinylene derivative, a polythiophene derivative, a poly-p-phenylene derivative, a polysilane derivative, a polyacetylene derivative, a polyfluorene derivative, and a polyvinylcarbazole derivative.

(Dopant Material)

The light-emitting material making up the light-emitting layer may further contain besides the above light-emitting materials, for example, a dopant material for the purpose of enhancing the light-emitting efficacy and changing the light-emitting wavelength. Examples of the dopant material may include a perylene derivative, a coumarin derivative, a rubrene derivative, a quinacridone derivative, a squarylium derivative, a porphyrin derivative, a styryl-based dyestuff, a tetracene derivative, a pyrazolone derivative, decacyclene, and phenoxazone.

(Other Prescribed Layers)

Although in this configuration example, the layered structure 60 has not only the light-emitting layer 50, but also prescribed layers such as the hole injection layer 42a, the hole transport layer 42b, and the electron injection layer 44, the organic EL element of the present invention is not limited to this configuration example.

Hereinafter, one example of the prescribed layer is described.

Examples of the prescribed layer provided between the cathode 34 and the light-emitting layer 50 may include besides the electron injection layer 44, an electron transport layer and a hole block layer. When between the cathode 34 and the light-emitting layer 50, besides the electron injection layer 44, an electron transport layer is provided, a layer positioned nearer to the cathode 34 refers to the electron injection layer and a layer positioned nearer to the light-emitting layer 50 refers to the electron transport layer.

Examples of the prescribed layer provided between the anode 32 and the light-emitting layer 50 may include besides the hole injection layer 42a and the hole transport layer 42b, an electron block layer and the like. When as illustrated in FIGS., both the hole injection layer 42a and the hole transport layer 42b are provided between the anode 42 and the light-emitting layer 50, a layer positioned nearer to the anode 32 refers to the hole injection layer and a layer positioned nearer to the light-emitting layer 50 refers to the hole transport layer.

The hole injection layer 42a and the electron injection layer 44 may be referred generically as "charge injection layer". The hole transport layer 42b and the electron transport layer may be referred generically as "charge transport layer".

Specific examples of the layer configuration that the layered structure 60 placed between the anode 32 and the cathode 34 may take are as follows:

a) Anode/Hole injection layer/Light-emitting layer/Electron injection layer/Cathode
b) Anode/Hole injection layer/Light-emitting layer/Electron transport layer/Electron injection layer/Cathode
c.) Anode/Hole injection layer/Hole transport layer/Light-emitting layer/Electron injection layer/Cathode
d) Anode/Hole injection layer/Hole transport layer/Light-emitting layer/Electron transport layer/Electron injection layer/Cathode
e) Anode/Light-emitting Layer/Electron injection layer/Cathode
f) Anode/Light-emitting layer/Electron transport layer/Electron injection layer/Cathode (here, the symbol "/" means that the layers sandwiching the symbol "1" are come into contact with each other as adjacent to each other.)

The organic EL element 10 may further comprising an insulation layer having a thickness of around 2 nm or less adjacent to the electrode for enhancing the adhesion with the electrode and improving electric charge injection from the electrode, and for enhancing the adhesion of the interface and preventing the intermixing, in the organic EL element 10, a thin buffer layer may be inserted between the layers adjacent to each other.

Hereinafter, the specific configuration of each prescribed layer is described.

(Hole Injection Layer)

The hole injection layer 42a is a layer having a function of improving the hole injection efficiency from the anode 32. Examples of the hole injection material making up the hole injection layer 42a may include a phenylamine compound, a star-burst type amine compound, a phthalocyanine compound, an oxide such as vanadium oxide, molybdenum oxide, ruthenium oxide, and aluminum oxide, amorphous carbon, polyaniline, and a polythiophene derivative.

The hole injection layer 42a can be film-formed, for example, by a coating method for applying a coating liquid in which the hole injection material is dissolved in a solvent. As the solvent, any suitable solvent can be used under such a condition that the solvent can dissolve the forming materials of the hole injection layer 42a.

Examples of the solvent may include: water; a chlorine solvent such as chloroform, methylene chloride, and dichloroethane; an ether solvent such as tetrahydrofuran; an aromatic hydrocarbon solvent such as toluene and xylene; a ketone solvent such as acetone and methyl ethyl ketone; and an ester solvent such as ethyl acetate, butyl acetate, and ethylcellosolve acetate.

By applying a coating liquid onto the first substrate 22 on which the anode 32 is provided using one of the coating methods described above and by subjecting the resultant coating film to heating treatment, the hole injection layer 42a can be formed.

The optimal value of the thickness of the hole injection layer 42a varies depending on the used material. The thickness of the hole injection layer 42a may be any suitable thickness under such a condition that at least no pin hole will be formed and the driving voltage and the light-emitting efficacy will be moderate values. When the thickness of the hole injection layer 42a is excessively large, the driving voltage of the element increases. Therefore, the thickness of the hole injection layer 42a is, for example 1 nm to 1 preferably 2 nm to 500 nm, more preferably 5 nm to 200 nm.

(Hole Transport Layer)

The hole transport layer 42b has a function of improving the hole injection from the anode 32 or the hole injection layer 42a or the hole transport layer 42b nearer to the anode 32. Examples of the hole transport material making up the hole transport layer 42b may include polyvinylcarbazole or derivatives thereof, polysilane or derivatives thereof, a polysiloxane derivative having an aromatic amine in side chains or the main chain thereof, a pyrazoline derivative, an arylamine derivative, a stilbene derivative, a triphenyldiamine derivative, polyaniline or derivatives thereof, polythiophene or derivatives thereof, polyarylamine or derivatives thereof, polypyrrole or derivatives thereof, poly(p-phenylenevinylene) or derivatives thereof, and poly(2,5-thienylenevinylene) or derivatives thereof.

Among them, as the hole transport material, used can be a macromolecular hole transport material such as polyvinylcarbazole or derivatives thereof, polysilane or derivatives thereof, a polysiloxane derivative having an aromatic amine in side chains or the main chain thereof, polyaniline or derivatives thereof, polythiophene or derivatives thereof, polyarylamine or derivatives thereof, poly(p-phenylenevinylene) or derivatives thereof, and poly(2,5-thienylenevinylene) or derivatives thereof. As the hole transport material, polyvinylcarbazole or derivatives thereof, polysilane or derivatives thereof, and a polysiloxane derivative having an aromatic amine in side chains or the main chain thereof are further preferred. When a low molecular hole transport material is used, the low molecular hole transport material is preferably dispersed in a macromolecular binder to be used.

In the case where a low molecular hole transport material is used, the forming method of the hole transport layer 42b may be a coating method using a mixed solution of the low molecular hole transport material with a macromolecular binder. In the case where a macromolecular hole transport material is used, the forming method of the hole transport layer 42b may be a coating method using a coating liquid in which the macromolecular hole transport material is dissolved in a solvent.

The solvent used in the coating method may be a solvent capable of dissolving the hole transport material. Examples of the solvent used in the coating method may include: a chlorine solvent such as chloroform, methylene chloride, and dichloroethane; an ether solvent such as tetrahydrofuran; an aromatic hydrocarbon solvent such as toluene and xylene; a ketone solvent such as acetone and methyl ethyl ketone; and an ester solvent such as ethyl acetate, butyl acetate, and ethylcellosolve acetate. As the coating method, there can be applied a method described above.

As the macromolecular binder to be mixed with, a macromolecular binder that does not inhibit the electric charge transport is preferred and a macromolecular binder having a weak absorption relative to visible light is preferred to be used. Examples of the macromolecular binder may include polycarbonate, polyacrylate, polymethyl acrylate, polymethyl methacrylate, polystyrene, polyvinyl chloride, and polysiloxane.

The thickness of the hole transport layer is selected so that no pin hole will be formed and the driving voltage and the light-emitting efficacy will be moderate values. The optimal value thereof varies depending on the used material. When the thickness of the hole transport layer is excessively large, the driving voltage of the organic EL element might increase. Therefore, the thickness of the hole transport layer is, for example 1 nm to 1 μm, preferably 2 nm to 500 nm, further preferably 5 nm to 200 nm.

<Electron Transport Layer>

The electron transport layer is a layer having the function of improving the electron injection from the cathode 34 or the electron injection layer 44 or the electron transport layer nearer to the cathode 34. Examples of the electron transport material making up the electron transport layer may include an oxadiazole derivative, anthraquinodimethane or derivatives thereof, benzoquinone or derivatives thereof, naphthoquinone or derivatives thereof, anthraquinone or derivatives thereof, tetracyanoanthraquinodimethane or derivatives thereof, a fluorenone derivative, diphenyldicyanoethylene or derivatives thereof, a diphenoquinone derivative, a metal complex of 8-hydroxyquinoline or derivatives thereof, polyquinoline or derivatives thereof, polyquinoxaline or derivatives thereof, and polyfluorene or derivatives thereof.

Among them, as the electron transport material, an oxadiazole derivative, benzoquinone or derivatives thereof, anthraquinone or derivatives thereof, a metal complex of 8-hydroxyquinoline or derivatives thereof, polyquinoline or derivatives thereof, polyquinoxaline or derivatives thereof, and polyfluorene or derivatives thereof are preferred, and 2-(4-biphenylyl)-5-(4-tert-butylphenyl)-1,3,4-oxadiazole, benzoquinone, anthraquinone, tris(8-quinolinol) aluminum, and polyquinoline are further preferred.

Examples of the method for forming the electron transport layer when a low molecular electron transport material is used may include a vacuum deposition method from a powder and a method by film-forming from a solution state or a molten state and the method for forming the electron transport layer when a macromolecular electron transport material is used may be a method by film-forming from a solution state or a molten state. In the film-forming from a solution state or a molten state, a macromolecular binder may be further used in combination. The method for film-forming the electron transport layer from a solution state or a molten state may be the coating methods described above.

The optimal value of the thickness of the electron transport layer varies depending on the used material. The layer needs to be thick enough at least to cause no pinhole. The thickness may be selected so that the driving voltage and the light-emitting efficacy will be moderate values. When the thickness of the electron transport layer is excessively large, the driving voltage of the element might increase. Therefore, the thickness of the electron transport layer is, for example 1 nm to 1 μm, preferably 2 nm to 500 nm, further preferably 5 nm to 200 nm.

<Electron Block Layer>

The electron block layer is a layer having the function of blocking the electron transport. When at least one of the hole injection layer 42a and the hole transport layer 42b has the function of blocking the electron transport, these layers may serve also as the electron block layer. That the electron block layer has the function of blocking the electron transport can be confirmed, for example, by a method comprising: preparing an element passing through a hole current alone; and confirming the blocking effect from a decrease of the current value thereof.

<Hole Block Layer>

The hole block layer is a layer having the function of blocking the hole transport. When at least one of the electron injection layer and the electron transport layer has the function of blocking the hole transport, these layers may serve also as the hole block layer. That the hole block layer has the function of blocking the hole transport can be confirmed, for example, by a method comprising: preparing an element passing through a hole current alone; and confirming the blocking effect from a decrease of the current value thereof.

<Method For Manufacturing Organic EL Element>

Figure 2:
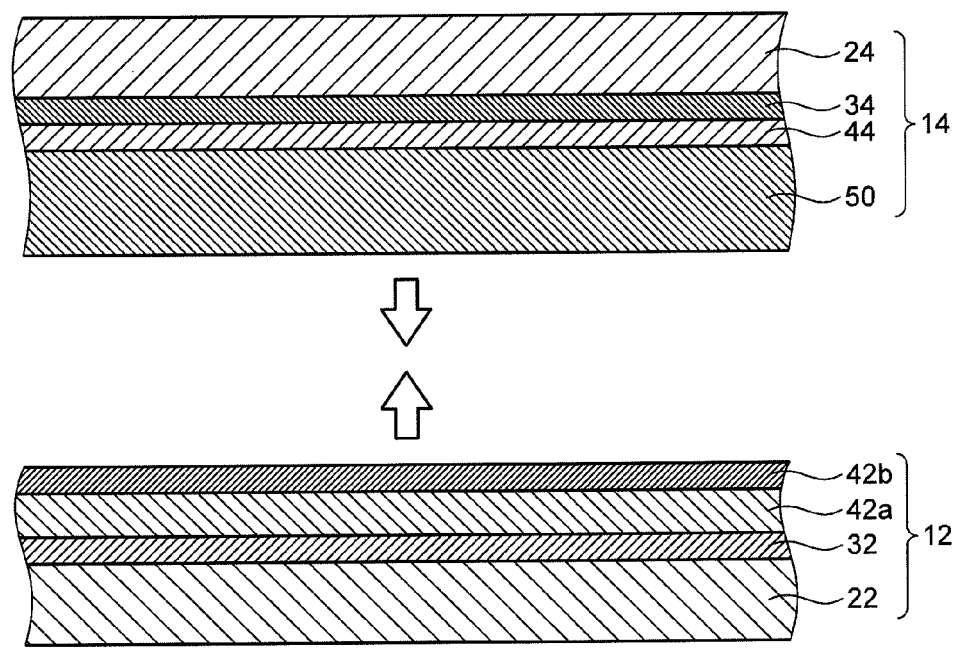
FIG. 2 is a schematic explanatory view illustrating one example of a manufacturing step.

The method for manufacturing the organic EL element of the present invention is described in detail referring to drawings. FIG. 2 is a view schematically illustrating one example of the step of manufacturing the organic EL element.

The method for manufacturing the organic EL element 10 of the present invention is a method for manufacturing the organic EL element 10 comprising the anode 32, the cathode 34, and the layered structure 60 placed between the anode 32 and the cathode 34, and comprises the steps of: preparing a first component in which either the anode alone is or both the anode and at least a part of the organic layers to make up the layered structure is provided on a first substrate; preparing a second component in which either the cathode alone is or both the cathode and the rest part to make up the layered structure excluding the part provided in the first component are provided on a second substrate; and laminating the first component and the second component to form the layered structure placed between the anode and the cathode, wherein the electron injection layer that comprises an ionic polymer is formed in the step of preparing the first component or the second component.

By laminating the first component and the second component, the layered structure is formed, so that (1) in an embodiment in which a part of the layered structure is provided in the first component, the rest part of the layered structure excluding the part provided in the first component is provided in the second component, (2) in an embodiment in which all of the layered structure is provided in the first component, none of the layered structure at all is provided in the second component, and (3) in an embodiment in which none of the layered structure at all is provided in the first component, all of the layered structure is provided in the second component.

There are not only a case where each of the first component and the second component contains a layer making up the layered structure layer by layer, but also a case where each of the first component and the second component contains a part of a layer divided so that the layer part is made up to a single layer by the above laminating step.

As described above, the electron injection layer 44 is formed with the ionic polymer that is difficult to be oxidized at around normal atmospheric pressure and further, even in the atmosphere, so that the above laminating step can be performed at around normal atmospheric pressure and further in the atmosphere.

Upon laminating a first component 12 and a second component 14 to make up the layered structure 60, the combination of the layers forming the contacting surfaces that are the exposed surfaces positioned opposite to the substrates when viewing each of the first component 12 and the second component 14 in the thickness direction of the substrate, is not particularly limited.

In the laminating step according to the configuration example of the organic EL element described referring to FIG. 1 above, when the first layered component and the second layered component that contain layers making up the layered structure layer by layer are laminated, the combination of the layers to come into contact with each other may include the examples below. In the combinations below, the former layer is a layer comprised in the first component 12 and the latter layer is a layer comprised in the second component 14.

1) Anode and hole injection layer
2) Hole injection layer and light-emitting layer
3) Hole injection layer and hole transport layer
4) Hole transport layer and light-emitting layer
5) Light-emitting layer and electron transport layer
6) Light-emitting layer and electron injection layer
7) Electron transport layer and electron injection layer
8) Electron injection layer and cathode In the laminating step, when each layer is a layer formed by applying a coating liquid, the combination of the layers to come into contact with each other may be either a combination of a layer formed from a coating liquid in which a material for the layer is dissolved or dispersed in a solvent having a polarity with a layer formed from a coating liquid in which a material for the layer is dissolved or dispersed in a solvent having a polarity the same as the above polarity, or a combination of a layer formed from a coating liquid in which a material for the layer is dissolved or dispersed in a solvent having a polarity with a layer formed from a coating liquid in which a material for the layer is dissolved or dispersed in a solvent having a polarity different from the above polarity. However, it is preferred to contact and laminate a layer formed from a coating liquid in which a material for the layer is dissolved or dispersed in a solvent having a polarity with a layer formed from a coating liquid in which a material for the layer is dissolved or dispersed in a solvent having a polarity the same as the above polarity. In other words, the laminating step is preferably performed as a step for contacting and laminating the layers formed from the coating liquids in which the material for the layer is dissolved in the solvents having polarities the same as each other with each other, such as the layers formed from the coating liquids using the solvents having the same non-polarity or the layers formed from the coating liquids using the solvents having the same polarity. For example, preferred is the combination of the hole transport layer and the light-emitting layer in 4) above in which each of the solvents of the coating liquids dissolving the material for the layer is a non-polar solvent.

Conventionally, when a plurality of layers are sequentially layered by a coating method using a coating liquid, for example when the light-emitting layer to come into contact with the hole transport layer is formed, the applied coating liquid for forming the light-emitting layer dissolves the hole transport layer formed previously, so that it is necessary to take some measure for preventing the hole transport layer from being dissolved when the coating liquid for forming the light-emitting layer is come into contact with the hole transport layer such as a measure of containing a crosslinker or the like in the coating liquid for forming the hole transport layer to be previously formed beforehand.

However, through the manufacturing method of the present invention, the first component 12 in which layers are formed on the first substrate 22 beforehand and the second component 14 in which layers are formed on the second substrate 24 as a form different from the first component 12 are laminated. Therefore, it is not necessary to contain an unnecessary component such as a crosslinker in layers to come into contact with each other, so that the electric characteristics, the function, and the like of the organic EL element to be manufactured can be enhanced. In addition, a step of effecting a crosslinking reaction can be omitted, so that the manufacturing step can be more simplified. Therefore, the manufacturing cost can be further reduced.

Referring to FIG. 2, one example of the method for manufacturing the organic EL element 10 is described.

This example is an example in which: the first component 12 comprises the hole transport layer 42b and the second component 14 comprises the light-emitting layer 50; and in the laminating step, the first component 12 and the second component 14 are come into contact to be laminated the hole transport layer 42b with the light-emitting layer 50. When the hole transport layer 42b (first layer) and the light-emitting layer 50 (second layer) are formed by the coating method, it is possible to use for forming the first layer, a first coating liquid using a non-polar solvent, and also to use for forming the second layer, a second coating liquid using a non-polar solvent is used. In this case, the polarity of the solvent of the first coating liquid becomes the same as the polarity of the solvent of the second coating liquid. When the layers making up the organic EL element of the present invention are formed by the coating method using a coating liquid, the coating step is performed in the atmosphere. Here, the coating step may be performed not only in the atmosphere, but also at around normal atmospheric pressure, for example in an inert gas atmosphere such as a nitrogen gas and an argon gas. In addition, the coating step may be performed in the atmosphere and a step for solidifying the coated film, for example by heating the coated film may be performed at around normal atmospheric pressure, for example in an inert gas atmosphere such as a nitrogen gas and an argon gas, which is the same hereinafter.

For example, when the electron injection layer 44 is formed by the coating method using a coating liquid, first, a coating liquid containing the ionic polymer is applied and film-formed and next, the film-formed thin film is solidified, thus forming the electron injection layer.

The step of applying and film-forming the coating liquid can be performed at around normal atmospheric pressure and further, in the atmosphere, and from the viewpoint of easy implementation, the step is preferably performed in the atmosphere. The solidification of the applied and film-formed thin film can be performed by drying naturally, irradiating with light, heating-drying at around normal atmospheric pressure, heating-drying in the atmosphere, vacuum-drying, and the like. Among them, from the viewpoint of easy implementation, the solidification of the thin film is preferably performed by heating-drying at around normal atmospheric pressure or heating-drying in the atmosphere and further, from the viewpoint of lengthening the element life, the solidification of the thin film is preferably performed by heating-drying in the atmosphere. When the applied and film-formed thin film is solidified by heating-drying the thin film, although the temperature for heating varies depending on the time for heating, the temperature is around 50° C. to 250° C., preferably 60° C. to 200° C. When the applied and film-formed thin film is solidified by heating-drying, although the time for heating varies depending on the temperature for heating, the time is around 5 minutes to 120 minutes, preferably 10 minutes to 60 minutes.

Here, "the atmosphere" means an atmosphere allowing containing the moisture and oxygen. Specifically, "the atmosphere" may include an unadjusted atmosphere at normal temperature and under normal pressure and further, includes an atmosphere adjusted with respect to the temperature, the pressure, the component, and the like while allowing containing the moisture and oxygen. This "adjusted atmosphere" may include an atmosphere that is subjected to a treatment of adjusting the constituent such as nitrogen, hydrogen, oxygen, and carbon dioxide under such a condition that the manufacturing method of the present invention comprising "applying" can be performed and a treatment of adjusting the ratio of these constituents, and in which the cleanliness with respect to airborne fine particles and airborne microbes may be adjusted and further, an environmental condition such as the temperature, the humidity, and the pressure may be adjusted under such a condition that the manufacturing method of the present invention comprising "applying" can be performed. The pressure of "the atmosphere" is usually normal pressure of 1,013 hPa±100 hPa.

(Step of Preparing First Component)

As illustrated in FIG. 2, first, the anode 32 is formed on the first substrate 22. First, the first substrate 22 is prepared and on one side of the first substrate 22 in the thickness direction thereof, a film of a conductive material is formed, followed by patterning the resultant film by a photolithography step and a patterning step following the photolithography step such as an etching step to form the anode 32. This step may be a step of forming the anode 32 by obtaining a substrate in which a film of a conductive material is film-formed on the first substrate 22 beforehand and performing the patterning step.

Next, by the material and the manufacturing step, which are described above, the hole injection layer 42a is formed so as to come into contact with the anode 32 and further, the hole transport layer 42b is formed so as to come into contact with the hole injection layer 42a. These hole injection layer 42a and hole transport layer 42b can be formed as layers by a method including: preparing a coating liquid using a solvent suitable for a selected material; applying the coating liquid by the coating method as described above such as a spin coating method; and subjecting the formed coating film to heating treatment.

By the above step, the first component 12 is formed.

(Step of Preparing Second Component)

First, the cathode 34 is formed on the second substrate 24. For forming the cathode 34, as described above, any suitable forming method such as a deposition method can be selected according to the selected material. The cathode 34 can be formed also by the coating method using a coating liquid like in the case of the hole injection layer 42a and the hole transport layer 42b.

As the method for forming the cathode 34 by the coating method, a method for applying a coating liquid in which a cathode material is dispersed in a solvent, a method for transferring a layer of a coating liquid formed on another supporting substrate, and the like are preferred.

The formation of the cathode 34 by the coating method is performed by applying the above coating liquid onto the second substrate 24. The applying of the coating liquid is preferably performed by the coating method such as a spin coating method or the printing method such as an inkjet method. Then, by subjecting the resultant coating film to heating treatment, the cathode 34 can be formed.

Next, using the coating liquid containing the ionic polymer, which is described above, by the coating method in the atmosphere, the electron injection layer 44 is formed so as to come into contact with the cathode 34.

The formation of the electron injection layer 44 can be performed by applying the coating liquid containing the ionic polymer having the function of improving the electron injection efficiency.

First, the ionic polymer is dissolved in a polar solvent to prepare a coating liquid. The coating liquid containing the ionic polymer is applied onto the provided cathode 34 so as to come into contact with the cathode 34. Like in the case of the hole injection layer 42a, the hole transport layer 42b, and the cathode 34, which are described above, as the coating method, a spin coating method and further, the printing method such as an inkjet method can be used.

Next, by subjecting the coating film of the coating liquid containing the ionic polymer to heating treatment, the electron injection layer 44 is formed.

Furthermore, by the same coating method as in the case of the hole injection layer 42a, the hole transport layer 42b, the cathode 34, and the electron injection layer 44, which are described above, the light-emitting layer 50 is formed so as to come into contact with the electron injection layer 42a.

By the above step, the second component 14 is formed.

(Step of Laminating First Component and Second Component)

As illustrated in FIG. 2, first, the hole transport layer 42b of the first component 12 and the light-emitting layer 50 of the second component 14 are positioned as opposite to each other.

In the illustrated example in FIG. 2, although the second component 14 is positioned upper than the first component 12, as another embodiment, the first component 12 may be positioned upper than the second component 14 to perform the laminating step.

Next, the first component 12 and the second component 14 are brought near to each other in the direction of the outlined arrows to be brought into contact and to be contacted. At this time, the solvent used in the coating liquid for forming the layers to come into contact with each other may also be applied to the contacting surfaces.

In this step, when at least one of the first component 12 and the second component 14 is a rigid substrate having low flexibility, the step can be performed, for example, by using a surface plate capable of holding the substrate attachably and detachably.

Next, in the state in which the first component 12 and the second component 14 are laminated, an adhesive member not illustrated is arranged as surrounding the organic EL element 10 to seal the organic EL element 10 with this adhesive member.

Thus, by laminating the first component 12 and the second component 14, the layered structure 60 is completed.

When the first component 12 and the second component 14 are structures exhibiting flexibility and are elongated film structures rolled up by a roll, the laminating step can be performed by a roll-to-roll process. Hereinafter, the laminating step by a roll-to-roll process is described.

(Step of Laminating First Component and Second Component by Roll-to-Roll Process)

When the laminating step is performed by a roll-to-roll process, the first component 12 comprising the first substrate 22 and the second component 14 comprising the second substrate 24 are elongated film structures to be rolled up from unwinding rolls to a winding roll and the laminating step is performed by continuously laminating each other the first component 12 and the second component 14 wound off from the each unwinding roll to be wound up with the winding roll.

<Configuration Example of Manufacturing Apparatus>

A manufacturing apparatus (laminating apparatus) for laminating a plurality of film structures with each other that can be suitably applied to a laminating step by a roll-to-roll process, is described.

Figure 3:
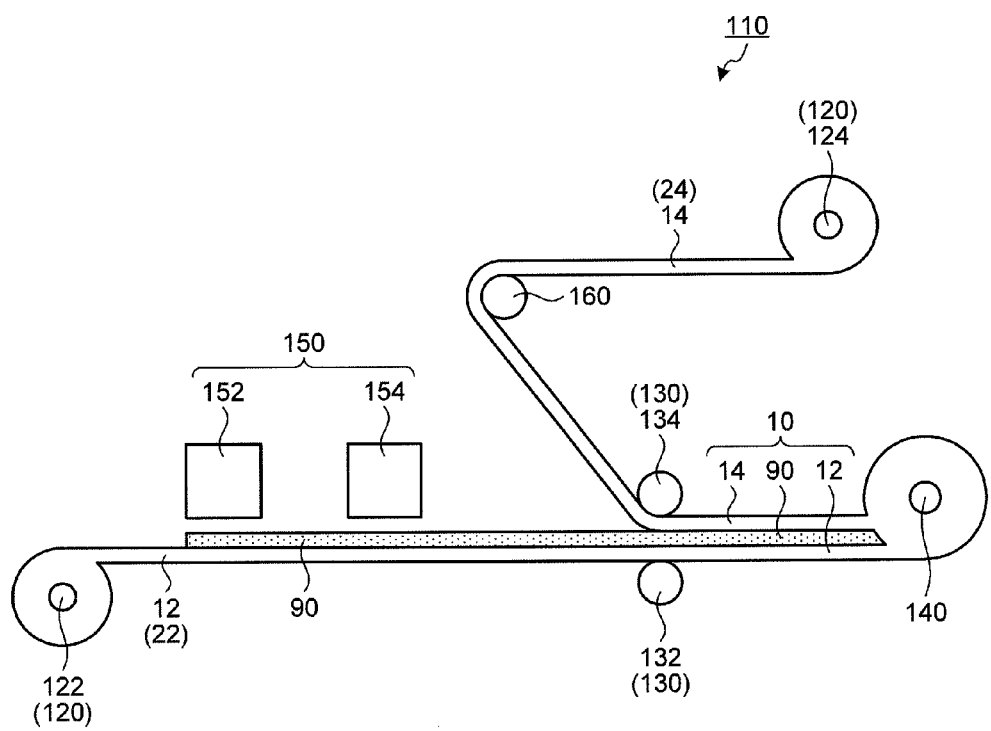
FIG. 3 is a schematic explanatory view illustrating one example of a manufacturing apparatus.

FIG. 3 is a schematic view describing a configuration example of the manufacturing apparatus.

As illustrated in FIG. 3, a manufacturing apparatus 110 comprises: two unwinding rolls 120 comprising a first unwinding roll 122 and a second unwinding roll 124; laminating rolls 130 that are a combination of a first laminating roll 132 and a second laminating roll 134; and a winding roll 140 for rolling up the laminated film structure.

The first unwinding roll 122 and the second unwinding roll 124 are positioned so as to be separated from each other. The laminating rolls 130 are positioned so as to be capable of laminating the first component 12 that is a film member and is wound off from the first unwinding roll 122 and the second component 14 that is a film member and is wound off from the second unwinding roll 124. The laminating roll 130s may be positioned so that for example, the first laminating roll 132 is fixed as a fixed roll and the second laminating roll 134 is positioned as a movable roll so that the contacting surfaces to come into contact with each other of the film members are opposite to each other.

In the vicinity of the conveying routes of the film member from the unwinding rolls 120 until the laminating roll 130, provided may be any suitable treating apparatuses 150 capable of subjecting the surface of the film member on the way of conveying to some desired treatment. For example, provided may also be an applying apparatus 152 for applying an adhesive member 90 for laminating onto the film member, a drying apparatus 154 for drying an excessive solvent contained in the adhesive member 90 applied onto the film member, one or more assistant rolls 160 for assisting the conveying of the film member or changing the conveying direction of the film member, and the like.

For the unwinding rolls 120, the laminating rolls 130, the winding roll 140, the treating apparatuses 150, and the assistant roll 160 contained in the manufacturing apparatus 110, any suitable configuration that has conventionally been publicly known can be adopted.

<Laminating Step>

The first component 12 rolled up by the first unwinding roll 122 and the second component 14 rolled up by the second unwinding roll 24 are wound off and the first component 12 and the second component 14 are sandwiched between the first laminating roll 132 and the second laminating roll 134 to be laminated to prepare the organic EL element 10 that is an elongated film structure. The elongated film structure is continuously rolled up by the winding roll 40.

In this step example, in the vicinity of the conveying route of the film member from the first unwinding roll 122 until the laminating rolls 130, provided is the treating apparatus 150 comprising the applying apparatus 152 for applying the adhesive member 90 and the drying apparatus 154 for drying the applied adhesive member 90, and through the adhesive member 90 applied to the first component 12 on the way of the conveying of the film member and dried, the first component 12 and the second component 14 are laminated.

After the completion of the laminating step, the adhesive member (90) is subjected to curing treatment. This curing treatment can be performed by a prescribed method according to the type of the adhesive member. As the adhesive member, for example, an ultraviolet ray curing-type resin and a thermally curing-type resin can be used. In this case, by subjecting the adhesive member to an irradiating with ultraviolet ray treatment, a heating treatment, or the like, the adhesive member is cured and the cured adhesive member can be caused to function as a sealing portion.

Through the method for manufacturing the organic EL element of the present invention, as described above, as the material for the electron injection layer 44, used is the ionic polymer that is difficult to be degraded and the function thereof is difficult to be lowered even when exposed to the moisture and oxygen in an atmosphere at around normal atmospheric pressure and further in the atmosphere, so that the forming step thereof can be performed in an atmosphere at around normal atmospheric pressure and further in the atmosphere. Therefore, the manufacturing of the organic EL element can be performed in the atmosphere and large scale equipment such as a vacuum chamber is not necessary, so that the step of manufacturing the organic EL element can be extremely simplified and the manufacturing cost can be remarkably reduced.

Through the manufacturing method of the present invention, the first component in which prescribed layers are formed and the second component in which prescribed layers are formed as different forms from each other, are laminated. Therefore, it is not necessary to contain an unnecessary component such as a crosslinker in the layers to come into contact with each other, so that the electric characteristics, the function, and the like of the manufactured organic EL element can be enhanced. In addition, a step of effecting a crosslinking reaction can be omitted, so that the manufacturing step can be more simplified. Therefore, the manufacturing cost can be further reduced.

Furthermore, through the manufacturing method of the present invention, upon forming the first component and the second component, when a finally formed layer is assumed to be a light-emitting layer, the light-emitting layer is not exposed to heating treatment during the formation of other layers, so that at least in the manufacturing step, the light-emitting layer is not degraded and significant characteristics such as the electric characteristics and the element life of the manufactured organic EL element can be enhanced.

EXAMPLES

With respect to more preferred several types of specific examples among the above-described ionic polymers used in the present invention, the synthesis examples thereof and the organic EL elements prepared using the synthesized ionic polymers are illustrated as Experiment Example below.

Hereinafter, based on Experiment Example, the present invention is more specifically described. Experiment Examples below should not be construed as limiting the scope of the present invention.

The weight average molecular weight (Mw) and the number average molecular weight (Mn) were measured using gel permeation chromatography (GPC) (manufactured by Tosoh Corporation: HLC-8220GPC) as the weight average molecular weight and the number average molecular weight in terms of polystyrene. The sample to be measured was dissolved in tetrahydrofuran so as to have a concentration of about 0.5% by weight and 50 µL of the resultant solution was injected into GPC. Moreover, as the mobile phase of GPC, tetrahydrofuran was used and the mobile phase was flowed at a flow rate of 0.5 mL/min. The structural analysis of the polymer was performed by a $^1$H-NMR analysis using 300 MHz NMR spectrometer (manufactured by Varian Inc.). The measurement was performed by dissolving the sample in a deuterated solvent (a solvent in which a hydrogen atom in a solvent molecule is substituted with a deuterium atom) capable of dissolving the sample so as to have a concentration of 20 mg/mL. The orbital energy of the highest occupied molecular orbital (HOMO) of the polymer was obtained by measuring the ionization potential of the polymer as the orbital energy of HOMO. On the other hand, the orbital energy of the lowest unoccupied molecular orbital (LUMO) of the polymer was obtained by measuring the energy difference between HOMO and LUMO and by calculating the sum of the energy difference and the above measured ionization potential as the orbital energy of LUMO. For measuring the ionization potential, a photoelectronic spectrophotometer (RIKEN KEIKI Co., Ltd.: AC-2) was used. The energy difference between HOMO and LUMO is obtained from an absorption terminal of an absorption spectrum of the polymer measured using an ultraviolet-visible-near infrared spectrophotometer (manufactured by Varian Inc.: Cary 5E).

Reference Example 1

Synthesis of 2,7-dibromo-9,9-bis[3-ethoxycarbonyl-4-[2-[2-(2-methoxyethoxy)ethoxy]ethoxy]phenyl]-fluorene (Compound A)

2,7-dibromo-9-fluorenone (52.5 g), ethyl salicylate (154.8 g), and mercapto acetic acid (1.4 g) were charged into a 300 mL flask and an atmosphere in the flask was purged with nitrogen (hereinafter, "the atmosphere in the flask was purged with nitrogen" may be described as only "was purged with nitrogen"). Thereto, methanesulfonic acid (630 mL) was added thereto and the resultant reaction mixture was stirred at 75° C. all night. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered. The resultant solid (62.7 g), 2-[2-(2-methoxyethoxy)ethoxy]-p-toluene sulfonate (86.3 g), potassium carbonate (62.6 g), and 18-crown-6 (7.2 g) were dissolved in N,N-dimethylformamide (DMF) (670 mL) and the resultant reaction solution was transferred into a flask and was stirred at 105° C. all night. The resultant reaction mixture was left to be cooled down to room temperature and into the flask, ice water was added, followed by stirring the resultant reaction mixture for 1 hour. To the reaction mixture, chloroform (300 mL) was added to subject the resultant reaction mixture to phase-separation extraction and the resultant extract was concentrated, thus obtaining 2,7-dibromo-9,9-bis[3-ethoxycarbonyl-4-[2-[2-(2-methoxyethoxy)ethoxy]ethoxy]phenyl]-fluorene (compound A) (51.2 g).

[Chemical Formula 64]

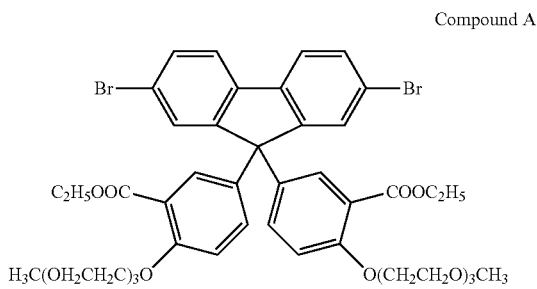

Compound A

Reference Example 2

Synthesis of 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (Compound B)

In a nitrogen atmosphere, the compound A (15 g), bis(pinacolate)diboron (8.9 g), [1,1'-bis(diphenylphosphino)ferrocene]dichloropalladium (II) dichloromethane complex (0.8 g), 1,1'-bis(diphenylphosphino)ferrocene (0.5 g), potassium acetate (9.4 g), and dioxane (400 mL) were mixed and the resultant reaction mixture was heated to 110° C. to heating-reflux the reaction mixture for 10 hours. The reaction mixture was left to be cooled down and was filtered and the filtrate was concentrated under reduced pressure. The reaction mixture was washed with methanol for three times. The resultant precipitate was dissolved in toluene and to the resultant solution, an activated carbon was added, followed by stirring the resultant mixture. Then, the mixture was filtered and the filtrate was concentrated under reduced pressure, thus obtaining 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B) (11.7 g).

[Chemical Formula 65]

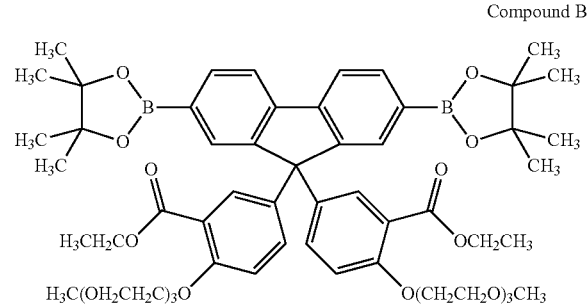

Compound B

Reference Example 3

Synthesis of poly[9,9-bis[3-ethoxycarbonyl-4-[2-[2-(2-methoxyethoxy)ethoxy]ethoxy]phenyl]-fluorene] (Polymer A)

In an inert atmosphere, the compound A (0.55 g), the compound B (0.61 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 8 hours. To the reaction mixture, 4-tert-butylphenylboronic acid (0.01 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. Then, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered to obtain a solid. The obtained solid was dissolved in tetrahydrofuran and the resultant solution was passed through an alumina column and a silica gel column to purify the solution. The tetrahydrofuran solution recovered from the column was concentrated and the concentrate was dropped into methanol (200 mL), followed by filtering and drying a deposited solid. The yield of obtained poly[9,9-bis[3-ethoxycarbonyl-4-bis[2-[2-(2-methoxyethoxy)ethoxy]ethoxy]phenyl]-fluorene] (polymer A) was 520 mg.

The number average molecular weight in terms of polystyrene of the polymer A was $5.2 \times 10^4$. The polymer A contains a structural unit represented by Formula (A).

[Chemical Formula 66]

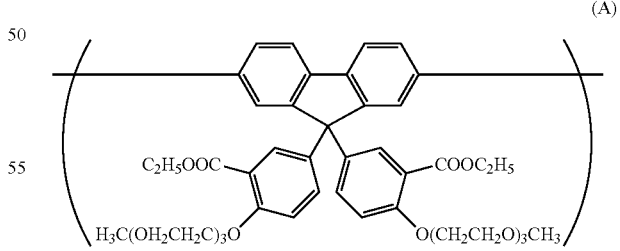

(A)

Experiment Example 1

Synthesis of Cesium Salt of Polymer A

The polymer A (200 mg) was charged into a 100 mL flask and an atmosphere in the flask was purged with nitrogen. To the polymer A, tetrahydrofuran (20 mL) and ethanol (20 mL)

were added and the temperature of the resultant reaction mixture was elevated to 55° C. Thereto, an aqueous solution prepared by dissolving cesium hydroxide (200 mg) in water (2 mL) was added and the resultant reaction mixture was stirred at 55° C. for 6 hours. The reaction mixture was cooled down to room temperature and therefrom, the reaction solvent was distilled off under reduced pressure. A generated solid was washed with water and was dried under reduced pressure, thus obtaining a light yellow solid (150 mg). By an NMR spectrum of the solid, it was confirmed that a signal ascribed to an ethyl group in an ethyl ester moiety in the polymer A disappeared completely. The obtained polymer A cesium salt is called a conjugated macromolecular compound 1. The conjugated macromolecular compound 1 contains a structural unit represented by Formula (B) ("the ratio of a structural unit containing one or more group(s) selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 1 was −5.5 eV and the orbital energy of LUMO of the conjugated macromolecular compound 1 was −2.7 eV.

[Chemical Formula 67]

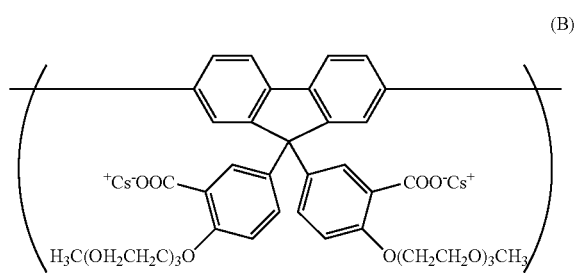

(B)

Experiment Example 2

Synthesis of Potassium Salt of Polymer A

The polymer A (200 mg) was charged into a 100 mL flask and an atmosphere in the flask was purged with nitrogen. Tetrahydrofuran (20 mL) and methanol (10 mL) were mixed with the polymer A. To the resultant reaction mixture, an aqueous solution prepared by dissolving potassium hydroxide (400 mg) in water (2 mL) was added and the resultant reaction mixture was stirred at 65° C. for 1 hour. To the reaction mixture, 50 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (131 mg). By an NMR spectrum of the solid, it was confirmed that a signal ascribed to an ethyl group in an ethyl ester moiety in the polymer A disappeared completely. The obtained polymer A potassium salt is called a conjugated macromolecular compound 2. The conjugated macromolecular compound 2 contains a structural unit represented by Formula (C) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 2 was −5.5 eV and the orbital energy of LUMO of the conjugated macromolecular compound 2 was −2.7 eV.

[Chemical Formula 68]

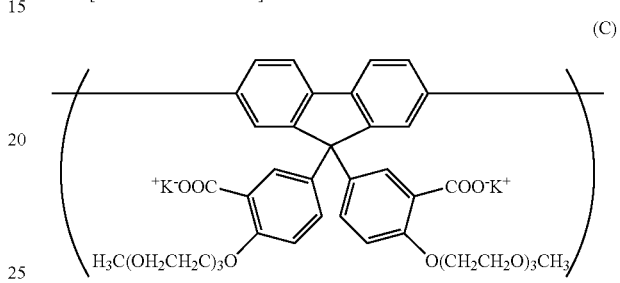

(C)

Experiment Example 3

Synthesis of Sodium Salt of Polymer A

The polymer A (200 mg) was charged into a 100 mL flask and an atmosphere in the flask was purged with nitrogen. Tetrahydrofuran (20 mL) and methanol (10 mL) were mixed with the polymer A. To the resultant reaction mixture, an aqueous solution prepared by dissolving sodium hydroxide (260 mg) in water (2 mL) was added and the resultant reaction mixture was stirred at 65° C. for 1 hour. To the reaction mixture, 30 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (123 mg). By an NMR spectrum of the solid, it was confirmed that a signal ascribed to an ethyl group in an ethyl ester moiety in the polymer A disappeared completely. The obtained polymer A sodium salt is called a conjugated macromolecular compound 3. The conjugated macromolecular compound 3 contains a structural unit represented by Formula (D) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 3 was −5.6 eV and the orbital energy of LUMO of the conjugated macromolecular compound 3 was −2.8 eV.

[Chemical Formula 69]

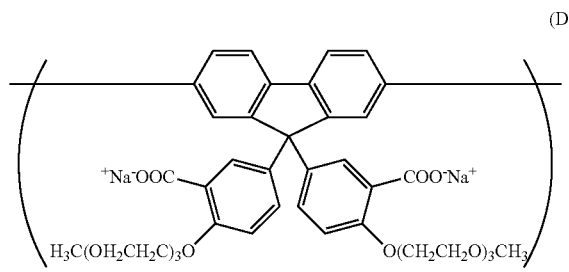

(D)

Experiment Example 4

Synthesis of Ammonium Salt of Polymer A

The polymer A (200 mg) was charged into a 100 mL flask and an atmosphere in the flask was purged with nitrogen. Tetrahydrofuran (20 mL) and methanol (15 mL) were mixed with the polymer A. To the resultant reaction mixture, an aqueous solution prepared by dissolving tetramethylammonium hydroxide (50 mg) in water (1 mL) was added and the resultant reaction mixture was stirred at 65° C. for 6 hours. To the reaction mixture, an aqueous solution prepared by dissolving tetramethylammonium hydroxide (50 mg) in water (1 mL) was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (150 mg). By an NMR spectrum of the solid, it was confirmed that a signal ascribed to an ethyl group in an ethyl ester moiety in the polymer A disappeared by 90%. The obtained polymer A ammonium salt is called a conjugated macromolecular compound 4. The conjugated macromolecular compound 4 contains a structural unit represented by Formula (E) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 90% by mole). The orbital energy of HOMO of the conjugated macromolecular compound 4 was −5.6 eV and the orbital energy of LUMO of the conjugated macromolecular compound 4 was −2.8 eV.

[Chemical Formula 70]

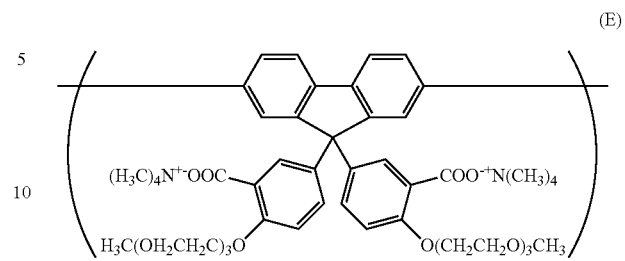

(E)

Reference Example 4

Synthesis of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (Polymer B)

In an inert atmosphere, the compound A (0.52 g), 2,7-bis (1,3,2-dioxaborolan-2-yl)-9,9-dioctylfluorene (1.29 g), (triphenylphosphine)palladium (0.0087 g), methyltrioctylammonium chloride (manufactured by Aldrich Corp.; trade name: Aliquat 336 (registered trade mark)) (0.20 g), toluene (10 mL), and a 2M sodium carbonate aqueous solution (10 mL) were mixed and the resultant reaction mixture was heated to 80° C. The reaction mixture was subjected to the reaction for 3.5 hours. Then, to the reaction mixture, p-bromotoluene (0.68 g) was added and the resultant reaction mixture was further subjected to the reaction for 2.5 hours. After the completion of the reaction, the reaction mixture was cooled down to room temperature and to the reaction mixture, ethyl acetate 50 mL/distilled water 50 mL was added, followed by removing the aqueous phase. To the reaction mixture, 50 mL of distilled water was added again and the aqueous phase was removed. To the reaction mixture, magnesium sulfate as a drying agent was added and insoluble matters were filtered, followed by removing the organic solvent. Then, the resultant residue was dissolved in 10 mL of THF again and to the resultant solution, 2 mL of saturated sodium diethyldithiocarbamate water was added. The resultant reaction mixture was stirred for 30 minutes and therefrom, the organic solvent was removed. The resultant residue was passed through an alumina column (eluent: hexane:ethyl acetate=1:1, v/v) to purify the residue. A deposited precipitate was filtered and the precipitate was dried under reduced pressure for 12 hours, thus obtaining 524 mg of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy] phenyl]-fluorene (polymer B)

The number average molecular weight in terms of polystyrene of the polymer B was $2.0 \times 10^3$. The polymer B is represented by Formula (F).

[Chemical Formula 71]

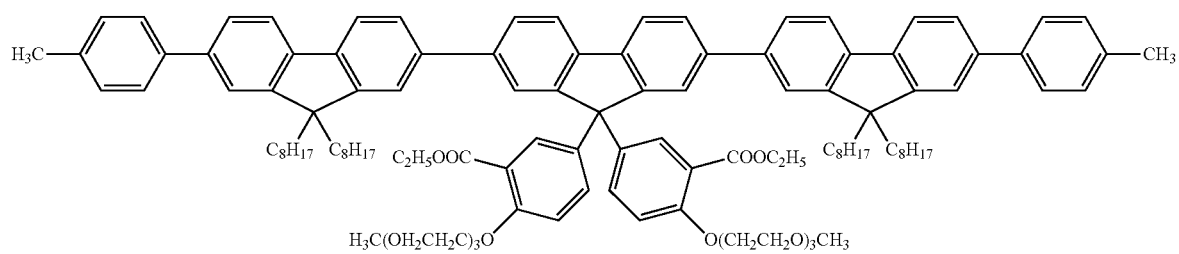

(F)

Experiment Example 5

Synthesis of Cesium Salt of Polymer B

The polymer B (262 mg) was charged into a 100 mL flask and an atmosphere in the flask was purged with argon. Into the flask, tetrahydrofuran (10 mL) and methanol (15 mL) were added and the temperature of the resultant reaction mixture was elevated to 55° C. To the reaction mixture of which temperature was elevated, an aqueous solution prepared by dissolving cesium hydroxide (341 mg) in water (1 mL) was added and the resultant reaction mixture was stirred at 55° C. for 5 hours. The reaction mixture was cooled down to room temperature and therefrom, the reaction solvent was distilled off under reduced pressure. A generated solid was washed with water and was dried under reduced pressure, thus obtaining a light yellow solid (250 mg). By an NMR spectrum of the solid, it was confirmed that a signal ascribed to an ethyl group in an ethyl ester moiety disappeared completely. The obtained polymer B cesium salt is called a conjugated macromolecular compound 5. The conjugated macromolecular compound 5 is represented by Formula (G) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are calculated by rounding off to one decimal place as 33.3% by mole). The orbital energy of HOMO of the conjugated macromolecular compound 5 was −5.6 eV and the orbital energy of LUMO of the conjugated macromolecular compound 5 was −2.6 eV.

Reference Example 5

Synthesis of Polymer C

In an inert atmosphere, the compound A (0.40 g), the compound B (0.49 g), N,N'-bis(4-bromophenyl)-N,N'-bis(4-tert-butyl-2,6-dimethylphenyl)-1,4-phenylenediamine (35 mg), (triphenylphosphine)palladium (8 mg), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 8 hours. To the reaction mixture, phenylboronic acid (0.01 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. A deposited precipitate was filtered and the precipitate was dried under reduced pressure for 2 hours, followed by dissolving the precipitate in 20 mL of tetrahydrofuran.

The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrated tetrahydrofuran solution was dropped into methanol (200 mL), followed by filtering and drying a deposited solid. The yield of the obtained solid (polymer C) was 526 mg.

The number average molecular weight in terms of polystyrene of the polymer C was $3.6 \times 10^4$. The polymer C contains a structural unit represented by Formula (H).

Here, N,N'-bis(4-bromophenyl)-N,N'-bis(4-tert-butyl-2,6-dimethylphenyl)-1,4-phenylenediamine can be synthesized, for example, by a method described in JP 2008-74917 A.

[Chemical Formula 72]

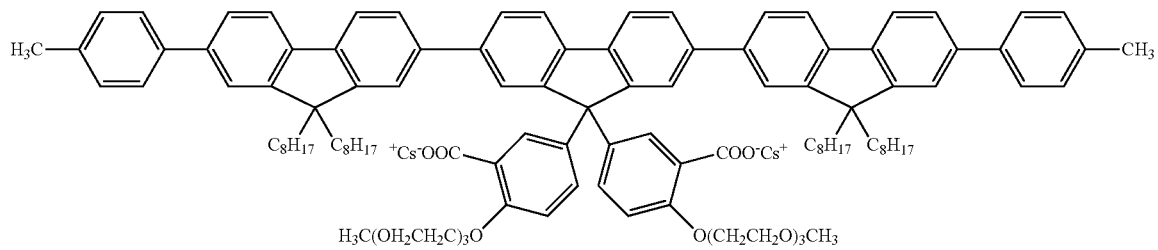

(G)

[Chemical Formula 73]

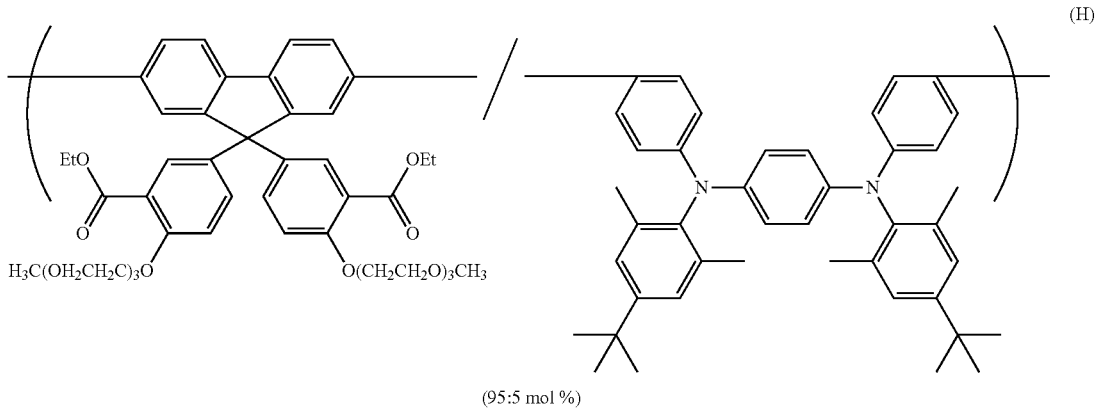

(95:5 mol %)

Experiment Example 6

Synthesis of Cesium Salt of Polymer C

The polymer C (200 mg) was charged into a 100 mL flask and an atmosphere in the flask was purged with nitrogen. Into the flask, tetrahydrofuran (20 mL) and methanol (20 mL) were added and the resultant reaction mixture was mixed. To the reaction mixture, an aqueous solution prepared by dissolving cesium hydroxide (200 mg) in water (2 mL) was added and the resultant reaction mixture was stirred at 65° C.

[Chemical Formula 74]

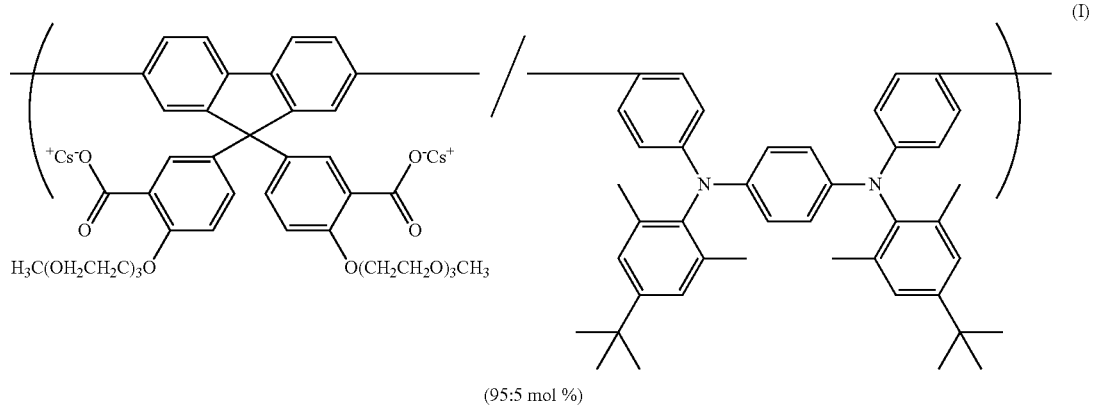

(95:5 mol %)

for 1 hour. To the reaction mixture, 30 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (150 mg). By an NMR spectrum of the solid, it was confirmed that a signal ascribed to an ethyl group in an ethyl ester moiety in the polymer C disappeared completely. The obtained polymer C cesium salt is called a conjugated macromolecular compound 6. The conjugated macromolecular compound 6 contains a structural unit represented by Formula (1) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 95% by mole). The orbital energy of HOMO of the conjugated macromolecular compound 6 was −5.3 eV and the orbital energy of LUMO of the conjugated macromolecular compound 6 was −2.6 eV.

Reference Example 6

Synthesis of Polymer D

In an inert atmosphere, the compound A (0.55 g), the compound B (0.67 g), (4-bromophenyl)-N,N'-bis(4-tert-butyl-2,6-dimethylphenyl)-1,4-phenylenediamine (0.038 g), 3,7-dibromo-N-(4-n-butylphenyl)phenoxazine (0.009 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 2 hours. To the reaction mixture, phenylboronic acid (0.004 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. A deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrated tetrahydrofuran solution was dropped into methanol (200 mL), followed by filtering and drying a deposited solid. The yield of the obtained solid (polymer D) was 590 mg.

The number average molecular weight in terms of polystyrene of the polymer D was $2.7 \times 10^4$. The polymer D contains a structural unit represented by Formula (J).

Here, 3,7-dibromo-N-(4-n-butylphenyl)phenoxazine was synthesized according to a method described in JP 2007-70620 A (or referring to a method described in JP 2004-137456 A).

Experiment Example 7

Synthesis of Cesium Salt of Polymer D

The polymer D (200 mg) was charged into a 100 mL flask and an atmosphere in the flask was purged with nitrogen. Tetrahydrofuran (15 mL) and methanol (10 mL) were mixed with the polymer D. To the reaction mixture, an aqueous solution prepared by dissolving cesium hydroxide (360 mg) in water (2 mL) was added and the resultant reaction mixture was stirred at 65° C. for 3 hours. To the reaction mixture, 10 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (210 mg). By an NMR spectrum of the solid, it was confirmed that a signal ascribed to an ethyl group in an ethyl ester moiety in the polymer D disappeared completely. The obtained polymer D cesium salt is called a conjugated macromolecular compound 7. The conjugated macromolecular compound 7 contains a structural unit represented by Formula (K) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 90% by mole). The orbital energy of HOMO of the conjugated macromolecular compound 7 was −5.3 eV and the orbital energy of LUMO of the conjugated macromolecular compound 7 was −2.4 eV.

[Chemical Formula 75]

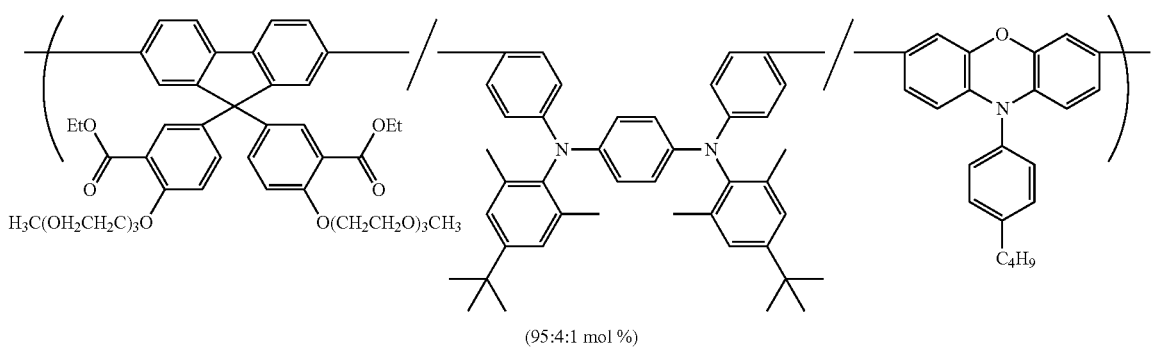

(J)

(95:4:1 mol %)

[Chemical Formula 76]

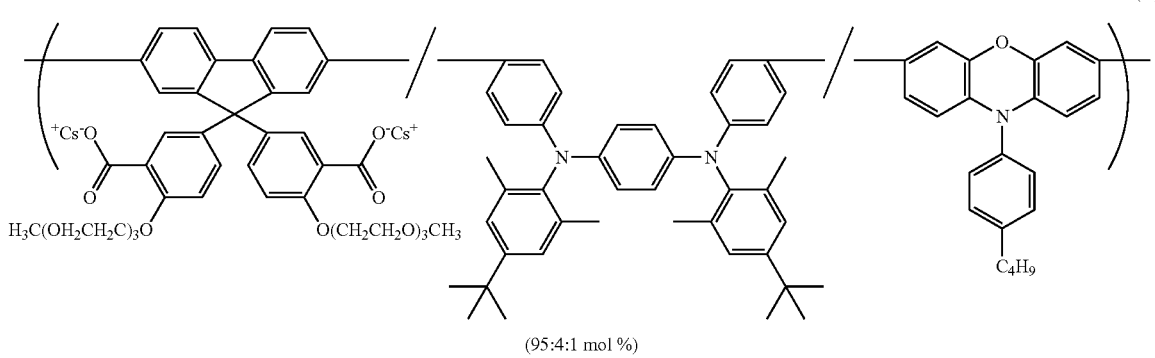

(95:4:1 mol %)

Reference Example 7

Synthesis of Polymer E

In an inert atmosphere, the compound A (0.37 g), the compound B (0.82 g), 1,3-dibromobenzene (0.09 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 7 hours. To the reaction mixture, phenylboronic acid (0.002 g) was added and the resultant reaction mixture was refluxed for 10 hours. Next, to the reaction mixture, a sodium diethyldithiocarbamate aqueous solution (10 mL, concentration: 0.05 g/mL) was added and the resultant reaction mixture was stirred for 1 hour. The reaction mixture was dropped into 300 mL of methanol and the resultant reaction mixture was stirred for 1 hour. A deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrate was dropped into methanol (200 mL), followed by filtering and drying a deposited solid. The yield of the obtained solid (polymer E) was 293 mg.

The number average molecular weight in terms of polystyrene of the polymer E was $1.8 \times 10^4$. The polymer E consists of a structural unit represented by Formula (L).

[Chemical Formula 77]

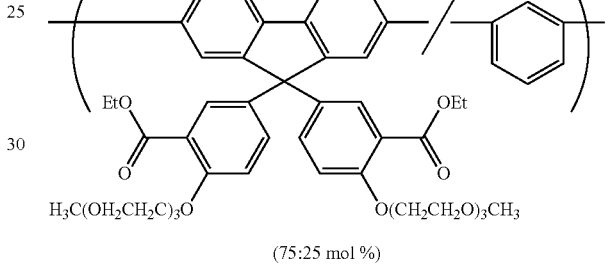

(75:25 mol %)

Experiment Example 8

Synthesis of Cesium Salt of Polymer E

The polymer E (200 mg) was charged into a 100 mL flask and an atmosphere in the flask was purged with nitrogen. Tetrahydrofuran (10 mL) and methanol (5 mL) were mixed with the polymer E. To the resultant reaction mixture, an aqueous solution prepared by dissolving cesium hydroxide (200 mg) in water (2 mL) was added and the resultant reaction mixture was stirred at 65° C. for 2 hours. To the reaction mixture, 10 mL of methanol was added and further, the resultant reaction mixture was stirred at 65° C. for 5 hours. The reaction mixture was cooled down to room temperature and therefrom, the reaction solvent was distilled off under reduced pressure. A generated solid was washed with water and was dried under reduced pressure, thus obtaining a light yellow solid (170 mg). By an NMR spectrum of the solid, it was confirmed that a signal ascribed to an ethyl group in an ethyl ester moiety in the polymer E disappeared completely. The obtained polymer E cesium salt is called a conjugated macromolecular compound 8. The conjugated macromolecular compound 8 contains a structural unit represented by Formula (M) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 75% by mole).

The orbital energy of HOMO of the conjugated macromolecular compound 8 was −5.6 eV and the orbital energy of LUMO of the conjugated macromolecular compound 8 was −2.6 eV.

[Chemical Formula 78]

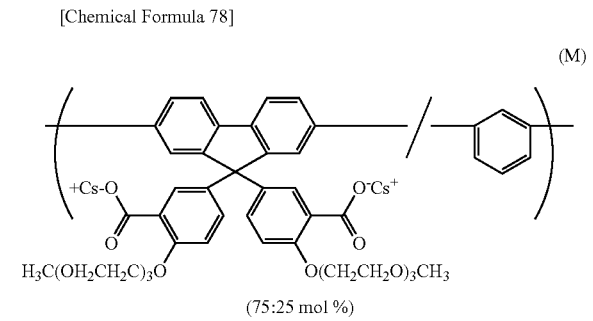

(M)

(75:25 mol %)

Reference Example 8

Synthesis of Polymer F

In an inert atmosphere, the compound B (1.01 g), 1,4-dibromo-2,3,5,6-tetrafluorobenzene (0.30 g), (triphenylphosphine)palladium (0.02 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 4 hours. To the reaction mixture, phenylboronic acid (0.002 g) was added and the resultant reaction mixture was refluxed for 4 hours. Next, to the reaction mixture, a sodium diethyldithiocarbamate aqueous solution (10 mL, concentration: 0.05 g/mL) was added and the resultant reaction mixture was stirred for 1 hour. The reaction mixture was dropped into 300 mL of methanol and the resultant reaction mixture was stirred for 1 hour. A deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in a solvent mixture of tetrahydrofuran/ethyl acetate (1/1 (volume ratio)) and the resultant solution was passed through an alumina column and a silica gel column to purify the solution. The tetrahydrofuran solution recovered from the column was concentrated and the concentrated tetrahydrofuran solution was dropped into methanol (200 mL), followed by filtering and drying a deposited solid. The yield of the obtained solid (polymer E) was 343 mg.

The number average molecular weight in terms of polystyrene of the polymer F was $6.0 \times 10^4$. The polymer F consists of a structural unit represented by Formula (N).

[Chemical Formula 79]

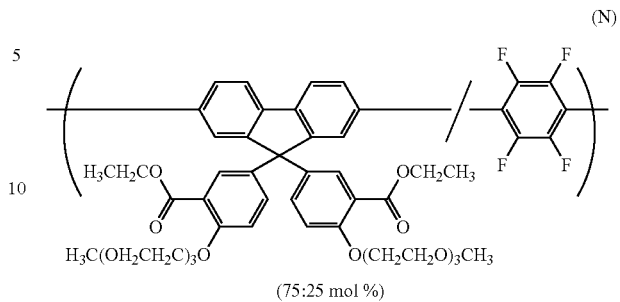

(N)

(75:25 mol %)

Experiment Example 9

Synthesis of Cesium Salt of Polymer F

The polymer F (150 mg) was charged into a 100 mL flask and an atmosphere in the flask was purged with nitrogen. Tetrahydrofuran (10 mL) and methanol (5 mL) were mixed with the polymer F. To the reaction mixture, an aqueous solution prepared by dissolving cesium hydroxide (260 mg) in water (2 mL) was added and the resultant reaction mixture was stirred at 65° C. for 2 hours. To the reaction mixture, 10 mL of methanol was added and further, the resultant reaction mixture was stirred at 65° C. for 5 hours. The reaction mixture was cooled down to room temperature and therefrom, the reaction solvent was distilled off under reduced pressure. A generated solid was washed with water and was dried under reduced pressure, thus obtaining a light yellow solid (130 mg). By an NMR spectrum of the solid, it was confirmed that a signal ascribed to an ethyl group in an ethyl ester moiety in the polymer E disappeared completely. The obtained polymer F cesium salt is called a conjugated macromolecular compound 9. The conjugated macromolecular compound 9 contains a structural unit represented by Formula (O) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 75% by mole). The orbital energy of HOMO of the conjugated macromolecular compound 9 was −5.9 eV and the orbital energy of LUMO of the conjugated macromolecular compound 9 was −2.8 eV.

[Chemical Formula 80]

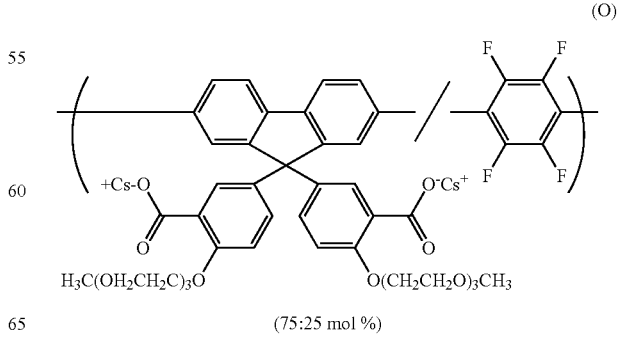

(O)

(75:25 mol %)

Reference Example 9

In an inert atmosphere, 2-[2-(2-methoxyethoxy)ethoxy]-p-toluene sulfonate (11.0 g), triethylene glycol (30.0 g), and potassium hydroxide (3.3 g) were mixed and the resultant reaction mixture was heated and stirred at 100° C. for 18 hours. The reaction mixture was left to be cooled down, was charged into water (100 mL), and was subjected to phase-separation extraction with chloroform, followed by concentrating the extract. The concentrated extract was subjected to the Kugel-Rhor distillation (10 mm Torr, 180° C.) to obtain 2-(2-(2-(2-(2-(2-methoxyethoxy)-ethoxy)-ethoxy)-ethoxy)-ethoxy)ethanol (6.1 g).

Reference Example 10

In an inert atmosphere, 2-(2-(2-(2-(2-(2-methoxyethoxy)-ethoxy)-ethoxy)-ethoxy)ethanol (8.0 g), sodium hydroxide (1.4 g), distilled water (2 mL), and tetrahydrofuran (2 mL) were mixed and the resultant reaction mixture was ice-cooled. Into the reaction mixture, a solution of p-tosyl chloride (5.5 g) in tetrahydrofuran (6.4 mL) was dropped over 30 minutes and after the dropping, the temperature of the reaction mixture was elevated to room temperature, followed by stirring the reaction mixture for 15 hours. To the reaction mixture, distilled water (50 mL) was added and the resultant reaction mixture was neutralized with a 6M sulfuric acid, followed by subjecting the reaction mixture to phase-separation extraction with chloroform. The extract was concentrated to obtain 2-(2-(2-(2-(2-(2-methoxyethoxy)-ethoxy)-ethoxy)-ethoxy) p-toluene sulfonate (11.8 g).

Reference Example 11

Synthesis of 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (Compound C)

2,7-dibromo-9-fluorenone (127.2 g), ethyl salicylate (375.2 g), and mercaptoacetic acid (3.5 g) were charged into a 300 mL flask and an atmosphere in the flask was purged with nitrogen. Into the flask, methanesulfonic acid (1420 mL) was added and the resultant reaction mixture was stirred at 75° C. all night. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered to obtain a solid (167.8 g). The obtained solid (5 g), 2-(2-(2-(2-(2-(2-methoxyethoxy)-ethoxy)-ethoxy)-ethoxy)-ethoxy) p-toluene sulfonate (10.4 g), potassium carbonate (5.3 g), and 18-crown-6 (0.6 g) were dissolved in N,N-dimethylformamide (DMF) (100 mL) and the resultant reaction solution was transferred into a flask and was stirred at 105° C. for 4 hours. The resultant reaction mixture was left to be cooled down to room temperature and was charged into ice water and the resultant reaction mixture was stirred for 1 hour. To the reaction mixture, chloroform (300 mL) was added to subject the resultant reaction mixture to phase-separation extraction and the resultant extract was concentrated. The concentrate was dissolved in ethyl acetate and the resultant solution was passed through an alumina column, followed by concentrating the solution, thus obtaining 2,7-dibromo-9,9-bis[3-ethoxycarbonyl-4-[2-(2-(2-(2-(2-(2-methoxyethoxy)-ethoxy)-ethoxy)-ethoxy)-ethoxy]phenyl]-fluorene (compound C) (4.5 g).

[Chemical Formula 81]

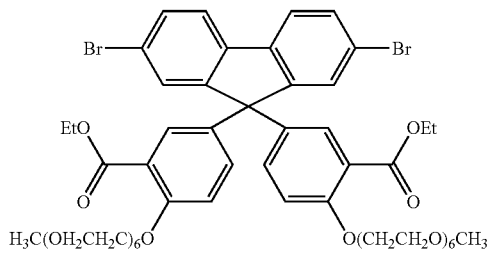

Compound C

Reference Example 12

Synthesis of Polymer G

In an inert atmosphere, the compound C (1.0 g), 4-tert-butylphenyl bromide (0.9 g), 2,2'-bipyridine (0.3 g), and dehydrated tetrahydrofuran (50 mL) were charged into a 200 mL flask and were mixed. The temperature of the resultant reaction mixture was elevated to 55° C. and thereto, bis(1,5-cyclooctadiene)nickel (0.6 g) was added, followed by stirring the resultant reaction mixture at 55° C. for 5 hours. The reaction mixture was cooled down to room temperature and the reaction mixture was dropped into a solution mixture of methanol (200 mL) and a 1N diluted hydrochloric acid (200 mL). A generated precipitate was collected by filtering and was re-dissolved in tetrahydrofuran. The resultant reaction solution was dropped into a solution mixture of methanol (200 mL) and a 15% ammonia water (100 mL) and a generated precipitate was collected by filtering. The precipitate was re-dissolved in tetrahydrofuran and the resultant reaction solution was dropped into a solution mixture of methanol (200 mL) and water (100 mL), followed by collecting a generated precipitate by filtering. The collected precipitate was dried under reduced pressure, thus obtaining a polymer G (360 mg).

The number average molecular weight in terms of polystyrene of the polymer G was $6.0 \times 10^4$. The polymer G consists of a structural unit represented by Formula (P).

[Chemical Formula 82]

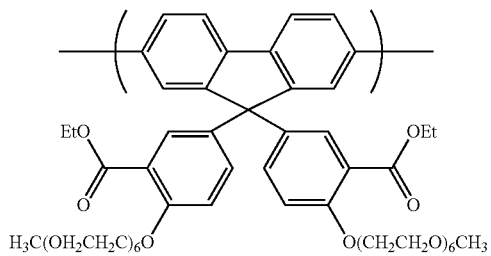

(P)

Experiment Example 10

Synthesis of Cesium Salt of Polymer G

The polymer G (150 mg) was charged into a 100 mL flask and an atmosphere in the flask was purged with nitrogen.

Tetrahydrofuran (15 mL) and methanol (5 mL) were mixed with the polymer G. To the resultant reaction mixture, an aqueous solution prepared by dissolving cesium hydroxide (170 mg) in water (2 mL) was added and the resultant reaction mixture was stirred at 65° C. for 6 hours. The reaction mixture was cooled down to room temperature and therefrom, the reaction solvent was distilled off under reduced pressure. A generated solid was washed with water and was dried under reduced pressure, thus obtaining a light yellow solid (95 mg). By an NMR spectrum of the solid, it was confirmed that a signal ascribed to an ethyl group in an ethyl ester moiety in the polymer G disappeared completely. The obtained polymer G cesium salt is called a conjugated macromolecular compound 10. The conjugated macromolecular compound 10 contains a structural unit represented by Formula (Q) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 10 was −5.7 eV and the orbital energy of LUMO of the conjugated macromolecular compound 10 was −2.9 eV.

[Chemical Formula 83]

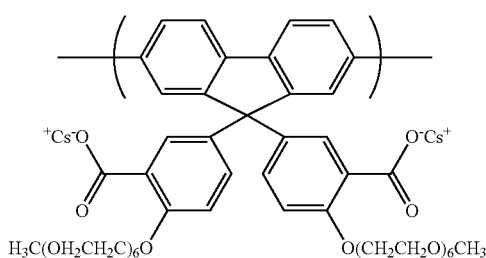

(Q)

Reference Example 13

Synthesis of 1,3-dibromo-5-ethoxycarbonyl-6-[2-[2-(2-methoxyethoxy)ethoxy]ethoxy]benzene In an inert atmosphere, 3,5-dibromosalicylic acid (20 g), ethanol (17 mL), concentrated sulfuric acid (1.5 mL), and toluene (7 mL) were mixed and the resultant reaction mixture was heated-stirred at 130° C. for 20 hours. The reaction mixture was left to be cooled down and the reaction mixture was charged into ice water (100 mL). The resultant reaction mixture was subjected to phase-separation extraction with chloroform and the extract was concentrated. The resultant solid was dissolved in isopropanol and the resultant reaction solution was dropped into distilled water. A resultant deposit was filtered to obtain a solid (18 g). In an inert atmosphere, the obtained solid (1 g), 2-[2-(2-methoxyethoxy)ethoxy]-p-toluene sulfonate (1.5 g), potassium carbonate (0.7 g), and DMF (15 mL) were mixed and the resultant reaction mixture was stirred at 100° C. for 4 hours. The reaction mixture was left to be cooled down and thereto, chloroform was added to subject the resultant reaction mixture to phase-separation extraction. The extract was concentrated. The concentrate was dissolved in chloroform and the resultant solution was passed through a silica gel column to purify the solution. The solution was concentrated, thus obtaining 1,3-dibromo-5-ethoxycarbonyl-6-[2-[2-(2-methoxyethoxy)ethoxy]ethoxy]brnzene (1.0 g).

Reference Example 14

Synthesis of Polymer H

In an inert atmosphere, the compound A (0.2 g), the compound B (0.5 g), 1,3-dibromo-5-ethoxycarbonyl-6-[2-[2-(2-methoxyethoxy)ethoxy]ethoxy]benzene (0.1 g), (triphenylphosphine)palladium (30 mg), tetrabutylammonium bromide (4 mg), and toluene (19 mL) were mixed and the resultant reaction mixture was heated to 105° C. Into the reaction mixture, a 2M sodium carbonate aqueous solution (5 mL) was dropped and the resultant reaction mixture was refluxed for 5 hours. To the reaction mixture, phenylboronic acid (6 mg) was added and the resultant reaction mixture was refluxed for 14 hours. Next, to the reaction mixture, a sodium diethyldithiocarbamate aqueous solution (10 mL, concentration: 0.05 g/mL) was added and the resultant reaction mixture was stirred for 2 hours. The aqueous phase was removed and the organic phase was washed with distilled water and was concentrated, thus obtaining a solid. The obtained solid was dissolved in chloroform and the resultant solution was passed through an alumina column and a silica gel column to purify the solution. The eluent from the column was concentrated and dried. The yield of the obtained polymer H was 0.44 g.

The number average molecular weight in terms of polystyrene of the polymer H was $3.6 \times 10^4$. The polymer H consists of a structural unit represented by Formula (R).

[Chemical Formula 84]

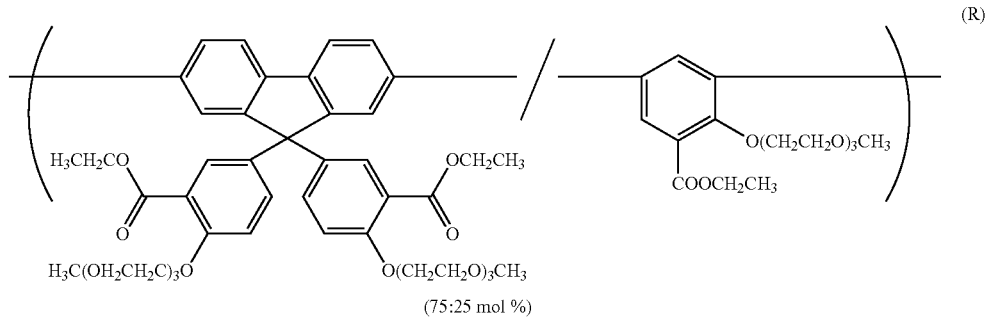

(R)

(75:25 mol %)

Experiment Example 11

Synthesis of Cesium Salt of Polymer H

The polymer H (200 mg) was charged into a 100 mL flask and an atmosphere in the flask was purged with nitrogen. Into the flask, tetrahydrofuran (14 mL) and methanol (7 mL) were added and the resultant reaction mixture was mixed. To the reaction mixture, an aqueous solution prepared by dissolving cesium hydroxide (90 mg) in water (1 mL) was added and the resultant reaction mixture was stirred at 65° C. for 1 hour. To the reaction mixture, 5 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (190 mg). By an NMR spectrum of the solid, it was confirmed that a signal ascribed to an ethyl group in an ethyl ester moiety in the polymer H disappeared completely. The obtained polymer H cesium salt is called a conjugated macromolecular compound 11. The conjugated macromolecular compound 11 contains a structural unit represented by Formula (S) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 11 was −5.6 eV and the orbital energy of LUMO of the conjugated macromolecular compound 11 was −2.8 eV.

solid was filtered and the solid was washed with heated acetonitrile. The washed solid was dissolved in acetone and from the resultant acetone solution, a solid was recrystallized and was filtered to obtain a solid. The obtained solid (16.3 g), 2-[2-(2-methoxyethoxy)ethoxy]-p-toluene sulfonate (60.3 g), potassium carbonate (48.6 g), and 18-crown-6 (2.4 g) were dissolved in N,N-dimethylformamide (DMF) (500 mL) and the resultant reaction solution was transferred into a flask and was stirred at 110° C. for 15 hours. The resultant reaction mixture was left to be cooled down to room temperature and was charged into ice water and the resultant reaction mixture was stirred for 1 hour. To the reaction mixture, ethyl acetate (300 mL) was added to subject the resultant reaction mixture to phase-separation extraction and the resultant extract was concentrated. The concentrate was dissolved in a solvent mixture of chloroform/methanol (50/1 (volume ratio)) and the resultant solution was passed through a silica gel column to purify the solution. The solution passed through the column was concentrated, thus obtaining 2,7-dibromo-9,9-bis [3,4-bis[2-[2-(2-methoxyethoxy)ethoxy]ethoxy]-5-methoxycarbonylphenyl]fluorene (compound D) (20.5 g).

Reference Example 16

Synthesis of 2,7-bis[7-(4-methylphenyl)-9,9-dioctylfluorene-2-yl]-9,9-bis[5-methoxycarbonyl-3,4-bis[2-[2-(2-methoxyethoxy)ethoxy]ethoxy]phenyl]-fluorene (Polymer I)

In an inert atmosphere, the compound D (0.70 g), 2-(4,4,5,5-tetramethyl-1,2,3-dioxaborolan-2-yl)-9,9-dioctylfluo-

[Chemical Formula 85]

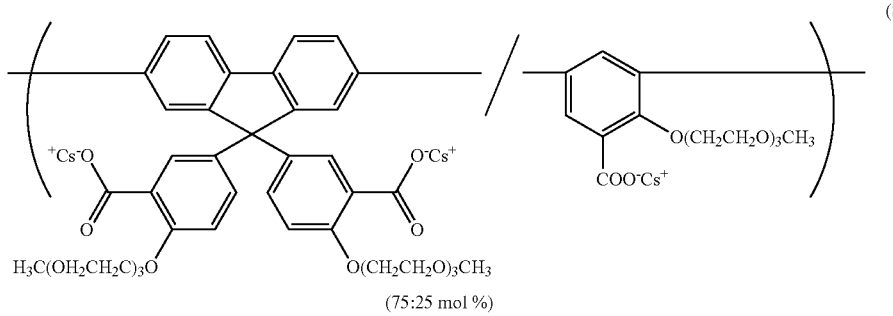

(75:25 mol %)

Reference Example 15

Synthesis of 2,7-dibromo-9,9-bis[3,4-bis[2-[2-(2-methoxyethoxy)ethoxy]ethoxy]-5-methoxycarbonylphenyl]fluorene (Compound D)

2,7-dibromo-9-fluorenone (34.1 g), methyl 2,3-dihydroxybenzoate (101.3 g), and mercaptoacetic acid (1.4 g) were charged into a 500 mL flask and an atmosphere in the flask was purged with nitrogen. Into the flask, methanesulfonic acid (350 mL) was added and the resultant reaction mixture was stirred at 90° C. for 19 hours. The reaction mixture was left to be cooled down and was charged into ice water and the resultant reaction mixture was stirred for 1 hour. A generated rene (0.62 g), (triphenylphosphine)palladium (0.019 g), dioxane (40 mL), water (6 mL), and a potassium carbonate aqueous solution (1.38 g) were mixed and the resultant reaction mixture was heated to 80° C. The reaction mixture was subjected to the reaction for 1 hour. After the completion of the reaction, to the reaction mixture, 5 mL of saturated sodium diethyldithiocarbamate water was added. The resultant reaction mixture was stirred for 30 minutes and therefrom, the organic solvent was removed. The resultant solid was passed through an alumina column (eluent: hexane:ethyl acetate=1:1 (volume ratio)) to purify the solid. The resultant solution was concentrated, thus obtaining 660 mg of 2,7-bis [7-(4-methylphenyl)-9,9-dioctylfluorene-2-yl]-9,9-bis[3-ethoxycarbonyl-4-[2-[2-(2-methoxyethoxy)ethoxy]ethoxy] phenyl]-fluorene (polymer I).

The number average molecular weight in terms of polystyrene of the polymer I was 2.0×10³. The polymer I is represented by Formula (T). Here, 2-(4,4,5,5-tetramethyl-1,2,3-dioxaborolan-2-yl)-9,9-dioctylfluorene can be synthesized, for example, by a method described in "The Journal of Physical Chemistry B 2000, 104, 9118-9125".

[Chemical Formula 86]

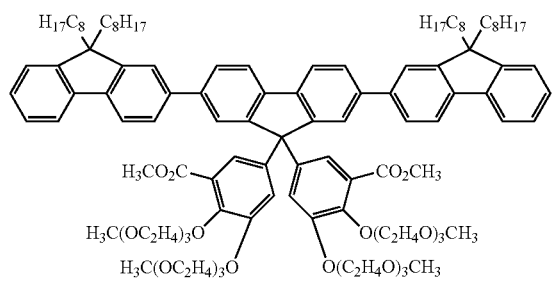

(T)

Experiment Example 12

Synthesis of Cesium Salt of Polymer I

The polymer I (236 mg) was charged into a 100 mL flask and an atmosphere in the flask was purged with argon. Into the flask, tetrahydrofuran (20 mL) and methanol (10 mL) were added and the temperature of the resultant reaction mixture was elevated to 65° C. Into the flask, an aqueous solution prepared by dissolving cesium hydroxide (240 mg) in water (2 mL) was added and the resultant reaction mixture was stirred at 65° C. for 7 hours. The resultant reaction mixture was cooled down to room temperature and therefrom, the reaction solvent was distilled off under reduced pressure. A generated solid was washed with water and was dried under reduced pressure, thus obtaining a light yellow solid (190 mg). By an NMR spectrum of the solid, it was confirmed that a signal ascribed to an ethyl group in the ethyl ester moiety disappeared completely. The obtained polymer I cesium salt is called a conjugated macromolecular compound 12. The conjugated macromolecular compound 12 is represented by Formula (U) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are calculated by rounding off to one decimal place as 33.3% by mole). The orbital energy of HOMO of the conjugated macromolecular compound 12 was −5.6 eV and the orbital energy of LUMO of the conjugated macromolecular compound 12 was −2.8 eV.

[Chemical Formula 87]

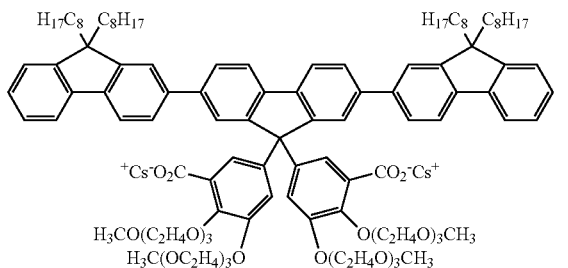

(U)

Reference Example 17

Synthesis of Compound E

In a nitrogen atmosphere, 2,7-dibromo-9-fluorenone (92.0 g, 272 mmol) and diethyl ether (3.7 L) were mixed and the resultant reaction mixture was cooled down to 0° C. Into the reaction mixture, a 1 mol/L methylmagnesium iodide-diethyl ether solution (0.5 L, 545 mmol) was dropped and the resultant reaction mixture was stirred for 3 hours. To the reaction mixture, an ammonium chloride aqueous solution was added and the aqueous phase was removed. The organic phase was dried over sodium sulfate anhydride and was concentrated under reduced pressure. The resultant crude product was purified by silica gel column chromatography, thus obtaining a compound E (92.81 g, 262 mmol, yield: 96%) represented by the formula below.

[Chemical Formula 88]

Compound E

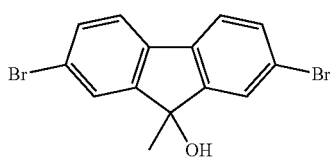

Synthesis of Compound F

In a nitrogen atmosphere, the compound E (83.0 g, 234 mmol), p-toluenesulfonic acid monohydrate (4.49 g, 23.6 mmol), and chloroform (2.5 L) were mixed and the resultant reaction mixture was refluxed for 1 hour. To the reaction mixture, an ammonium chloride aqueous solution was added and the aqueous phase was removed. The organic phase was dried over sodium sulfate anhydride and was concentrated under reduced pressure, thus obtaining a compound F (73.6 g, 219 mmol, yield: 93%) represented by the formula below.

[Chemical Formula 89]

Compound F

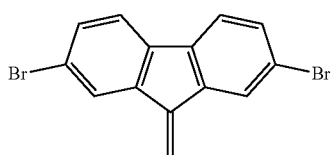

Synthesis of Compound G

In a nitrogen atmosphere, the compound F (70.0 g, 208 mmol), ethyl salicylate (104 g, 625 mmol), mercaptoacetic acid (4.20 g, 45.6 mmol), and methanesulfonic acid (1214 g) were mixed and the resultant reaction mixture was stirred at 70° C. for 8 hours. The resultant reaction mixture was dropped into ice water and a deposited solid was filtered to be recovered, followed by washing the solid with methanol. The resultant crude product was purified by silica gel column chromatography, thus obtaining a compound G (52.14 g, 104 mmol, yield: 50%) represented by the formula below.

[Chemical Formula 90]

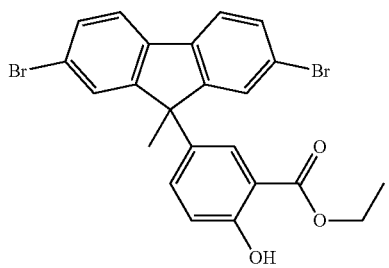

Compound G

Synthesis of Compound H

In a nitrogen atmosphere, the compound G (41.2 g, 82.0 mmol), 2-[2-(2-methoxyethoxy)ethoxy]-ethyl-p-toluene sulfonate (75.8 g, 238 mmol), dimethylformamide (214 g), potassium carbonate (54.4 g, 394 mmol), and 18-crown-6 (4.68 g, 18 mmol) were mixed and the resultant reaction mixture was stirred at 105° C. for 2 hours. The reaction mixture was charged into water and the resultant reaction mixture was extracted with ethyl acetate. The organic phase was dried over sodium sulfate anhydride and was concentrated under reduced pressure. The resultant crude product was purified by silica gel column chromatography, thus obtaining a compound H (40.2 g, 62.0 mmol, yield: 76%) represented by the formula below. The result of $^1$H NMR measured with respect to the obtained compound H is as follows.

$^1$H NMR (400 MHz, CDCl$_3$, rt)

δ(ppm) 1.37 (3H), 1.84 (3H), 3.36 (3H), 3.53 (2H), 3.58-3.79 (6H), 3.73 (2H), 4.12 (2H), 4.34 (2H), 6.80 (1H), 6.90 (1H), 7.28 (2H), 7.48 (2H), 7.58 (2H), 7.70 (1H).

[Chemical Formula 91]

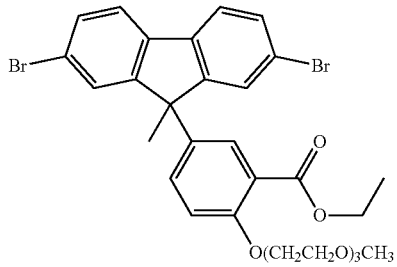

Compound H

Synthesis of Compound I

In a nitrogen atmosphere, the compound H (28.4 g, 43.8 mmol), bis(pinacolato)diboron (24.30 g, 95.7 mol), [1,1'-bis(diphenylphosphino)ferrocene]palladium (II) dichloride dichlorometane adduct (0.35 g, 0.4 mmol), 1,1'-bis(diphenylphosphino)ferrocene (0.24 g, 0.4 mmol), potassium acetate (25.60 g, 260 mmol), and 1,4-dioxane (480 mL) were mixed and the resultant reaction mixture was stirred at 120° C. for 17 hours. The reaction mixture was filtered and the filtrate was washed with ethyl acetate. The filtrate was concentrated under reduced pressure, was purified by silica gel column chromatography, and next was recrystallized to be purified, thus obtaining a compound I (18.22 g, 24.5 mmol, yield: 56%) represented by the formula below. The result of $^1$H NMR measured with respect to the obtained compound I is as follows.

$^1$H NMR (400 MHz, CDCl$_3$, rt)

δ (ppm) 1.30-1.47 (27H), 1.88 (3H), 3.35 (3H), 3.53 (2H), 3.60-3.69 (4H), 3.73 (2H), 3.84 (2H), 4.10 (2H), 4.34 (2H), 6.74 (1H), 6.87 (1H), 7.58 (2H), 7.72-7.89 (5H).

[Chemical Formula 92]

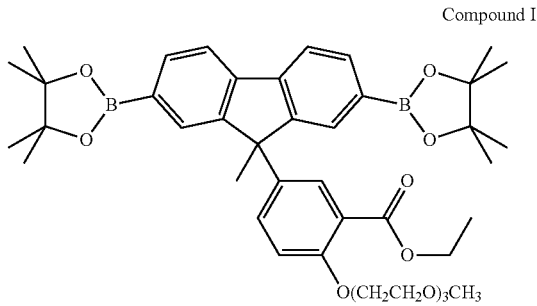

Compound I

Synthesis of Polymer J

In an argon atmosphere, the compound H (0.47 g), the compound I (0.48 g), dichlorobis(triphenylphosphine) palladium (0.6 mg), tetrabutylammonium bromide (6 mg), toluene (6 mL), and a 2 mol/L sodium carbonate aqueous solution (2 mL) were mixed and the resultant reaction mixture was stirred at 105° C. for 6 hours. Next, to the reaction mixture, phenylboronic acid (35 mg) was added and the resultant reaction mixture was stirred at 105° C. for 14 hours. To the reaction mixture, sodium diethyldithiocarbamate trihydrate (0.65 g) and water (13 mL) were added and the resultant reaction mixture was stirred at 80° C. for 2 hours. The reaction mixture was dropped into methanol and a deposit was filtered to be recovered, followed by drying the recovered deposit. The resultant solid was dissolved in chloroform and was purified by alumina chromatography and silica gel chromatography. The resultant eluent was dropped into methanol and a deposit was filtered to be recovered. The recovered deposit was dried, thus obtaining a polymer J (0.57 g).

The number average molecular weight in terms of polystyrene of the polymer J was 2.0×10$^4$. The polymer J consists of a structural unit represented by Formula (V) below.

[Chemical Formula 93]

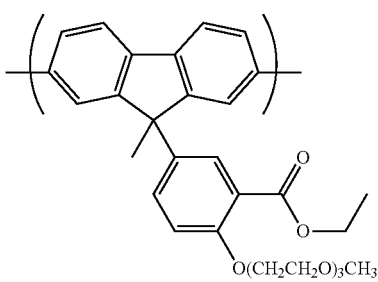

(V)

Experiment Example 13

Synthesis of Cesium Salt of Polymer J

In an argon atmosphere, the polymer J (0.20 g), THF (18 mL), methanol (9 mL), cesium hydroxide monohydrate (97 mg), and water (1 mL) were mixed and the resultant reaction mixture was stirred at 65° C. for 2 hours. Next, to the reaction mixture, methanol (52 mL) was added and the resultant reaction mixture was stirred at 65° C. for 6 hours. The reaction mixture was concentrated and dried. To the resultant solid, methanol was added and the resultant reaction mixture was filtered, followed by dropping the filtrate into isopropanol. The resultant solid was filtered to be recovered. The recovered solid was dried, thus obtaining a polymer J cesium salt (0.20 g). The obtained polymer J cesium salt is called a conjugated macromolecular compound 13. The conjugated macromolecular compound 13 consists of a structural unit represented by Formula (W).

[Chemical Formula 94]

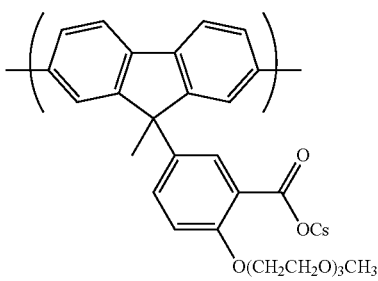

(W)

The orbital energy of HOMO of the conjugated macromolecular compound 13 was −5.51 eV and the orbital energy of LUMO of the conjugated macromolecular compound 13 was −2.64 eV.

Reference Example 18

Synthesis of Compound J

In a nitrogen stream, 2,7-dibromo-9,9-bis(3,4-dihydroxy)-fluorene (138.4 g), 2-[2-(2-methoxyethoxy)ethoxy]-ethyl-p-toluene sulfonate (408.6 g), potassium carbonate (358.5 g), and acetonitrile (2.5 L) were mixed and the resultant reaction mixture was heated-refluxed for 3 hours. The reaction mixture was left to be cooled down and was filtered. The resultant filtrate was concentrated under reduced pressure and was purified by silica gel column chromatography, thus obtaining a compound J (109.4 g) represented by the formula below.

[Chemical Formula 95]

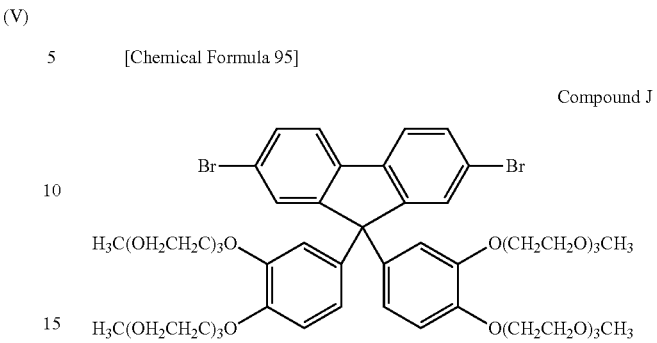

Compound J

Synthesis of Compound K

In a nitrogen atmosphere, the compound J (101.2 g), bis(pinacolato)diboron (53.1 g), [1,1'-bis(diphenylphosphino)ferrocene]dichloropalladium (II) dichlorometane complex (3.7 g), 1,1'-bis(diphenylphosphino)ferrocene (5.4 g), potassium acetate (90.6 g), and dioxane (900 mL) were mixed and the resultant reaction mixture was heated to 110° C. and was heated-refluxed for 8 hours. The reaction mixture was left to be cooled down and was filtered. The resultant filtrate was concentrated under reduced pressure and was purified by silica gel column chromatography, thus obtaining a compound K (51.4 g).

[Chemical Formula 96]

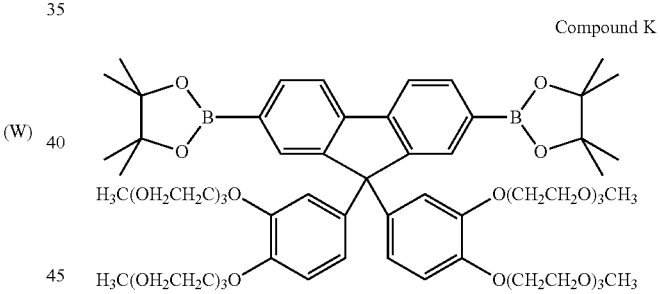

Compound K

Synthesis of Polymer K

The compound K (0.715 g), the compound J (0.426 g), aliquot 336 (6.60 mg), bis(triphenylphosphine) dichloropalladium (0.460 mg), a 2 mol/L sodium carbonate aqueous solution (10 mL), and toluene (20 mL) were mixed and the resultant reaction mixture was stirred at 105° C. for 5 hours. Next, to the reaction mixture, phenylboronic acid (32 mg) was added and the resultant reaction mixture was stirred at 105° C. for 6 hours. To the reaction mixture, sodium diethyldithiocarbamate trihydrate (0.72 g) and water (14 mL) were added and the resultant reaction mixture was stirred at 80° C. for 2 hours. The reaction mixture was dropped into methanol and a deposit was filtered to be recovered, followed by drying the recovered deposit. The resultant solid was dissolved in chloroform and was purified by alumina chromatography and silica gel chromatography. The resultant eluent was concentrated and dried. The resultant solid was dissolved in toluene and the resultant solution was dropped into methanol. The resultant deposit was filtered to be recovered. The recovered deposit was dried, thus obtaining a polymer K (0.55 g).

The number average molecular weight in terms of polystyrene of the polymer K was $2.3\times10^4$. The polymer K consists of a structural unit represented by Formula (X) below.

[Chemical Formula 97]

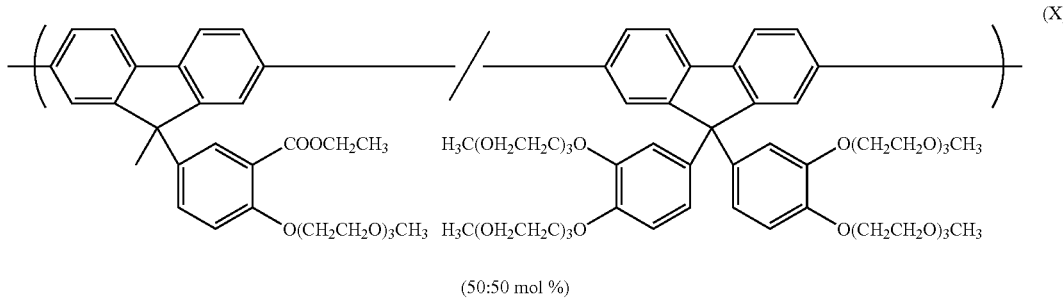

(X)

(50:50 mol %)

Experiment Example 14

Synthesis of Cesium Salt of Polymer K

In an argon atmosphere, the polymer K (0.15 g), THF (20 mL), methanol (10 mL), cesium hydroxide monohydrate (103 mg), and water (1 mL) were mixed and the resultant reaction mixture was stirred at 65° C. for 2 hours. Next, to the reaction mixture, methanol (20 mL) was added and the resultant reaction mixture was stirred at 65° C. for 2 hours. The reaction mixture was concentrated and dried. To the resultant solid, methanol was added and the resultant reaction mixture was filtered. The resultant filtrate was concentrated and was dried. The resultant solid was washed with water and was dried, thus obtaining a polymer K cesium salt (0.14 g). The obtained polymer K cesium salt is called a conjugated macromolecular compound 14. The conjugated macromolecular compound 14 consists of a structural unit represented by Formula (Y).

[Chemical Formula 98]

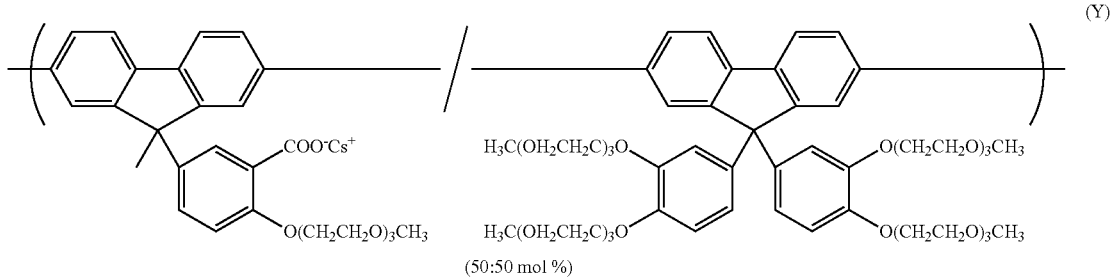

(Y)

(50:50 mol %)

The orbital energy of HOMO of the conjugated macromolecular compound 14 was −5.56 eV and the orbital energy of LUMO of the conjugated macromolecular compound 14 was −2.67 eV.

Reference Example 19

Synthesis of Compound L

In a nitrogen atmosphere, 5-bromo-2-hydroxybenzoic acid (92.85 g), ethanol (1,140 mL), and concentrated sulfuric acid (45 mL) were mixed and the resultant reaction mixture was refluxed for 48 hours. The reaction mixture was concentrated under reduced pressure and thereto, ethyl acetate (1,000 mL) was added. The resultant organic phase was washed with water and a 10% by weight sodium carbonate aqueous solution. The organic phase was dried over sodium sulfate anhydride and was concentrated under reduced pressure. The resultant crude product was purified by silica gel column chromatography, thus obtaining a compound L (95.38 g, yield: 91%) represented by the formula below.

[Chemical Formula 99]

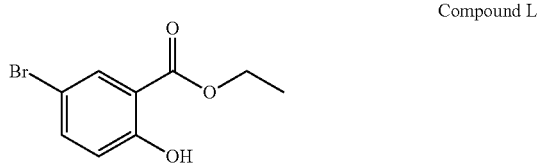

Compound L

Synthesis of Compound M

In a nitrogen atmosphere, the compound L (95.0 g), bis (pinacolato)diboron (108.5 g), [1,1'-bis(diphenylphosphino) ferrocene]palladium (II) dichloride dichlorometane adduct (3.3 g), 1,1'-bis(diphenylphosphino)ferrocene (2.2 g), potassium acetate (117.2 g), and 1,4-dioxane (1.3 L) were mixed and the resultant reaction mixture was stirred at 105° C. for 22 hours. The reaction mixture was filtered and the resultant filtrate was washed with dioxane and toluene. The washed filtrate was concentrated under reduced pressure and thereto, ethyl acetate was added. The resultant reaction mixture was washed with saturated saline and the organic phase was dried over sodium sulfate anhydride and was concentrated under reduced pressure. The resultant crude product was purified by silica gel column chromatography, thus obtaining a compound M (90.1 g, 308 mmol).

[Chemical Formula 100]

Compound M

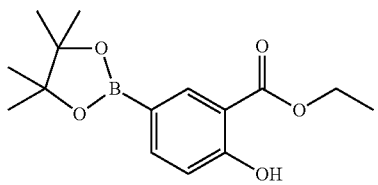

Synthesis of Compound N

In a nitrogen atmosphere, 1,5-dihydroxynaphthalene (15.0 g), triethylamine (28.5 g), and chloroform (150 mL) were mixed and the resultant reaction mixture was cooled down to 0° C. Into the cooled reaction mixture, trifluoromethanesulfonic acid anhydride (68.7 g) was dropped and the resultant reaction mixture was stirred for 1 hour. To the reaction mixture, water and chloroform were added and the aqueous phase was removed. The resultant organic phase was washed with water, was dried over sodium sulfate anhydride, and was concentrated under reduced pressure. The resultant solid was recrystallized to be purified, thus obtaining a compound N (31.46 g) represented by the formula below. In the formula below, Tf represents a trifluoromethylsulfonyl group.

[Chemical Formula 101]

Compound N

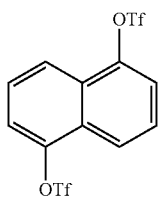

Synthesis of Compound O

In a nitrogen atmosphere, the compound N (16.90 g), the compound M (23.30 g), tetrakis(triphenylphosphine)palladium (0) (4.60 g), potassium phosphate (42.30 g), and 1,2-dimethoxethane (340 mL) were mixed and the resultant reaction mixture was stirred at 80° C. for 14 hours. The reaction mixture was filtered and the resultant filtrate was washed with chloroform and methanol. The washed filtrate was concentrated under reduced pressure and the resultant residue was purified by silica gel column chromatography, thus obtaining a compound 0 (8.85 g) represented by the formula below.

[Chemical Formula 102]

Compound O

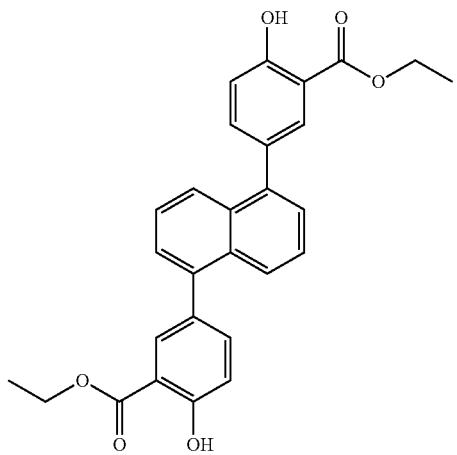

Synthesis of Compound P

In a nitrogen atmosphere, the compound O (8.80 g), 2-[2-(2-methoxyethoxy)ethoxy]-ethyl-p-toluene sulfonate (12.52 g), dimethylformamide (380 mL), potassium carbonate (13.32 g), and 18-crown-6 (1.02 g) were mixed and the resultant reaction mixture was stirred at 100° C. for 23 hours. The reaction mixture was charged into water and the resultant reaction mixture was extracted with ethyl acetate. The resultant organic phase was washed with a sodium chloride aqueous solution, was dried over sodium sulfate anhydride, and was concentrated under reduced pressure. The resultant crude product was purified by silica gel column chromatography, thus obtaining a compound P (7.38 g) represented by the formula below.

[Chemical Formula 103]

Compound P

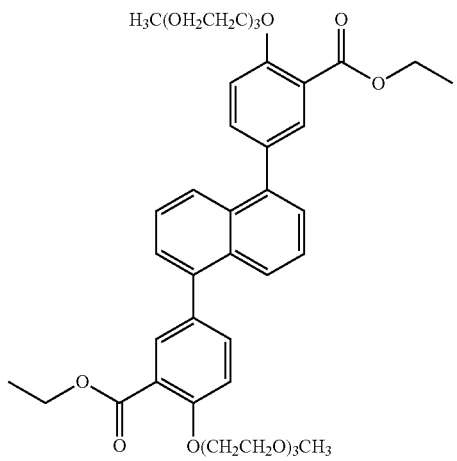

Synthesis of Compound Q

In a nitrogen atmosphere, the compound P (5.53 g), bis (pinacolato)diboron (11.25 g), (1,5-cyclooctadiene) (methoxy) iridium (I) dimer (0.15 g, manufactured by Sigma Aldrich Corp.), 4,4'-di-tert-butyl-2,2'-dipyridyl (0.12 g, manufactured by Sigma Aldrich Corp.), and 1,4-dioxane (300 mL) were mixed and the resultant reaction mixture was stirred at 110° C. for 19 hours. The reaction mixture was concentrated under reduced pressure. The resultant crude product was purified by silica gel column chromatography and next, was purified by recrystallization, thus obtaining a compound Q (5.81 g) represented by the formula below. The result of $^1$H NMR measured with respect to the obtained compound Q is as follows.

$^1$H NMR (400 MHz, CDCl$_3$, rt)

δ (ppm) 1.27-1.41 (30H), 3.39 (6H), 3.57 (4H), 3.66-3.75 (8H), 3.83 (4H), 3.99 (4H), 4.27-4.42 (8H), 7.13 (2H), 7.60 (2H), 7.76 (2H), 7.93 (2H), 8.30 (2H).

[Chemical Formula 104]

Compound Q

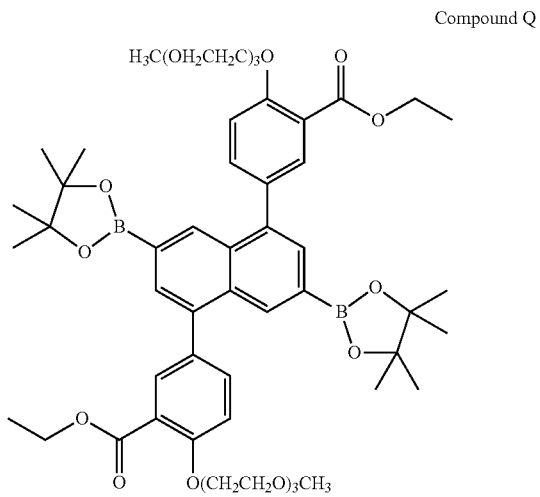

Synthesis of Polymer L

In an argon atmosphere, the compound J (0.53 g), the compound Q (0.43 g), dichlorobis(triphenylphosphine)palladium (0.3 mg), Aliquat 336 (5 mg, manufactured by Sigma Aldrich Corp.), toluene (12 mL), and a 2 mol/L sodium carbonate aqueous solution (1 mL) were mixed and the resultant reaction mixture was stirred at 105° C. for 9 hours. Next, to the reaction mixture, phenylboronic acid (23 mg) was added and the resultant reaction mixture was stirred at 105° C. for 14 hours. To the reaction mixture, sodium diethyldithiocarbamate trihydrate (0.40 g) and water (8 mL) were added and the resultant reaction mixture was stirred at 80° C. for 2 hours. The reaction mixture was dropped into methanol and the resultant deposit was filtered to be recovered and was dried. The resultant solid was dissolved in chloroform and the resultant solution was purified by alumina chromatography and silica gel chromatography, followed by dropping the resultant eluent into methanol. The resultant deposit was filtered to be recovered and the recovered deposit was dried, thus obtaining a polymer L (0.56 g).

The number average molecular weight in terms of polystyrene of the polymer L was $3.4 \times 10^4$. The polymer L consists of a structural unit represented by Formula (Z) below.

[Chemical Formula 105]

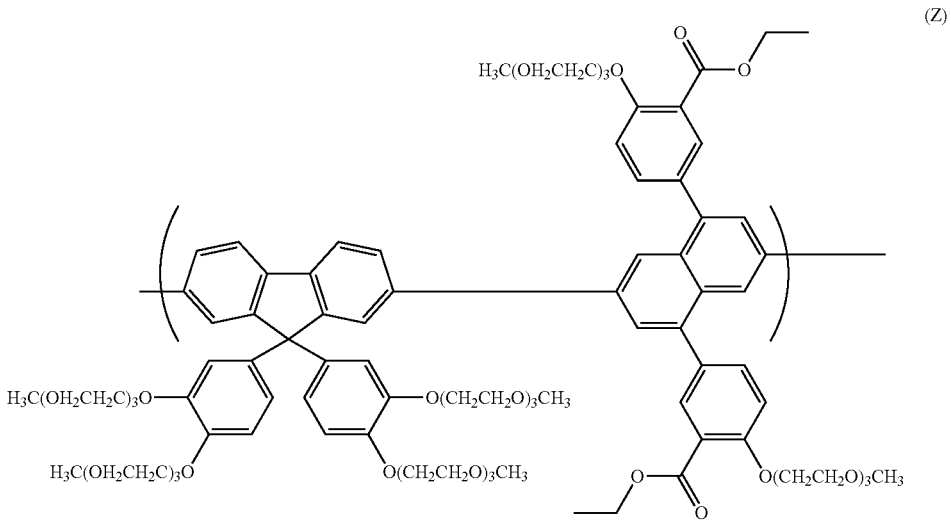

Experiment Example 15

Synthesis of Cesium Salt of Polymer L

In an argon atmosphere, the polymer L (0.25 g), THF (13 mL), methanol (6 mL), cesium hydroxide monohydrate (69 mg), and water (1 mL) were mixed and the resultant reaction mixture was stirred at 65° C. for 6 hours. The reaction mixture was concentrated and the concentrate was dropped into isopropanol, followed by filtering the resultant solid to be recovered. The recovered solid was dried. To the solid, methanol was added and the resultant reaction mixture was filtered, followed by dropping the resultant filtrate into isopropanol. The resultant solid was filtered to be recovered and the recovered solid was dried, thus obtaining a polymer L cesium salt (0.19 g). The obtained polymer L cesium salt is called a conjugated macromolecular compound 15. The conjugated macromolecular compound 15 consists of a structural unit represented by Formula (AA) below.

[Chemical Formula 106]

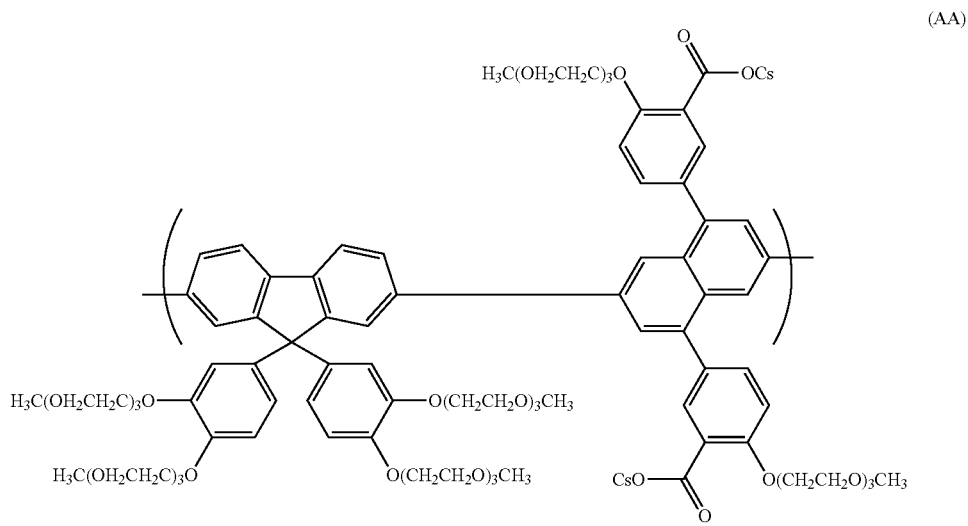

(AA)

The orbital energy of HOMO of the conjugated macromolecular compound 15 was −5.50 eV and the orbital energy of LUMO of the conjugated macromolecular compound 15 was −2.65 eV.

Experiment Example 16

Methanol and the conjugated macromolecular compound 1 were mixed to obtain a composition containing 0.2% by weight of the conjugated macromolecular compound 1. Onto an ITO cathode (film thickness: 45 nm) film-formed and patterned on the surface of a glass substrate, the composition was applied in the atmosphere by a spin coating method to obtain a coating film having a film thickness of 10 nm. The substrate on which the coating film was provided was heated in an inert atmosphere (nitrogen atmosphere) under normal pressure at 130° C. for 10 minutes to evaporate the solvent and then, the substrate was naturally cooled down to room temperature to obtain the substrate in which the electron injection layer containing the conjugated macromolecular compound 1 was formed.

Next, a light-emitting macromolecular material (manufactured by Summation Co., Ltd.; "Lumation BP361") and xylene were mixed to obtain the composition for forming a light-emitting layer containing 1.4% by weight of a light-emitting macromolecular material. Onto the layer containing the conjugated macromolecular compound 1 of the thus-obtained substrate in which the layer containing the conjugated macromolecular compound 1 was formed, a composition for forming a light-emitting layer was applied in the atmosphere by a spin coating method to obtain a coating film having a film thickness of 80 nm. The substrate in which the coating film was provided was heated in an inert atmosphere (nitrogen atmosphere) at 130° C. for 15 minutes to evaporate the solvent and then, the substrate was naturally cooled down to room temperature to obtain the substrate in which the light-emitting layer was formed.

Next, onto the light-emitting layer of the thus-obtained substrate in which the light-emitting layer was formed, a hole injection material solution was applied in the atmosphere by a spin coating method to obtain a coating film having a film thickness of 60 nm. The substrate in which this coating film was provided was heated in an inert atmosphere (nitrogen atmosphere) at 130° C. for 15 minutes to evaporate the solvent and then, the substrate was naturally cooled down to room temperature to obtain the substrate in which the hole injection layer was formed. Here, as the hole injection material solution, a PEDOT:PSS solution (poly(3,4-ethylenedioxythiophene-polystyrenesulfonic acid) (manufactured by Starck-V TECH Ltd.; trade name: Baytron) was used.

The thus-obtained substrate in which the hole injection layer was formed was inserted into a vacuum apparatus and on the hole injection layer, Au was film-formed in a thickness of 80 nm by a vacuum deposition method to form the anode to provide a layered structure 1.

The thus-obtained layered structure 1 was taken out of the vacuum apparatus and was sealed with a sealing glass through a two-fluid mixing type epoxy resin in an inert gas atmosphere (nitrogen atmosphere), thus obtaining the organic EL element 1.

To the thus-obtained organic EL element 1, a forward direction voltage of 10 V was applied to measure the light-emitting brightness and the light-emitting efficiency. The result of the measurement is listed in Table 1.

TABLE 1

|  | Light-emitting brightness (cd/m$^2$) | Light-emitting efficiency (cd/A) |
| --- | --- | --- |
| Organic EL element 1 | 3580 | 3.1 |

Experiment Example 17

<Manufacture of Dual-sided Emission-type Organic EL Element>

By the same operation as in Experiment Example 16, except that the film thickness of Au was changed to 20 nm from Experiment Example 16, a dual-sided emission-type organic EL element 2 was obtained.

To the thus-obtained dual-sided emission-type organic EL element 2, a forward direction voltage of 15 V was applied to measure the light-emitting brightness and the light-emitting efficiency. The result of the measurement is listed in Table 2.

TABLE 2

|  | Light-emitting brightness (cd/m$^2$) | Light-emitting efficiency (cd/A) |
| --- | --- | --- |
| Organic EL element 2 | Upper surface side: 1091<br>Lower surface side: 5341 | Upper surface side: 0.3<br>Lower surface side: 1.1 |

As listed in Tables 1 and 2, it was confirmed that an organic EL element of reverse laminating in which the electron injection layer was formed by film-forming the ionic polymer in the atmosphere by a coating step could emit light.

Experiment Example 18

A glass substrate in which an ITO thin film having a thickness of 50 nm was formed was prepared. The ITO thin film was formed by a sputtering method and corresponds to the anode. Onto this ITO thin film, a suspension of the macromolecular compound A was applied by a spin coating method and a film was formed to form a coating film for a hole injection layer having a thickness of 60 nm. This thin film was dried on a hot plate at 170° C. for 15 minutes to form the hole injection layer. Here, the hole injection layer was formed in the atmosphere.

Next, the macromolecular compound B was dissolved in xylene in a concentration of 0.8% by weight to obtain a xylene solution. This xylene solution was applied onto the hole injection layer in the atmosphere by a spin coating method to film-form a coating film for a hole transport layer having a thickness of 20 nm. Next, the coating film was retained in a nitrogen atmosphere in which each of the oxygen concentration and the water concentration was controlled to 10 ppm or less in the volume ratio at 180° C. for 60 minutes to be dried to obtain the hole transport layer.

Next, the macromolecular compound C was dissolved in xylene in a concentration of 1.3% by weight to obtain a xylene solution. This xylene solution was applied onto the hole transport layer in the atmosphere by a spin coating method to film-form a coating film for a light-emitting layer having a thickness of 80 nm. Next, the coating film was retained in a nitrogen atmosphere under the atmospheric pressure in which each of the oxygen concentration and the water concentration was controlled to 10 ppm or less in the volume ratio at 170° C. for 10 minutes to be dried to obtain the light-emitting layer.

Next, the conjugated macromolecular compound 1 was dissolved in methanol in a concentration of 0.2% by weight to obtain a methanol solution. This methanol solution was applied onto the light-emitting layer in the atmosphere by a spin coating method to film-form a coating film for an electron injection layer having a film thickness of 6 nm. Next, the coating film was retained in the atmosphere at 130° C. for 10 minutes to be dried to obtain the electron injection layer.

Next, in a state in which the pressure was reduced to $1.0 \times 10^{-4}$ Pa or less, aluminum was deposited in a film thickness of about 100 nm as the cathode. After the completion of the deposition, the layered structure was sealed using a glass substrate, thus manufacturing an organic EL element 3.

Experiment Example 19

In Experiment Example 19, in the same manner as in Experiment Example 18, except that the heating temperature alone during the formation of the electron injection layer was changed from Experiment Example 18, the organic EL element was formed. In order to omit an overlapped description, only the forming method of the electron injection layer is described below.

The conjugated macromolecular compound 1 was dissolved in methanol in a concentration of 0.2% by weight to obtain a methanol solution. This methanol solution was applied onto the light-emitting layer by a spin coating method to film-form a coating film for an electron injection layer having a film thickness of 6 nm. Next, the coating film was retained in the atmosphere at 170° C. for 10 minutes to be dried to obtain the electron injection layer.

Experiment Example 20

In Experiment Example 20, in the same manner as in Experiment Example 18, except that the heating time alone during the formation of the electron injection layer was changed from Experiment Example 18, the organic EL element was formed. In order to omit an overlapped description, only the forming method of the electron injection layer is described below.

The conjugated macromolecular compound 1 was dissolved in methanol in a concentration of 0.2% by weight to obtain a methanol solution. This methanol solution was applied onto the light-emitting layer by a spin coating method to film-form a coating film for an electron injection layer having a film thickness of 6 nm. Next, the coating film was retained in the atmosphere at 130° C. for 30 minutes to be dried to obtain the electron injection layer.

Experiment Example 21

In Experiment Example 21, in the same manner as in Experiment Example 18, except that the heating temperature and the heating time alone during the formation of the electron injection layer were changed from Experiment Example 18, the organic EL element was manufactured. In order to omit an overlapped description, only the forming method of the electron injection layer is described below.

The conjugated macromolecular compound 1 was dissolved in methanol in a concentration of 0.2% by weight to obtain a methanol solution. This methanol solution was applied onto the light-emitting layer by a spin coating method to film-form a coating film for an electron injection layer having a film thickness of 6 nm. Next, the coating film was retained in the atmosphere at 150° C. for 30 minutes to be dried to obtain the electron injection layer.

Experiment Example 22

In Experiment Example 22, in the same manner as in Experiment Example 18, except that an atmosphere alone during the formation of the electron injection layer was changed from Experiment Example 18, the organic EL element was formed. In order to omit an overlapped description, only the forming method of the electron injection layer is described below.

The conjugated macromolecular compound 1 was dissolved in methanol in a concentration of 0.2% by weight to obtain a methanol solution. This methanol solution was applied onto the light-emitting layer by a spin coating method to film-form a coating film for an electron injection layer having a film thickness of 6 nm. Next, the coating film was retained in a nitrogen atmosphere under the atmospheric pressure in which each of the oxygen concentration and the water concentration was controlled to 10 ppm or less in the volume ratio at 130° C. for 10 minutes to be dried.

[Measurement of Half-life of Brightness]

The half-life of brightness of each of the organic EL elements prepared in Experiment Examples 18 to 22 was measured. That is, the time (half-life of brightness: LT50) until the brightness becomes 50% of an initial brightness when each organic EL element was constant current-driven, was measured. The initial brightness when the constant current-driving is initiated was set at 5,000 cd/m$^2$. The life ratio of each organic EL element was calculated on the basis that the half-life of brightness of the organic EL element prepared in Experiment Example 22 was assumed to be 1.0.

The measurement result is listed together with the conditions (drying atmosphere, drying temperature, and drying time) for drying the coating film for the electron injection layer in Table 3 below.

TABLE 3

| | Atmosphere for drying | Temperature for drying | Time for drying | Life ratio |
|---|---|---|---|---|
| Experiment Example 18 | Air(Atmosphere) | 130° C. | 10 minutes | 1.2 |
| Experiment Example 19 | Air(Atmosphere) | 170° C. | 10 minutes | 1.2 |
| Experiment Example 20 | Air(Atmosphere) | 130° C. | 30 minutes | 1.5 |
| Experiment Example 21 | Air(Atmosphere) | 150° C. | 30 minutes | 1.5 |
| Experiment Example 22 | N$_2$(Nitrogen) | 130° C. | 10 minutes | 1.0 |

As listed in Table 3, it was confirmed that an organic EL element in which the electron injection layer was formed, where the coating film for the electron injection layer was dried in a nitrogen atmosphere or the atmosphere as an atmosphere for drying, could emit light. Moreover, in the case where the atmosphere is used as an atmosphere for drying, the half-life of brightness is enhanced more than in the case where a nitrogen atmosphere is used as an atmosphere for drying.

Example 1

A PEN (polyethylene naphthalate) film substrate in which an ITO thin film was provided was prepared. The ITO thin film was formed by a sputtering method and corresponds to the anode. Onto this ITO thin film, a PEDOT:PSS solution (poly(3,4-ethylenedioxythiophene-polystyrenesulfonic acid) (manufactured by H.C. Starck GmbH; trade name: Baytron) was applied in the atmosphere by a spin coating method to obtain a coating film having a film thickness of 60 nm. The PEN film substrate in which this coating film was provided was heated using a hot plate in an atmosphere under normal pressure at 170° C. for 15 minutes to evaporate the solvent. Then, the PEN film substrate in which the ITO thin film and this coating film were provided was naturally cooled down to room temperature to obtain a PEN film substrate in which the ITO thin film and the hole injection layer were formed.

Next, the macromolecular compound B, which is a hole transport layer material, was dissolved in xylene in a concentration of 0.8% by weight to obtain a xylene solution of the macromolecular compound B. This xylene solution of the macromolecular compound B was applied onto the hole injection layer in the atmosphere by a spin coating method to obtain a coating film for a hole transport layer having a film thickness of 15 nm. The PEN film substrate in which this coating film for a hole transport layer was provided was preserved in a nitrogen atmosphere in which each of the oxygen concentration and the water concentration was controlled to 10 ppm or less in the volume ratio.

Next, a glass substrate was prepared. On this glass substrate, aluminum as a cathode material was deposited in a thickness of about 100 nm in a state in which the pressure was reduced to 1.0×10$^{-4}$ Pa or less to form the cathode.

Next, the thus-obtained conjugated macromolecular compound 1, which is an electron injection layer material, was dissolved in methanol in a concentration of 0.2% by weight to obtain a methanol solution of the conjugated macromolecular compound 1. This methanol solution of the conjugated macromolecular compound 1 was applied onto the cathode in the atmosphere by a spin coating method to obtain a coating film for an electron injection layer having a film thickness of 6 nm. The glass substrate in which this coating film for an electron injection layer was provided was retained in the atmosphere at 130° C. for 10 minutes to dry the coating film for an electron injection layer. Then, the glass substrate was naturally cooled down to room temperature to obtain a glass substrate in which the cathode and the electron injection layer were formed.

Next, the macromolecular compound C, which is a light-emitting macromolecular material, was dissolved in xylene in a concentration of 1.3% by weight to obtain a xylene solution of the macromolecular compound C. This xylene solution of the macromolecular compound C was applied onto the electron injection layer in the atmosphere by a spin coating method to obtain a coating film for a light-emitting layer having a film thickness of 80 nm.

Next, the PEN film substrate preserved in a nitrogen atmosphere was taken out into the atmosphere and the PEN film substrate in which the coating films for an ITO thin film, a hole injection layer, and a hole transport layer were formed and the glass substrate in which the coating films for a cathode, an electron injection layer, and a light-emitting layer were formed were visually aligned with each other to laminate both substrates so that the coating film for a hole transport layer and the coating film for a light-emitting layer were come into contact with each other and to fix both substrates with a clip so as not to be shifted from each other. The lamination of both substrates was performed without performing steps of removing the solvents of the coating film for a hole transport layer and the coating film for a light-emitting layer. Next, in the atmosphere, the laminate of both substrates was retained in an oven at 100° C. for 60 minutes. Through the above operations, the organic EL element was manufactured.

Comparative Example 1

In Comparative Example 1, in the same manner as in Example 1, except that the material for an electron injection layer and the forming method of the electron injection layer alone were changed from Example 1, the organic EL element was manufactured. In Comparative Example 1, instead of forming the electron injection layer by a coating method using the ionic polymer, barium as an electron injection layer material was deposited in a thickness of about 5 nm in a state in which the pressure was reduced to $1.0 \times 10^{-4}$ Pa or less to form the electron injection layer.

To the organic EL elements manufactured in Example 1 and Comparative Example 1 as described above, the voltage was applied to confirm the state of the light emission. With respect to the organic EL element prepared in Example 1, normal light emission was confirmed. However, with respect to the organic EL element manufactured in Comparative Example 1, light emission was not confirmed.

Although in Example 1 and Comparative Example 1, as the hole transport layer material, the macromolecular compound B was used and as the light-emitting macromolecular material, the macromolecular compound C was used, the experiment results of Example 1 and Comparative Example 1 do not particularly depend on the type of the hole transport layer material and the light-emitting macromolecular material.

EXPLANATIONS OF LETTERS OR NUMERALS

10 Organic EL element
12 First component
14 Second component
22 First substrate
24 Second substrate
32 Anode
34 Cathode
42a Hole injection layer
42b Hole transport layer
44 Electron injection layer
50 Light-emitting layer
60 Layered structure
90 Adhesive member
110 Manufacturing apparatus (Laminating apparatus)
120 Unwinding roll
122 First unwinding roll
124 Second unwinding roll
130 Laminating roll
132 First laminating roll
134 Second laminating roll
140 Winding roll
150 Treating apparatus
152 Applying apparatus
154 Drying apparatus
160 Assistant roll

The invention claimed is:

1. A method for manufacturing an organic electroluminescent element that comprises an anode, a cathode, a layered structure placed between the anode and the cathode and formed by stacking a plurality of organic layers including an electron injection layer provided in contact with the cathode, the method comprising the steps of:
   preparing a first component in which either the anode alone is or both the anode and at least a part of the organic layers to make up the layered structure is provided on a first substrate;
   preparing a second component in which either the cathode alone is or both the cathode and the rest part to make up the layered structure excluding the part provided in the first component are provided on a second substrate; and
   laminating the first component and the second component to form the layered structure placed between the anode and the cathode,
   wherein the electron injection layer that comprises an ionic polymer is formed in the step of preparing the first component or the second component, and
   wherein the step of preparing the first component or the second component comprises forming the electron injection layer by applying a coating liquid in an air atmosphere at normal temperature and under normal pressure.

2. The method for manufacturing an organic electroluminescent element according to claim 1, wherein
   the first component and the second component are each an elongated film structure to be rolled up from an unwinding roll to a winding roll, and
   the step of laminating comprises that the first component and the second component wound off from the each unwinding roll are continuously laminated each other and wound up with the winding roll.

3. The method for manufacturing an organic electroluminescent element according to claim 1, wherein the laminating is performed at normal atmospheric pressure.

4. The method for manufacturing an organic electroluminescent element according to claim 1, wherein the first substrate and the second substrate are made of the same material.

5. The method for manufacturing an organic electroluminescent element according to claim 1, wherein
   the step of laminating comprises contacting a first layer formed by applying a first coating liquid with a second layer formed by applying a second coating liquid, and
   the first coating liquid and second coating liquid each comprises a solvent with the same polarity.

6. The method for manufacturing an organic electroluminescent element according to claim 5, wherein
   the first component comprises a hole transport layer formed by applying a coating liquid,
   the second component comprises a light-emitting layer formed by applying a coating liquid, and
   the step of laminating comprises that the hole transport layer and the light-emitting layer are come into contact to be laminated.

* * * * *